US008610846B2

(12) United States Patent
Ishitani et al.

(10) Patent No.: US 8,610,846 B2
(45) Date of Patent: Dec. 17, 2013

(54) DISPLAY DEVICE WITH STACKED POLARIZERS

(75) Inventors: Tetsuji Ishitani, Kanagawa (JP); Takeshi Nishi, Kanagawa (JP); Yuji Egi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/559,755

(22) Filed: Jul. 27, 2012

(65) Prior Publication Data

US 2013/0027622 A1 Jan. 31, 2013

Related U.S. Application Data

(63) Continuation of application No. 11/669,408, filed on Jan. 31, 2007, now Pat. No. 8,405,800.

(30) Foreign Application Priority Data

Feb. 2, 2006 (JP) ................................. 2006-026416

(51) Int. Cl.
*G02F 1/1335* (2006.01)
(52) U.S. Cl.
USPC ............................................. 349/96; 349/117
(58) Field of Classification Search
USPC ................... 349/96, 117; 359/485.04
See application file for complete search history.

(56) References Cited

U.S. PATENT DOCUMENTS

| 4,068,926 | A | | 1/1978 | Nakamura et al. |
| 4,592,623 | A | | 6/1986 | Yamamoto et al. |
| 4,769,242 | A | | 9/1988 | Shibanai |
| 4,769,292 | A | | 9/1988 | Tang et al. |
| 4,968,120 | A | * | 11/1990 | Depp et al. ...................... 349/97 |
| 5,050,965 | A | | 9/1991 | Conner et al. |
| 5,142,393 | A | | 8/1992 | Okumura et al. |
| 5,237,438 | A | | 8/1993 | Miyashita et al. |

(Continued)

FOREIGN PATENT DOCUMENTS

| CN | 001469166 A | 1/2004 |
| CN | 1510478 A | 7/2004 |

(Continued)

OTHER PUBLICATIONS

Chen et al., "21.2: Optimum Film Compensation Modes for TN and VA LCDs," SID Digest '98 : SID International Symposium Digest of Technical Papers, 1998, pp. 315-318.

(Continued)

*Primary Examiner* — Nathanael R Briggs

(74) *Attorney, Agent, or Firm* — Fish & Richardson P.C.

(57) ABSTRACT

An object of the present invention is to provide a display device having a high contrast ratio by a simple and easy method. Another object of the present invention is to manufacture such a display device having a high contrast ratio at low cost. The present invention relates to a display device including a first substrate; a second substrate; a layer including a display element, wherein the layer including the display element is interposed between the first substrate and the second substrate; and stacked polarizers on the outer side of the first substrate or the second substrate. The stacked polarizers are arranged to be in a parallel Nicols state and the wavelength distributions of the extinction coefficients of the stacked polarizers are different from each other.

9 Claims, 76 Drawing Sheets

(56) References Cited

U.S. PATENT DOCUMENTS

| | | |
|---|---|---|
| 5,283,132 A | 2/1994 | Ogura et al. |
| 5,305,143 A | 4/1994 | Taga et al. |
| 5,396,406 A | 3/1995 | Ketchpel |
| 5,519,523 A | 5/1996 | Madokoro et al. |
| 5,583,677 A | 12/1996 | Ito et al. |
| 5,805,253 A | 9/1998 | Mori et al. |
| 5,831,375 A * | 11/1998 | Benson, Jr. .................. 313/110 |
| 5,856,819 A | 1/1999 | Vossler |
| 6,011,580 A | 1/2000 | Hattori et al. |
| 6,023,317 A | 2/2000 | Xu et al. |
| 6,097,147 A | 8/2000 | Baldo et al. |
| 6,147,734 A | 11/2000 | Kashima |
| 6,201,592 B1 | 3/2001 | Terashita et al. |
| 6,291,255 B1 | 9/2001 | Huang et al. |
| 6,356,029 B1 | 3/2002 | Hunter |
| 6,445,005 B1 | 9/2002 | Yamazaki et al. |
| 6,577,361 B1 | 6/2003 | Sekiguchi et al. |
| 6,583,472 B1 | 6/2003 | Shibata et al. |
| 6,583,770 B1 | 6/2003 | Antila et al. |
| 6,621,508 B1 | 9/2003 | Shiraishi et al. |
| 6,646,698 B2 | 11/2003 | Mori |
| 6,656,608 B1 | 12/2003 | Kita et al. |
| 6,657,260 B2 | 12/2003 | Yamazaki et al. |
| 6,689,492 B1 | 2/2004 | Yamazaki et al. |
| 6,706,339 B1 | 3/2004 | Miyatake et al. |
| 6,762,436 B1 | 7/2004 | Huang et al. |
| 6,765,721 B2 | 7/2004 | Kawazu et al. |
| 6,774,877 B2 | 8/2004 | Nishitoba et al. |
| 6,778,229 B2 | 8/2004 | Inoue et al. |
| 6,784,457 B2 | 8/2004 | Yamazaki et al. |
| 6,806,640 B2 | 10/2004 | Okada et al. |
| 6,816,217 B2 | 11/2004 | Sone |
| 6,830,828 B2 | 12/2004 | Thompson et al. |
| 6,863,997 B2 | 3/2005 | Thompson et al. |
| 6,869,695 B2 | 3/2005 | Thompson et al. |
| 6,872,472 B2 | 3/2005 | Liao et al. |
| 6,887,592 B2 | 5/2005 | Hieda et al. |
| 6,893,743 B2 | 5/2005 | Sato et al. |
| 6,894,312 B2 | 5/2005 | Yamazaki et al. |
| 6,897,914 B2 | 5/2005 | Yoshida |
| 6,897,916 B2 | 5/2005 | Hamamoto |
| 6,911,271 B1 | 6/2005 | Lamansky et al. |
| 6,934,081 B2 | 8/2005 | Higashio et al. |
| 6,939,624 B2 | 9/2005 | Lamansky et al. |
| 6,942,931 B2 | 9/2005 | Lee et al. |
| 6,951,694 B2 | 10/2005 | Thompson et al. |
| 6,970,144 B1 | 11/2005 | Swift et al. |
| 6,970,218 B2 | 11/2005 | Fukuda et al. |
| 6,985,291 B2 | 1/2006 | Watson et al. |
| 6,995,816 B2 | 2/2006 | Mi et al. |
| 6,998,772 B2 | 2/2006 | Terumoto |
| 7,015,990 B2 | 3/2006 | Yeh et al. |
| 7,034,451 B2 | 4/2006 | Senbonmatsu |
| 7,057,681 B2 | 6/2006 | Hinata et al. |
| 7,057,682 B2 | 6/2006 | Watson et al. |
| 7,059,718 B2 | 6/2006 | Masterson |
| 7,060,370 B2 | 6/2006 | Kinoshita et al. |
| 7,060,371 B2 | 6/2006 | Akiyama et al. |
| 7,064,740 B2 | 6/2006 | Daly |
| 7,098,086 B2 | 8/2006 | Shibata et al. |
| 7,126,659 B2 | 10/2006 | Fukuda et al. |
| 7,139,053 B2 | 11/2006 | Yuuki et al. |
| 7,144,608 B2 | 12/2006 | Paukshto et al. |
| 7,148,502 B2 | 12/2006 | Yamazaki et al. |
| 7,157,156 B2 | 1/2007 | Raychaudhuri et al. |
| 7,161,185 B2 | 1/2007 | Yamazaki et al. |
| 7,161,649 B2 | 1/2007 | Lee et al. |
| 7,175,898 B2 | 2/2007 | Luhmann et al. |
| 7,176,619 B2 | 2/2007 | Miyachi et al. |
| 7,176,999 B2 | 2/2007 | Miyachi |
| 7,211,823 B2 | 5/2007 | Tung et al |
| 7,218,365 B2 | 5/2007 | Chang et al. |
| 7,265,383 B2 | 9/2007 | Yamazaki et al. |
| 7,301,591 B2 | 11/2007 | Akiyama |
| 7,307,679 B2 | 12/2007 | Toyooka et al. |
| 7,315,338 B2 | 1/2008 | Yeh et al. |
| 7,317,279 B2 | 1/2008 | Chen |
| 7,324,180 B2 | 1/2008 | Kashima |
| 7,327,335 B2 | 2/2008 | Yamazaki et al. |
| 7,332,432 B2 | 2/2008 | Nakamura et al. |
| 7,333,077 B2 | 2/2008 | Koyama et al. |
| 7,339,316 B2 | 3/2008 | Adachi et al. |
| 7,375,464 B2 | 5/2008 | Chin et al. |
| 7,381,479 B2 | 6/2008 | Lamansky et al. |
| 7,453,640 B2 | 11/2008 | Yeh et al. |
| 7,468,769 B2 | 12/2008 | Nakagawa |
| 7,495,382 B2 | 2/2009 | Yamazaki et al. |
| 7,501,685 B2 | 3/2009 | Shibata et al. |
| 7,534,724 B2 | 5/2009 | Nakamura et al. |
| 7,688,403 B2 | 3/2010 | Usukura et al. |
| 7,919,411 B2 | 4/2011 | Nakamura et al. |
| 7,982,267 B2 | 7/2011 | Shibata et al. |
| 8,105,945 B2 | 1/2012 | Nakamura et al. |
| 2001/0030726 A1 * | 10/2001 | Yoshida et al. ............... 349/117 |
| 2001/0048405 A1 | 12/2001 | Salley |
| 2002/0025419 A1 | 2/2002 | Lee et al. |
| 2002/0027416 A1 | 3/2002 | Kim et al. |
| 2002/0093284 A1 | 7/2002 | Adachi et al. |
| 2002/0113546 A1 | 8/2002 | Seo et al. |
| 2002/0140343 A1 | 10/2002 | Hirabayashi |
| 2002/0159003 A1 * | 10/2002 | Sato et al. ...................... 349/65 |
| 2002/0186469 A1 | 12/2002 | Kawazu et al. |
| 2003/0017361 A1 | 1/2003 | Thompson et al. |
| 2003/0053011 A1 * | 3/2003 | Mori .............................. 349/96 |
| 2003/0054199 A1 | 3/2003 | Oh |
| 2003/0057419 A1 | 3/2003 | Murakami et al. |
| 2003/0063456 A1 | 4/2003 | Katahira |
| 2003/0103022 A1 | 6/2003 | Noguchi et al. |
| 2003/0129452 A1 | 7/2003 | Tsuji et al. |
| 2003/0147030 A1 | 8/2003 | Sone |
| 2003/0210360 A1 | 11/2003 | Yoshida |
| 2004/0105049 A1 | 6/2004 | Yeh et al. |
| 2004/0141122 A1 | 7/2004 | Nakagawa |
| 2004/0144974 A1 | 7/2004 | Lee et al. |
| 2004/0146663 A1 | 7/2004 | Paukshto et al. |
| 2004/0151829 A1 | 8/2004 | Boroson et al. |
| 2004/0169461 A1 | 9/2004 | Moriyama et al. |
| 2004/0169624 A1 | 9/2004 | Yamazaki et al. |
| 2004/0174478 A1 | 9/2004 | Fukuda et al. |
| 2004/0183082 A1 | 9/2004 | Yamazaki |
| 2004/0195965 A1 | 10/2004 | Yamazaki et al. |
| 2004/0201341 A1 | 10/2004 | Miyachi et al. |
| 2004/0201795 A1 | 10/2004 | Paukshto |
| 2004/0202893 A1 | 10/2004 | Abe |
| 2004/0227698 A1 | 11/2004 | Yamazaki et al. |
| 2004/0233362 A1 | 11/2004 | Kashima |
| 2004/0239258 A1 | 12/2004 | Seki |
| 2004/0239658 A1 | 12/2004 | Koyama et al. |
| 2004/0245529 A1 | 12/2004 | Yamazaki et al. |
| 2004/0251823 A1 | 12/2004 | Park et al. |
| 2004/0257497 A1 | 12/2004 | Paukshto et al. |
| 2004/0262576 A1 | 12/2004 | Thompson et al. |
| 2004/0263056 A1 | 12/2004 | Seo et al. |
| 2004/0263066 A1 | 12/2004 | Abe et al. |
| 2004/0263069 A1 | 12/2004 | Yamazaki et al. |
| 2005/0012686 A1 | 1/2005 | Osame et al. |
| 2005/0024339 A1 | 2/2005 | Yamazaki et al. |
| 2005/0073627 A1 | 4/2005 | Akiyama |
| 2005/0077817 A1 | 4/2005 | Yamazaki et al. |
| 2005/0093438 A1 | 5/2005 | Chen |
| 2005/0100660 A1 | 5/2005 | Ito et al. |
| 2005/0123791 A1 | 6/2005 | Deaton et al. |
| 2005/0127820 A1 | 6/2005 | Yamazaki et al. |
| 2005/0140895 A1 | 6/2005 | Watson et al. |
| 2005/0157225 A1 | 7/2005 | Toyooka et al. |
| 2005/0157255 A1 | 7/2005 | Masterson |
| 2005/0162092 A1 | 7/2005 | Yamazaki et al. |
| 2005/0179835 A1 | 8/2005 | Lee et al. |
| 2005/0202278 A1 | 9/2005 | Mishima et al. |
| 2005/0253789 A1 | 11/2005 | Ikeda |
| 2006/0007376 A1 | 1/2006 | Fukuda et al. |
| 2006/0024526 A1 | 2/2006 | Thompson et al. |
| 2006/0055847 A1 | 3/2006 | Yamazaki et al. |
| 2006/0114375 A1 | 6/2006 | Yeh et al. |

(56) References Cited

U.S. PATENT DOCUMENTS

| | | |
|---|---|---|
| 2006/0114376 A1 | 6/2006 | Yeh et al. |
| 2006/0114384 A1 | 6/2006 | Yeh et al. |
| 2006/0158096 A1 | 7/2006 | Adachi et al. |
| 2006/0164571 A1 | 7/2006 | Broer et al. |
| 2006/0215096 A1 | 9/2006 | Iwamoto et al. |
| 2007/0014009 A1 | 1/2007 | Cross et al. |
| 2007/0024776 A1 | 2/2007 | Jeng et al. |
| 2007/0054066 A1 | 3/2007 | Usukura et al. |
| 2007/0120475 A1 | 5/2007 | Ishitani et al. |
| 2007/0121033 A1 | 5/2007 | Ishitani et al. |
| 2007/0126962 A1 | 6/2007 | Egi et al. |
| 2007/0146579 A1 | 6/2007 | Egi et al. |
| 2007/0146580 A1 | 6/2007 | Ishitani et al. |
| 2007/0159044 A1 | 7/2007 | Ishitani et al. |
| 2007/0177071 A1 | 8/2007 | Egi et al. |
| 2007/0177084 A1 | 8/2007 | Ishitani et al. |
| 2007/0182885 A1 | 8/2007 | Egi et al. |
| 2007/0200977 A1 | 8/2007 | Egi et al. |
| 2007/0200978 A1 | 8/2007 | Ishitani et al. |
| 2007/0285777 A1 | 12/2007 | Toyoshima et al. |
| 2009/0179549 A1 | 7/2009 | Abe et al. |
| 2011/0114964 A1 | 5/2011 | Shibata et al. |
| 2012/0094412 A1 | 4/2012 | Nakamura et al. |

FOREIGN PATENT DOCUMENTS

| | | |
|---|---|---|
| EP | 0365778 A2 | 5/1990 |
| EP | 1081676 A1 | 3/2001 |
| EP | 1152282 A1 | 11/2001 |
| EP | 1376207 A1 | 1/2004 |
| EP | 1478033 A2 | 11/2004 |
| EP | 1564713 A2 | 8/2005 |
| EP | 2299435 A2 | 3/2011 |
| JP | 62-206524 A | 9/1987 |
| JP | 64-082014 A1 | 3/1989 |
| JP | 01-191122 A | 8/1989 |
| JP | 3-257429 A | 11/1991 |
| JP | 5-034731 A | 2/1993 |
| JP | 5-100114 A | 4/1993 |
| JP | 06-222357 A | 8/1994 |
| JP | 7-181476 A | 7/1995 |
| JP | 2761453 A1 | 3/1998 |
| JP | 2761453 A | 6/1998 |
| JP | 10-255976 A | 9/1998 |
| JP | 2000-180843 A | 6/2000 |
| JP | 2000-249832 A | 9/2000 |
| JP | 3174367 A | 3/2001 |
| JP | 2001-144301 A | 5/2001 |
| JP | 3174367 A | 6/2001 |
| JP | 2001-242320 A | 9/2001 |
| JP | 3315476 B2 | 8/2002 |
| JP | 2002-277867 A | 9/2002 |
| JP | 2003-172819 A | 6/2003 |
| JP | 2003-279963 A | 10/2003 |
| JP | 2004-085590 A | 3/2004 |
| JP | 2004-139052 A | 5/2004 |
| JP | 2004-354818 A | 12/2004 |
| JP | 2005-109390 A | 4/2005 |
| JP | 2005-242370 A | 9/2005 |
| JP | 2005-349616 A | 12/2005 |
| JP | 2006-032939 A | 2/2006 |
| TW | 451083 B | 8/2001 |
| WO | WO 00/34821 A1 | 6/2000 |
| WO | WO 2004/036272 A1 | 4/2004 |
| WO | WO 2004/068179 A2 | 8/2004 |

OTHER PUBLICATIONS

Lazarev et al., "P-116:Thin Crystal Films(TCF) for LCD Contrast Enhancement," SID Digest '03 : SID International Symposium Digest of Technical Papers, 2003, pp. 669-671.
International Search Report (Application No. PCT/JP2006/323515) dated Dec. 26, 2006.
Written Opinion (Application No. PCT/JP2006/323515) dated Dec. 26, 2006.
International Search Report (Application No. PCT/JP2006/325145) dated Mar. 20, 2007.
Written Opinion (Application No. PCT/JP2006/325145) dated Mar. 20, 2007.
Search Report (Application No. 06022862.4) dated Mar. 6, 2007.
Search Report (Application No. 06024409.2) dated Apr. 18, 2007.
Search Report (Application No. 06025873.8) dated Jan. 29, 2007.
Search Report (Application No. 06025980.1) dated May 7, 2007.
Search Report (Application No. 07001418.8) dated May 10, 2007.
Search Report (Application No. 07001332.1) dated Aug. 7, 2007.
Search Report (Application No. 07003058.0) dated May 15, 2007.
Search Report (Application No. 07002954.1) dated May 15, 2007.
Chinese Office Action (Application No. 200710092356.2), dated Apr. 8, 2010, 15 pages, English translation.
European Search Report (Application No. 07001418.8), dated Jul. 28, 2010, 5 pages.
Chinese Office Action (Application No. 200710092356.2) Dated May 25, 2011, with full English translation, 15 pages.
Xiang-Dong Mi et al., "45.4: Wide Viewing-Angle Polarizers Having Relaxed Manufacturing Tolerances," SID 06 Digest, pp. 1535-1538, Jun. 2006, in English, 4 pages.
Chen et al., "21.2: Optimum Film Compensation Modes for TN And VA LCDS," SID Digest '98 : SID International Symposium Digest of Technical Papers, 1998, vol. 29, pp. 315-318.
Lazarev et al., "P-116:Thin Crystal Films(TCF) for LCD Contrast Enhancement," SID Digest '03 : SID International Symposium Digest of Technical Papers, 2003, vol. 34, pp. 669-671.
Office Action, Taiwanese Patent Application No. 96103419, dated Jul. 8, 2013, 12 pages with full English translation.

\* cited by examiner

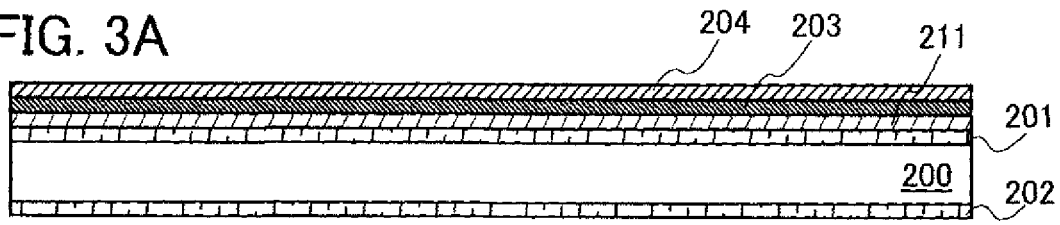
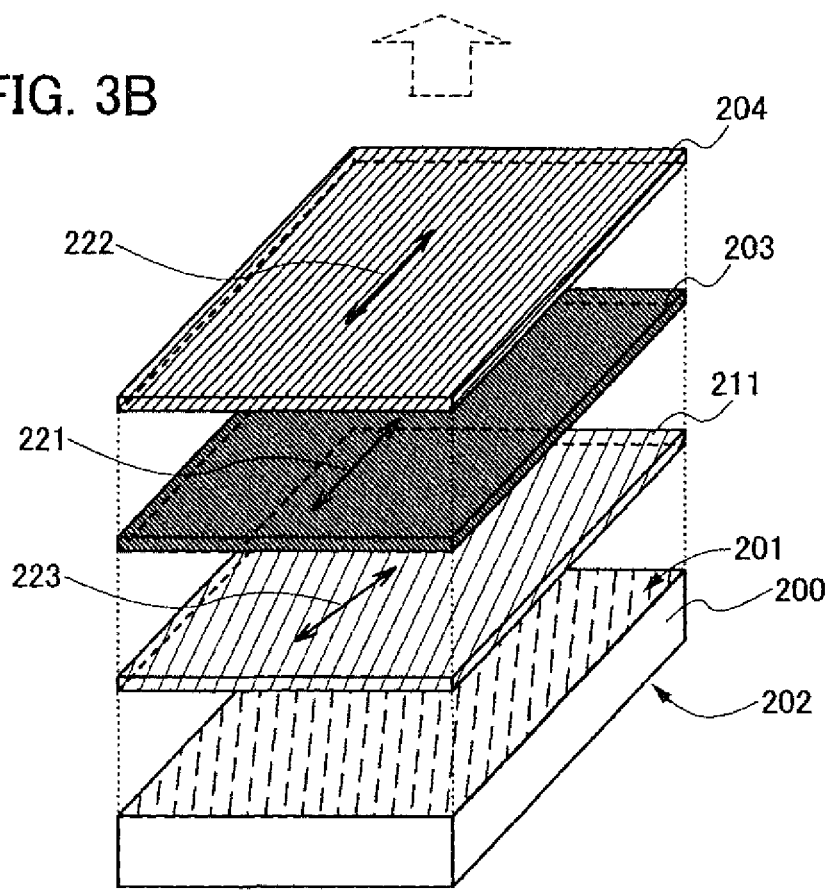

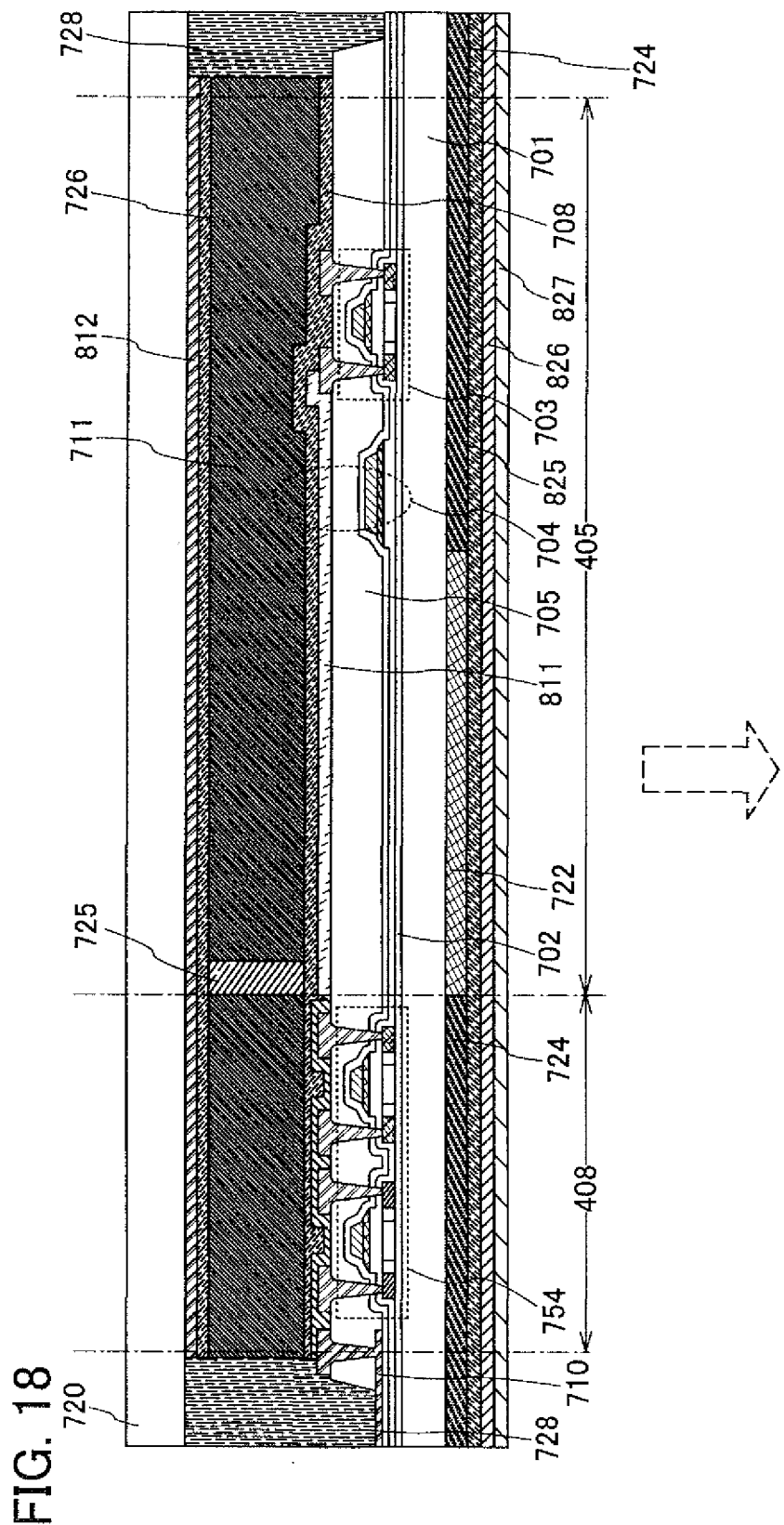

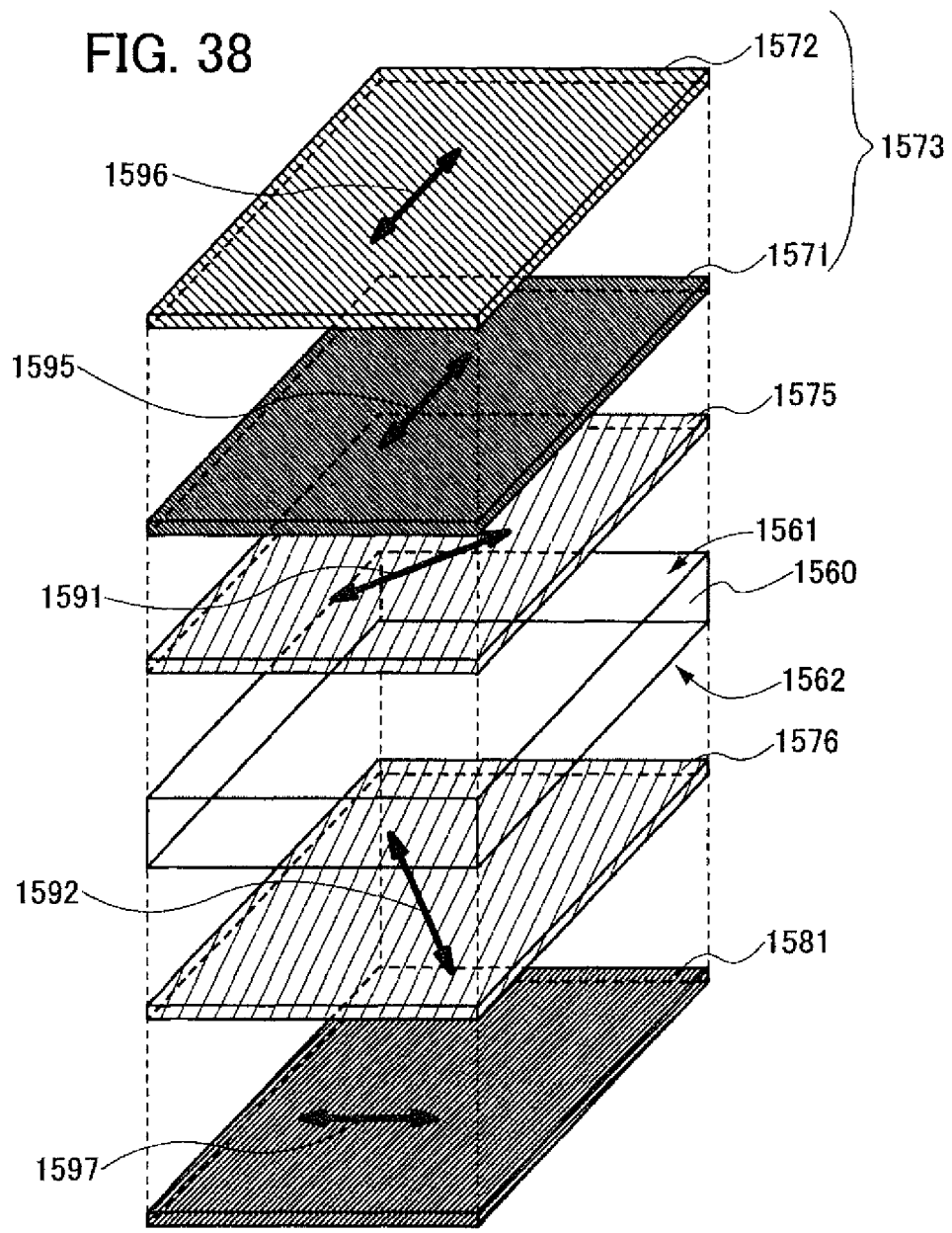

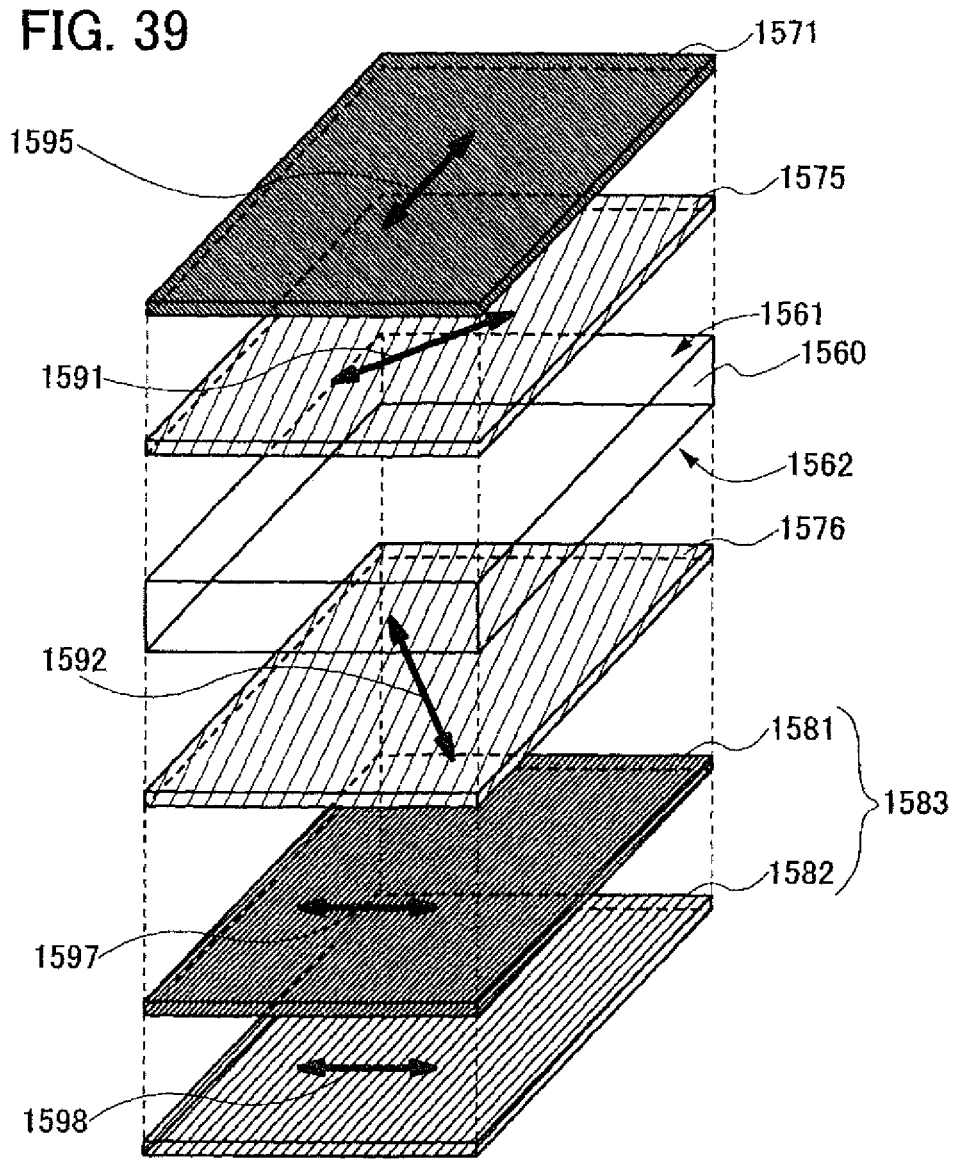

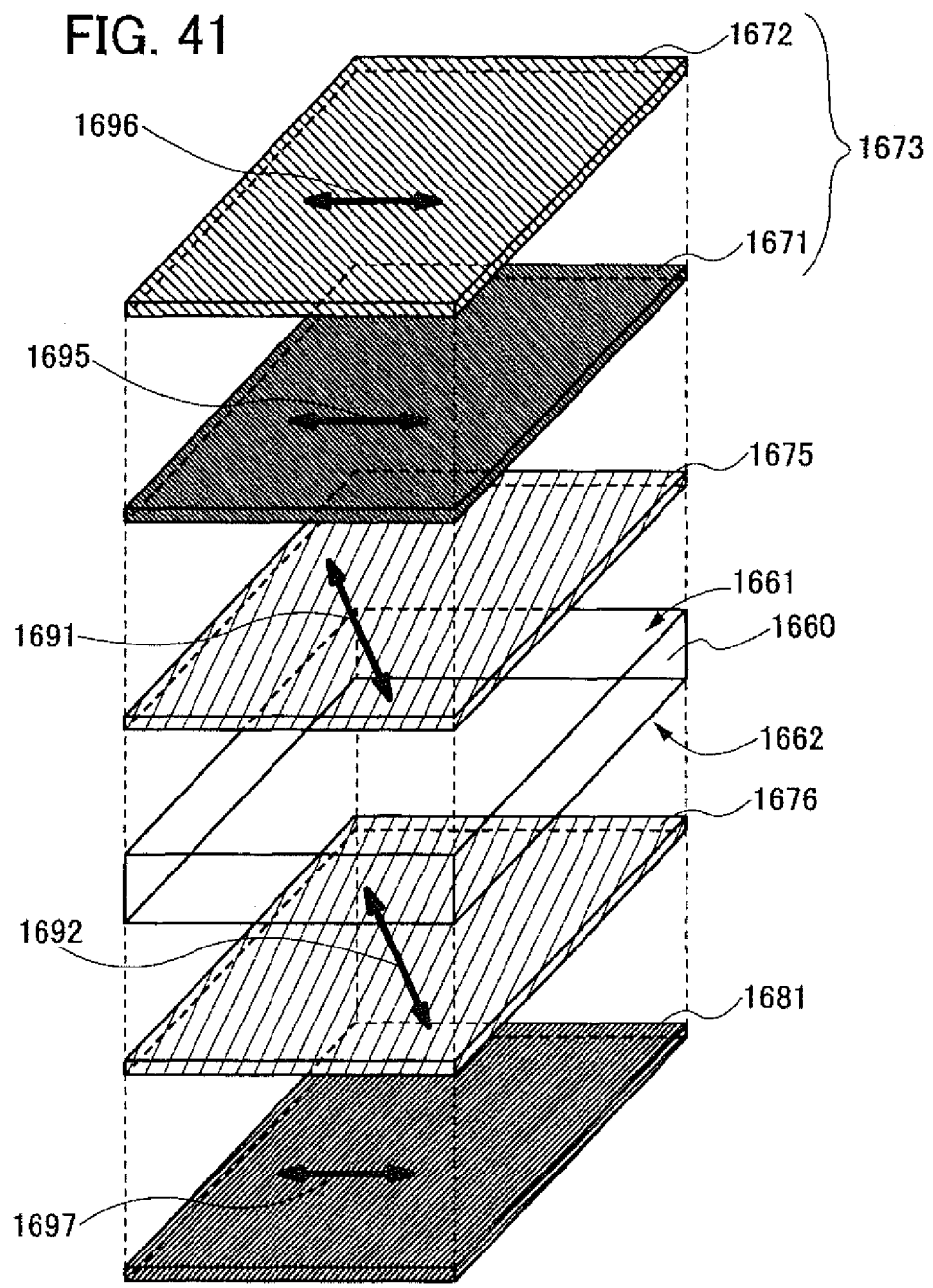

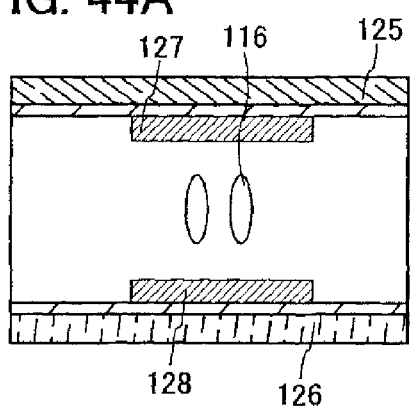
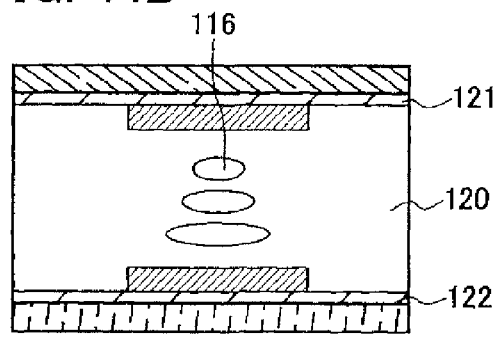
FIG. 44A
FIG. 44B

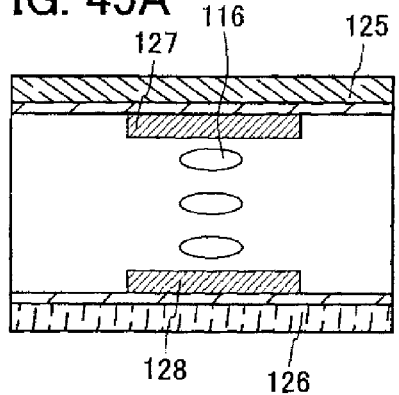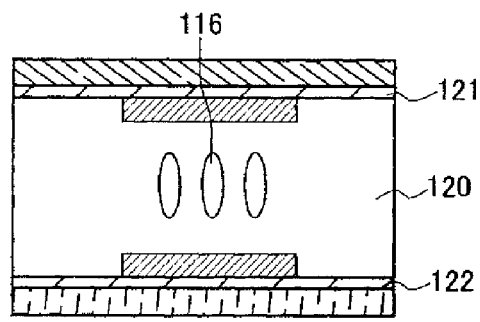
FIG. 45A
FIG. 45B

DISPLAY DEVICE WITH STACKED POLARIZERS

CROSS-REFERENCE TO RELATED APPLICATIONS

This application is a continuation of U.S. application Ser. No. 11/669,408, filed Jan. 31, 2007, now allowed, which claims the benefit of a foreign priority application filed in Japan as Serial No. 2006-026416 on Feb. 2, 2006, both of which are incorporated by reference.

BACKGROUND OF THE INVENTION

1. Field of the Invention

The present invention relates to a structure of a display device for increasing a contrast ratio.

2. Description of the Related Art

A display device which is very thin and lightweight as compared to conventional cathode-ray tube display devices, a so-called flat panel display, has been developed. A liquid crystal display device including a liquid crystal element as a display element, a display device including a self-light emitting element, an FED (Field Emission Display) using an electron source, and the like compete in the market of flat panel displays. Therefore, lower power consumption and a higher contrast ratio are required in order to increase the added value and differentiate from other products.

A general liquid crystal display device is provided with one polarizing plate on each of substrates to keep a contrast ratio. Contrast ratio of the liquid crystal display device can be increased by decreasing black luminance thereof. Therefore, higher display quality can be provided when images are seen in a dark room such as a home theater room.

For example, they have proposed the structure in which a first polarizing plate is provided on the outer side of a substrate on the viewing side of a liquid crystal cell, a second polarizing plate is provided on the outer side of the substrate opposite to the viewing side, and the third polarizing plate is provided for heightening the polarization degree when light from an auxiliary light source provided at the end of the substrate opposite to the viewing side is polarized through the second polarizing plate and passes the liquid crystal cell, in order to increase a contrast ratio (Reference 1: PCT International Publication No. 00/34821). As a result, it is possible to suppress unevenness of display and improve a contrast ratio, which are caused due to shortage of polarization degree and polarization distribution of polarizing plates.

The viewing angle dependence of contrast ratio has been regarded as a problem. A primary factor of viewing angle dependence is optical anisotropy in accordance with the long axis direction and the short axis direction of liquid crystal molecules. Due to optical anisotropy, the visibility of an image which is looked at is different to their visibility when looking at the device from an oblique direction. Consequently, the luminance of white display and the luminance of black display change depending on the viewing angle, and the contrast ratio also has viewing angle dependence.

In order to solve the problem of the viewing angle dependence of the contrast ratio, a structure in which a retardation film is inserted has been proposed. For example, in vertical alignment mode (VA mode), by setting up biaxial retardation films having three directions having different refractive indexes so as to interpose a liquid crystal layer, the viewing angle dependence is suppressed (Reference 2: 'Optimum Film Compensation Modes for TN and VA LCDs', SID98 DIGEST, p. 315-318).

Further, a structure employing stacked wide view (WV) films in which a discotic liquid crystal compound is hybrid-aligned has been proposed for twisted nematic mode (TN mode) (Reference 3: Japanese Patent No. 3315476).

In a projection type liquid crystal display device, in order to solve a problem of deterioration of a polarizing plate, a structure in which two or more linear polarizing plates are stacked in a state in which their absorption axes are parallel to each other has been proposed and high display quality can be obtained by the structure (Reference 4: Japanese Published Patent Application No. 2003-172819).

As a flat panel display except for a liquid crystal display device, there is a display device including an electroluminescent element. It can be thin because the electroluminescent element is a self-light emitting element and it does not require a light irradiation means such as a backlight. Further, a display device including an electroluminescent element has an advantage that response speed is higher and dependence on a viewing angle is less than a liquid crystal display device.

A structure in which a polarizing plate or a circularly polarizing plate is provided is also proposed with respect to a display device including an electroluminescent element (Reference 5: Japanese Patent No. 2761453, and Reference 6: Japanese Patent No. 3174367).

As a structure of a display device including an electroluminescent element, a structure in which light emitted from a light emitting element interposed between light-transmitting substrates can be observed on an anode substrate side and on a cathode substrate side (Reference 7: Japanese Published Patent Application No. H10-255976).

A method for increasing a contrast ratio by using three polarizing plates as described in Reference 1 can be realized by using inexpensive polarizing plates; however, it is difficult to perform display with a higher contrast ratio by the method. Although stacking an additional polarizing plate increases a contrast ratio, it cannot suppress slight light leakage. This is because light absorptance changes depending on wavelength of light, that is, absorptance in a specific wavelength region is lower than that in another wavelength region. In other words, light is hardly absorbed only in the specific region. The same kind of polarizing plates are generally used; therefore, even if polarizing plates are stacked to improve contrast, a wavelength region in which light is not easily absorbed remains as it is. This causes the slight light leakage. The light leakage prevents a contrast ratio from being improved.

SUMMARY OF THE INVENTION

However, there is still a strong need to increase a contrast ratio and researches have been made for improvement of contrast in a display device.

For example, black luminance of a liquid crystal display device is higher compared with the black luminance of light emitting elements used for plasma display panels (PDP) and electroluminescent (EL) panels when they do not emit light. As a result, there is a problem in that the contrast ratio is low, and there is a strong need to increase the contrast ratio.

In addition, a need to increase a contrast ratio is required for a display device including an electroluminescent element as well as a liquid crystal display device.

Therefore, an object of the present invention is to increase the contrast ratio of the display device. Further, another object of the present invention is to provide a display device with a wide viewing angle.

In addition, an object of the present invention is to form such a high-performance display device at low cost.

The present invention has been made in view of the aforementioned problems. One feature of the present invention is to provide a plurality of linear polarizers over one substrate. In the plurality of polarizers, polarizing plates each including one polarizing film may be stacked, or a plurality of polarizing films may be stacked in one polarizing plate. In addition, polarizing plates each including a plurality of polarizing films may be stacked.

An aspect of the present invention is that a plurality of linear polarizers provided over one substrate has different wavelength distributions of extinction coefficients of their absorption axes. Therefore, when absorptances of polarizers change depending on wavelength of light, a wavelength region in which light is absorbed can be extended by stacking polarizers having different wavelength distributions of extinction coefficients of their absorption axes. That is, even when one of the stacked polarizers has a property in which light is hard to be absorbed in a specific wavelength region, another polarizer can absorb light in the wavelength region; therefore, light having a wide range of wavelength region can be absorbed as a whole.

In this specification, a plurality of polarizers which are stacked are referred to as "stacked polarizers", a plurality of polarizing films which are stacked are referred to as "stacked polarizing films", and a plurality of polarizing plates which are stacked are referred to as "stacked polarizing plates".

An aspect of the present invention is to arrange the plurality of polarizers described above to be in a parallel Nicols state.

A parallel Nicols state refers to arrangement such that angular deviation between absorption axes of polarizers is 0°. On the other hand, a crossed Nicols state refers to arrangement such that angular deviation between absorption axes of polarizers is 90°. A transmission axis is provided so as to be orthogonal to the absorption axis of the polarizer, and a crossed Nicols state and a parallel Nicols state are similarly defined when transmission axes are used.

An aspect is that the plurality of linear polarizers which are stacked have different wavelength distributions of extinction coefficients.

In addition, a retardation plate (also referred to as a retardation film or a wave plate) may be provided between the stacked polarizers and a substrate.

In a combination of a polarizing plate and a retardation plate, a structure in which a quarter-wave plate (also referred to as a λ/4 plate) is used as a retardation plate is referred to as a circularly polarizing plate. Therefore, as a structure in which stacked polarizing plates are arranged in accordance with a quarter-wave plate, a structure in which a circularly polarizing plate and a polarizing plate are stacked may be used.

A polarizer and a quarter-wave plate provided over one substrate are arranged to be shifted by 45°. Specifically, when the angle of an absorption axis of the polarizer is 0° (when a transmission axis is 90°), the axis of a slow axis of the quarter-wave plate is arranged to be 45° or 135°.

In this specification, although the absorption axis of a polarizer and the slow axis of a quarter-wave plate provided over one substrate are preferably arranged so as to be shifted from each other by 45°, the angular deviation between the absorption axis of the polarizer and the slow axis of the quarter-wave plate may be more or less than 45° by some margin as long as a similar effect can be obtained.

The present invention relates to a display device structure hereinafter.

An aspect of the present invention relates to a display device including a first substrate, a second substrate, a layer including a display element and interposed between the first substrate and the second substrate, and stacked polarizers on the outer side of the first substrate or the second substrate, in which the stacked polarizers are arranged to be in a parallel Nicols state and the wavelength distributions of the extinction coefficients of the absorption axes of the stacked polarizers are different from each other.

An aspect of the present invention relates to a display device including a first substrate, a second substrate, a layer including a display element and interposed between the first substrate and the second substrate, stacked polarizers on the outer side of the first substrate, and stacked polarizers on an the outer side of the second substrate, in which the stacked polarizers on the outer side of the first substrate are arranged to be in a parallel Nicols state and the wavelength distributions of the extinction coefficients of the absorption axes of the stacked polarizers are different from each other, in which the stacked polarizers on the outer side of the second substrate are arranged to be in a parallel Nicols state and the wavelength distributions of the extinction coefficients of the absorption axes of the stacked polarizers are different from each other, and in which the stacked polarizers on the outer side of the first substrate and the stacked polarizers on the outer side of the second substrate are arranged to be in a crossed Nicols state.

An aspect of the present invention relates to a display device including a first substrate, a second substrate, a layer including a display element and interposed between the first substrate and the second substrate, stacked polarizers on the outer side of the first substrate, and stacked polarizers on the outer side of the second substrate, in which the stacked polarizers on the outer side of the first substrate are arranged to be in a parallel Nicols state and the wavelength distributions of the extinction coefficients of the absorption axes of the stacked polarizers are different from each other, in which the stacked polarizers on the outer side of the second substrate are arranged to be in a parallel Nicols state and the wavelength distributions of the extinction coefficients of the absorption axes of the stacked polarizers are different from each other, and in which the absorption axes of the stacked polarizers on the outer side of the first substrate and the absorption axes of the stacked polarizers on the outer side of the second substrate are arranged to be in a parallel Nicols state.

An aspect of the present invention relates to a display device including a first substrate, a second substrate, a layer including a display element and interposed between the first substrate and the second substrate, stacked polarizers on the outer side of the first substrate or the second substrate, and a retardation plate between the first substrate and the stacked polarizers or between the second substrate and the stacked polarizers, in which the stacked polarizers are arranged to be in a parallel Nicols state and the wavelength distributions of the extinction coefficients of the absorption axes of the stacked polarizers are different from each other.

An aspect of the present invention relates to a display device including a first substrate, a second substrate, a layer including a display element and interposed between the first substrate and the second substrate, stacked polarizers on the outer side of the first substrate, stacked polarizers on the outer side of the second substrate, a first retardation plate between the first substrate and the stacked polarizers on the outer side of the first substrate, and a second retardation plate between the second substrate and the stacked polarizers on the outer side of the second substrate, in which the stacked polarizers on the outer side of the first substrate are arranged to be in a parallel Nicols state and the wavelength distributions of the extinction coefficients of the absorption axes of the stacked polarizers are different from each other, in which the stacked polarizers on the outer side of the second substrate are arranged to be in a parallel Nicols state and the wavelength distributions of the extinction coefficients of the absorption axes of the stacked polarizers are different from each other, and in which the stacked polarizers on the outer side of the first substrate and the stacked polarizers on the outer side of the second substrate are arranged to be in a crossed Nicols state.

An aspect of the present invention relates to a display device including a first substrate, a second substrate, a layer including a display element and interposed between the first substrate and the second substrate, stacked polarizers on the outer side of the first substrate, stacked polarizers on the outer side of the second substrate, a first retardation plate between the first substrate and the stacked polarizers on the outer side of the first substrate, and a second retardation plate between the second substrate and the stacked polarizers on the outer side of the second substrate, in which the stacked polarizers on the outer side of the first substrate are arranged to be in a parallel Nicols state and the wavelength distribution of the extinction coefficients of the absorption axes of the stacked polarizers are different from each other, in which the stacked polarizers on the outer side of the second substrate are arranged to be in a parallel Nicols state and the wavelength distribution of the extinction coefficients of the absorption axes of the stacked polarizers are different from each other, and in which the stacked polarizers on the outer side of the first substrate and the stacked polarizers on the outer side of the second substrate are arranged to be in a parallel Nicols state.

In an aspect of the present invention, the display element is a liquid crystal element.

In an aspect of the present invention, the display element is an electroluminescent element.

An aspect of the present invention is a display device including a display element interposed between a first light-transmitting substrate and a second light-transmitting substrate which are arranged to be opposite to each other; and stacked polarizing plates which are arranged on the outer side of the first light-transmitting substrate or the second light-transmitting substrate, in which the stacked polarizing plates have different wavelength distributions of extinction coefficients of absorption axes, and the stacked polarizing plates are in a parallel Nicols state.

An aspect of the present invention is a display device including a display element interposed between a first light-transmitting substrate and a second light-transmitting substrate which are arranged to be opposite to each other; first stacked polarizing plates on the outer side of the first light-transmitting substrate; and second stacked polarizing plates on the outer side of the second light-transmitting substrate, in which the stacked first polarizing plates have different wavelength distributions of the extinction coefficients of the absorption axes, and the stacked first polarizing plates are in a parallel Nicols state; and in which the stacked second polarizing plates have different wavelength distributions of extinction coefficients of the absorption axes, and the stacked second polarizing plates are in a parallel Nicols state.

An aspect of the present invention is a display device including a display element interposed between a first light-transmitting substrate and a second light-transmitting substrate which are arranged to be opposite to each other; stacked first polarizing plates on the outer side of the first light-transmitting substrate; and stacked second polarizing plates on the outer side of the second light-transmitting substrate, in which the stacked first polarizing plates have different wavelength distributions of the extinction coefficients of the absorption axes, and the stacked first polarizing plates are substantially in a parallel Nicols state; and in which the stacked second polarizing plates have different wavelength distributions of extinction coefficients of the absorption axes, and the stacked second polarizing plates are substantially in a parallel Nicols state.

An aspect of the present invention is a display device including a display element interposed between a first light-transmitting substrate and a second light-transmitting substrate which are arranged to be opposite to each other; a first retardation plate on the outer side of the first light-transmitting substrate; a second retardation plate on the outer side of the second light-transmitting substrate; stacked first polarizing plates on the outer side of the first retardation plate; and stacked second polarizing plates on the outer side of the second retardation plate, in which the first polarizing plates have different wavelength distributions of extinction coefficients of absorption axes, and the first polarizing plates are in a parallel Nicols state; and in which the second polarizing plates have different wavelength distribution of extinction coefficients of absorption axes, and the second polarizing plates are in a parallel Nicols state.

An aspect of the present invention is a display device including a display element interposed between a first light-transmitting substrate and a second light-transmitting substrate which are arranged to be opposite to each other; and stacked polarizing plates on the outer sides of the first light-transmitting substrate and the second light-transmitting substrate, in which the stacked polarizing plates on each side are arranged to be in a parallel Nicols state.

An aspect of the present invention is a display device including a display element interposed between a first light-transmitting substrate and a second light-transmitting substrate which are arranged to be opposite to each other; and stacked polarizing plates on the outer sides of the first light-transmitting substrate and the second light-transmitting substrate, in which the stacked polarizing plates on each side are arranged to be in a parallel Nicols state, and the polarizing plates stacked on the outer side of the first light-transmitting substrate and the polarizing plates stacked on the outer side of the second light-transmitting substrate are arranged to be in a crossed Nicols state.

An aspect of the present invention is a display device including a display element interposed between a first light-transmitting substrate and a second light-transmitting substrate which are arranged to be opposite to each other; a color filter provided on an inner side of the first light-transmitting substrate or the second light-transmitting substrate; and stacked polarizing plates on the outer sides of the first light-transmitting substrate and the second light-transmitting substrate, in which the stacked polarizing plates on each side are arranged to be in a parallel Nicols state, and the polarizing plates provided on the outer side of the first light-transmitting substrate and the polarizing plates provided on the outer side of the second light-transmitting substrate are arranged to be in a crossed Nicols state.

An aspect of the present invention is a display device including a display element interposed between a first light-transmitting substrate and a second light-transmitting substrate which are arranged to be opposite to each other; and stacked polarizing plates on the outer sides of the first light-transmitting substrate and the second light-transmitting substrate, in which the stacked polarizing plates on each side are arranged to be in a parallel Nicols state, the polarizing plates provided on the outer side of the first light-transmitting substrate and the polarizing plates provided on the outer side of the second light-transmitting substrate are arranged to be in a crossed Nicols state, and a contrast ratio in the case where the stacked polarizing plates are arranged to be in a parallel Nicols state is greater than that in the case where the same are arranged to be in a crossed Nicols state.

An aspect of the present invention is a display device including a display element interposed between a first light-transmitting substrate and a second light-transmitting substrate which are arranged to be opposite to each other; and stacked polarizing plates on the outer side of the first light-transmitting substrate and stacked polarizing plates on the outer side of the second light-transmitting substrate, in which the stacked polarizing plates on each side are arranged to be in a parallel Nicols state, the polarizing plates provided on the outer sides of the first light-transmitting substrate and the polarizing plates provided on the second light-transmitting substrate are arranged to be in a crossed Nicols state, and a ratio of transmittance of light transmitting the display device in the case where the stacked polarizing plates on the outer side of the first light-transmitting substrate and the stacked polarizing plates on the outer side of the second light-transmitting substrate are arranged to be in a parallel Nicols state to transmittance of light transmitting the display device in the case where the same are arranged to be in a crossed Nicols state is higher than a ratio of transmittance of light transmitting the display device in the case where a single polarizing plate on the outer side of the first light-transmitting substrate and a single polarizing plate on the outer side of the second light-transmitting substrate are arranged to be in a parallel Nicols state to transmittance in the case where they are arranged to be in a crossed Nicols state.

In an aspect of the present invention, as the stacked polarizing plates, a first polarizing plate and a second polarizing plate are provided in contact with each other.

In an aspect of the present invention, the display element is a liquid crystal element.

An aspect of the present invention is a liquid crystal display device which includes a first light-transmitting substrate and a second light-transmitting substrate which are arranged to be opposite to each other, a display element which is interposed between the first light-transmitting substrate and the second light-transmitting substrate, and a retardation film and stacked polarizing plates which are sequentially arranged on the outer side of the first light-transmitting substrate or the second light-transmitting substrate, in which the stacked polarizing plates are arranged to be in a parallel Nicols state.

An aspect of the present invention is a liquid crystal display device which includes a first light-transmitting substrate and a second light-transmitting substrate which are arranged to be opposite to each other, a display element which is interposed between the first light-transmitting substrate and the second light-transmitting substrate, a retardation film and stacked polarizing plates which are sequentially arranged on the outer side of the first light-transmitting substrate, and a retardation film and a polarizing plate which are sequentially arranged on the outer side of the second light-transmitting substrate, in which the stacked polarizing plates are arranged to be in a parallel Nicols state.

An aspect of the present invention is a liquid crystal display device which includes a first light-transmitting substrate and a second light-transmitting substrate which are arranged to be opposite to each other, a display element which is interposed between the first light-transmitting substrate and the second light-transmitting substrate, a retardation film and stacked polarizing plates which are sequentially arranged on the outer side of the first light-transmitting substrate, and a retardation film and stacked polarizing plates which are sequentially arranged on the outer side of the second light-transmitting substrate, in which the stacked polarizing plates are arranged to be in a parallel Nicols state, and the polarizing plates provided on the outer side of the first light-transmitting substrate and the polarizing plates provided on the outer side of the second light-transmitting substrate are arranged to be in a crossed Nicols state.

An aspect of the present invention is a liquid crystal display device which includes a first light-transmitting substrate and a second light-transmitting substrate which are arranged to be opposite to each other, a display element which is interposed between the first light-transmitting substrate and the second light-transmitting substrate, a color filter which is provided on an inner side of the first light-transmitting substrate or the second light-transmitting substrate, a retardation film and stacked polarizing plates which are sequentially arranged on the outer side of the first light-transmitting substrate, and a retardation film and stacked polarizing plates which are sequentially arranged on the outer side of the second light-transmitting substrate, in which the stacked polarizing plates in each side are arranged to be in a parallel Nicols state, and the polarizing plates provided on the outer side of the first light-transmitting substrate and the polarizing plates provided on the outer side of the second light-transmitting substrate are arranged to be in a crossed Nicols state.

In the present invention, the stacked polarizing plates preferably include two polarizing plates.

In an aspect of the present invention, the retardation film is a film in which liquid crystals are hybrid-oriented, a film in which liquid crystals are twisted-oriented, a uniaxial retardation film, or a biaxial retardation film.

In an aspect of the present invention, the first light-transmitting substrate has a first electrode, the second light-transmitting substrate has a second electrode, and the display element is a liquid crystal element which performs white display when voltage is applied between the first electrode and the second electrode and performs black display when a voltage is not applied between the first electrode and the second electrode.

In an aspect of the present invention, the first light-transmitting substrate has a first electrode, the second light-transmitting substrate has a second electrode, and the display element is a liquid crystal element which performs white display when a voltage is not applied between the first electrode and the second electrode and performs black display when voltage is applied between the first electrode and the second electrode.

An aspect of the present invention relates to a reflection type liquid crystal display device which includes a first substrate, a second substrate opposing to the first substrate, a liquid crystal provided between the first substrate and the second substrate, a reflective material provided for one of the first substrate and the second substrate, a circularly polarizing plate having a retardation plate and stacked linear polarizing plates provided on the outer side of the other one of the first substrate and the second substrate.

In an aspect of the present invention, all the stacked linear polarizing plates are arranged to be in a parallel Nicols state.

In an aspect of the present invention, the retardation plate is either a uniaxial retardation film or a biaxial retardation film.

An aspect of a display device of the present invention is a structure which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, and stacked second linear polarizing plates which are arranged on the outer side of the second light-transmitting substrate.

An aspect of a display device of the present invention is a structure which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, and stacked second linear polarizing plates which are arranged on the outer side of the second light-transmitting substrate, in which all the stacked first linear polarizing plates are arranged to be in a parallel Nicols state, and all the stacked second linear polarizing plates are arranged to be in a parallel Nicols state.

An aspect of a display device of the present invention is a structure which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, and stacked second linear polarizing plates which are arranged on the outer side of the second light-transmitting substrate, in which all the stacked first linear polarizing plates are arranged to be in a parallel Nicols state, all the stacked second linear polarizing plates are arranged to be in a parallel Nicols state, and the stacked first linear polarizing plates and the stacked second linear polarizing plates are arranged to be in a crossed Nicols state.

An aspect of a display device of the present invention is a structure which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, and a second linear polarizing plate which is arranged on the outer side of the second light-transmitting substrate, in which all the stacked first linear polarizing plates are arranged to be in a parallel Nicols state, and the stacked first linear polarizing plates and the stacked second linear polarizing plates are arranged to be in a crossed Nicols state.

In a structure of the present invention, the stacked polarizing plates may have a structure in which the polarizing plates are provided to be in contact with each other.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, a first circularly polarizing plate having first linear polarizing plates which is arranged on the outer side of the first light-transmitting substrate, and a second circularly polarizing plate having stacked second linear polarizing plates which is arranged on the outer side of the second light-transmitting substrate.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, a first circularly polarizing plate having stacked first linear polarizing plates which is arranged on the outer side of the first light-transmitting substrate, and a second circularly polarizing plate having stacked second linear polarizing plates which is arranged on the outer side of the second light-transmitting substrate, in which all the stacked first linear polarizing plates are arranged to be in a parallel Nicols state, all the stacked second linear polarizing plates are arranged to be in a parallel Nicols state, and the stacked first linear polarizing plates and the stacked second linear polarizing plates are arranged to be in a parallel Nicols state.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, stacked second linear polarizing plates which are arranged on the outer side of the second light-transmitting substrate, a first retardation plate provided between the first light-transmitting substrate and the stacked first linear polarizing plates, and a second retardation plate provided between the second light-transmitting substrate and the stacked second linear polarizing plates, in which all the first linear polarizing plates are arranged to be in a parallel Nicols state, all the stacked second linear polarizing plates are arranged to be in a parallel Nicols state, the stacked first linear polarizing plates and the stacked second linear polarizing plates are arranged to be in a parallel Nicols state, a slow axis of the first retardation plate is arranged to be shifted by 45° from the transmission axis of the stacked first linear polarizing plates, and a slow axis of the second retardation plate is arranged to be shifted by 45° from the transmission axis of the stacked second linear polarizing plates.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, stacked second linear polarizing plates which are arranged on the outer side of the second light-transmitting substrate, a first retardation plate provided between the first light-transmitting substrate and the stacked first linear polarizing plates, and a second retardation plate provided between the second light-transmitting substrate and the stacked second linear polarizing plates, in which all the first linear polarizing plates are arranged to be in a parallel Nicols state, the stacked first linear polarizing plates and the stacked second linear polarizing plates are arranged to be in a parallel Nicols state, a slow axis of the first retardation plate is arranged to be shifted by 45° from the transmission axis of the stacked first linear polarizing plates, and a slow axis of the second retardation plate is arranged to be shifted by 45° from the transmission axis of the stacked second linear polarizing plates.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, a first circularly polarizing plate having stacked first linear polarizing plates which are arranged on the outer side of the first light-transmitting substrate, a second circularly polarizing plate having stacked second linear polarizing plates which are arranged on the outer side of the second light-transmitting substrate, in which all the stacked first linear polarizing plates are arranged to be in a parallel Nicols state, all the stacked second linear polarizing plates are arranged to be in a parallel Nicols state, and the stacked first linear polarizing plate and the stacked second linear polarizing plates are arranged to be in a crossed Nicols state.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, stacked second linear polarizing plates which are arranged on the outer side of the second light-transmitting substrate, a first retardation plate provided between the first light-transmitting substrate and the stacked first linear polarizing plates, and a second retardation plate provided between the second light-transmitting substrate and the stacked second linear polarizing plates, in which all the stacked first linear polarizing plates are arranged to be in a parallel Nicols state, all the stacked second linear polarizing plates are arranged to be in a parallel Nicols state, the stacked first linear polarizing plates and the stacked second linear polarizing plates are arranged to be in a crossed Nicols state, a slow axis of the first retardation plate is arranged to be shifted by 45° from the transmission axis of the stacked first linear polarizing plates, a slow axis of the second retardation plate is arranged to be shifted by 45° from the transmission axis of the stacked second linear polarizing plates, and the transmission axis of the stacked second linear polarizing plates is arranged to be shifted by 90° from the transmission axis of the stacked first linear polarizing plate.

An aspect of the present invention is a display device which includes a first light-transmitting substrate and a second light-transmitting substrate which are arranged to be opposite to each other, a light emitting element which is provided between the substrates opposite to each other and can emit light to both sides of the first light-transmitting substrate and the second light-transmitting substrate, stacked first linear polarizing plates which are arranged on the outer side of the first light-transmitting substrate, stacked second linear polarizing plates which are arranged on the outer side of the second light-transmitting substrate, a first retardation plate provided between the first light-transmitting substrate and the stacked first linear polarizing plates, and a second retardation plate provided between the second light-transmitting substrate and the stacked second linear polarizing plates, in which all the stacked first linear polarizing plates are arranged to be in a parallel Nicols state, the stacked first linear polarizing plates and the stacked second linear polarizing plates are arranged to be in a crossed Nicols state, a slow axis of the first retardation plate is arranged to be shifted by 45° from the transmission axis of the stacked first linear polarizing plates, a slow axis of the second retardation plate is arranged to be shifted by 45° from the transmission axis of the stacked second linear polarizing plates, and the transmission axis of the stacked second linear polarizing plates is arranged to be shifted by 90° from the transmission axis of the stacked first linear polarizing plates.

An aspect of the present invention is a display device which includes a first substrate, a second substrate which is opposite to the first substrate, a light emitting element which is provided between the first substrate and the second substrate, a circularly polarizing plate which has a retardation plate and stacked linear polarizing plates and is arranged on the outer side of one of the first substrate and the second substrate, in which light from the light emitting element is emitted from one of the first substrate and the second substrate.

In an aspect of the present invention, all the stacked linear polarizing plates are arranged to be in a parallel Nicols state.

In an aspect of the present invention, the slow axis of the retardation plate is arranged to be shifted by 45° from the transmission axes of the linear polarizing plates.

In an aspect of the present invention, the light emitting element includes an electroluminescent layer formed between a pair of electrodes. One of the pair of electrodes may have a reflective property, and the other of the pair of electrodes may have light-transmitting property.

In the above aspect of the present invention, the retardation plate and the stacked linear polarizing plates are arranged on the outer side of the substrate on the electrode side having light-transmitting property.

A "crossed Nicols state" refers to the arrangement in which transmission axes of polarizing plates are shifted from each other by 90°. A "parallel Nicols state" refers to the arrangement in which transmission axes of polarizing plates are shifted from each other by 0°. An absorption axis is provided to be orthogonal to the transmission axis of the polarizing plate, and a "parallel Nicols state" is also defined using the absorption axis in a similar manner.

In this specification, although absorption axes of polarizers are preferably arranged such that angular deviation between the absorption axes is 0° or 0°±10° in a parallel Nicols state, the angular deviation therebetween may be further deviated from the angular range by some extent as long as a similar effect can be obtained. Absorption axes of polarizers are preferably arranged such that angular deviation between the absorption axes is 90° or 90°±10° in a crossed Nicols state; however, the angular deviation therebetween may be further deviated from the angular range by some extent as long as a similar effect can be obtained.

In the present invention, a display element is a light emitting element. An element utilizing electroluminescence (an electroluminescent element), an element utilizing plasma, and an element utilizing field emission are given as the light emitting element. The electroluminescent element (also referred to as an "EL element" in this specification) can be divided into an organic EL element and an inorganic EL element depending on a material to be applied. A display device having such a light emitting element is also referred to as a light emitting device.

In the present invention, extinction coefficients of stacked polarizers are different from each other.

The present invention can be applied to a passive matrix type display device in which a switching element is not formed, as well as an active matrix type display device using a switching element.

Since a simple structure such that a plurality of polarizers is provided, the contrast ratio of the display device can be increased. Since wavelength distributions of extinction coefficients of absorption axes of a plurality of polarizers provided for one substrate are different from each other, the fluctuation of the wavelength distribution of the absorption of the plurality of polarizers as a whole can be suppressed and slight light leakage is suppressed; therefore, the contrast ratio of the display device can be increased.

Since a plurality of polarizers is stacked to be in a parallel Nicols state, black luminance can be decreased and the contrast ratio of the display device can be increased.

In accordance with the present invention, by using a retardation plate, a display device with a wide viewing angle can be provided as well as the contrast ratio of the display device is increased.

BRIEF DESCRIPTION OF THE DRAWINGS

FIGS. 3A and 3B are diagrams showing a display device according to the present invention.

FIG. 18 is a cross sectional view of a display device according to the present invention.

FIG. 38 is a diagram showing a display device according to the present invention.

FIG. 39 is a diagram showing a display device according to the present invention.

FIG. 41 is a diagram showing a display device according to the present invention.

FIGS. 44A and 44B are diagrams each showing a mode of a liquid crystal element according to the present invention.

FIGS. 45A and 45B are diagrams each showing a mode of a liquid crystal element according to the present invention.

DETAILED DESCRIPTION OF THE INVENTION

Embodiment Modes

Figure 1A:
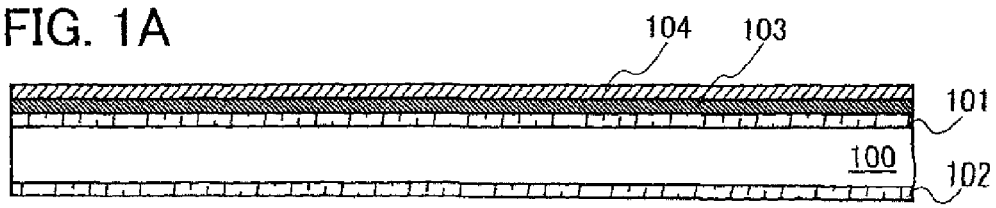
FIGS. 1A and 1B are diagrams showing a display device according to the present invention.

Hereinafter, Embodiment Modes will be described with reference to the drawings. The present invention can be carried out in many different modes. It is easily understood by those skilled in the art that modes and details disclosed herein can be modified in various ways without departing from the spirit and the scope of the present invention. It should be noted that the present invention should not be interpreted as being limited to the description of the embodiment modes given below. Like portions or portions having a like function are denoted by the same reference numerals through drawings, and therefore, description thereon is omitted.

Embodiment Mode 1

Figure 1B:
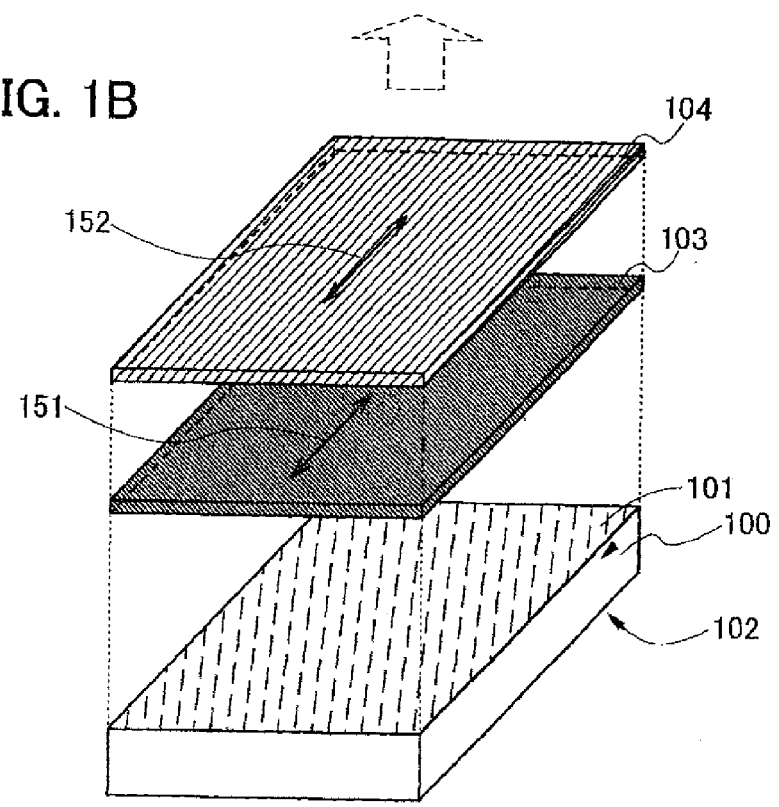

Embodiment Mode 1 will describe a concept of a display device of the present invention with reference to FIGS. 1A and 1B.

FIG. 1A is a cross sectional view of a display device in which polarizers are stacked, and FIG. 1B is a perspective view thereof.

As shown in FIG. 1A, a display element 100 is interposed between a first substrate 101 and a second substrate 102 which are arranged to be opposite to each other.

Light-transmitting substrates can be used for the first substrate 101 and the second substrate 102. As such light-transmitting substrates, a glass substrate such as alumino borosilicate glass, barium borosilicate glass, a quartz substrate, or the like can be used. A substrate made from acrylic or plastic typified by polyethylene terephthalate (PET), polyethylene naphthalate (PEN), polyethersulfone (PES), or polycarbonate (PC) can be used for the light-transmitting substrates.

Polarizers are stacked on the outer side of the substrate 101, in other words, on the side which is not in contact with the display element 100 from the substrate 101. A first polarizer 103 and a second polarizer 104 are provided on the outer side of the substrate 101 side.

Next, in the perspective view of FIG. 1B, the first polarizer 103 and the second polarizer 104 are arranged in such a way that an absorption axis 151 of the first polarizer 103 and an absorption axis 152 of the second polarizer 104 should be parallel to each other. This parallel state is referred to as parallel Nicols.

The polarizers stacked in this manner are arranged to be in a parallel Nicols state.

Transmission axes exist in a direction orthogonal to the absorption axes based on the characteristics of the polarizers. Thus, a state in which transmission axes are parallel to each other can also be referred to as a parallel Nicols state.

Moreover, the wavelength distributions of extinction coefficients of the first polarizer 103 and the second polarizer 104 are different. However, in this specification, the range of the extinction coefficients of the absorption axes in polarizers is preferably $3.0 \times 10^{-4}$ to $3.0 \times 10^{-2}$. The extinction coefficients of the first polarizer 103 and the second polarizer 104 are preferably in this range, which similarly applied to the following Embodiment modes and examples.

FIGS. 1A and 1B show an example in which two polarizers are stacked; however, three or more polarizers may be stacked.

By stacking polarizers to be in parallel Nicols, black luminance can be decreased, and thus, the contrast ratio of the display device can be increased.

In addition, this embodiment mode can be freely combined with other embodiment modes and other examples in this specification, if necessary.

Embodiment Mode 2

Figure 2A:
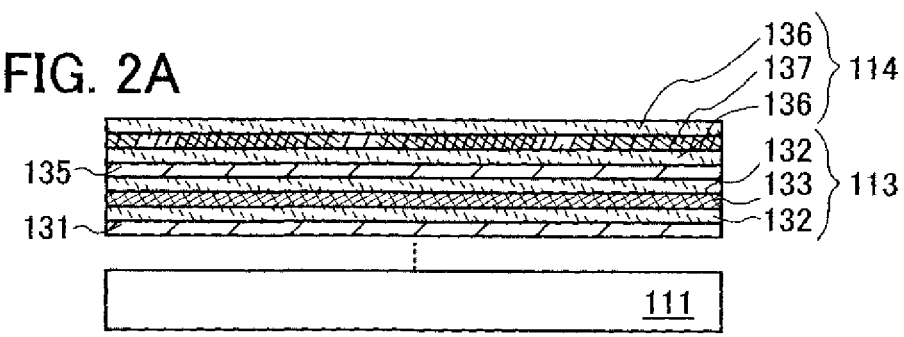
FIGS. 2A to 2C are diagrams each showing a structure of stacked polarizers according to the present invention.
Figure 2B:
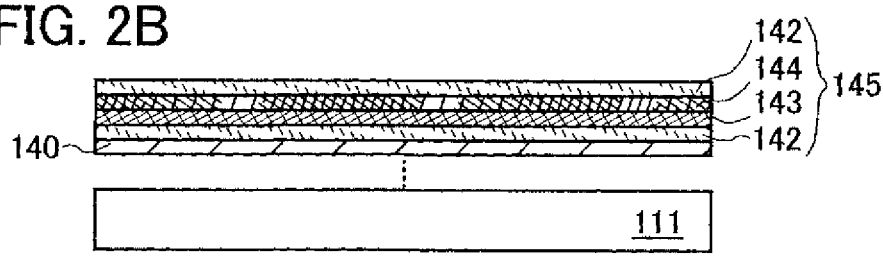
Figure 2C:
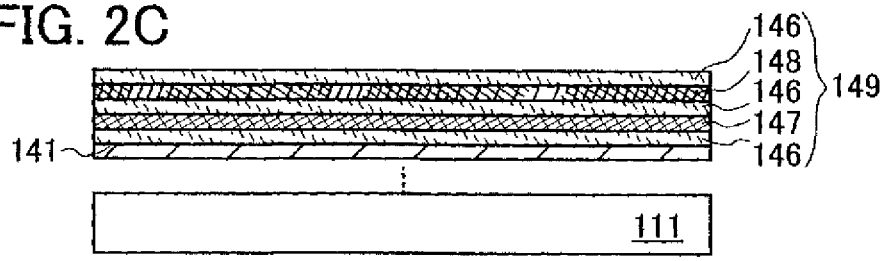

Embodiment Mode 2 will describe a structure in which polarizers are stacked with reference to FIGS. 2A to 2C.

FIG. 2A shows an example in which polarizing plates each having one polarizing film are stacked as the stacked polarizers.

In FIG. 2A, each of the polarizing plates 113 and 114 is a linear polarizing plate, and can be formed from a known material to have the following structure. For example, an adhesive layer 131, the polarizing plate 113 in which a protective film 132, a polarizing film 133, and a protective film 132 are stacked, an adhesive layer 135 and the polarizing plate 114 in which a protective film 136, a polarizing film 137, and a protective film 136 are stacked similarly to the polarizing plate 113, can be stacked from a substrate 111 side (see FIG. 2A). As the protective films 132 and 136, TAC (triacetyl cellulose) or the like can be used. As the polarizing films 133 and 137, a mixed layer including PVA (polyvinyl alcohol) and a dichroic pigment may be formed. As the dichroic pigment, iodine and dichromatic organic dye can be cited. The positions of the polarizing plate 113 and a polarizing plate 145 may be reverse. In addition, an anti-glare treatment or an anti-reflection treatment may be carried out on the surfaces of the protective films 136.

FIG. 2B shows an example in which a plurality of polarizing films are stacked in one polarizing plate as one example of the stacked polarizers. FIG. 2B shows a state in which an adhesive layer 140, and the polarizing plate 145 including a protective film 142, a polarizing film (A) 143, a polarizing film (B) 144, and a protective film 142 are stacked from the substrate 111 side. The positions of the polarizing film 143 and the polarizing film 144 may be reverse. In addition, an anti-glare treatment or an anti-reflection treatment may be carried out on the surfaces of the protective films 142.

FIG. 2C shows another example in which a plurality of polarizing films are stacked in one polarizing plate. FIG. 2C shows an adhesive layer 141, a polarizing plate 149 in which a protective film 146, a polarizing film (A) 147, a protective film 146, a polarizing film (B) 148, and a protective film 146 are stacked from the substrate 111 side. In other words, the structure shown in FIG. 2C is a structure in which the protective film is interposed between the polarizing films. The positions of the polarizing film 147 and the polarizing film 148 may be reverse. In addition, an anti-glare treatment or an anti-reflection treatment may be carried out on the surfaces of the protective films 146.

For the protective films 142 and 146, a similar material to the protective film 132 may be used, and each of the polarizing film (A) 143, the protective film (B) 144, the polarizing film (A) 147, and the protective film (B) 148 may be formed from a similar material to the polarizing films 133 and 137.

In FIGS. 2A to 2C, two polarizers are stacked; however, the number of polarizers is not limited to two. In the case where three or more polarizers are stacked, three or more polarizing plates may be stacked in the structure shown in FIG. 2A. In the structure shown in FIG. 2B, the number of polarizing films provided between the protective films 142 may be increased. In the structure shown in FIG. 2C, a polarizing film and a protective film to be formed thereover may be stacked in such a way as stacking the protective film 146, the polarizing film (A) 147, the protective film 146, the polarizing film (B) 148, the protective film 146, the polarizing film (C), the protective film 146, or the like.

Further, the stacked structures shown in FIGS. 2A to 2C may be combined. In other words, three polarizers may be stacked, by combining the polarizing plate 113 including the polarizing film 133 shown in FIG. 2A and the polarizing plate 145 including the polarizing film 143 and the polarizing film 144 shown in FIG. 2B, for example. The structure of the stacked polarizers like this may be freely combined with FIGS. 2A to 2C, as appropriate.

Furthermore, a plurality of polarizing plates 145 shown in FIG. 2B may be stacked so as to stack polarizers. Similarly, a plurality of polarizing plates 149 shown in FIG. 2C may be stacked.

The case where polarizers are arranged in parallel Nicols indicates that, in FIG. 2A, the absorption axes of the polarizing plates 113 and 114 are parallel, in other words, the absorption axes of the polarizing films 133 and 137 are parallel; that, in FIG. 2B, absorption axes of the polarizing films 143 and 144 are arranged to be parallel; and that, in FIG. 2C, absorption axes of the polarizing films 147 and 148 are arranged to be parallel. Even when the number of polarizing films and polarizing plates increases, absorption axes of them are arranged to be parallel.

Figure 59A:
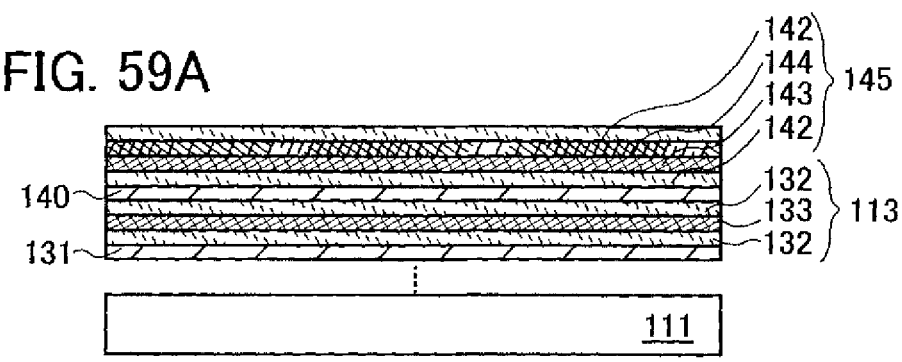
FIGS. 59A and 59B are diagrams each showing a structure of stacked polarizers according to the present invention.
Figure 59B:
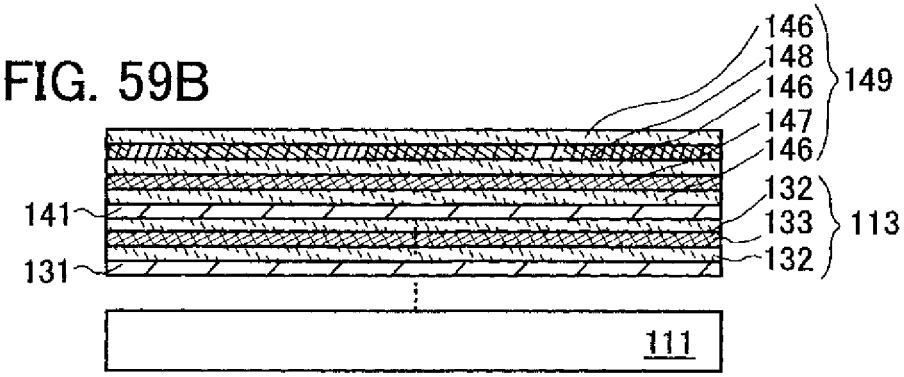

FIGS. 2A to 2C show the examples in which two polarizers are stacked; however, FIGS. 59A and 59B show examples in which three polarizers are stacked.

FIG. 59A shows an example in which the polarizing plate 113 including the polarizing film 133 shown in FIG. 2A, and the polarizing plate 145 including the polarizing film 143 and the polarizing film 144 shown in FIG. 2B are stacked. The positions of the polarizing plate 113 and the polarizing plate 145 may be reverse. In addition, an anti-glare treatment or an anti-reflection treatment may be carried out on the surfaces of the protective films 142.

FIG. 59B shows an example in which the polarizing plate 113 including the polarizing film 133 shown in FIG. 2A, and the polarizing plate 149 including the polarizing film 147 and the polarizing film 148 shown in FIG. 2C are stacked. The positions of the polarizing plate 113 and the polarizing plate 149 may be reverse. In addition, an anti-glare treatment or an anti-reflection treatment may be carried out on the surfaces of the protective films 146.

FIGS. 60A to 60C, FIGS. 61A and 61B, and FIGS. 62A and 62B show examples in which four polarizers are stacked.

Figure 60A:
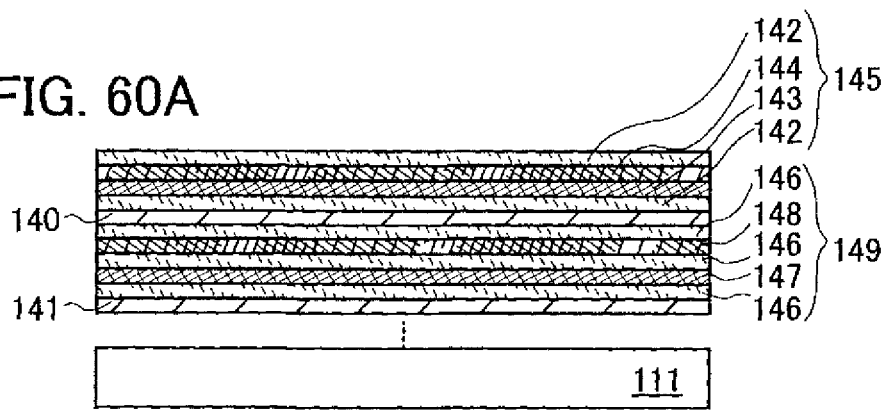
FIGS. 60A to 60C are diagrams each showing a structure of stacked polarizers according to the present invention.

FIG. 60A shows an example in which the polarizing plate 149 including the polarizing film 147 and the polarizing film 148 shown in FIG. 2C and the polarizing plate 145 including the polarizing film 143 and the polarizing film 144 shown in FIG. 2B are stacked. The positions of the polarizing plate 145 and the polarizing plate 149 may be reverse. In addition, an anti-glare treatment or an anti-reflection treatment may be carried out on the surfaces of the protective films 142.

Figure 60B:
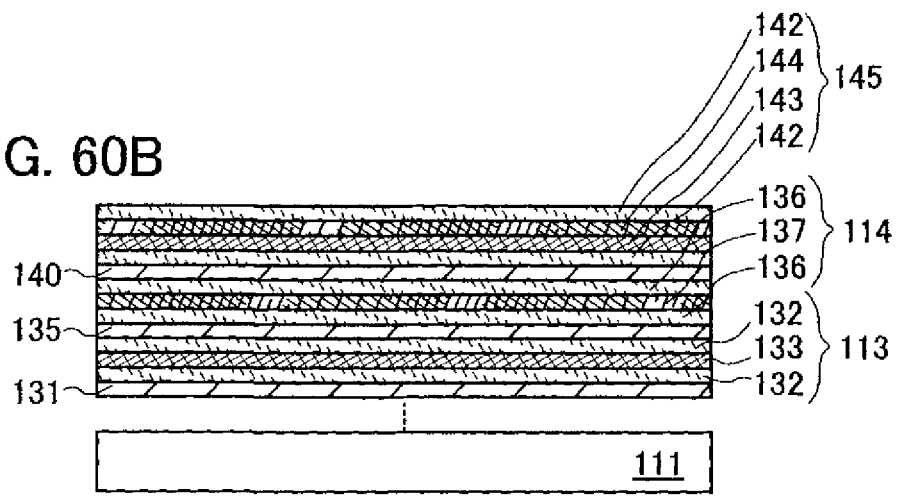

FIG. 60B shows an example in which the polarizing plate 113 including the polarizing film 133 and the polarizing plate 114 including the polarizing film 137 shown in FIG. 2A, and the polarizing plate 145 including the polarizing film 143 and the polarizing film 144 shown in FIG. 2B are stacked. The stacked order of the polarizing plates 113, 114 and 145 is not limited to this example. In addition, an anti-glare treatment or an anti-reflection treatment may be carried out on the surfaces of the protective films 142.

Figure 60C:
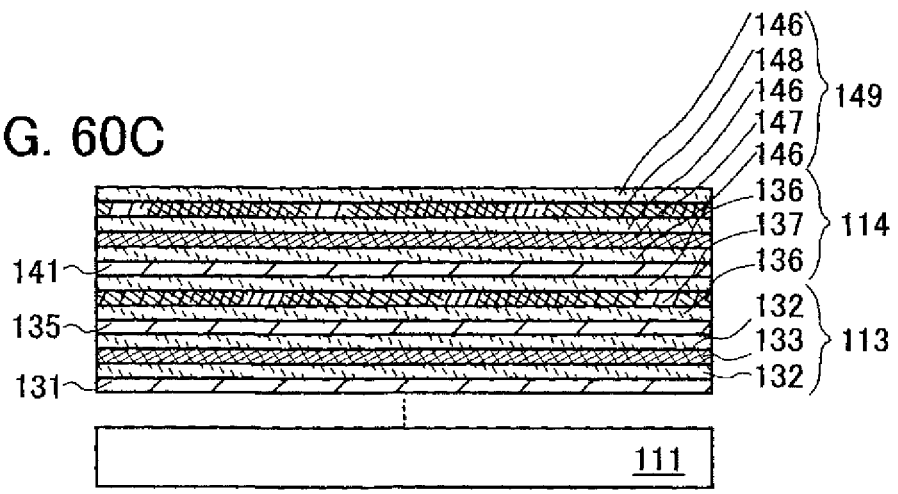

FIG. 60C shows an example in which the polarizing plate 113 including the polarizing film 133 and the polarizing plate 114 including the polarizing film 137 shown in FIG. 2A, and the polarizing plate 149 including the polarizing film 147 and the polarizing film 148 shown in FIG. 2C are stacked. The stacked order of the polarizing plates 113, 114 and 149 is not limited to this example. In addition, an anti-glare treatment or an anti-reflection treatment may be carried out on the surfaces of the protective films 146.

Figure 61A:
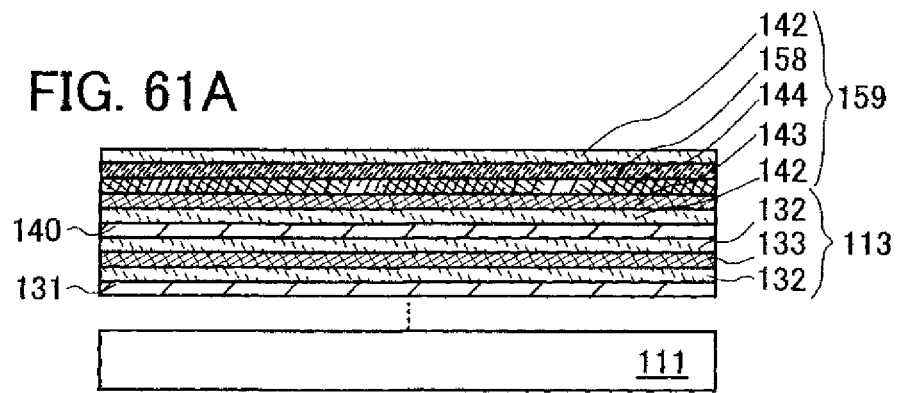
FIGS. 61A and 61B are diagrams each showing a structure of stacked polarizers according to the present invention.

FIG. 61A shows an example in which the polarizing plate 113 including the polarizing film 133 shown in FIG. 2A, and a polarizing plate 159 including three stacked polarizing films shown in FIG. 2B, i.e., the polarizing film 143, the polarizing film 144 and a polarizing film 158, are stacked. The positions of the polarizing plate 113 and the polarizing plate 159 may be reverse. In addition, an anti-glare treatment or an anti-reflection treatment may be carried out on the surfaces of the protective films 142.

Figure 61B:
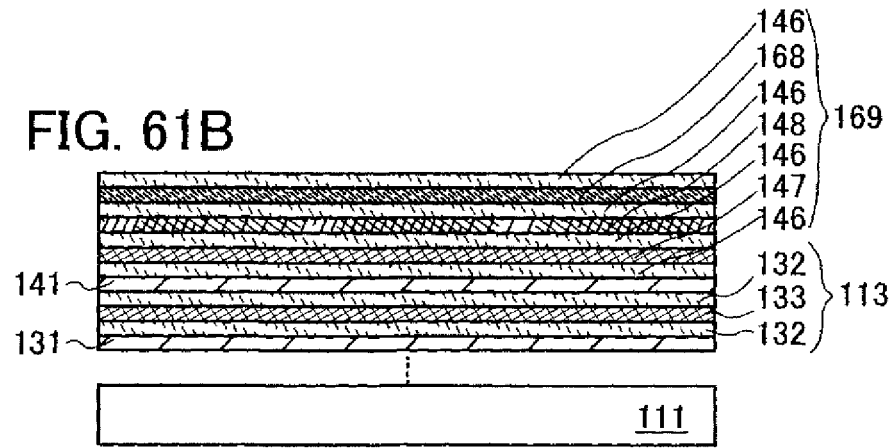

FIG. 61B shows an example in which the polarizing plate 113 including the polarizing film 133 shown in FIG. 2A, and a polarizing plate 169 including three stacked polarizing films shown in FIG. 2C, i.e., the polarizing film 147, the polarizing film 148 and a polarizing film 168, are stacked. The positions of the polarizing plate 113 and the polarizing plate 169 may be reverse. In addition, an anti-glare treatment or an anti-reflection treatment may be carried out on the surfaces of the protective films 146.

Figure 62A:
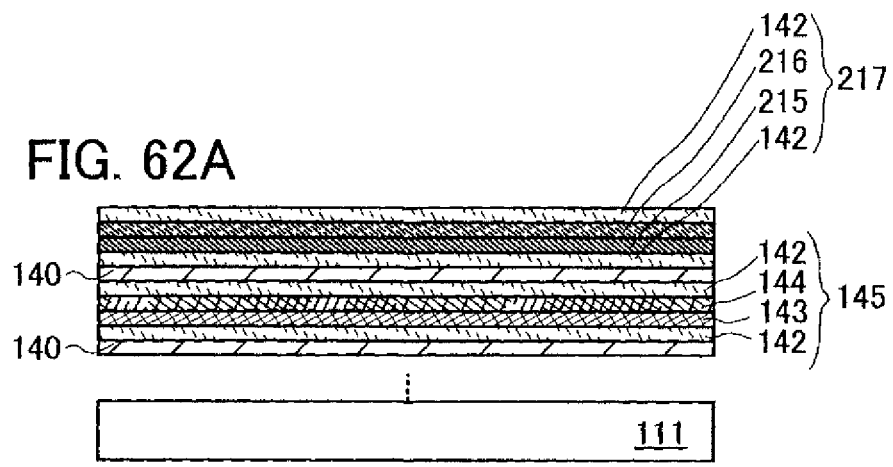
FIGS. 62A and 62B are diagrams each showing a structure of stacked polarizers according to the present invention.

FIG. 62A shows an example in which the polarizing plate 145 including the polarizing film 143 and the polarizing film 144 shown in FIG. 2B, and a polarizing plate 217 including a polarizing film 215 and a polarizing film 216 having the same structure as that in FIG. 2B are stacked. In addition, an anti-glare treatment or an anti-reflection treatment may be carried out on the surfaces of the protective films 142.

Figure 62B:
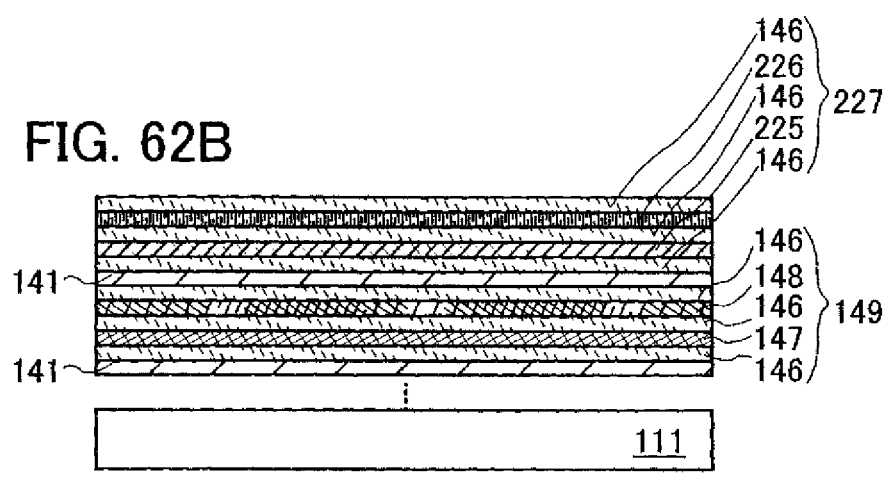

FIG. 62B shows an example in which the polarizing plate 149 including the polarizing film 147 and the polarizing film 148 shown in FIG. 2C, and a polarizing plate 227 including a polarizing film 225 and a polarizing film 226 having the same structure as that in FIG. 2C are stacked. In addition, an anti-glare treatment or an anti-reflection treatment may be carried out on the surfaces of the protective films 146.

In FIGS. 59A and 59B, 60A to 60C, 61A and 61B, and 62A and 62B, a retardation plate may be provided between the substrate 111 and the polarizer if necessary.

Figure 63A:
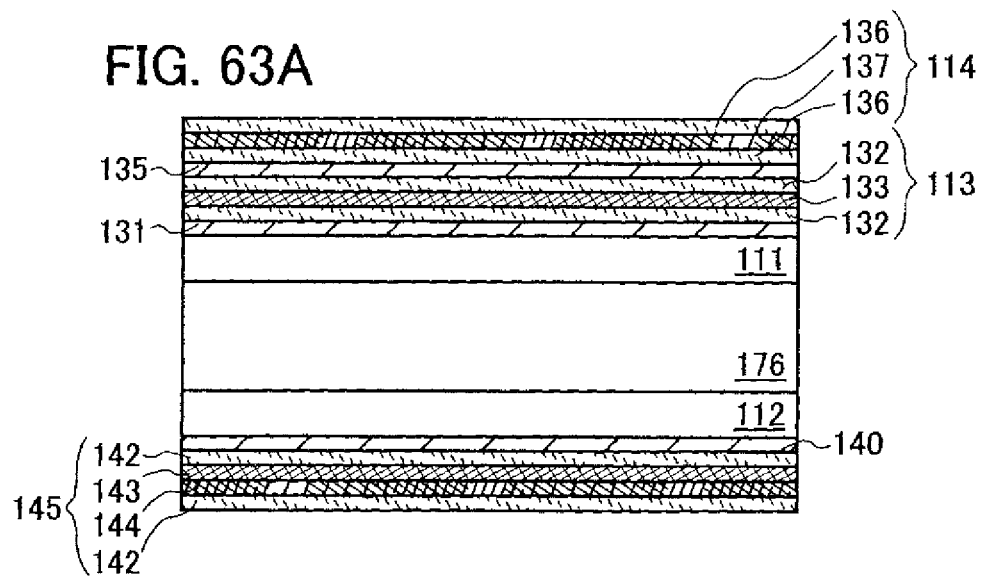
FIGS. 63A and 63B are diagrams each showing a structure of stacked polarizers according to the present invention.
Figure 63B:
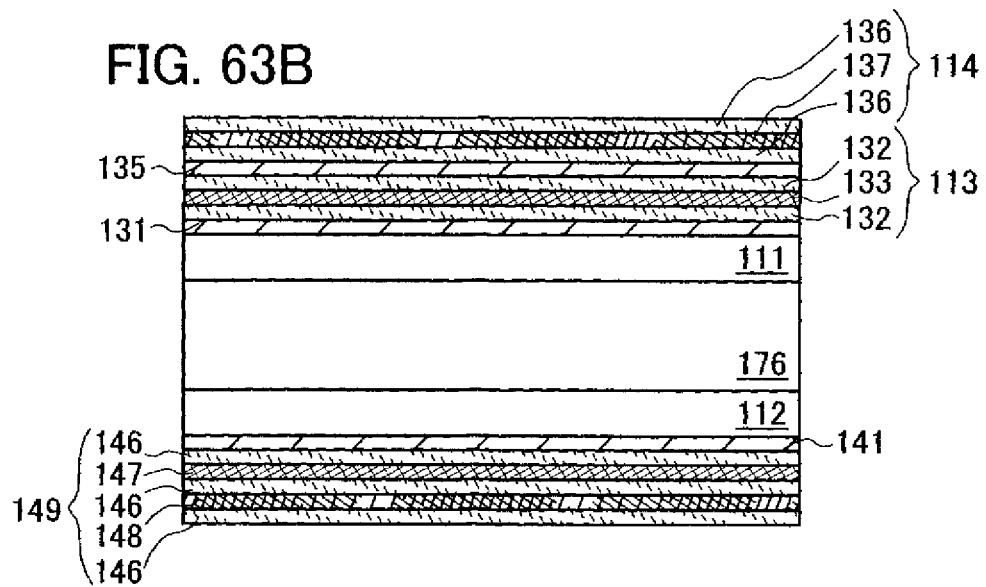
Figure 64:
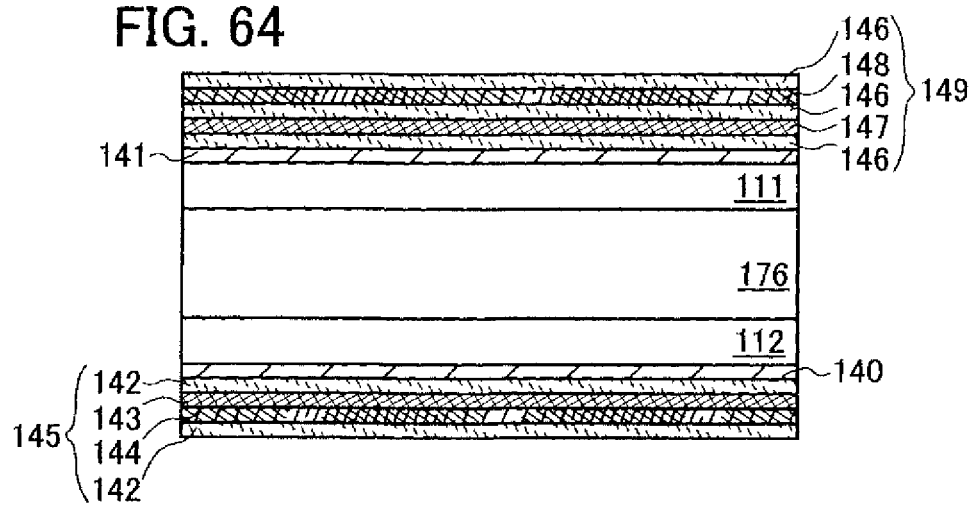
FIG. 64 is a diagram showing a structure of stacked polarizers according to the present invention.

In FIGS. 63A and 63B, and FIG. 64, a layer 176 including a display element is interposed between the substrate 111 and a substrate 112, and stacked polarizers have different structures over and below the layer 176 including the display element. A retardation plate is not shown for simplification; however, a retardation plate may be provided between the substrate and the polarizer if necessary.

In FIGS. 63A and 63B, and FIG. 64, the number of polarizers which are provided between the substrate 111 and the substrate 112 is two; however, needless to say, three or more polarizers may be provided. In the case of three or more polarizers, the structures shown in FIGS. 59A and 59B, 60A to 60C, 61A and 61B, and 62A and 62B may be employed.

In FIG. 63A, on the substrate 111 side, the polarizing plate 113 including the polarizing film 133 and the polarizing plate 114 including the polarizing film 137 shown in FIG. 2A are stacked. On the substrate 112 side, the polarizing plate 145 including the polarizing film 143 and the polarizing film 144 shown in FIG. 2B is provided. The positions of the polarizing plates 113 and 114 and the polarizing plate 145 may be reverse when the positional relation of the top and bottom sides of the display device is considered. In addition, an anti-glare treatment or an anti-reflection treatment may be carried out on the surfaces of the protective films 136 and the protective films 142.

In FIG. 63B, on the substrate 111 side, the polarizing plate 113 including the polarizing film 133 and the polarizing plate 114 including the polarizing film 137 shown in FIG. 2A are stacked. On the substrate 112 side, the polarizing plate 149 including the polarizing film 147 and the polarizing film 148 shown in FIG. 2C is provided. The positions of the polarizing plates 113 and 114 and the polarizing plate 149 may be reverse, when the positional relation of the top and bottom sides of the display device is considered. In addition, an anti-glare treatment or an anti-reflection treatment may be carried out on the surfaces of the protective films 136 and the protective films 146.

In FIG. 64, on the substrate 111 side, the polarizing plate 149 including the polarizing film 147 and the polarizing film 148 shown in FIG. 2C is provided. On the substrate 112 side, the polarizing plate 145 including the polarizing film 143 and the polarizing film 144 is provided. The positions of the polarizing plate 145 and the polarizing plate 149 may be reverse, when the positional relation of the top and bottom sides of the display device is considered. In addition, an anti-glare treatment or an anti-reflection treatment may be carried out on the surfaces of the protective films 146 and the protective films 142.

Needless to say, this embodiment mode can be applied to Embodiment Mode 1, and further, this embodiment mode can be applied to other embodiment modes and examples in this specification.

Embodiment Mode 3

Embodiment Mode 3 will describe a concept of a display device of the present invention with reference to FIGS. 3A and 3B.

FIG. 3A is a cross sectional view of a display device in which a retardation plate and stacked polarizers are provided, and FIG. 3B is a perspective view of the display device.

As shown in FIG. 3A, a display element 200 is interposed between a first substrate 201 and a second substrate 202 which are opposite to each other.

Light-transmitting substrates can be used for the first substrate 201 and the second substrate 202. As such light-transmitting substrates, a similar material to the material of the substrate 101 described in Embodiment Mode 1 may be used.

On the outer side of the first substrate 201, i.e., on the side which is not in contact with the display element 200 from the first substrate 201, a retardation plate 211, and polarizers 203 and 204 which are stacked are provided. Light is linearly polarized by the polarizer(s) and circularly polarized by a retardation plate (also referred to as a retardation film or a wavelength plate). In other words, the stacked polarizers can be referred to as stacked linear polarizers. The stacked polarizers indicate stacked two or more polarizers. Embodiment Mode 2 can be applied to the stacked structure of the polarizers like this.

FIGS. 3A and 3B show examples where two polarizers are stacked; however, three or more polarizers may be stacked.

In addition, the wavelength distributions of extinction coefficients of the first polarizer 203 and the second polarizer 204 are different from each other.

On the outer side of the first substrate 201, the retardation plate 211, the first polarizer 203, and the second polarizer 204 are provided sequentially. In this embodiment mode, a quarter-wave plate may be used as the retardation plate 211.

In this specification, what is obtained by combining the retardation plate and the stacked polarizers in this manner is also referred to as a circularly polarizing plate having stacked polarizers (linear polarizers).

The first polarizer 203 and the second polarizer 204 are arranged in such a way that an absorption axis 221 of the first polarizer 203 and an absorption axis 222 of the second polarizer 204 should be parallel. In other words, the first polarizer 203 and the second polarizer 204, i.e., the stacked polarizers are arranged to be in a parallel Nicols state.

A slow axis 223 of the retardation plate 211 is arranged with angular deviation of 45° from the absorption axis 221 of the first polarizer 203 and the absorption axis 222 of the second polarizer 204.

Figure 4:
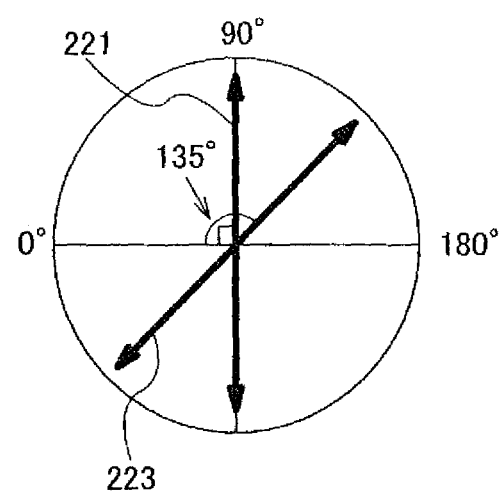
FIG. 4 is a diagram showing angular deviation between polarizers according to the present invention.

FIG. 4 shows angular deviation between the absorption axis 221 and the slow axis 223. The angle formed by the slow axis 223 and the transmission axis is 135°, and the angle formed by the absorption axis 221 and the transmission axis is 90°, and thus, the difference of the slow axis 223 and the absorption axis 221 is 45°.

The retardation plate has a fast axis in an orthogonal direction to the slow axis according to the characteristics of the retardation plate. Thus, the arrangement of the retardation plate and a polarizing plate can be determined with use of not only the slow axis but also the fast axis. In this embodiment mode, the arrangement is done such that the angular deviation between the absorption axis and the slow axis should be 45°, in other words, the arrangement is done such that the angular deviation between the absorption axis and the fast axis should be 135°.

In this specification, it is assumed that the above angular condition is satisfied when angular deviation between an absorption axis and a slow axis is described; however, the angular deviation between the axes may differ from the above-described angles to some extent as long as a similar effect can be obtained.

The retardation plate 211 may be, for example, a film in which liquid crystals are hybrid-oriented, a film in which liquid crystals are twisted-oriented, a uniaxial retardation film, or a biaxial retardation film. Such retardation plates can widen the viewing angle in the display device.

A uniaxial retardation film is formed by stretching a resin in one direction. Further, a biaxial retardation film is formed by stretching a resin into an axis in a crosswise direction, and then gently stretching the resin into an axis in a lengthwise direction. As the resin used here, cyclo-olefin polymer (COP), polycarbonate (PC), polymethylmethacrylate (PMMA), polystyrene (PS), polyethersulfone (PES), polyphenylene sulfide (PPS), polyethylene terephthalate (PET), polyethylene naphthalate (PEN), polypropylene (PP), polyphenylene oxide (PPO), polyarylate (PAR), polyimide (PI), polytetrafluoroethylene (PTFE), or the like is given.

The film in which liquid crystals are hybrid-oriented may be a film obtained by using a triacetyl cellulose (TAC) film as a base and hybrid-aligning discotic liquid crystals or nematic liquid crystals. The retardation plate can be attached to the substrate after being attached to a polarizing plate.

By stacking polarizing plates to be in parallel Nicols, reflected light of external light can be reduced compared to a case of a singular polarizing plate. Thus, black luminance can be decreased, and thus, the contrast ratio of the display device can be increased.

Moreover, in this embodiment mode, since a quarter-wave plate is used as the retardation plate, reflection can be suppressed.

In addition, this embodiment mode can be freely combined with other embodiment modes and other examples in this specification, if necessary.

Embodiment Mode 4

Embodiment Mode 4 will describe a concept of a display device of the present invention.

Figure 5A:
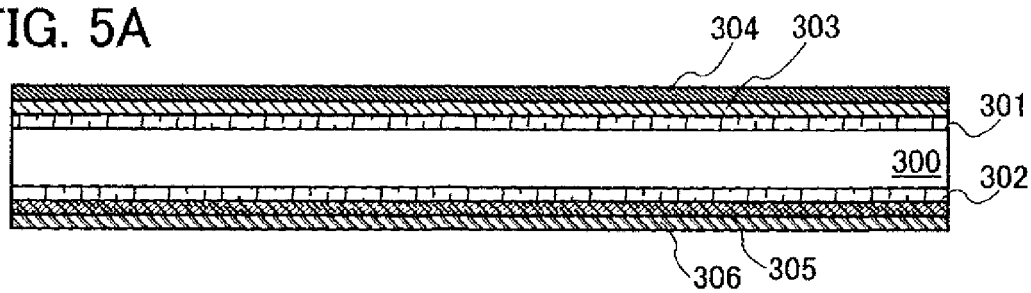
FIGS. 5A and 5B are diagrams showing a display device according to the present invention.
Figure 5B:
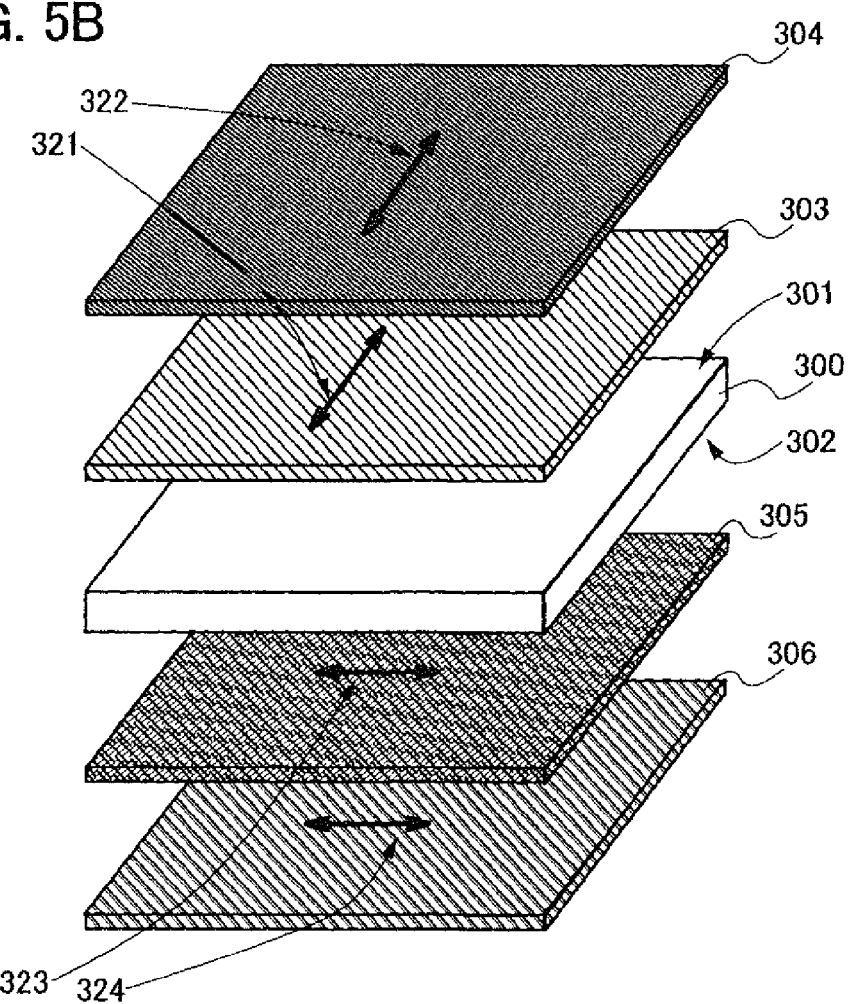

FIG. 5A is a cross sectional view of a display device provided with a polarizer having a stacked structure, and FIG. 5B is a perspective view of the display device. This embodiment mode describes a liquid crystal display device using a liquid crystal element as a display element as one example.

As shown in FIG. 5A, a layer 300 including a liquid crystal element is interposed between a first substrate 301 and a second substrate 302 which are opposite to each other. For the substrates 301 and 302, an insulating substrate having a light-transmitting property (also, referred to as a light-transmitting substrate) is used. For example, a glass substrate such as barium borosilicate glass or alumino borosilicate glass, a quartz substrate, or the like can be used. A substrate made from a synthetic resin such as acrylic or plastic typified by polyethylene-terephthalate (PET), polyethylene naphthalate (PEN), polyethersulfone (PES), or polycarbonate (PC) can be used for the light-transmitting substrates.

Polarizers are stacked on the outer sides than the substrates 301 and 302, in other words, on the sides which are not in contact with the layer 300 including the display element from the substrate 301 and 302. In this embodiment mode, as the structure of the stacked polarizers, polarizing plates each including one polarizing film shown in FIG. 2A are stacked. Needless to say, the structures shown in FIGS. 2B and 2C may also be used.

On the first substrate 301 side, a first polarizing plate 303 and a second polarizing plate 304 are provided, and on the second substrate 302 side, a third polarizing plate 305 and a fourth polarizing plate 306 are provided.

These polarizing plates 303 to 306 can be formed using known materials, and can have a structure in which an adhesive face, TAC (triacetyl cellulose), a mixed layer of PVA (polyvinyl alcohol) and a dichroic pigment, and TAC are sequentially stacked from the substrate side. The dichroic pigment includes iodine and dichroic organic dye.

Further, the wavelength distributions of extinction coefficients of the first polarizing plate 303 and the second polarizing plate 304 are different, and the wavelength distributions of extinction coefficients of the third polarizing plate 305 and the fourth polarizing plate 306 are different.

FIGS. 5A and 5B show an example in which two polarizing plates are stacked for one substrate; however, three or more polarizing plates may be stacked.

As shown in FIG. 5B, the first polarizing plate 303 and the second polarizing plate 304 are stacked in such a way that an absorption axis 321 of the first polarizing plate 303 and an absorption axis 322 of the second polarizing plate 304 should be parallel. This parallel state is referred to as parallel Nicols. Similarly, the third polarizing plate 305 and the fourth polarizing plate 306 are arranged in such a way that an absorption axis 323 of the third polarizing plate 305 and an absorption axis 324 of the fourth polarizing plate 306 should be parallel, in other words, to be in parallel Nicols. The stacked polarizing plates 303, 304 and the stacked polarizing plates 305, 306 are arranged such that their absorption axes should be orthogonal to each other. The orthogonal state is called crossed Nicols.

A transmission axis exists in a direction orthogonal to the absorption axis according to the characteristics of the polarizing plate. Thus, the case where transmission axes are parallel to each other can also be referred to as parallel Nicols. In addition, the case where transmission axes are orthogonal to each other can also be referred to as crossed Nicols.

The polarizing plates are stacked to be in a parallel Nicols state, thereby reducing light leakage in the direction of the absorption axis. Further, by arranging the stacked polarizing plates in a crossed Nicols state, light leakage can be reduced compared to the case where a pair of single polarizing plates is arranged in crossed Nicols. Therefore, the contrast ratio of the display device can be increased.

In addition, this embodiment mode can be freely combined with other embodiment modes and other examples in this specification, if necessary.

Embodiment Mode 5

Embodiment Mode 5 will describe a specific structure of a liquid crystal display device described in Embodiment Mode 4.

Figure 6:
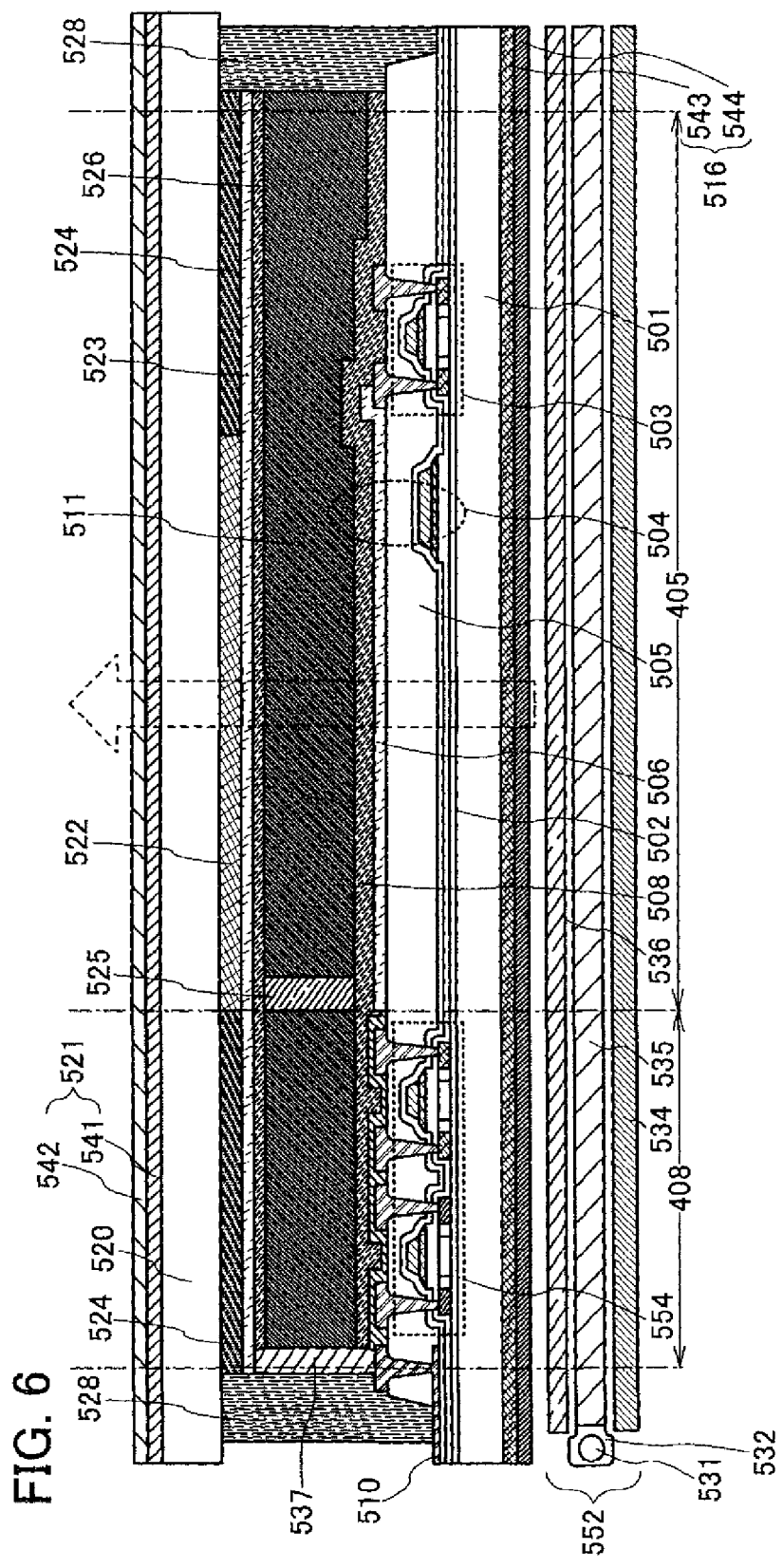
FIG. 6 is a cross sectional view of a display device according to the present invention.

FIG. 6 shows a cross sectional view of a liquid crystal display device provided with a polarizing plate having a stacked structure.

The liquid crystal display device shown in FIG. 6 includes a pixel portion 405 and a driver circuit portion 408. In the pixel portion 405 and the driver circuit portion 408, a base film 502 is provided over a substrate 501. An insulating substrate similar to Embodiment Mode 1 to Embodiment Mode 4 can be used for the substrate 501. It is concerned that a substrate formed from a synthetic resin generally has a lower allowable temperature limit than other substrates; however, it can be employed by displacing after a manufacturing process using a higher heat-resistant substrate.

The pixel portion 405 is provided with a transistor as a switching element through the base film 502. In this embodiment mode, a thin film transistor (TFT) is used as the transistor, which is referred to as a switching TFT 503.

A TFT can be formed by many methods. For example, a crystalline semiconductor film is used as an active layer. A gate electrode is provided over the crystalline semiconductor film with a gate insulating film interposed therebetween. An impurity element can be added to the active layer by using the gate electrode. Since an impurity element is added using the gate electrode in this manner, a mask for adding the impurity element is not required to be formed. The gate electrode may have a single layer structure or a stacked structure. An impurity region can be formed as a high concentration impurity region and a low concentration impurity region by controlling the concentration thereof. A structure of such a TFT having a low concentration impurity region is referred to as an LDD (Lightly Doped Drain) structure. Further, the low concentration impurity region can be formed so as to overlap with the gate electrode. A structure of such a TFT is referred to as a GOLD (Gate Overlapped LDD) structure.

The TFT may be a top gate type TFT or a bottom gate type TFT, and may be formed if necessary.

FIG. 6 shows the switching TFT 503 having a GOLD structure. The polarity of the switching TFT 503 is an n-type by using phosphorus (P) or the like for an impurity region thereof. In the case of forming a p-type TFT, boron (B) or the like may be added. After that, a protective film which covers the gate electrode and the like is formed. A dangling bond in the crystalline semiconductor film can be terminated by hydrogen elements mixed in the protective film.

Further, in order to improve planarity, an interlayer insulating film 505 may be formed. The interlayer insulating film 505 may be formed from an organic material or an inorganic material, or formed using a stacked structure of these. Openings are formed in the interlayer insulating film 505, the protective film, and the gate insulating film; thereby wiring connected to the impurity regions is formed. In this manner, the switching TFT 503 can be formed. The present invention is not limited to the structure of the switching TFT 503.

Then, a pixel electrode 506 connected to the wiring is formed.

Further, a capacitor 504 can be formed at the same time as the switching TFT 503. In this embodiment mode, the capacitor 504 is formed of a stack of a conductive film formed at the same time as the gate electrode, the protective film, the interlayer insulating film 505, and the pixel electrode 506.

In addition, the pixel portion 405 and the driver circuit portion 408 can be formed over the same substrate by using a crystalline semiconductor film. In that case, transistors in the pixel portion and transistors of the driver circuit portion 408 are formed at the same time. The transistors used for the driver circuit portion 408 form a CMOS circuit; the transistors are referred to as a CMOS circuit 554. Each of the transistors which form the CMOS circuit 554 may have a similar structure to the switching TFT 503. Further, the LDD structure can be used instead of the GOLD structure, and a similar structure is not necessarily required.

An alignment film 508 is formed so as to cover the pixel electrode 506. The alignment film 508 is subjected to rubbing treatment. This rubbing treatment is not performed in some cases in a mode of a liquid crystal, for example, in a case of a VA mode.

Next, a counter substrate 520 is provided. A color filter 522 and a black matrix (BM) 524 can be provided on an inner side of the counter substrate 520, that is, on the side which is in contact with a liquid crystal. These can be formed by known methods; however, a droplet discharging method (representatively an ink-jetting method) by which a predetermined material is dropped can eliminate the waste of the material. Further, the color filter and the like are provided in a region where the switching TFT 503 is not provided. That is to say, the color filter is provided to be opposite to a light-transmitting region, i.e., an opening region. The color filter and the like may be formed from materials which exhibit red (R), green (G), and blue (B) in the case where a liquid crystal display device performs full-color display, and a material which exhibits at least one color in the case of mono-color display.

The color filter is not provided in some cases when diodes (LEDs) of RGB and the like are arranged in a backlight and a successive additive color mixing method (field sequential method) in which color display is performed by time division.

The black matrix 524 is provided to reduce reflection of external light due to the wiring of the switching TFT 503 and the CMOS circuit 554. Therefore, the black matrix 524 is provided so as to overlap with the switching TFT 503 and the CMOS circuit 554. The black matrix 524 may be provided so as to overlap with the capacitor 504. Accordingly, reflection by a metal film included in the capacitor 504 can be prevented.

Then, a counter electrode 523 and an alignment film 526 are provided. The alignment film 526 is subjected to rubbing treatment. This rubbing treatment is not performed in some cases in a mode of a liquid crystal, for example, in a case of a VA mode.

The wiring included in the TFT, the gate electrode, the pixel electrode 506, and the counter electrode 523 can be selected from indium tin oxide (ITO), indium zinc oxide (IZO) in which zinc oxide (ZnO) is mixed in indium oxide, a conductive material in which silicon oxide ($SiO_2$) is mixed in indium oxide, organic indium, organotin, a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), or copper (Cu), an alloy thereof, or metal nitride thereof.

Such a counter substrate 520 is attached to the substrate 501 using a sealing material 528. The sealing material 528 can be drawn over the substrate 501 or the counter substrate 520 by using a dispenser or the like. Further, a spacer 525 is provided in a part of the pixel portion 405 and the driver circuit portion 408 in order to keep a space between the substrate 501 and the counter substrate 520. The spacer 525 has a columnar shape, a spherical shape, or the like.

A liquid crystal 511 is injected between the substrate 501 and the counter substrate 520 attached to each other in this manner. It is preferable to inject the liquid crystal in vacuum. The liquid crystal 511 can be formed by a method other than an injecting method. For example, the liquid crystal 511 may be dropped and then the counter substrate 520 may be attached to the substrate 501. Such a dropping method is preferably employed when using a large substrate to which the injecting method cannot be applied easily.

The liquid crystal 511 includes a liquid crystal molecule of which tilt is controlled by the pixel electrode 506 and the counter electrode 523. Specifically, the tilt of the liquid crystal molecule is controlled by a voltage applied to the pixel electrode 506 and the counter electrode 523. Such a control is performed using a control circuit provided in the driver circuit portion 408. The control circuit is not necessarily formed over the substrate 501, and a circuit connected through a connecting terminal 510 may be used. In this case, an anisotropic conductive film containing conductive microparticles can be used so as to be connected to the connecting terminal 510. Further, the counter electrode 523 is electrically connected to a part of the connecting terminal 510, whereby a potential of the counter electrode 523 can be a common potential. For example, a bump 537 can be used for the conduction.

Next, a structure of a backlight unit 552 is described. The backlight unit 552 includes a cold cathode tube, a hot cathode tube, a diode, an inorganic EL, or an organic EL as a light source 531 which emits light, a lamp reflector 532 to effectively lead light to a light guide plate 535, the light guide plate 535 by which light is totally reflected and led to the entire surface, a diffusing plate 536 for reducing variation in brightness, and a reflective plate 534 for reusing light leaking under the light guide plate 535.

A control circuit for controlling the luminance of the light source 531 is connected to the backlight unit 552. The luminance of the light source 531 can be controlled by a signal supplied from the control circuit.

In addition, a structure in which polarizing plates are stacked as shown in FIG. 2A is used as a polarizer in this embodiment mode. Naturally, the stacked polarizers shown in FIG. 2B and FIG. 2C may also be used. As shown in FIG. 6, a polarizing plate having a stacked structure 516 is provided between the substrate 501 and the backlight unit 552, and a polarizing plate 521 having a stacked structure is provided over the counter substrate 520 as well.

That is, the substrate 501 is provided with a polarizing plate 543 and a polarizing plate 544 which are sequentially stacked from the substrate side as the polarizing plate having a stacked structure 516. At this time, the polarizing plate 543 and the polarizing plate 544 which are stacked are attached to each other so as to be in a parallel Nicols state.

In addition, the counter substrate 520 is provided with a polarizing plate 541 and a polarizing plate 542 which are sequentially stacked from the substrate side as the polarizing plate having a stacked structure 521. At this time, the polarizing plate 541 and the polarizing plate 542 which are stacked are attached to each other so as to be in a parallel Nicols state.

Further, the polarizing plate 516 having a stacked structure and the polarizing plate having a stacked structure 521 are arranged to be in a crossed Nicols state.

The wavelength distributions of extinction coefficients of the polarizing plate 541 and the polarizing plate 542 are different from each other. The wavelength distributions of extinction coefficients of the polarizing plate 543 and the polarizing plate 544 are different from each other.

FIG. 6 shows an example in which two polarizing plates are stacked for one substrate; however, three or more polarizing plates may be stacked.

The contrast ratio can be increased by arranging the stacked polarizing plates in such a liquid crystal display device. By using the polarizing plates which have different wavelength distributions of extinction coefficients, light in a wider wavelength range can be absorbed and the contrast ratio can be made higher, which is preferable.

In addition, this embodiment mode can be freely combined with other embodiment modes and other examples in this specification, if necessary.

Embodiment Mode 6

Embodiment Mode 6 will describe a liquid crystal display device which has a polarizer having a stacked structure, but which uses a TFT having an amorphous semiconductor film, which is different from Embodiment Mode 5.

Like ones to those in Embodiment Mode 5 are denoted by the same reference numerals, and Embodiment Mode 5 can be applied to an element which is not particularly described.

Figure 7:
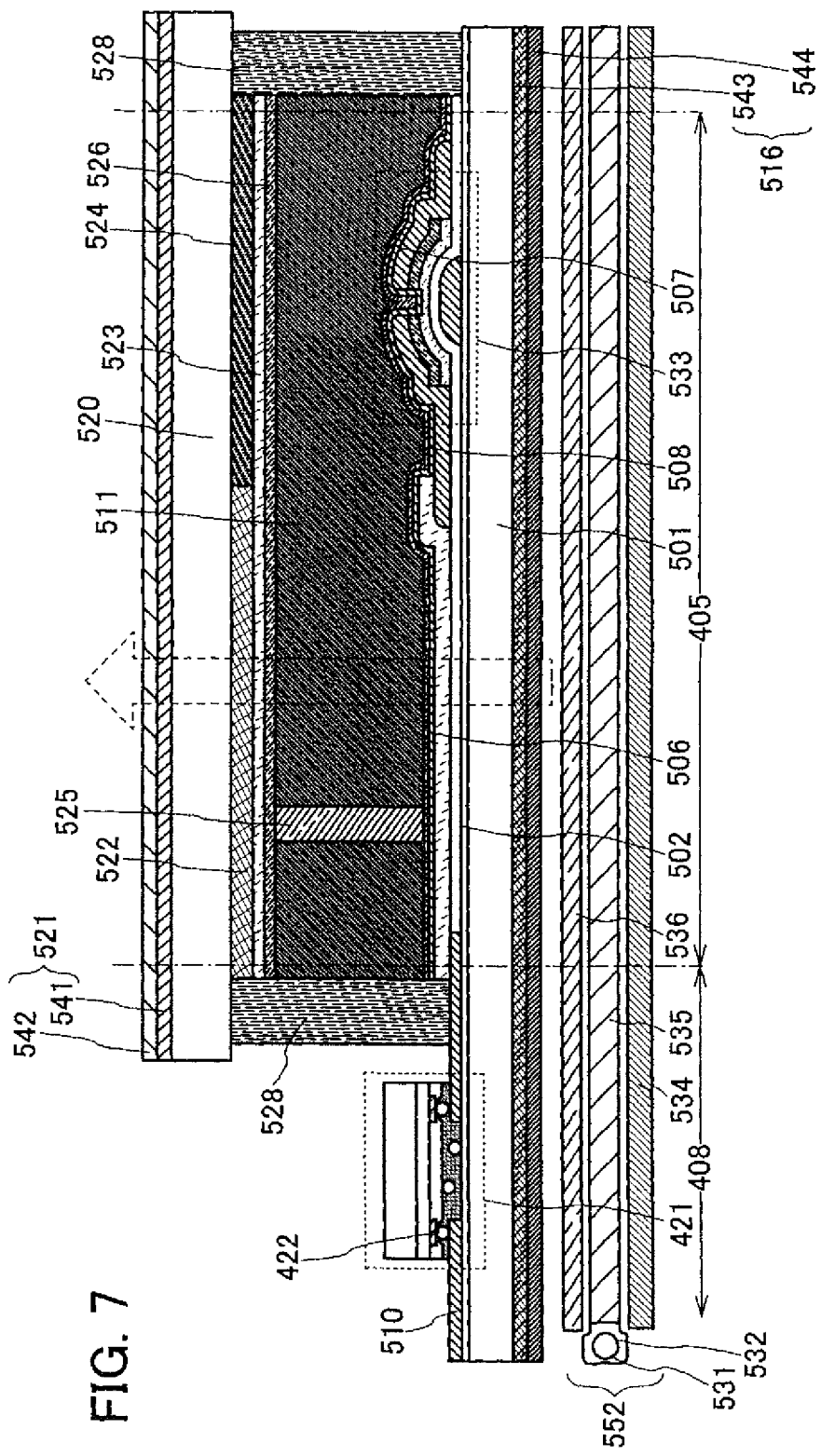
FIG. 7 is a cross sectional view of a display device according to the present invention.

In FIG. 7, a structure of a liquid crystal display device including a transistor using an amorphous semiconductor film (hereinafter referred to as an amorphous TFT) as a switching element is described. The pixel portion 405 is provided with a switching TFT 533 including an amorphous TFT. The amorphous TFT can be formed by a known method. In the case of a channel etch type, for example, a gate electrode is formed over the base film 502, and a gate insulating film which covers the gate electrode, an n-type semiconductor film, an amorphous semiconductor film, a source electrode and a drain electrode are formed. By using the source electrode and the drain electrode, an opening is formed in the n-type semiconductor film. At this time, a part of the amorphous semiconductor film is removed, which is called a channel etch type. Then, a protective film 507 is formed and the amorphous TFT is obtained. In addition, the amorphous TFT also includes a channel protective type, and when an opening is formed in the n-type semiconductor film by using the source electrode and the drain electrode, a protective film is provided such that the amorphous semiconductor film is not removed. Other structures can be similar to the channel etch type.

The alignment film 508 is formed similarly to FIG. 6, and the alignment film 508 is subjected to rubbing treatment. This rubbing treatment is not performed in some cases in a mode of a liquid crystal, for example, in a case of a VA mode.

The counter substrate 520 is prepared and attached to the substrate 501 by using the sealing material 528 similarly to FIG. 6. By filling a space between the counter substrate 520 and the substrate 501 with the liquid crystal 511 and sealing, a liquid crystal display device can be formed.

Similarly to FIG. 6, a structure in which polarizing plates are stacked as shown in FIG. 2A is used as a polarizer in this embodiment mode. Naturally, the stacked polarizers shown in FIG. 2B and FIG. 2C may also be used. As shown in FIG. 6, the polarizing plate having a stacked structure 516 is provided between the substrate 501 and the backlight unit 552, and the polarizing plate 521 having a stacked structure is provided over the counter substrate 520 as well.

That is, the substrate 501 is provided with the polarizing plate 543 and the polarizing plate 544 which are sequentially stacked from the substrate side as the polarizing plate 516 having a stacked structure. At this time, the polarizing plate 543 and the polarizing plate 544 which are stacked are attached to each other so as to be in a parallel Nicols state.

In addition, the counter substrate 520 is provided with the polarizing plate 541 and the polarizing plate 542 which are sequentially stacked from the substrate side as the polarizing plate having a stacked structure 521. At this time, the polarizing plate 541 and the polarizing plate 542 which are stacked are attached to each other so as to be in a parallel Nicols state.

Further, the polarizing plate having a stacked structure 516 and the polarizing plate having a stacked structure 521 are arranged to be in a crossed Nicols state.

The wavelength distributions of extinction coefficients of the polarizing plate 541 and the polarizing plate 542 are different from each other. The wavelength distributions of extinction coefficients of the polarizing plate 543 and the polarizing plate 544 are different from each other.

FIG. 7 shows an example in which two polarizing plates are stacked for one substrate; however, three or more polarizing plates may be stacked.

In the case of forming a liquid crystal display device by using an amorphous TFT as the switching TFT 533 in this manner, an IC 421 formed using a silicon wafer can be mounted as a driver on the driver circuit portion 408 in consideration of operating performance. For example, a signal to control the switching TFT 533 can be supplied by connecting a wiring of the IC 421 and a wiring connected to the switching TFT 533 by using an anisotropic conductor having a conductive microparticle 422. A mounting method of the IC 421 is not limited to this, and the IC 421 may be mounted by a wire bonding method.

Further, the IC can be connected to a control circuit with the connecting terminal 510 interposed therebetween. At this time, an anisotropic conductive film having the conductive microparticle 422 can be used to connect the IC to the connecting terminal 510.

Since the other structures are similar to FIG. 6, description thereof is omitted here.

The contrast ratio can be increased by arranging the stacked polarizing plates in such a liquid crystal display device. In the present invention, it is possible to absorb light in a wider wavelength range by using stacked polarizing plates having different wavelength distributions of extinction coefficients, and therefore, the contrast ratio of the liquid crystal display can be made higher, which is preferable.

In addition, this embodiment mode can be freely combined with other embodiment modes and other examples in this specification, if necessary.

Embodiment Mode 7

Embodiment Mode 7 will describe a concept of a display device of the present invention.

Figure 8A:
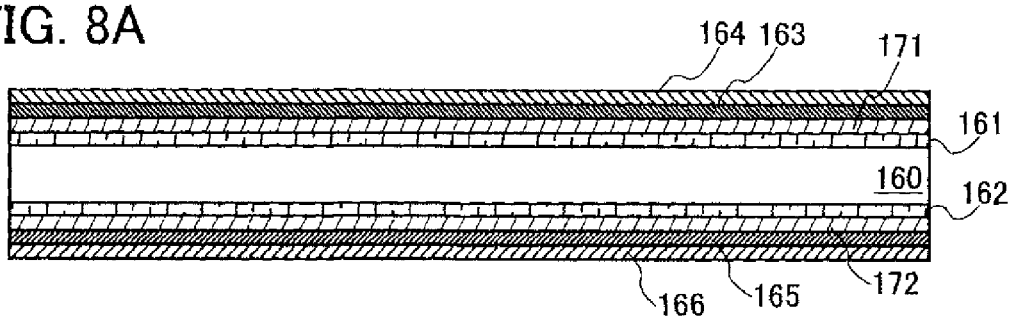
FIGS. 8A and 8B are diagrams showing a display device according to the present invention.
Figure 8B:
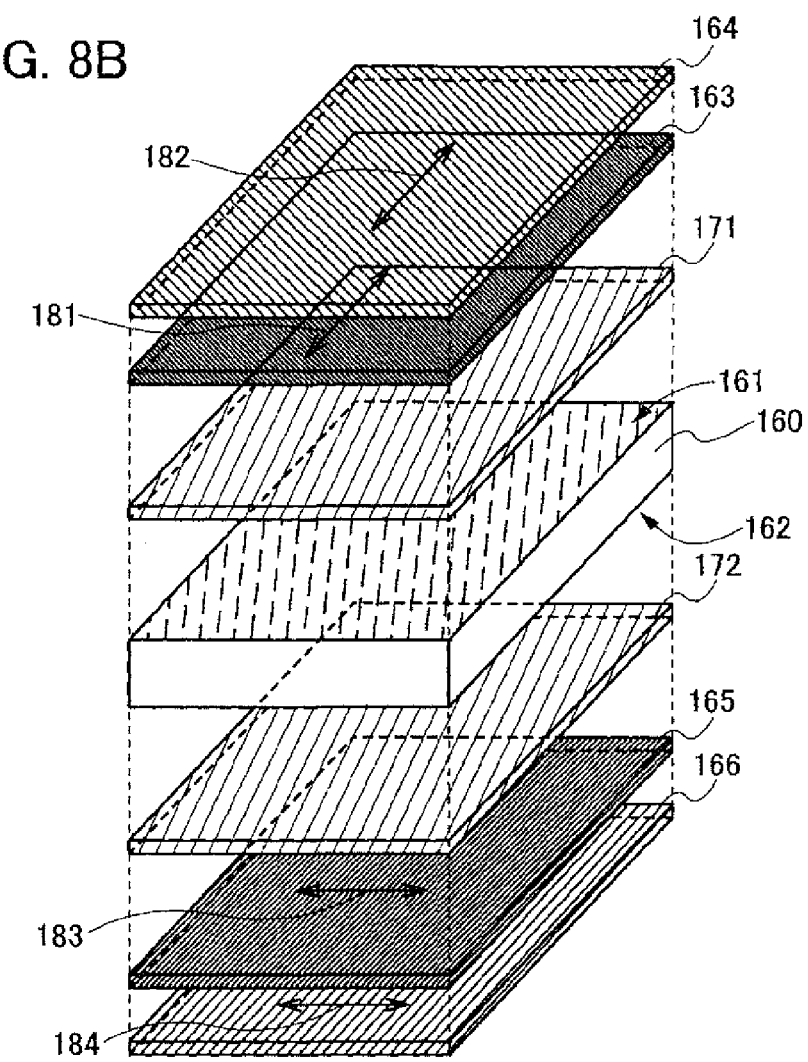

FIG. 8A shows a cross sectional view of a display device provided with a polarizer having a stacked structure, and FIG. 8B shows a perspective view of the display device. In this embodiment mode, a liquid crystal display device including a liquid crystal element as a display element is described as an example.

As shown in FIG. 8A, a layer 160 including a liquid crystal element is interposed between a first substrate 161 and a second substrate 162 which are arranged to be opposite to each other. Light-transmitting substrates are used for the substrate 161 and the substrate 162. As such light-transmitting substrate, a glass substrate such as barium borosilicate glass or alumino-borosilicate glass, a quartz substrate, or the like can be used. Alternatively, a substrate formed from a synthetic resin having flexibility, such as a plastic, typified by polyethylene-terephthalate (PET), polyethylene naphthalate (PEN), polyethersulfone (PES), or polycarbonate (PC), or acrylic, can be used for a light-transmitting substrate.

On the outer sides of the substrate 161 and the substrate 162, namely sides which are not in contact with the layer 160 including the liquid crystal element from the substrate 161 and the substrate 162, respectively, stacked polarizers are provided. In this embodiment mode, as the structure of the stacked polarizers, polarizing plates each including one polarizing film shown in FIG. 2A are stacked. Needless to say, the structures shown in FIGS. 2B and 2C may also be used.

On the outer sides of the substrate 161 and the substrate 162, that is, on the sides which are not in contact with the layer 160 including the liquid crystal element from the substrate 161 and the substrate 162, respectively, a retardation plate (also referred to as a retardation film or a wave plate) and stacked polarizing plates are sequentially provided. On the first substrate 161 side, a first retardation plate 171, a first polarizing plate 163, and a second polarizing plate 164 are sequentially provided. On the second substrate 162 side, a second retardation plate 172, a third polarizing plate 165, and a fourth polarizing plate 166 are sequentially provided. The retardation plate is used for a wider viewing angle or an antireflective effect, and when the retardation plates are used for antireflection, quarter-wave plates are used as the retardation plate 171 and the retardation plate 172.

These polarizing plates 163 to 166 can be formed from a known material. For example, a structure can be used, in which an adhesive surface, TAC (triacetyl cellulose), a mixed layer of PVA (polyvinyl alcohol) and a dichroic pigment, and TAC are sequentially stacked from the substrate side. Iodine and dichromatic organic dye can be cited as dichroic pigments.

The wavelength distributions of extinction coefficients of the first polarizing plate 163 and the second polarizing plate 164 are different from each other. The wavelength distributions of extinction coefficients of the third polarizing plate 165 and the fourth polarizing plate 166 are different from each other.

FIGS. 8A and 8B show an example in which two polarizing plates are stacked for one substrate; however, three or more polarizing plates may be stacked.

The retardation film may be, for example, a film in which liquid crystals are hybrid-oriented, a film in which liquid crystals are twisted-oriented, a uniaxial retardation film, or a biaxial retardation film. Such retardation films can widen the viewing angle of the display device.

A uniaxial retardation film is formed by stretching a resin in one direction. Further, a biaxial retardation film is formed by stretching a resin into an axis in a crosswise direction, then gently stretching the resin into an axis in a lengthwise direction. Examples of a resin that can be used here are a cyclo olefin polymer (COP), polycarbonate (PC), polymethylmethacrylate (PMMA), polystyrene (PS), polyethersulfone (PES), polyphenylene sulfide (PPS), polyethylene terephthalate (PET), polyethylene naphthalate (PEN), polypropylene (PP), polyphenylene oxide (PPO), polyarylate (PAR), polyimide (PI), and polytetrafluoroethylene (PTFE).

The film in which a liquid crystal is hybrid aligned is formed by using a triacetyl cellulose (TAC) film as a base and hybrid-aligned discotic liquid crystals or nematic liquid crystals. A retardation film can be attached to a light-transmitting substrate after being attached to a polarizing plate.

Next, as can be seen in the perspective view shown in FIG. 8B, the first polarizing plate 163 and the second polarizing plate 164 are arranged in such a way that an absorption axis 181 of the first polarizing plate 163 and an absorption axis 182 of the second polarizing plate 164 should be parallel. This parallel state is referred to as parallel Nicols. Similarly, the third polarizing plate 165 and the fourth polarizing plate 166 are arranged in such a way that an absorption axis 183 of the third polarizing plate 165 and an absorption axis 184 of the fourth polarizing plate 166 should be parallel, that is, they are in a parallel Nicols state.

The stacked polarizing plates in this manner are arranged such that they are in a parallel Nicols state.

The stacked polarizing plates, which are opposite to each other via the layer 160 including a liquid crystal element, are arranged such that their absorption axes be orthogonal to each other. The orthogonal state is called crossed Nicols.

A transmission axis exists in a direction orthogonal to the absorption axis based on the characteristics of the polarizing plate. Thus, a state in which the transmission axes are parallel to each other can also be referred to as parallel Nicols. In addition, the case where transmission axes are orthogonal to each other can also be referred to as crossed Nicols.

Since the stacked polarizing plates are stacked to be in a parallel Nicols state, light leakage in the absorption axis direction can be reduced. Further, by disposing opposite polarizing plates in a crossed Nicols state, light leakage can be reduced, compared to the case where a pair of single polarizing plates is arranged in crossed Nicols. Consequently, the contrast ratio of the display device can be increased.

Furthermore, in the present invention, since a retardation plate is used, a display device having an antireflective effect or a display device with a wide viewing angle can be provided.

In addition, this embodiment mode can be freely combined with other embodiment modes and other examples in this specification, if necessary.

Embodiment Mode 8

Embodiment Mode 8 will describe a specific structure of a liquid crystal display device described in Embodiment Mode 7.

Figure 9:
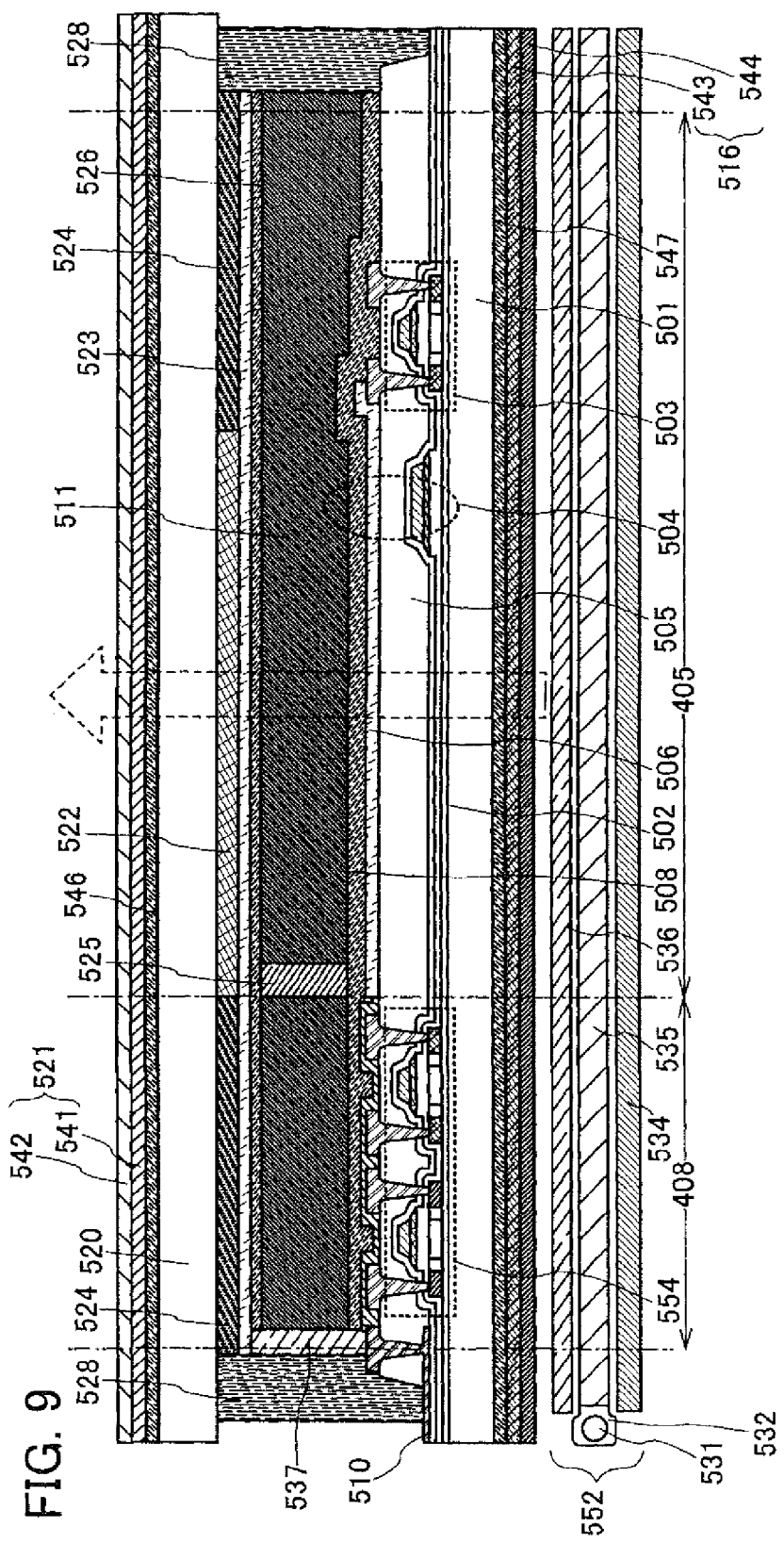
FIG. 9 is a cross sectional view of a display device according to the present invention.

Elements in a liquid crystal display device shown in FIG. 9 similar to those in FIG. 6 are denoted by the same reference numerals, and description of FIG. 6 can be applied to an element which is not particularly described.

FIG. 9 is a cross sectional view of a liquid crystal display device provided with stacked polarizing plates.

A liquid crystal display device includes the pixel portion 405 and the driver circuit portion 408. In the pixel portion 405 and the driver circuit portion 408, the base film 502 is provided over the substrate 501. An insulating substrate similar to the one in Embodiment Mode 7 can be used for the substrate 501. Further, generally there is a concern that a substrate formed from a synthetic resin has a low allowable temperature limit compared to other substrates. However, it is possible to employ a substrate formed from a synthetic resin by transposing a substrate after a manufacturing process using a substrate with high heat resistance.

The pixel portion 405 is provided with a transistor as a switching element through the base film 502. In this embodiment mode, a thin film transistor (TFT) is used as the transistor, which is referred to as the switching TFT 503. A TFT can be formed by many methods. For example, a crystalline semiconductor film is used as an active layer. A gate electrode is provided over the crystalline semiconductor film with a gate insulating film interposed therebetween. An impurity element can be added to the active layer by using the gate electrode. Since an impurity element is added using the gate electrode in this manner, a mask for adding the impurity element is not required to be formed. The gate electrode may have a single layer structure or a stacked structure. An impurity region can be formed as a high concentration impurity region and a low concentration impurity region by controlling the concentration thereof. A structure of such a TFT having a low concentration impurity region is referred to as an LDD (Lightly Doped Drain) structure. Further, the low concentration impurity region can be formed so as to overlap with the gate electrode. A structure of such a TFT is referred to as a GOLD (Gate Overlapped LDD) structure.

The TFT may be a top gate type TFT or a bottom gate type TFT, and may be formed if necessary.

FIG. 9 shows the switching TFT 503 having a GOLD structure. The polarity of the switching TFT 503 is an n-type by using phosphorus (P) or the like for an impurity region thereof. In the case of forming a p-type TFT, boron (B) or the like may be added. After that, a protective film which covers the gate electrode and the like is formed. A dangling bond in the crystalline semiconductor film can be terminated by hydrogen elements mixed in the protective film.

Further, in order to improve planarity, the interlayer insulating film 505 may be formed. The interlayer insulating film 505 may be formed from an organic material or an inorganic material, or formed using a stacked structure of these. Openings are formed in the interlayer insulating film 505, the protective film, and the gate insulating film; thereby wiring connected to the impurity regions is formed. In this manner, the switching TFT 503 can be formed. The present invention is not limited to the structure of the switching TFT 503.

Then, the pixel electrode 506 connected to the wiring is formed.

Further, the capacitor 504 can be formed at the same time as the switching TFT 503. In this embodiment mode, the capacitor 504 is formed of a stack of a conductive film formed at the same time as the gate electrode, the protective film, the interlayer insulating film 505, and the pixel electrode 506.

In addition, the pixel portion 405 and the driver circuit portion 408 can be formed over the same substrate by using a crystalline semiconductor film. In that case, transistors in the pixel portion 405 and transistors of the driver circuit portion 408 are formed at the same time. The transistors used for the driver circuit portion 408 form a CMOS circuit; the transistors are referred to as the CMOS circuit 554. Each of the transistors which form the CMOS circuit 554 may have a similar structure to the switching TFT 503. Further, the LDD structure can be used instead of the GOLD structure, and a similar structure is not necessarily required.

The alignment film 508 is formed so as to cover the pixel electrode 506. The alignment film 508 is subjected to rubbing treatment. This rubbing treatment is not performed in some cases in a mode of a liquid crystal, for example, in a case of a VA mode.

Next, the counter substrate 520 is provided. The color filter 522 and the black matrix (BM) 524 can be provided on an inner side of the counter substrate 520, that is, on the side which is in contact with a liquid crystal. These can be formed by known methods; however, a droplet discharging method (representatively an ink-jetting method) by which a predetermined material is dropped can eliminate the waste of the material. Further, the color filter and the like are provided in a region where the switching TFT 503 is not provided. That is to say, the color filter is provided to be opposite to a light-transmitting region, i.e., an opening region. The color filter and the like may be formed from materials which exhibit red (R), green (G), and blue (B) in the case where a liquid crystal display device performs full-color display, and a material which exhibits at least one color in the case of mono-color display.

The color filter is not provided in some cases when diodes (LEDs) of RGB and the like are arranged in a backlight and a successive additive color mixing method (field sequential method) in which color display is performed by time division. The black matrix 524 is provided to reduce reflection of external light due to the wiring of the switching TFT 503 and the CMOS circuit 554. Therefore, the black matrix 524 is provided so as to overlap with the switching TFT 503 and the CMOS circuit 554. The black matrix 524 may be provided so as to overlap with the capacitor 504. Accordingly, reflection by a metal film included in the capacitor 504 can be prevented.

Then, the counter electrode 523 and the alignment film 526 are provided. The alignment film 526 is subjected to rubbing treatment. This rubbing treatment is not performed in some cases in a mode of a liquid crystal, for example, in a case of a VA mode.

The wiring included in the TFT, the gate electrode, the pixel electrode 506, and the counter electrode 523 can be selected from indium tin oxide (ITO), indium zinc oxide (IZO) in which zinc oxide (ZnO) is mixed in indium oxide, a conductive material in which silicon oxide ($SiO_2$) is mixed in indium oxide, organic indium, organotin, a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), or copper (Cu), an alloy thereof, or metal nitride thereof.

Such a counter substrate 520 is attached to the substrate 501 using the sealing material 528. The sealing material 528 can be drawn over the substrate 501 or the counter substrate 520 by using a dispenser or the like. Further, the spacer 525 is provided in a part of the pixel portion 405 and the driver circuit portion 408 in order to keep a space between the substrate 501 and the counter substrate 520. The spacer 525 has a columnar shape, a spherical shape, or the like.

The liquid crystal 511 is injected between the substrate 501 and the counter substrate 520 attached to each other in this manner. It is preferable to inject the liquid crystal in vacuum. The liquid crystal 511 can be formed by a method other than an injecting method. For example, the liquid crystal 511 may be dropped and then the counter substrate 520 may be attached to the substrate 501. Such a dropping method is preferably employed when using a large substrate to which the injecting method cannot be applied easily.

The liquid crystal 511 includes a liquid crystal molecule of which tilt is controlled by the pixel electrode 506 and the counter electrode 523. Specifically, the tilt of the liquid crystal molecule is controlled by a voltage applied to the pixel electrode 506 and the counter electrode 523. Such a control is performed using a control circuit provided in the driver circuit portion 408. The control circuit is not necessarily formed over the substrate 501, and a circuit connected through the connecting terminal 510 may be used. In this case, an anisotropic conductive film containing conductive microparticles can be used so as to be connected to the connecting terminal 510. Further, the counter electrode 523 is electrically connected to a part of the connecting terminal 510, whereby a potential of the counter electrode 523 can be a common potential. For example, the bump 537 can be used for the conduction.

Next, a structure of the backlight unit 552 is described. The backlight unit 552 includes a cold cathode tube, a hot cathode tube, a diode, an inorganic EL, or an organic EL as the light source 531 which emits light, the lamp reflector 532 to effectively lead light to the light guide plate 535, the light guide plate 535 by which light is totally reflected and led to the entire surface, the diffusing plate 536 for reducing variation in brightness, and the reflective plate 534 for reusing light leaking under the light guide plate 535.

A control circuit for controlling the luminance of the light source 531 is connected to the backlight unit 552. The luminance of the light source 531 can be controlled by a signal supplied from the control circuit.

In addition, a structure in which polarizing plates are stacked as shown in FIG. 2A is used as a polarizer in this embodiment mode. Naturally, the stacked polarizers shown in FIG. 2B and FIG. 2C may also be used. As shown in FIG. 9, a retardation plate 547 and the polarizing plate having a stacked structure 516 are provided between the substrate 501 and the backlight unit 552, and a retardation plate 546 and the polarizing plate having a stacked structure 521 are provided over the counter substrate 520 as well. The stacked polarizing plates and the retardation film can be attached to each other and bonded to each of the substrate 501 and the substrate 520.

That is, the substrate 501 is provided with the retardation plate 547, the polarizing plate 543 and the polarizing plate 544 which are stacked as the polarizing plate having a stacked structure 516, which are sequentially stacked from the substrate side. At this time, the polarizing plate 543 and the polarizing plate 544 which are stacked are attached to each other so as to be in a parallel Nicols state.

In addition, the counter substrate 520 is provided with the retardation plate 546, the polarizing plate 541 and the polarizing plate 542 stacked as the polarizing plate having a stacked structure 521, which are sequentially stacked from the substrate side. At this time, the polarizing plate 541 and the polarizing plate 542, which are stacked, are attached to each other so as to be in a parallel Nicols state.

Further, the polarizing plate having a stacked structure 516 and the polarizing plate having a stacked structure 521 are arranged to be in a crossed Nicols state.

The wavelength distributions of extinction coefficients of the polarizing plate 541 and the polarizing plate 542 are different from each other. The wavelength distributions of extinction coefficients of the polarizing plate 543 and the polarizing plate 544 are different from each other.

FIG. 9 shows an example in which two polarizing plates are stacked for one substrate; however, three or more polarizing plates may be stacked.

A contrast ratio of a display device can be increased by providing stacked polarizing plates. By using retardation plates, a display device having an antireflective effect or a display device with a wide viewing angle can be provided.

In addition, this embodiment mode can be freely combined with other embodiment modes and other examples in this specification, if necessary.

Embodiment Mode 9

Embodiment Mode 9 will describe a liquid crystal display device which has stacked polarizing plates, but which uses a TFT having an amorphous semiconductor film, which is different from Embodiment Mode 8.

Figure 10:
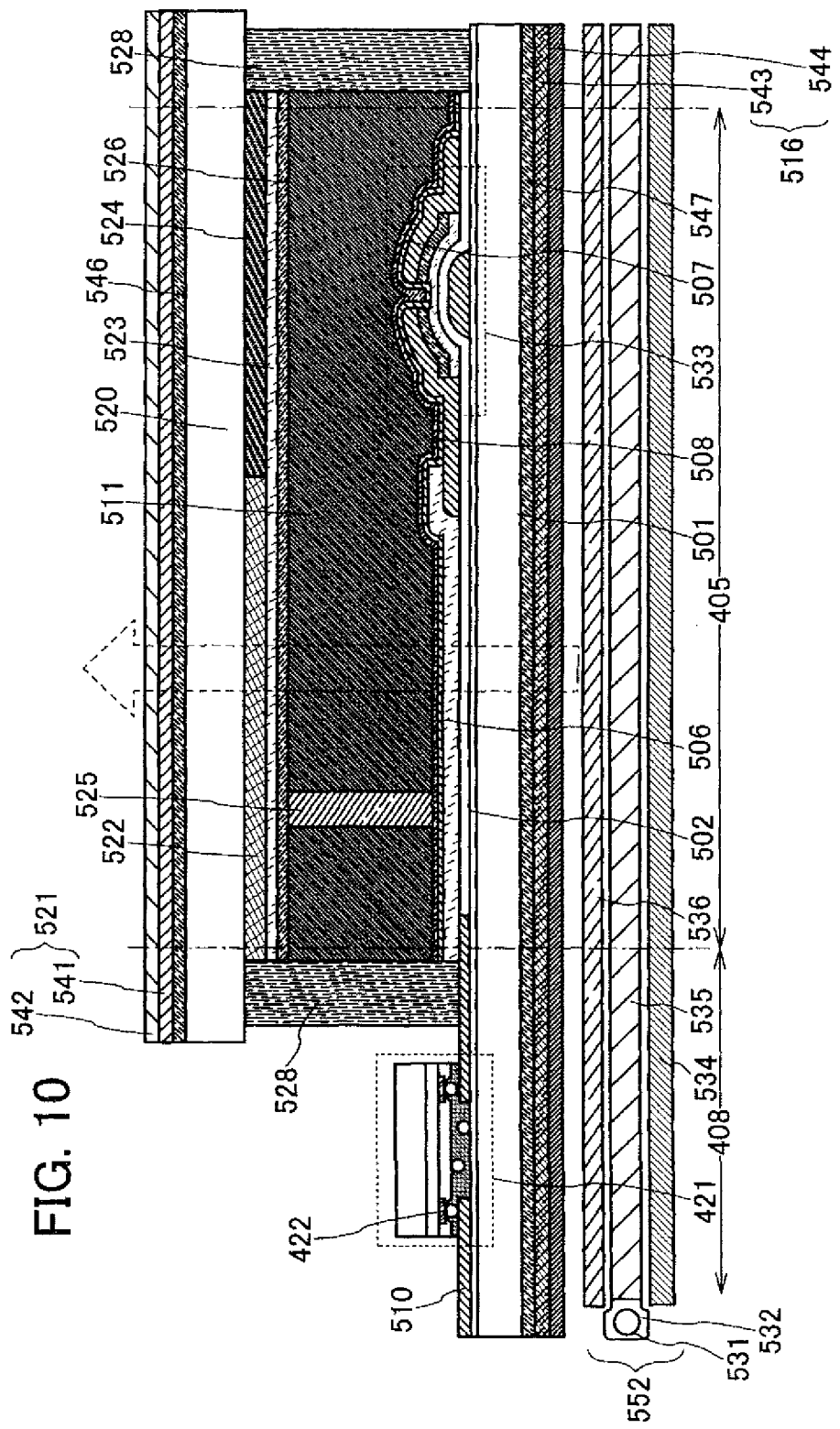
FIG. 10 is a cross sectional view of a display device according to the present invention.

In FIG. 10, a structure of a liquid crystal display device including a transistor using an amorphous semiconductor film (hereinafter referred to as an amorphous TFT) as a switching element is described. The pixel portion 405 is provided with the switching TFT 533 including an amorphous TFT. The amorphous TFT can be formed by a known method. In the case of a channel etch type, for example, a gate electrode is formed over the base film 502, and a gate insulating film which covers the gate electrode, an n-type semiconductor film, an amorphous semiconductor film, a source electrode and a drain electrode are formed. By using the source electrode and the drain electrode, an opening is formed in the n-type semiconductor film. At this time, a part of the amorphous semiconductor film is removed, which is called a channel etch type. Then, the protective film 507 is formed and the amorphous TFT is obtained. In addition, the amorphous TFT also includes a channel protective type, and when an opening is formed in the n-type semiconductor film by using the source electrode and the drain electrode, a protective film is provided such that the amorphous semiconductor film is not removed. Other structures can be similar to the channel etch type.

The alignment film 508 is formed similarly to FIG. 9, and the alignment film 508 is subjected to rubbing treatment. This rubbing treatment is not performed in accordance with a mode of a liquid crystal.

The counter substrate 520 is prepared and attached to the substrate 501 by using the sealing material 528 similarly to FIG. 9. By filling a space between the counter substrate 520 and the substrate 501 with the liquid crystal 511 and sealing, a liquid crystal display device can be formed.

In addition, a structure in which polarizing plates are stacked as shown in FIG. 2A is used as a polarizer in this embodiment mode. Naturally, the stacked polarizers shown in FIG. 2B and FIG. 2C may also be used. As shown in FIG. 10, similarly to FIG. 9, the retardation plate 547 and the polarizing plate having a stacked structure 516 are provided between the substrate 501 and the backlight unit 552, and the retardation plate 546 and the polarizing plate having a stacked structure 521 are provided over the counter substrate 520 as well. The stacked polarizing plates and the retardation film can be attached to each other and bonded to each of the substrate 501 and the substrate 520.

That is, the substrate 501 is provided with the retardation plate (also referred to as the retardation film or the wave plate) 547, the polarizing plate 543 and the polarizing plate 544 which are stacked as the polarizing plate having a stacked structure 516, which are sequentially stacked from the substrate side. At this time, the polarizing plate 543 and the polarizing plate 544, which are stacked, are attached to each other so as to be in a parallel Nicols state.

In addition, the counter substrate 520 is provided with the retardation plate 546, the polarizing plate 541 and the polarizing plate 542, which are stacked, as the polarizing plate having a stacked structure 521, which are sequentially stacked from the substrate side. At this time, the polarizing plate 541 and the polarizing plate 542, which are stacked, are attached to each other so as to be in a parallel Nicols state.

Further, the polarizing plate having a stacked structure 516 and the polarizing plate having a stacked structure 521 are arranged to be in a crossed Nicols state.

The wavelength distributions of extinction coefficients of the polarizing plate 541 and the polarizing plate 542 are different from each other. The wavelength distributions of extinction coefficients of the polarizing plate 543 and the polarizing plate 544 are different from each other.

FIG. 10 shows an example in which two polarizing plates are stacked for one substrate; however, three or more polarizing plates may be stacked.

The contrast ratio can be increased by providing the stacked polarizing plates. By using the retardation plate, a display device with a wide viewing angle can be provided.

In the case of forming a liquid crystal display device by using an amorphous TFT as the switching TFT 533 in this manner, the IC 421 formed using a silicon wafer can be mounted as a driver on the driver circuit portion 408 in consideration of operating performance. For example, a signal to control the switching TFT 533 can be supplied by connecting a wiring of the IC 421 and a wiring connected to the switching TFT 533 by using an anisotropic conductor having the conductive microparticle 422. Note that a mounting method of the IC is not limited to this, and the IC may be mounted by a wire bonding method.

Further, the IC can be connected to a control circuit with the connecting terminal 510 interposed therebetween. At this time, an anisotropic conductive film having the conductive microparticle 422 can be used to connect the IC to the connecting terminal 510.

Since the other structures are similar to FIG. 9, description thereof is omitted here.

In addition, this embodiment mode can be freely combined with other embodiment modes and other examples in this specification, if necessary.

Embodiment Mode 10

Embodiment Mode 10 will describe a structure of a backlight. The backlight is provided in a display device as a backlight unit having a light source. The light source is surrounded by a reflective plate so that the backlight unit can efficiently disperse light.

The backlight in this embodiment mode is used as the backlight unit 552 described in Embodiment Mode 5, Embodiment Mode 6, Embodiment Mode 8, and Embodiment Mode 9.

Figure 11:
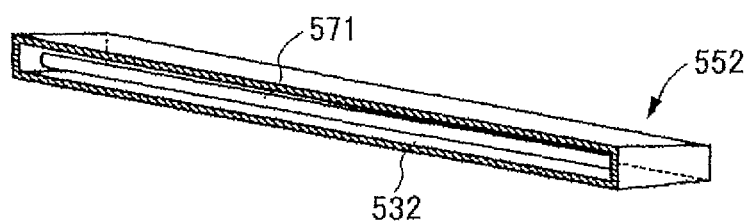
FIG. 11 is a diagram showing a lighting means included in a display device according to the present invention.

As shown in FIG. 11, the backlight unit 552 can employ a cold cathode tube 571 as a light source. Further, in order to efficiently reflect light which is from the cold cathode tube 571, the lamp reflector 532 can be provided. The cold cathode tube 571 is often used in a large-sized display device. That is because of the strength of the luminance from the cold cathode tube. Therefore, a backlight unit included in a cold cathode tube can be used for a display of a personal computer.

Figure 12:
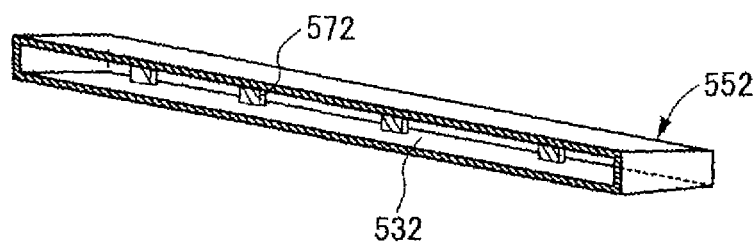
FIG. 12 is a diagram showing a lighting means included in a display device according to the present invention.

As shown in FIG. 12, the backlight unit 552 can use a diode (an LED) 572 as a light source. For example, the diodes (W) 572 that emit white light can be arranged at predetermined distances. Further, in order to efficiently reflect light that is from the diodes (W) 572, the lamp reflector 532 can be provided.

Figure 13A:
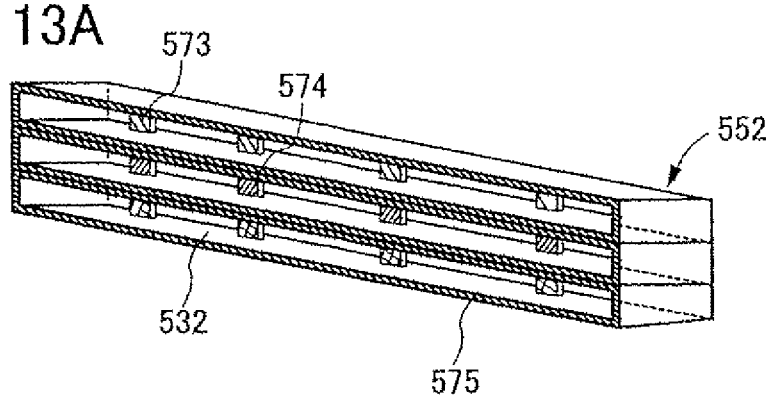
FIGS. 13A and 13B are diagrams each showing a lighting means included in a display device according to the present invention.

As shown in FIG. 13A, the backlight unit 552 can employ diodes (LEDs) of each color, RGB, as a light source, that is, a diode (R) 573 which emits red light, a diode (G) 574 which emits green light, and a diode (B) 575 which emits blue light. By using the diodes (LEDs) 573, 574, and 575 of each color, RGB, color reproducibility can be improved compared to when only the diodes (W) 572 that emit white light are used. Further, in order to efficiently reflect light that is from the diode (R) 573, the diode (G) 574, and the diode (B) 575, the lamp reflector 532 can be provided.

Figure 13B:
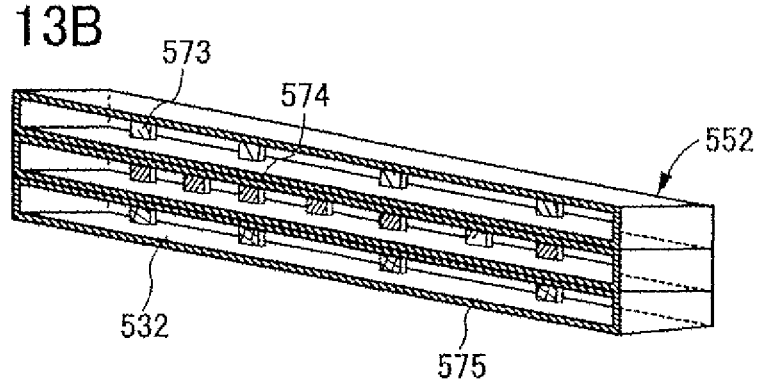

Further, as shown in FIG. 13B, when the diodes (LEDs) 573, 574 and 575 of each color, RGB, are used as a light source, it is not necessary to provide the same number of diodes of each color or to arrange them in the same arrangement. For example, a plurality of diodes of a color with a low emission intensity (for example, green) may be arranged.

Further, the diodes (W) 572 that emit white light may be combined with the diodes (LEDs) 573, 574 and 575 of each color, RGB.

Note that in the case where RGB diodes are provided, when a field sequential mode is used, color display can be conducted by activating the RGB diodes in sequence according to time.

When diodes are employed, since luminance is high, the backlight unit is suitable for a large-sized display device. Further, since the color purity of each color, RGB, is good, color reproducibility is excellent compared to when a cold cathode tube is employed, and since layout area can be reduced, if the backlight unit is adapted to a small-sized display device, a narrow frame can be attempted.

Further, the light source is not necessarily arranged as the backlight unit shown in FIGS. 11, 12, 13A, and 13B. For example, when a large-sized display device is equipped with a backlight having diodes, the diodes can be arranged on the back surface of the substrate. At that point, diodes of each color can be sequentially arranged, keeping a predetermined distance between them. Color reproducibility can be improved according to the arrangement of the diodes.

Since stacked polarizers are provided in a display device employing such a backlight, images with a high contrast ratio can be provided. In particular, the backlight having diodes is suitable for a large-sized display device, and by increasing the contrast ratio of the large-sized display device, a high-quality image can be provided even in a dark place.

In addition, this embodiment mode can be freely combined with other embodiment modes and other examples in this specification, if necessary.

Embodiment Mode 11

Figure 14A:
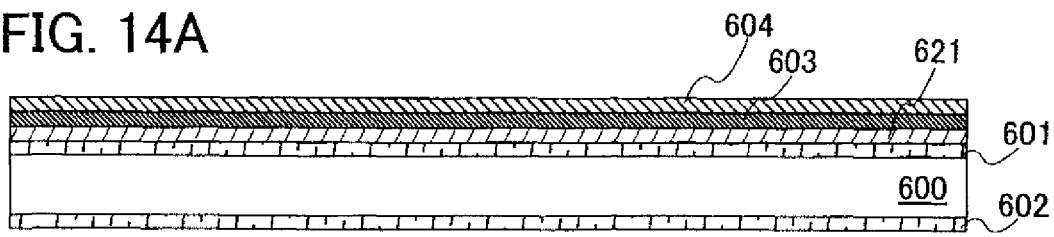
FIGS. 14A and 14B are diagrams showing a display device according to the present invention.
Figure 14B:
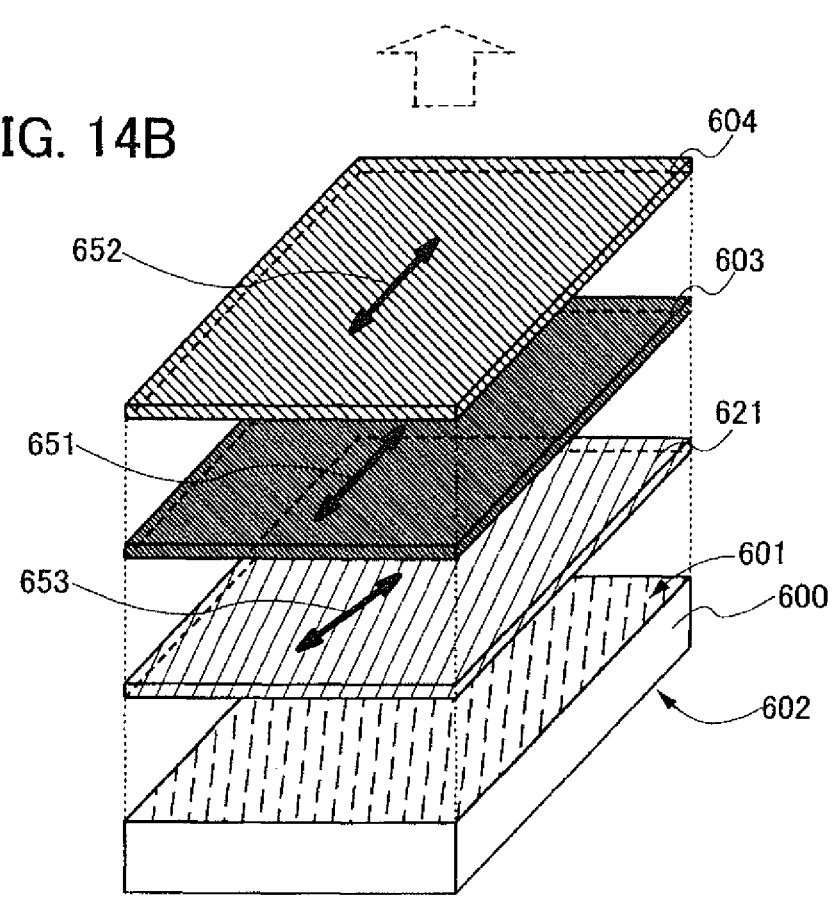

Embodiment Mode 11 will describe a concept of a reflection type liquid crystal display device of the present invention with reference to FIGS. 14A and 14B.

FIG. 14A shows a cross sectional view of a liquid crystal display device provided with stacked polarizers, and FIG. 14B shows a perspective view of the display device.

As shown in FIG. 14A, a layer 600 including a liquid crystal element is interposed between a first substrate 601 and a second substrate 602 which are arranged to be opposite to each other.

Light-transmitting substrates can be used for the first substrate 601 and the second substrate 602. As such light-transmitting substrate, a glass substrate such as barium borosilicate glass or alumino-borosilicate glass, a quartz substrate, or the like can be used. Alternatively, a substrate formed from a synthetic resin having flexibility, such as a plastic, typified by polyethylene-terephthalate (PET), polyethylene naphthalate (PEN), polyethersulfone (PES), or polycarbonate (PC), or acrylic, can be used for a light-transmitting substrate.

On the outer side of the substrate 601, that is, on the side which is not in contact with the layer 600 including the liquid crystal element from the substrate 601, a retardation plate (also referred to as a "retardation film" or a "wave plate") and stacked polarizers are sequentially provided. The structure in which polarizing plates are stacked as shown in FIG. 2A is used as the stacked polarizers in this embodiment mode. Naturally, the structure shown in FIG. 2B or FIG. 2C may also be used.

On the first substrate 601 side, a retardation plate 621, a first polarizing plate 603, and a second polarizing plate 604 are sequentially provided. A slow axis of the retardation plate 621 is denoted by reference numeral 653. External light passes the second polarizing plate 604, the first polarizing plate 603, the retardation plate 621, and the substrate 601, and then enters the layer 600 including the liquid crystal element. The light is reflected using a reflective material provided for the second substrate 602 so that display is performed.

Since the polarizing plate 603 and the polarizing plate 604 are linear polarizing plates and are the same as the polarizing plate 113 and the polarizing plate 114 in FIG. 2A, detailed description thereof is omitted here.

The wavelength distributions of extinction coefficients of the polarizing plate 603 and the polarizing plate 604 are different from each other.

FIGS. 14A and 14B show an example in which two polarizing plates are stacked for one substrate; however, three or more polarizing plates may be stacked.

A uniaxial retardation film (e.g., a quarter-wave plate) can be used as the retardation plate (also referred to as the retardation film) 621.

A uniaxial retardation film is formed by stretching a resin in one direction. Examples of a resin that can be used here are a cyclo olefin polymer (COP), polycarbonate (PC), polymethylmethacrylate (PMMA), polystyrene (PS), polyethersulfone (PES), polyphenylene sulfide (PPS), polyethylene terephthalate (PET), polyethylene naphthalate (PEN), polypropylene (PP), polyphenylene oxide (PPO), polyarylate (PAR), polyimide (PI), and polytetrafluoroethylene (PTFE).

The retardation film can be attached to a substrate after being attached to a polarizing plate.

Next, as can be seen in the perspective view shown in FIG. 14B, the first linear polarizing plate 603 and the second linear polarizing plate 604 are arranged in such a way that an absorption axis 651 of the first linear polarizing plate 603 and an absorption axis 652 of the second linear polarizing plate 604 should be parallel. This parallel state is referred to as parallel Nicols.

The stacked polarizing plates in this manner are arranged such that they should be in a parallel Nicols state.

Transmission axes exist in a direction orthogonal to the absorption axes based on the characteristics of the polarizing plates. Thus, a state in which the transmission axes are parallel to each other can also be referred to as parallel Nicols.

Since the stacked polarizing plates are stacked such that their absorption axes should be in a parallel Nicols state, black luminance can be decreased. Consequently, the contrast ratio of the display device can be increased.

Moreover, in the present invention, since a retardation plate is used, reflection can be suppressed.

In addition, this embodiment mode can be freely combined with other embodiment modes and other examples in this specification, if necessary.

Embodiment Mode 12

Embodiment Mode 12 will describe a specific structure of a reflection type liquid crystal display device described in Embodiment Mode 11.

Figure 15:
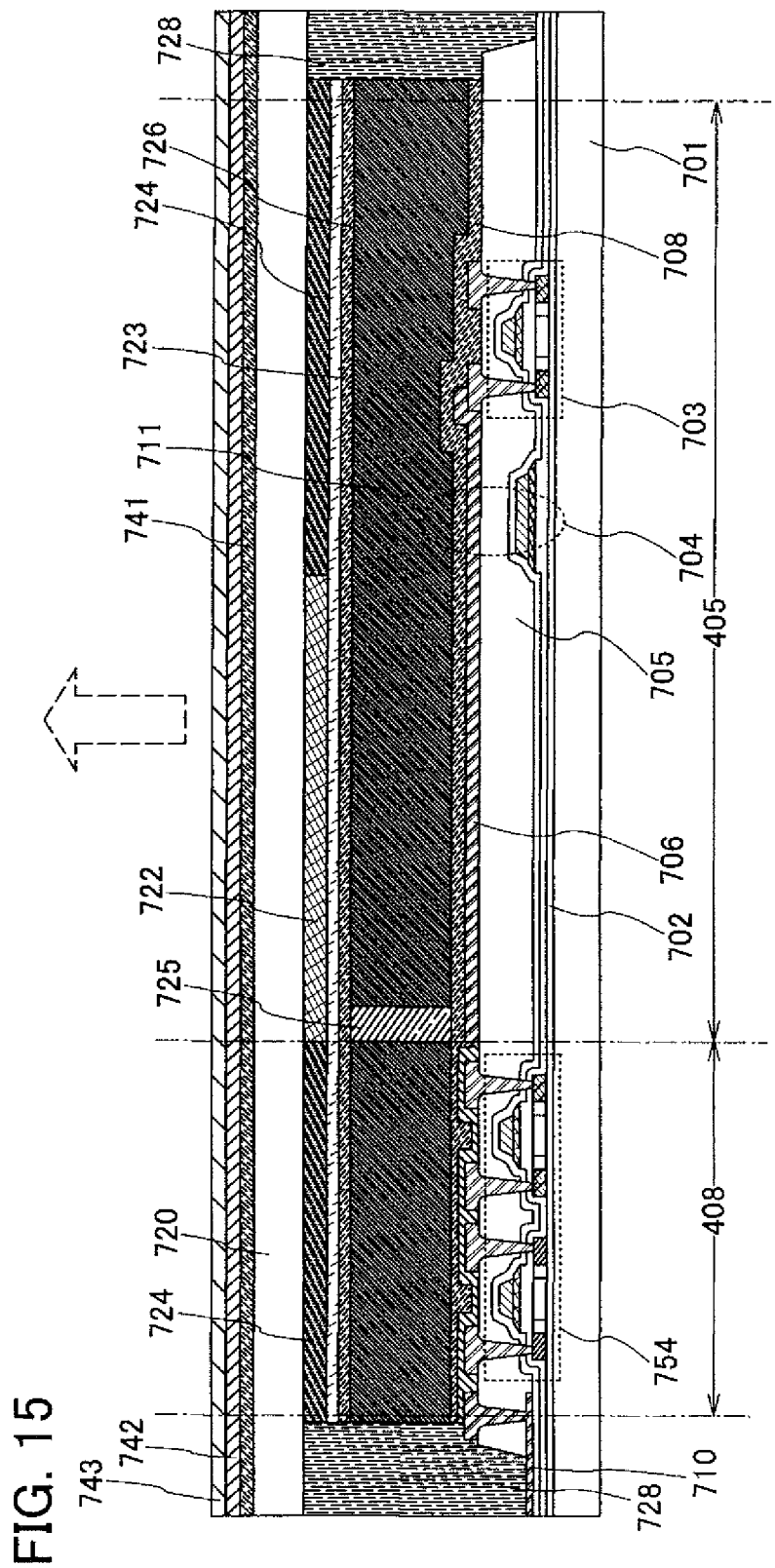
FIG. 15 is a cross sectional view of a display device according to the present invention.

FIG. 15 shows a cross sectional view of a reflection type liquid crystal display device provided with stacked polarizers.

The reflection type liquid crystal display device shown in this embodiment mode includes the pixel portion 405 and the driver circuit portion 408. In the pixel portion 405 and the driver circuit portion 408, a base film 702 is provided over a substrate 701. A substrate similar to Embodiment Mode 11 can be used for the substrate 701. It is concerned that a substrate formed from a synthetic resin generally has a lower allowable temperature limit than other substrates; however, it can be employed by displacing after a manufacturing process using a higher heat-resistant substrate.

The pixel portion 405 is provided with a transistor as a switching element through the base film 702. In this embodiment mode, a thin film transistor (TFT) is used as the transistor, which is referred to as a switching TFT 703.

TFTs which are used for the switching TFT 703 and the driver circuit portion 408 can be formed by many methods. For example, a crystalline semiconductor film is used as an active layer. A gate electrode is provided over the crystalline semiconductor film with a gate insulating film interposed therebetween. An impurity element can be added to the crystalline semiconductor film which serves as the active layer by using the gate electrode to form an impurity region. Since an impurity element is added using the gate electrode in this manner, a mask for adding the impurity element is not required to be formed. The gate electrode may have a single layer structure or a stacked structure.

The TFT may be a top gate type TFT or a bottom gate type TFT, and may be formed if necessary.

An impurity region can be formed as a high concentration impurity region and a low concentration impurity region by controlling the concentration thereof. A structure of such a TFT having a low concentration impurity region is referred to as an LDD (Lightly Doped Drain) structure. The low concentration impurity region can be formed so as to overlap with the gate electrode. A structure of such a TFT is referred to as a GOLD (Gate Overlapped LDD) structure in this specification.

FIG. 15 shows the switching TFT 703 having a GOLD structure. The polarity of the switching TFT 703 is an n-type by using phosphorus (P) or the like for an impurity region thereof. In the case of forming a p-type TFT, boron (B) or the like may be added.

After that, a protective film which covers the gate electrode and the like is formed. A dangling bond in the crystalline semiconductor film can be terminated by hydrogen elements mixed in the protective film.

Further, in order to improve planarity, an interlayer insulating film 705 may be formed. The interlayer insulating film 705 may be formed from an organic material or an inorganic material, or formed using a stacked structure of these.

Openings are formed in the interlayer insulating film 705, the protective film, and the gate insulating film; thereby wiring connected to the impurity regions is formed. In this manner, the switching TFT 703 can be formed. The present invention is not limited to the structure of the switching TFT 703.

Then, a pixel electrode 706 connected to the wiring is formed.

Further, a capacitor 704 can be formed at the same time as the switching TFT 703. In this embodiment mode, the capacitor 704 is formed of a stack of a conductive film formed at the same time as the gate electrode, the protective film, the interlayer insulating film 705, and the pixel electrode 706.

In addition, the pixel portion and the driver circuit portion can be formed over the same substrate by using a crystalline semiconductor film. In that case, thin film transistors in the pixel portion and thin film transistors of the driver circuit portion 408 are formed at the same time.

The thin film transistors used for the driver circuit portion 408 form a CMOS circuit; the transistors are referred to as a CMOS circuit 754. Each of the transistors which form the CMOS circuit 754 may have a similar structure to the switching TFT 703. Further, the LDD structure can be used instead of the GOLD structure, and a similar structure is not necessarily required.

An alignment film 708 is formed so as to cover the pixel electrode 706. The alignment film 708 is subjected to rubbing treatment. This rubbing treatment is not performed in some cases in a mode of a liquid crystal, for example, in a case of a VA mode.

Next, a counter substrate 720 is provided. A color filter 722 and a black matrix (BM) 724 can be provided on an inner side of the counter substrate 720, that is, on the side which is in contact with a liquid crystal. The color filter 722 and the black matrix 724 can be formed by known methods; however, a droplet discharging method (representatively an ink-jetting method) by which a predetermined material is dropped can eliminate the waste of the material.

Further, the color filter 722 is provided in a region where the switching TFT 703 is not provided. That is to say, the color filter 722 is provided to be opposite to a light-transmitting region, i.e., an opening region. The color filter 722 may be formed from materials which exhibit red (R), green (G), and blue (B) in the case where a liquid crystal display device performs full-color display, and a material which exhibits at least one color in the case of mono-color display.

The color filter is not provided in some cases when a successive additive color mixing method (field sequential method) in which color display is performed by time division is used.

The black matrix 724 is provided to reduce reflection of external light due to the wiring of the switching TFT 703 and the CMOS circuit 754. Therefore, the black matrix 724 is provided so as to overlap with the switching TFT 703 and the CMOS circuit 754. The black matrix 724 may be provided so as to overlap with the capacitor 704. Accordingly, reflection by a metal film included in the capacitor 704 can be prevented.

Then, a counter electrode 723 and an alignment film 726 are provided. The alignment film 726 is subjected to rubbing treatment. This rubbing treatment is not performed in some cases in a mode of a liquid crystal, for example, in a case of a VA mode.

The pixel electrode 706 is formed from a reflective conductive material. Such a reflective conductive material can be selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, or metal nitride thereof. External light is emitted toward the upper side of the switching TFT 703 and the CMOS circuit 754, reflected on the pixel electrode 706 which is a reflective electrode, and emitted to the counter substrate 720 side.

In addition, for the wiring included in the TFT and the gate electrode, a similar material to the pixel electrode 706 may be used.

The counter electrode 723 can be formed from a light transmitting conductive material. Such a light transmitting conductive material can be selected from indium tin oxide (ITO), a conductive material in which zinc oxide (ZnO) is mixed in indium oxide, a conductive material in which silicon oxide ($SiO_2$) is mixed in indium oxide, organic indium, organotin, or the like.

Such a counter substrate 720 is attached to the substrate 701 using a sealing material 728. The sealing material 728 can be formed over the substrate 701 or the counter substrate 720 by using a dispenser or the like. Further, a spacer 725 is provided in a part of the pixel portion 405 and the driver circuit portion 408 in order to keep a space between the substrate 701 and the counter substrate 720. The spacer 725 has a columnar shape, a spherical shape, or the like.

A liquid crystal 711 is injected between the substrate 701 and the counter substrate 720 attached to each other in this manner. It is preferable to inject the liquid crystal in vacuum. The liquid crystal 711 can be formed by a method other than an injecting method. For example, the liquid crystal 711 may be dropped and then the counter substrate 720 may be attached to the substrate 701. Such a dropping method is preferably employed when using a large substrate to which the injecting method cannot be applied easily.

The liquid crystal 711 includes a liquid crystal molecule of which tilt is controlled by the pixel electrode 706 and the counter electrode 723. Specifically, the tilt of the liquid crystal molecule is controlled by a voltage applied to the pixel electrode 706 and the counter electrode 723. Such a control is performed using a control circuit provided in the driver circuit portion 408. The control circuit is not necessarily formed over the substrate 701, and a circuit connected through a connecting terminal 710 may be used. In this case, an anisotropic conductive film containing conductive microparticles can be used so as to be connected to the connecting terminal 710. Further, the counter electrode 723 is electrically connected to a part of the connecting terminal 710, whereby a potential of the counter electrode 723 may be a common potential.

In addition, a structure in which polarizing plates are stacked as shown in FIG. 2A is used as a polarizer in this embodiment mode. Naturally, the stacked polarizers shown in FIG. 2B and FIG. 2C may also be used.

The counter substrate 720 is provided with a retardation plate 741, and a polarizing plate 742 and a polarizing plate 743 which are stacked as a polarizing plate having a stacked structure, which are sequentially provided from the substrate side. The stacked polarizing plates and the retardation plate 741 can be attached to each other and bonded to the counter substrate 720. At this time, the polarizing plate 742 and the polarizing plate 743 which are stacked are then attached to be in a parallel Nicols state.

The wavelength distributions of extinction coefficients of the polarizing plate 742 and the polarizing plate 743 are different from each other.

FIG. 15 shows an example in which two polarizing plates are stacked for one substrate; however, three or more polarizing plates may be stacked.

It is possible to increase a contrast ratio of a display device by arranging stacked polarizing plates. By using the retardation film, a display device which is capable of realizing a lower black luminance can be provided.

This embodiment mode can be combined with Embodiment Mode 11, if necessary.

In addition, this embodiment mode can be freely combined with other embodiment modes and other examples in this specification, if necessary.

Embodiment Mode 13

Embodiment Mode 13 will describe a liquid crystal display device which has stacked polarizing plates, but which uses a TFT having an amorphous semiconductor film, which is different from Embodiment Mode 12.

Figure 16:
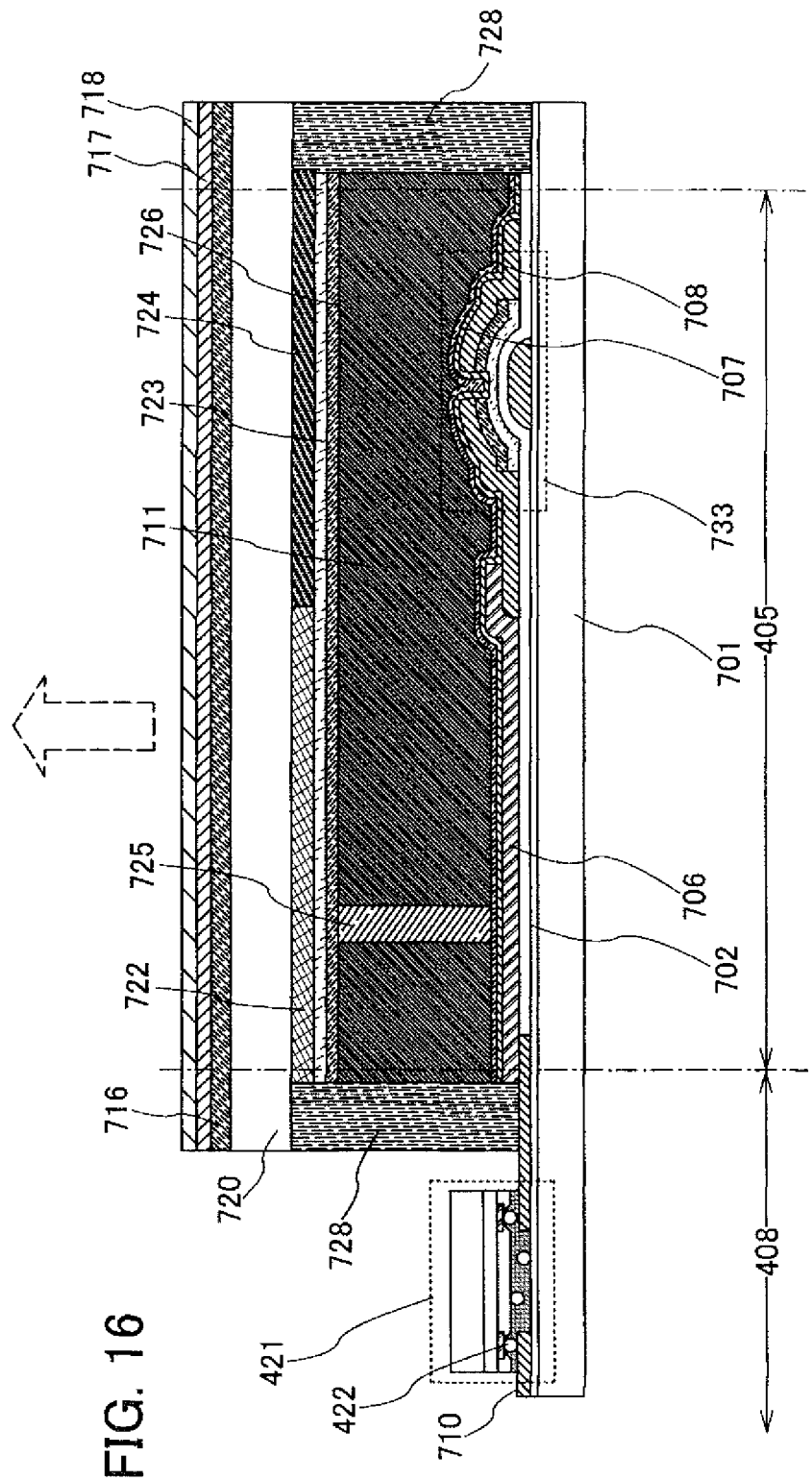
FIG. 16 is a cross sectional view of a display device according to the present invention.

In FIG. 16, a structure of a reflection type liquid crystal display device including a transistor using an amorphous semiconductor film (hereinafter referred to as an amorphous TFT) as a switching element is described.

The pixel portion 405 is provided with a switching TFT 733 including an amorphous TFT. The amorphous TFT can be formed by a known method. In the case of a channel etch type, for example, a gate electrode is formed over the base film 702, and a gate insulating film which covers the gate electrode, an amorphous semiconductor film, an n-type semiconductor film, a source electrode and a drain electrode are formed. By using the source electrode and the drain electrode, an opening is formed in the n-type semiconductor film. At this time, a part of the amorphous semiconductor film is removed, which is called a channel etch type. Then, a protective film 707 is formed and the amorphous TFT is obtained. In addition, the amorphous TFT also includes a channel protective type, and when an opening is formed in the n-type semiconductor film by using the source electrode and the drain electrode, a protective film is provided such that the amorphous semiconductor film is not removed. Other structures can be similar to the channel etch type.

The alignment film 708 is formed similarly to FIG. 15, and the alignment film 708 is subjected to rubbing treatment. This rubbing treatment is not performed in accordance with a mode of a liquid crystal.

The counter substrate 720 is prepared and attached to the substrate 701 by using the sealing material 728 similarly to FIG. 15. By filling a space between the counter substrate 720 and the substrate 701 with the liquid crystal 711 and sealing, a reflection type liquid crystal display device can be formed.

On the counter substrate 701 side, a retardation plate 716, a polarizing plate 717 and a polarizing plate 718, which are stacked, as the polarizing plate 516 are sequentially provided from the substrate side. The polarizing plate 717 and the polarizing plate 718, which are stacked, and the retardation plate 716 can be attached to each other and bonded to the counter substrate 720. At this time, the polarizing plate 717 and the polarizing plate 718, which are stacked, are attached to each other so as to be in a parallel Nicols state.

The wavelength distributions of extinction coefficients of the polarizing plate 717 and the polarizing plate 718 are different from each other.

FIG. 16 shows an example in which two polarizing plates are stacked for one substrate; however, three or more polarizing plates may be stacked.

It is possible to increase a contrast ratio of a display device by arranging stacked polarizing plates. By using the retardation plate, a display device which is capable of realizing a lower black luminance can be provided.

In the case of forming a liquid crystal display device by using an amorphous TFT as the switching TFT 733 in this manner, the IC 421 formed using a silicon wafer can be mounted as a driver on the driver circuit portion 408 in consideration of operating performance. For example, a signal to control the switching TFT 733 can be supplied by connecting a wiring of the IC 421 and a wiring connected to the switching TFT 733 by using an anisotropic conductor having the conductive microparticle 422. Note that a mounting method of the IC is not limited to this, and the IC may be mounted by a wire bonding method.

Further, the IC can be connected to a control circuit with the connecting terminal 710 interposed therebetween. At this time, an anisotropic conductive film having the conductive microparticle 422 can be used to connect the IC to the connecting terminal 710.

Since the other structures are similar to FIG. 15, description thereof is omitted here.

Note that this embodiment mode can be combined with Embodiment Mode 11 and Embodiment Mode 12, if necessary.

In addition, this embodiment mode can be freely combined with other embodiment modes and other examples in this specification, if necessary.

Embodiment Mode 14

Embodiment Mode 14 will describe a reflection type liquid crystal display device which has a structure different from that in Embodiment Mode 11 to Embodiment Mode 13 with reference to FIGS. 17A, 17B, 18, and 19.

However, elements which have the same reference numerals as in FIGS. 14A and 14B, 15, and 16 are like ones, and a different element is described.

Figure 17A:
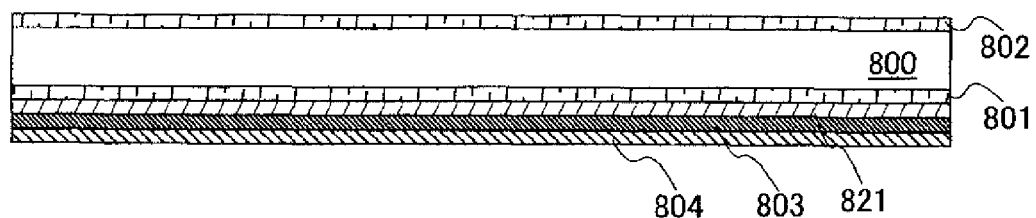
FIGS. 17A and 17B are diagrams showing a display device according to the present invention.
Figure 17B:
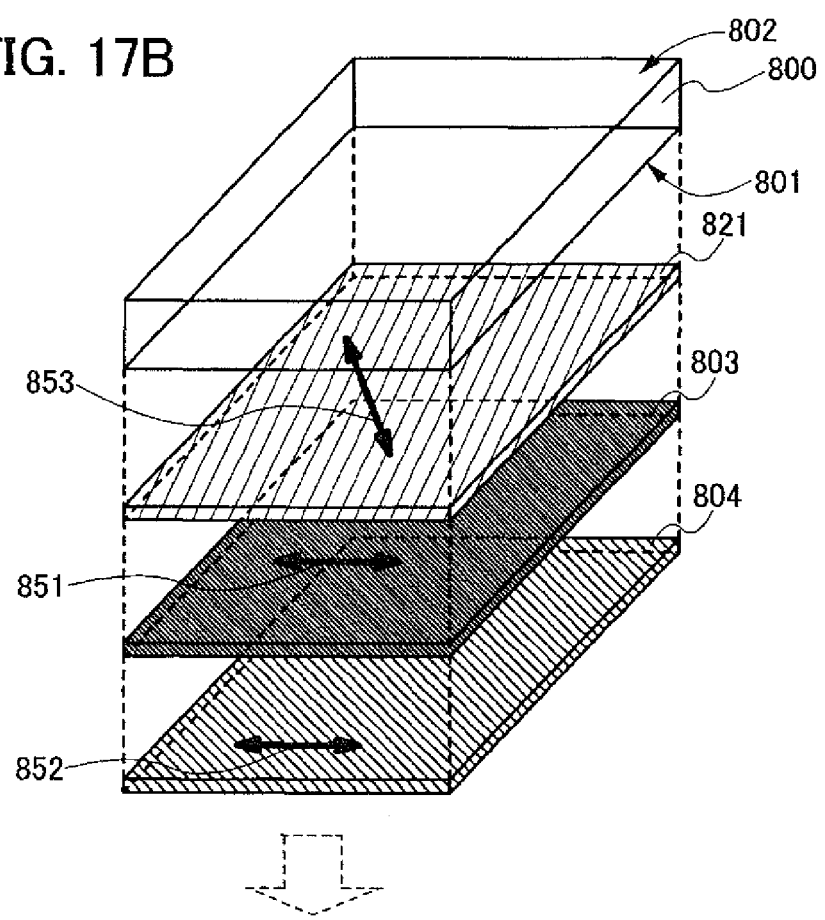

In a reflection type liquid crystal display device in FIGS. 17A and 17B, a layer 800 including a liquid crystal element is interposed between a first substrate 801 and a second substrate 802 which are arranged to be opposite to each other.

On the outer side of the substrate 801, that is, on a side which is not in contact with the layer 800 including the liquid crystal element from the substrate 801, a retardation plate and stacked polarizing plates are sequentially provided. On the first substrate 801 side, a retardation plate 821, a first polarizing plate 803, and a second polarizing plate 804 are sequentially provided. The first polarizing plate 803 and the second polarizing plate 804 are arranged in such a way that an absorption axis 851 of the first polarizing plate 803 and an absorption axis 852 of the second polarizing plate 804 should be parallel. A slow axis of the retardation plate 821 is denoted by reference numeral 853. External light passes the second polarizing plate 804, the second polarizing plate 803, the retardation plate 821, and the substrate 801, and then enters the layer 800 including the liquid crystal element. The light is reflected using a reflective material provided for the second substrate 802 so that display is performed.

The wavelength distributions of extinction coefficients of the first polarizing plate 803 and the second polarizing plate 804 are different from each other.

A specific structure of a reflection type liquid crystal display device in this embodiment mode is described with reference to FIGS. 18 and 19. Description of FIG. 15 can be applied to FIG. 18 and description of FIG. 16 can be applied to FIG. 19. Similar ones are described with the same reference numerals.

FIG. 18 shows a reflection type liquid crystal display device using a TFT having a crystalline semiconductor film as a switching element. FIG. 19 shows a reflection type liquid crystal device using a TFT having an amorphous semiconductor film as a switching element.

In FIG. 18, a pixel electrode 811 connected to the switching TFT 703 is formed from a light transmitting conductive material. As such a light transmitting conductive material, a material similar to the counter electrode 723 in Embodiment Mode 12 can be used.

A counter electrode 812 is formed from a reflective conductive material. As such a reflective conductive material, a material similar to the pixel electrode 706 in Embodiment Mode 2 can be used.

The color filter 722 and the black matrix 724 are provided on a surface opposite to a surface of the substrate 701 over which a TFT is formed. Further, a retardation plate 825, a first polarizing plate 826, and a second polarizing plate 827 are stacked.

The wavelength distributions of extinction coefficients of the first polarizing plate 826 and the second polarizing plate 827 are different from each other.

Figure 19:
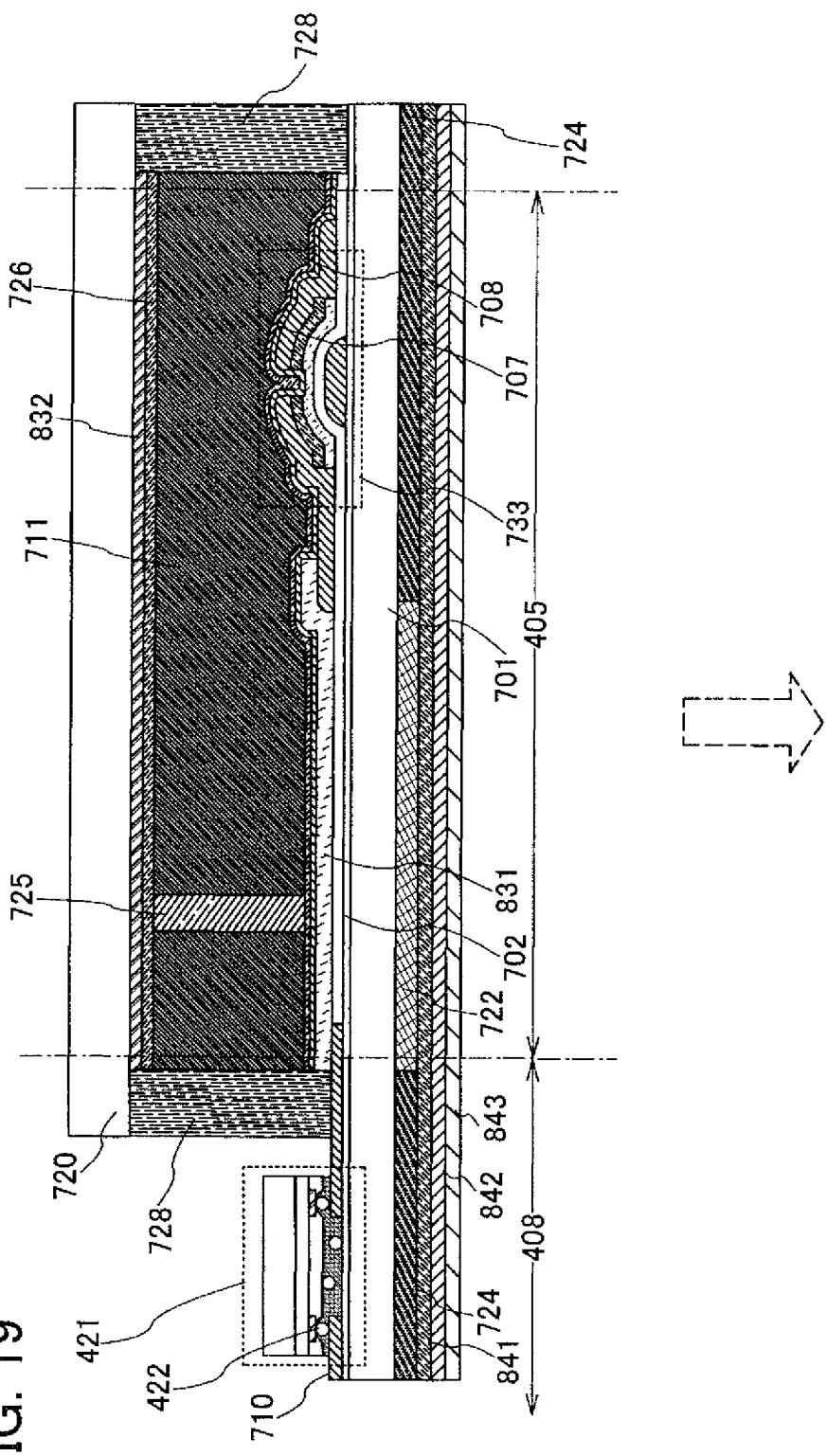
FIG. 19 is a cross sectional view of a display device according to the present invention.

In FIG. 19, a pixel electrode 831 connected to the switching TFT 733 is formed of a light transmitting conductive material. As such a light transmitting conductive material, a material similar to the counter electrode 723 in Embodiment Mode 12 can be used.

A counter electrode 832 is formed from a reflective conductive material. As such a reflective conductive material, a material similar to the pixel electrode 706 in Embodiment Mode 12 can be used.

The color filter 722 and the black matrix 724 are provided on a surface opposite to a surface of the substrate 701 over which the TFT is formed. Further, a retardation plate 841, a first polarizing plate 842, and a second polarizing plate 843 are stacked.

The wavelength distributions of extinction coefficients of the polarizing plate 842 and the polarizing plate 843 are different from each other.

FIGS. 17A, 17B, 18, and 19 show examples in which two polarizing plates are stacked for one substrate; however, three or more polarizing plates may be stacked.

The structure in which polarizing plates are stacked (see FIG. 2A) is used as stacked polarizers in this embodiment mode. However, the structure shown in FIG. 2B and FIG. 2C may also be used.

Note that this embodiment mode can be combined with Embodiment Mode 11 to Embodiment Mode 13, if necessary.

In addition, this embodiment mode can be freely combined with other embodiment modes and other examples in this specification, if necessary.

Embodiment Mode 15

Embodiment Mode 15 will describe operation of each circuit and the like included in a liquid crystal display device in Embodiment Mode 4 to Embodiment Mode 14.

FIGS. 20A to 20C, and 21 show system block diagrams of the pixel portion 405 and the driver circuit portion 408 of a liquid crystal display device.

The pixel portion 405 includes a plurality of pixels. At intersection regions of signal lines 412 and scanning lines 410, which form each pixel, switching elements are provided. Application of a voltage for controlling a tilt of a liquid crystal molecule can be controlled by the switching element. A structure in which a switching element is provided at an intersection region is called an active structure. The pixel portion of the present invention is not limited to an active structure such as this, and may have a passive structure. A passive structure does not have a switching element in each pixel; therefore, the manufacturing process is simple.

The driver circuit portion 408 includes a control circuit 402, a signal line driver circuit 403, and a scanning line driver circuit 404. The control circuit 402 includes a function of performing gray scale control in accordance with the display content of the pixel portion 405. Therefore, the control circuit 402 inputs generated signals to the signal line driver circuit 403 and the scanning line driver circuit 404. Then, when a switching element is selected by the scanning line driver circuit 404 through the scanning line 410, voltage is applied to a pixel electrode of the selected intersection region. The value of the voltage is determined based on a signal inputted from the signal line driver circuit 403 through the signal line.

Figure 20A:
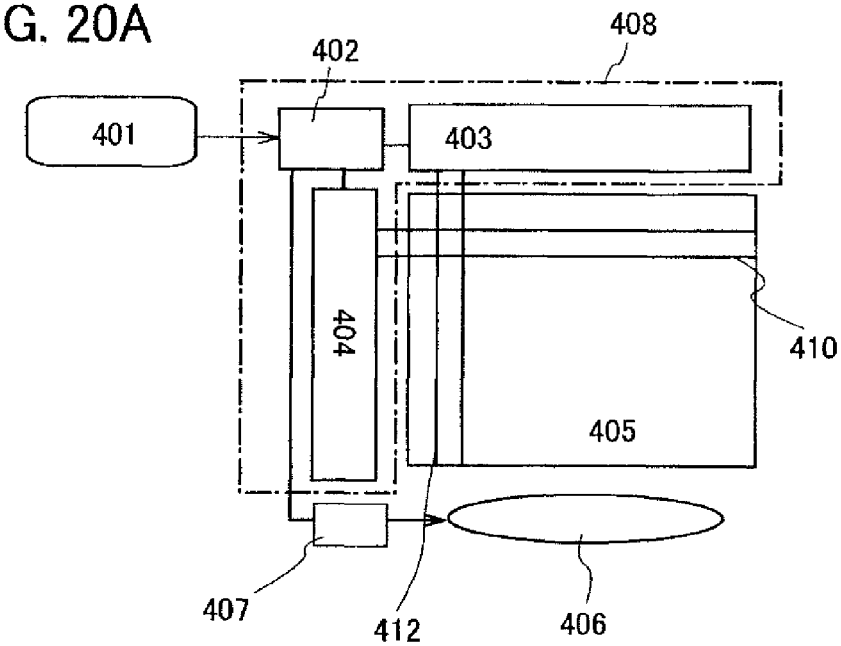
FIGS. 20A to 20C are block diagrams showing a display device according to the present invention.

As for the transmission type liquid crystal display device shown in FIGS. 6, 7, 9, and 10, in the control circuit 402 shown in FIG. 20A, a signal which controls electrical power supplied to a lighting means 406 is generated, and is inputted to a power source 407 of the lighting means 406. The backlight unit shown in FIGS. 11 to 13B can be used for the lighting means. Further, a front light can be used for a lighting means instead of a backlight. A front light refers to a plate-like light unit that is fitted in front of a pixel portion and is formed from a luminous body which illuminates the whole screen and a light-guiding body. By using such a lighting means, a pixel portion can be illuminated evenly with low power consumption.

Figure 21:
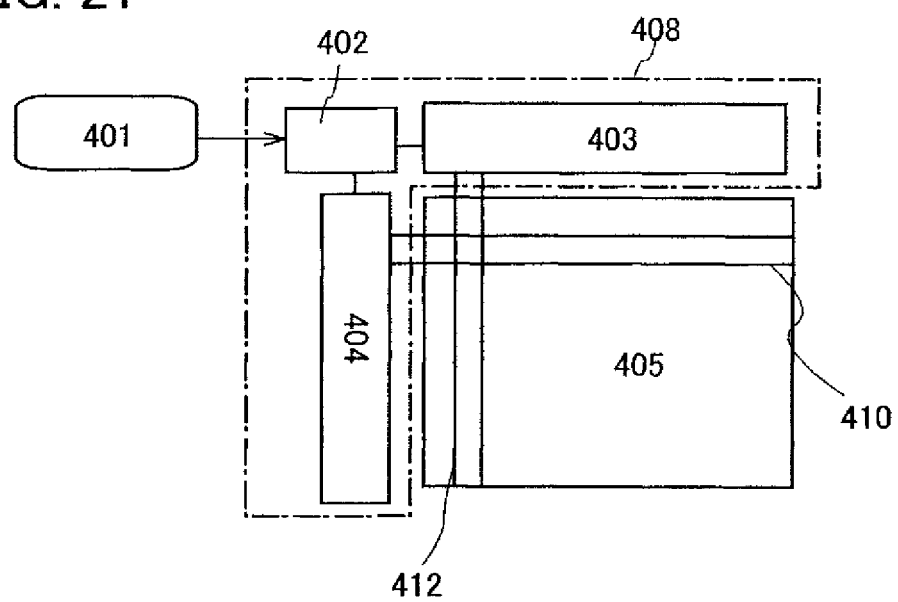
FIG. 21 is a block diagram showing a display device according to the present invention.

On the other hand, in a reflection type liquid crystal display device shown in FIGS. 15, 16, 18, and 19, a lighting means and a power source are not necessarily provided; therefore, the structure shown in FIG. 21 may be used.

Figure 20B:
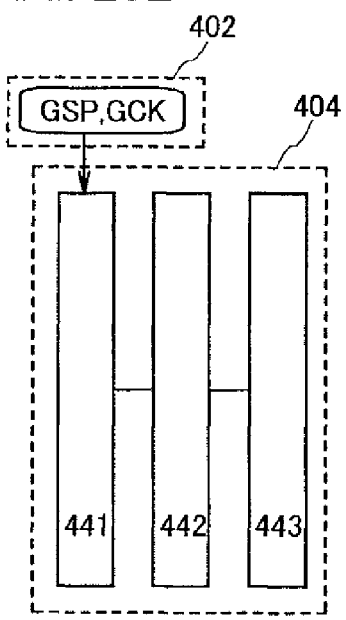

The scanning line driver circuit 404 as shown in FIG. 20B includes a shift register 441, a level shifter 442, and a circuit which functions as a buffer 443. Signals such as a gate start pulse (GSP) and a gate clock signal (GCK) are inputted to the shift register 441. The scanning line driver circuit of the present invention is not limited to the structure shown in FIG. 20B.

Figure 20C:
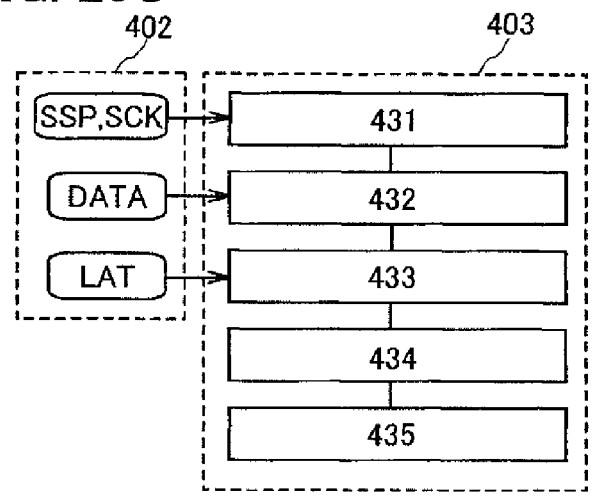

Further, as shown in FIG. 20C, the signal line driver circuit 403 includes a shift register 431, a first latch 432, a second latch 433, a level shifter 434, and a circuit which functions as a buffer 435. The circuit which functions as the buffer 435 is a circuit which has a function of amplifying weak signals, and includes an operational amplifier and the like. A signal such as a start pulse (SSP) is inputted to the level shifter 434, and data (DATA) such as a video signal which is generated based on an image signal 401 is inputted to the first latch 432. Latch (LAT) signals can be held temporarily in the second latch 433, and inputted to the pixel portion 405 all together. This is referred to as line sequential drive. Therefore, when a pixel performs dot sequential drive rather than line sequential drive, it is not necessary to include the second latch. Thus, the signal line driver circuit of the present invention is not limited to the structure shown in FIG. 20C.

The signal line driver circuit 403, the scanning line driver circuit 404, and the pixel portion 405 can be formed from semiconductor elements provided over the same substrate. The semiconductor element can be formed using a thin film transistor provided over a glass substrate. In that case, a crystalline semiconductor film is preferably used as a part of the semiconductor element. Since a crystalline semiconductor film has good electrical characteristics, in particular, high mobility, it can form a circuit included in a driver circuit portion. Further, the signal line driver circuit 403 and the scanning line driver circuit 404 can be mounted on the substrate using an IC (Integrated Circuit) chip. In that case, an amorphous semiconductor film can be used for a part of the semiconductor element of the pixel portion (see the above embodiment modes).

Since stacked polarizers are provided in such a liquid crystal display device, a contrast ratio can be increased. That is, the contrast ratio of the light from the lighting means which is controlled by the control circuit and reflected light can be increased by the stacked polarizers.

In addition, this embodiment mode can be freely combined with other embodiment modes and other examples in this specification, if necessary.

Embodiment Mode 16

Embodiment Mode 16 will describe a concept of a display device including a light emitting element of the present invention.

In a structure of the present invention, an element utilizing electroluminescence (an electroluminescent element), an element utilizing plasma, and an element utilizing field emission are given as a light emitting element. The electroluminescent element can be divided into an organic EL element and an inorganic EL element depending on a material to be applied. A display device having such a light emitting element is also referred to as a light emitting device. In this embodiment mode, an electroluminescent element is used as a light emitting element.

Figure 22A:
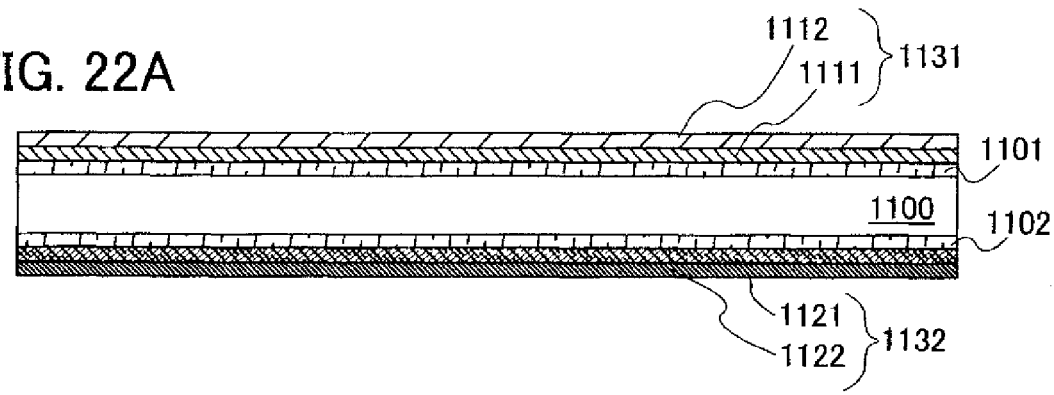
FIGS. 22A and 22B are diagrams showing a display device according to the present invention.
Figure 22B:
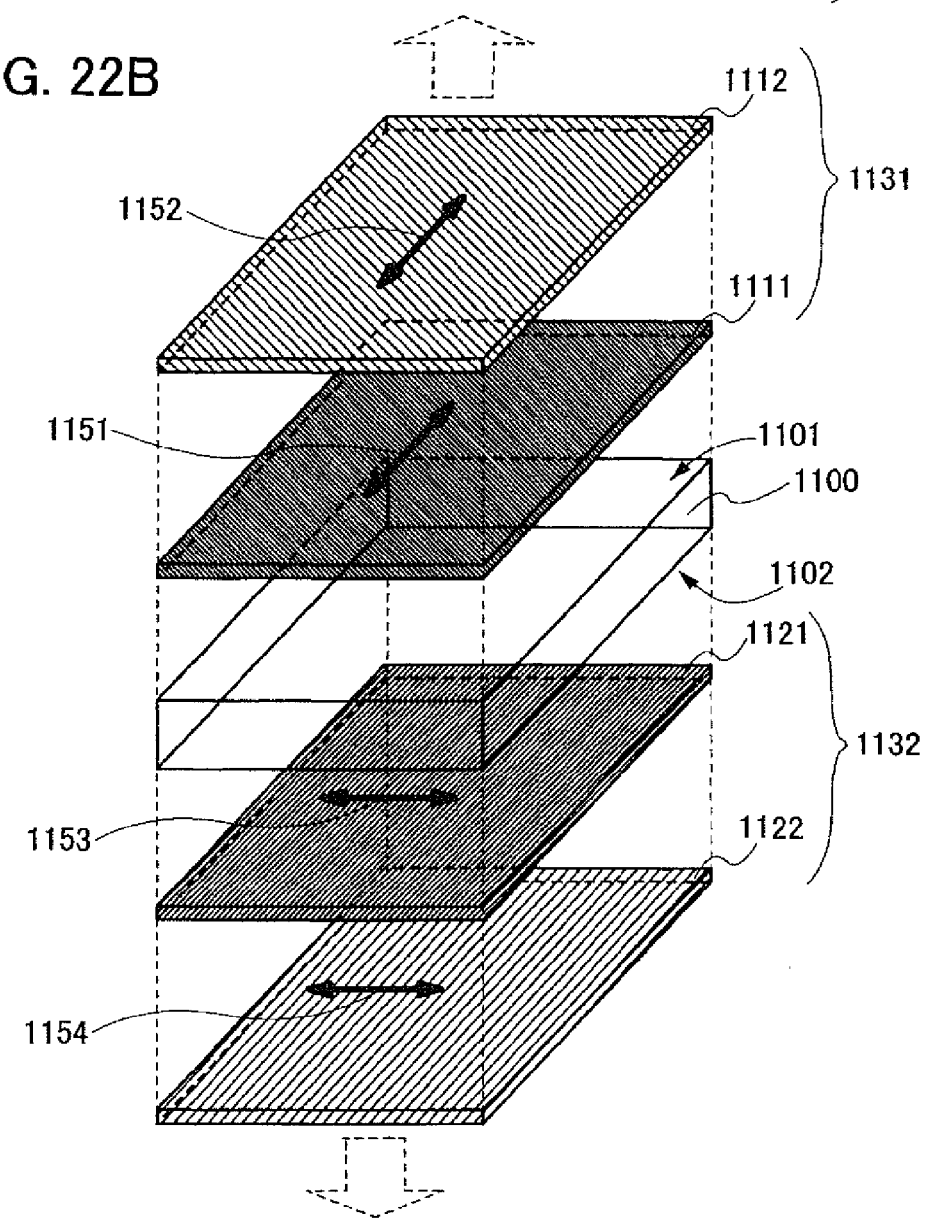

As shown in FIGS. 22A and 22B, a layer 1100 including an electroluminescent element is interposed between a first substrate 1101 and a second substrate 1102 which are arranged to be opposite to each other. Note that FIG. 22A shows a cross sectional view of a display device of this embodiment mode, and FIG. 22B shows a perspective view of the display device of this embodiment mode.

In FIG. 22B, light from the electroluminescent element can be emitted to the first substrate 1101 side and the second substrate 1102 side (in directions indicated by dashed arrows). Light-transmitting substrates are used for the first substrate 1101 and the second substrate 1102. As such light-transmitting substrate, for example, a glass substrate such as barium borosilicate glass or alumino borosilicate glass, a quartz substrate, or the like can be used. Further, a substrate formed from a synthetic resin having flexibility such as plastic typified by polyethylene-terephthalate (PET), polyethylene naphthalate (PEN), polyethersulfone (PES), or polycarbonate (PC), or acrylic can be used for the light-transmitting substrates.

Stacked polarizers are provided on the outer sides of the first substrate 1101 and the second substrate 1102, namely on the sides which are not in contact with the layer 1100 including the electroluminescent element. Light emitted from the electroluminescent element is linearly polarized by the polarizers. That is, the stacked polarizers can be referred to as a linear polarizer having a stacked structure. The stacked polarizers indicate a state where two or more polarizers are stacked. In this embodiment mode, a display device in which two polarizers are stacked is exemplified, and the two polarizers to be stacked are stacked in contact with each other as shown in FIG. 22A.

Embodiment Mode 2 can be applied to the stacked structure of the polarizers like this. In this embodiment mode, the structure shown in FIG. 2A is used as the stacked polarizers; however, the structure shown in FIG. 2B or FIG. 2C may also be used.

In FIGS. 22A and 22B, an example in which two polarizers are stacked is shown; however, two or more polarizers may be stacked.

On the outer side of the first substrate 1101, a first polarizing plate 1111 and a second polarizing plate 1112 are sequentially provided as a polarizing plate having a stacked structure 1131. The first polarizing plate 1111 and the second polarizing plate 1112 are arranged in such a way that an absorption axis 1151 of the first polarizing plate 1111 and an absorption axis 1152 of the second polarizing plate 1112 should be parallel. That is, the first polarizing plate 1111 and the second polarizing plate 1112 are arranged such that they should be in a parallel Nicols state.

On the outer side of the second substrate 1102, a third polarizing plate 1121 and a fourth polarizing plate 1122 are sequentially provided as a polarizing plate having a stacked structure 1132. The third polarizing plate 1121 and the fourth polarizing plate 1122 are arranged in such a way that an absorption axis 1153 of the third polarizing plate 1121 and an absorption axis 1154 of the fourth polarizing plate 1122 should be parallel. That is, the third polarizing plate 1121 and the fourth polarizing plate 1122 are arranged such that they are in a parallel Nicols state.

The absorption axis 1151 (and the absorption axis 1152) of the polarizing plate having a stacked structure 1131 provided over the first substrate 1101, and the absorption axis 1153 (and the absorption axis 1154) of the polarizing plate having a stacked structure 1132 provided under the second substrate 1102 are orthogonal to each other. That is, the polarizing plate having a stacked structure 1131 and the polarizing plate having a stacked structure 1132, namely polarizing plates having a stacked structure which are opposite to each other via a layer 1100 including an electroluminescent element, are arranged to be in a crossed Nicols state.

These polarizing plates 1111, 1112, 1121, and 1122 can be formed from a known material. For example, a structure can be used, in which an adhesive surface, TAC (triacetyl cellulose), a mixed layer of PVA (polyvinyl alcohol) and a dichroic pigment, and TAC are sequentially stacked from the substrate side. As the dichroic pigment, iodine and dichromatic organic dye can be cited.

Note that a transmission axis exists in a direction orthogonal to the absorption axis based on the characteristics of the polarizing plate. Thus, a state in which the transmission axes are parallel to each other can also be referred to as parallel Nicols.

Since polarizing plates are stacked to be in a parallel Nicols state, light leakage in the absorption axis direction can be reduced. Further, polarizing plates each having a stacked structure which are opposite to each other via a layer including an electroluminescent element are arranged to be in a crossed Nicols state. By using such stacked polarizing plates, light leakage can be reduced, compared to a structure in which a pair of single polarizing plates is arranged in a crossed Nicols state. Consequently, the contrast ratio of the display device can be increased.

The wavelength distributions of extinction coefficients of the polarizing plate 1111 and the polarizing plate 1112 are different from each other. The wavelength distributions of extinction coefficient of the polarizing plate 1121 and the polarizing plate 1122 are different from each other.

In addition, this embodiment mode can be freely combined with other embodiment modes and other examples in this specification, if necessary.

Embodiment Mode 17

Figure 23:
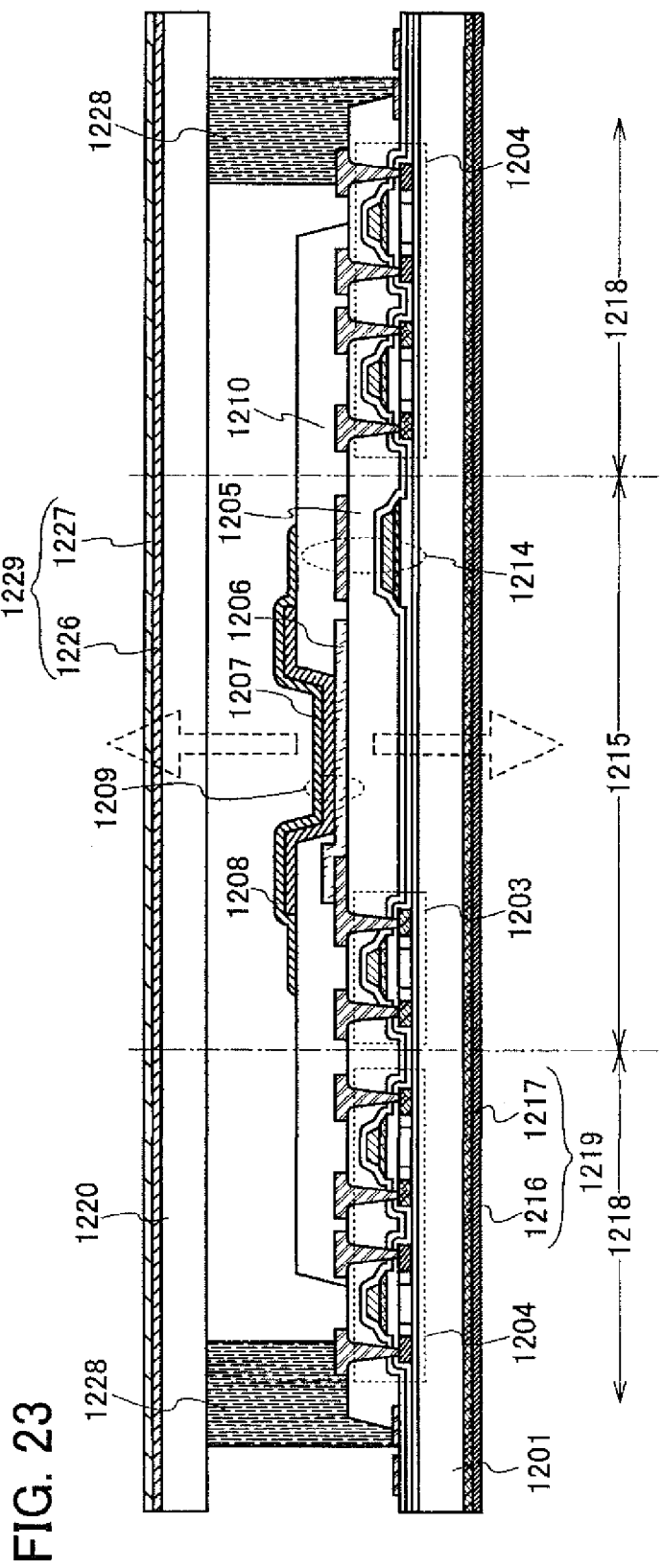
FIG. 23 is a cross sectional view of a display device according to the present invention.

Embodiment Mode 17 will exemplify a cross sectional view of a display device of the present invention with reference to FIG. 23.

A thin film transistor is formed over a substrate (hereinafter referred to as an insulating substrate) 1201 having an insulating surface through an insulating layer. The thin film transistor (also referred to as a TFT) includes a semiconductor layer processed in a predetermined shape, a gate insulating layer which covers the semiconductor layer, a gate electrode provided over the semiconductor layer with the gate insulating layer interposed therebetween, and a source electrode or drain electrode connected to an impurity layer in a semiconductor film.

A material used for the semiconductor layer is a semiconductor material having silicon, and a crystalline state thereof may be any of amorphous, microcrystalline, and crystalline. An inorganic material is preferably used for the insulating layer typified by a gate insulating film, and silicon nitride or silicon oxide can be used. The gate electrode and the source electrode or drain electrode may be formed from a conductive material, and tungsten, tantalum, aluminum, titanium, silver, gold, molybdenum, copper, or the like is included.

The display device in this embodiment mode can be roughly divided into a pixel portion 1215 and a driver circuit portion 1218. A thin film transistor 1203 provided in the pixel portion 1215 is used as a switching element, and a thin film transistor 1204 provided in the driver circuit portion 1218 is used as a CMOS circuit. In order to use the driver circuit portion 1218 as a CMOS circuit, a p-channel TFT and an N-channel TFT are included. The thin film transistor 1203 can be controlled by the CMOS circuit provided in the driver circuit portion 1218.

Note that although FIG. 23 shows a top gate type TFT as a thin film transistor, a bottom gate type TFT may be used.

An insulating layer 1205 having a stacked structure or a single layer structure is formed so as to cover the thin film transistor 1203 and the thin film transistor 1204. The insulating layer 1205 can be formed from an inorganic material or an organic material.

As the inorganic material, silicon nitride or silicon oxide can be used. As the organic material, polyimide, acrylic, polyamide, polyimide amide, resist, benzocyclobutene, siloxane, polysilazane, or the like can be used. Siloxane is composed of a skeleton structure formed by the bond of silicon (Si) and oxygen (O), in which an organic group containing at least hydrogen (such as an alkyl group or an aromatic hydrocarbon) is included as a substituent. Alternatively, a fluoro group may be used as the substituent. Further alternatively, a fluoro group and an organic group containing at least hydrogen may be used as the substituent. Polysilazane is formed using a liquid material containing a polymer material having the bond of silicon (Si) and nitrogen (N) as a starting material. If the insulating layer is formed using an inorganic material, a surface thereof follows a depression/projection below. Alternatively, if the insulating layer is formed using an organic material, a surface thereof is planarized. For example, in a case where the insulating layer 1205 is required to have planarity, it is preferable that the insulating layer 1205 be formed using an organic material. Note that, even if an inorganic material is used, planarity can be obtained by thickly forming the material.

The source electrode or drain electrode is manufactured by forming a conductive layer in an opening provided in the insulating layer 1205 or the like. At this time, a conductive layer serving as a wiring over the insulating layer 1205 can be formed. A capacitor 1214 can be formed using a conductive layer of the gate electrode, the insulating layer 1205, and a conductive layer of the source electrode or drain electrode.

A first electrode 1206 to be connected to either the source electrode or drain electrode is formed. The first electrode 1206 is formed using a material having a light-transmitting property. As the material having a light-transmitting property, indium tin oxide (ITO), zinc oxide (ZnO), indium zinc oxide (IZO), zinc oxide to which gallium is added (GZO), and the like can be given. Even if a non-light transmitting material such as rare-earth metal such as Yb or Er as well as alkali metal such as Li or Cs, alkaline earth metal such as Mg, Ca, or Sr, an alloy thereof (Mg:Ag, Al:Li, Mg:In, or the like), and a compound of these (calcium fluoride or calcium nitride), is used, the first electrode 1206 can have a light-transmitting property by being formed to be extremely thin. Therefore, a non-light transmitting material may be used for the first electrode 1206.

An insulating layer 1210 is formed so as to cover an end portion of the first electrode 1206. The insulating layer 1210 can be formed in a similar manner to the insulating layer 1205. An opening is provided in the insulating layer 1210 to cover the end portion of the first electrode 1206. An end surface of the opening may have a tapered shape, whereby disconnection of a layer to be formed later can be prevented. For example, in a case where a non-photosensitive resin or a photosensitive resin is used for the insulating layer 1210, a tapered shape can be provided in a side surface of the opening in accordance with an exposure condition.

After that, an electroluminescent layer 1207 is formed in the opening of the insulating layer 1210. The electroluminescent layer includes a layer including each function, specifically, a hole injecting layer, a hole transporting layer, a light emitting layer, an electron transporting layer, and an electron injecting layer. A boundary of each layer is not necessarily clear, and there may be a case where a part of the boundary is mixed.

A specific material for forming the light emitting layer is exemplified hereinafter. When reddish emission is desired to be obtained, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidin-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonate) (abbreviation: Ir[Fdpq]$_2$(acac)), or the like can be used for the light emitting layer. However, it is not limited to these materials, and a substance which exhibits emission with a peak from 600 nm to 700 nm in an emission spectrum can be used.

When greenish emission is desired to be obtained, N,N'-dimethylquinacridone (abbreviation: DMQd), coumarin 6, coumarin 545T, tris(8-quinolinolato)aluminum (abbreviation: Alq$_3$), or the like can be used for the light emitting layer. However, it is not limited to these materials, and a substance which exhibits emission with a peak from 500 nm to 600 nm in an emission spectrum can be used.

When bluish emission is desired to be obtained, 9,10-bis(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), or the like can be used for the light emitting layer. However, it is not limited to these materials, and a substance which exhibits emission with a peak from 400 nm to 500 nm in an emission spectrum can be used.

When whitish emission is desired to be obtained, a structure can be used, in which TPD (aromatic diamine), 3-(4-tert-butylphenyl)-4-phenyl-5-(4-biphenylyl)-1,2,4-triazole (abbreviation: TAZ), tris(8-quinolinolato)aluminum (abbreviation: Alq$_3$), Alq$_3$ doped with Nile Red which is a red light emitting pigment, and Alq$_3$ are stacked by an evaporation method or the like.

Then, a second electrode 1208 is formed. The second electrode 1208 can be formed in a similar manner to the first electrode 1206. A light emitting element 1209 having the first electrode 1206, the electroluminescent layer 1207, and the second electrode 1208 can be formed.

At this time, since the first electrode 1206 and the second electrode 1208 each have a light-transmitting property, light can be emitted in both directions from the electroluminescent layer 1207. Such a display device which can emit light in both directions can be referred to as a dual emission display device.

Then, the insulating substrate 1201 and a counter substrate 1220 are attached to each other by a sealing material 1228. In this embodiment mode, the sealing material 1228 is provided over a part of the driver circuit portion 1218; therefore, a narrow frame can be attempted. As a matter of course, arrangement of the sealing material 1228 is not limited thereto. The sealing material 1228 may be provided on the outer side than the driver circuit portion 1218.

A space formed by the attachment is filled with an inert gas such as nitrogen and sealed, or filled with a resin material having a light-transmitting property and high hygroscopicity. Accordingly, intrusion of moisture or oxygen, which becomes one factor of deterioration of the light emitting element 1209, can be prevented. Further, a spacer may be provided to keep a space between the insulating substrate 1201 and the counter substrate 1220, and the spacer may have hygroscopicity. The spacer has a spherical shape or a columnar shape.

The counter substrate 1220 can be provided with a color filter or a black matrix. Even in a case where a single color light emitting layer, for example, a white light emitting layer is used, full-color display is possible by the color filter. Further, even in a case where a light emitting layer of each R, G, and B is used, a wavelength of light to be emitted can be controlled by providing the color filter, whereby clear display can be provided. By the black matrix, reflection of external light caused by a wiring or the like can be reduced.

Then, a first polarizing plate 1216 and a second polarizing plate 1217, which are sequentially stacked as a polarizing plate having a stacked structure 1219, are provided on the outer side of the insulating substrate 1201. A third polarizing plate 1226 and a fourth polarizing plate 1227, which are sequentially stacked as a polarizing plate having a stacked structure 1229, are provided on the outer side of the counter substrate 1220. In other words, the polarizing plate having a stacked structure 1219 and the polarizing plate having a stacked structure 1229 are provided on the outer side of the insulating substrate 1201 and on the outer side of the counter substrate 1220, respectively.

At this time, the polarizing plate 1216 and the polarizing plate 1217 are attached to each other so as to be in a parallel Nicols state. The polarizing plate 1226 and the polarizing plate 1227 are also attached to each other so as to be in a parallel Nicols state.

Further, the polarizing plate having a stacked structure 1219 and the polarizing plate having a stacked structure 1229 are arranged to be in a crossed Nicols state.

Consequently, black luminance can be decreased, and the contrast ratio can be increased.

The structure in which polarizing plates are stacked as shown in FIG. 2A is used as a polarizer in this embodiment mode. Naturally, the stacked polarizers shown in FIG. 2B and FIG. 2C may also be used.

The wavelength distributions of extinction coefficients of the polarizing plate 1216 and the polarizing plate 1217 are different. The wavelength distributions of extinction coefficients of the polarizing plate 1226 and the polarizing plate 1227 are different.

FIG. 23 shows an example in which two polarizing plates are stacked for one substrate; however, three or more polarizing plates may be stacked.

In this embodiment mode, a mode is shown, in which the driver circuit portion is also formed over the insulating substrate 1201. However, an IC circuit formed from a silicon wafer may be used for the driver circuit portion. In this case, an image signal or the like from the IC circuit can be inputted to the switching thin film transistor 1203 through a connecting terminal or the like.

Note that this embodiment mode is described using an active display device. However, stacked polarizing plates can be provided even in a passive display device. Accordingly, a contrast ratio can be increased.

In addition, this embodiment mode can be freely combined with other embodiment modes and other examples in this specification, if necessary.

Embodiment Mode 18

Embodiment Mode 18 will describe a concept of a display device of the present invention. In this embodiment mode, the display device uses an electroluminescent element as a light emitting element.

Figure 24:
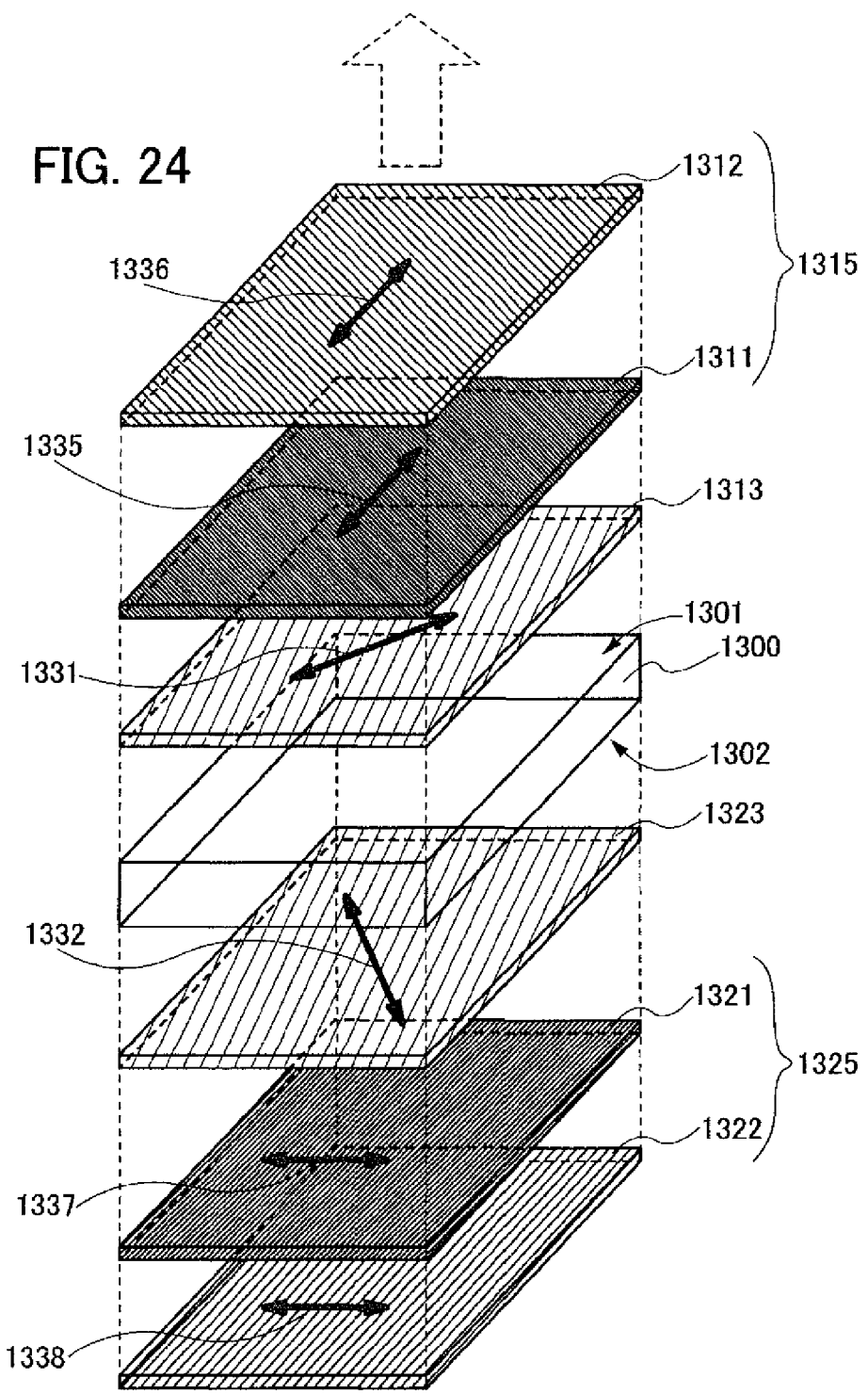
FIG. 24 is a diagram showing a display device according to the present invention.

As shown in FIG. 24, a layer 1300 including an electroluminescent element is interposed between a first substrate 1301 and a second substrate 1302 arranged to be opposite to each other. Light from the electroluminescent element can be emitted to the first substrate 1301 side and the second substrate 1302 side (in directions indicated by dashed arrows).

Light-transmitting substrates are used for the first substrate 1301 and the second substrate 1302. As such light-transmitting substrate, for example, a glass substrate such as barium borosilicate glass or alumino borosilicate glass, a quartz substrate, or the like can be used. Further, a substrate formed from a synthetic resin having flexibility such as plastic typified by polyethylene-terephthalate (PET), polyethylene naphthalate (PEN), polyethersulfone (PES), or polycarbonate (PC), or acrylic can be used for the light-transmitting substrate.

A retardation plate and stacked polarizers are provided on the outer sides of the first substrate 1301 and the second substrate 1302, namely on the sides which are not in contact with the layer 1300 including the electroluminescent element from the first substrate 1301 and the second substrate 1302, respectively. In this embodiment mode, as the structure of the stacked polarizers, polarizing plates each including one polarizing film shown in FIG. 2A are stacked. Needless to say, the structures shown in FIGS. 2B and 2C may also be used. Light is circularly polarized by the retardation plate and linearly polarized by the polarizing plate. That is, the stacked polarizers can be referred to as a linear polarizer having a stacked structure. The stacked polarizers indicate a state where two or more polarizers are stacked.

A first retardation plate 1313, and a first polarizing plate 1311 and a second polarizing plate 1312, which are stacked as a polarizing plate having a stacked structure 1315, are sequentially provided on the outer side of the first substrate 1301. In this embodiment mode, quarter-wave plates are used as the retardation plate 1313 and a retardation plate 1323 which is described later.

The retardation plate and the stacked polarizing plates are also collectively referred to as a circularly polarizing plate having stacked polarizing plates (linear polarizing plates). The first polarizing plate 1311 and the second polarizing plate 1312 are arranged in such a way that an absorption axis 1335 of the first polarizing plate 1311 and an absorption axis 1336 of the second polarizing plate 1312 should be parallel. In other words, the first polarizing plate 1311 and the second polarizing plate 1312 are arranged to be in a parallel Nicols state.

A slow axis 1331 of the retardation plate 1313 is arranged to be shifted from the absorption axis 1335 of the first polarizing plate 1311 and the absorption axis 1336 of the second polarizing plate 1312 by 45°.

Figure 25A:
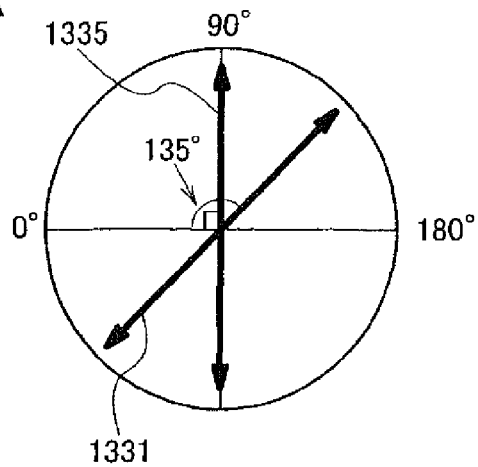
FIGS. 25A to 25C are diagrams each showing angular deviation between polarizers according to the present invention.

FIG. 25A shows angular deviation between the absorption axis 1335 (and the absorption axis 1336) and the slow axis 1331. The angle formed by the slow axis 1331 and the transmission axes of the stacked polarizing plates 1315 is 135° and the angle formed by the absorption axis 1335 (and the absorption axis 1336) and the transmission axes of the stacked polarizing plates 1315 is 90°, which means the slow axis and the absorption axes are shifted from each other by 45°.

The second retardation plate 1323, and a third polarizing plate 1321 and a fourth polarizing plate 1322, which are stacked as a polarizing plate having a stacked structure 1325, are sequentially provided on the outer side of the second substrate 1302. The retardation plate and the stacked polarizing plates are also referred to as a circularly polarizing plate having stacked polarizing plates. An absorption axis 1337 of the third polarizing plate 1321 and an absorption axis 1338 of the fourth polarizing plate 1322 are arranged to be parallel to each other. In other words, the third polarizing plate 1321 and the fourth polarizing plate 1322 are arranged to be in a parallel Nicols state.

A slow axis 1332 of the retardation plate 1323 is arranged to be shifted from the absorption axis 1337 of the third polarizing plate 1321 and the absorption axis 1338 of the fourth polarizing plate 1322 by 45°.

Figure 25B:
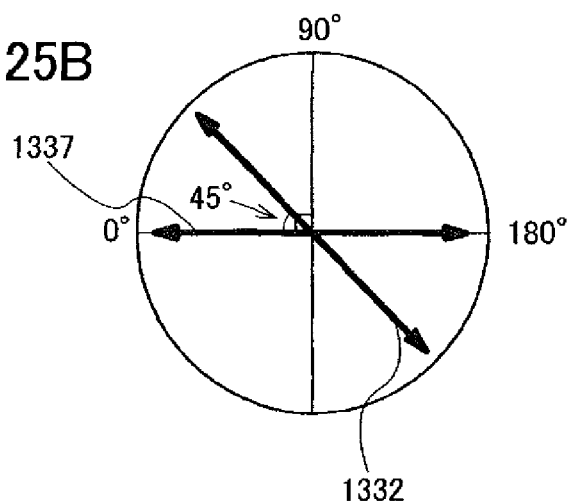

FIG. 25B shows angular deviation between the absorption axis 1337 (and the absorption axis 1338) and the slow axis 1332. The angle formed by the slow axis 1332 and the transmission axes of the stacked polarizing plates 1315 is 45° and the angle formed by the absorption axis 1337 (and the absorption axis 1338) and the transmission axes of the stacked polarizing plates 1315 is 0°, which means the slow axis and the absorption axes are shifted from each other by 45°. In other words, the slow axis 1331 of the first retardation plate 1313 is arranged to be shifted by 45° from the absorption axis 1335 of the first linear polarizing plate 1311 (and the absorption axis 1336 of the second linear polarizing plate 1312). The slow axis 1332 of the second retardation plate 1323 is arranged to be shifted by 45° from the absorption axis 1337 of the third linear polarizing plate 1321 (and the absorption axis 1338 of the fourth linear polarizing plate 1322).

In this embodiment mode, the absorption axis 1335 (and the absorption axis 1336) of the polarizing plate having a stacked structure 1315 provided over the first substrate 1301 and the absorption axis 1337 (and the absorption axis 1338) of the polarizing plate having a stacked structure 1325 provided under the second substrate 1302 are orthogonal to each other. In other words, the polarizing plate having a stacked structure 1315 and the polarizing plate having a stacked structure 1325, namely opposite polarizing plates via the layer 1300 including an electroluminescent element, are arranged to be in a crossed Nicols state.

Figure 25C:
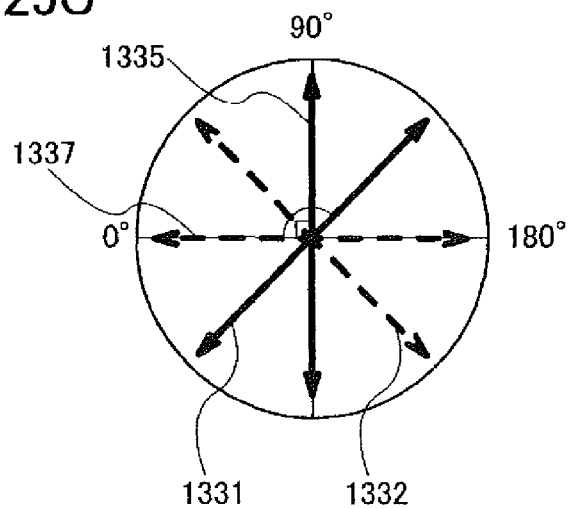

FIG. 25C shows a state where the absorption axis 1335 and the slow axis 1331 each indicated by a solid line and the absorption axis 1337 and the slow axis 1332 each indicated by a dashed line overlap with each other. FIG. 25C shows that the absorption axis 1335 and the absorption axis 1337 are orthogonal to each other, and the slow axis 1331 and the slow axis 1332 are also orthogonal to each other.

In this specification, it is assumed that the above angle condition is satisfied when an angular deviation between an absorption axis and a slow axis, an angular deviation between absorption axes, or an angular deviation between slow axes is described; however, the angular deviation between the axes may differ from the above-described angles to some extent as long as a similar effect can be obtained.

These polarizing plates 1311, 1312, 1321, and 1322 can be formed from a known material. For example, a structure can be used, in which an adhesive surface, TAC (triacetyl cellulose), a mixed layer of PVA (polyvinyl alcohol) and a dichroic pigment, and TAC are sequentially stacked from the substrate side. As a dichroic pigment iodine and dichromatic organic dye can be cited.

Transmission axes exist in a direction orthogonal to the absorption axes based on the characteristics of the polarizing plates. Therefore, a state in which the transmission axes are parallel to each other can also be referred to as parallel Nicols.

The wavelength distributions of extinction coefficients of the polarizing plate 1311 and the polarizing plate 1312 are different from each other. The wavelength distributions of extinction coefficients of the polarizing plate 1321 and the polarizing plate 1322 are different from each other.

FIG. 24 shows an example in which two polarizing plates are stacked for one substrate; however, three or more polarizing plates may be stacked.

A fast axis exists in a direction orthogonal to the slow axis based on the characteristics of the retardation plate. Therefore, arrangement of the retardation plate and the polarizing plate can be determined using not only the slow axis but also the fast axis. In this embodiment mode, the absorption axis and the slow axis are arranged to be shifted from each other by 45°, in other words, the absorption axis and the fast axis are arranged to be shifted from each other by 135°.

As the circularly polarizing plate, a circularly polarizing plate with a widened band is given. The circularly polarizing plate with a widened band is an object in which a wavelength range in which phase difference is 90°, is widened by stacking several retardation plates. Also in this case, a slow axis of each retardation plate arranged on the outer side of the first substrate 1301 and a slow axis of each retardation plate arranged on the outer side of the second substrate 1302 may be arranged to be 90°, and opposite polarizing plates may be arranged to be in a crossed Nicols state.

In this specification, it is assumed that the above angle range is satisfied when angular deviation between absorption axes, angular deviation between an absorption axis and a slow axis, or angular deviation between slow axes is described; however, the angular deviation between the axes may differ from the above-described angles to some extent as long as a similar effect can be obtained.

Since the stacked polarizing plates are stacked to be in a parallel Nicols state, light leakage in the absorption axis direction can be reduced. Further, polarizing plates opposite to each other via a layer including an electroluminescent element are arranged to be in a crossed Nicols state. The opposite polarizing plates are arranged to be in a crossed Nicols state. Since a circularly polarizing plates each having such polarizing plates are provided, light leakage can be further reduced compared to the case in which circularly polarizing plates each having a single polarizing plate are arranged to be in a crossed Nicols state. Accordingly, the contrast ratio of the display device can be increased.

Embodiment Mode 19

Figure 26:
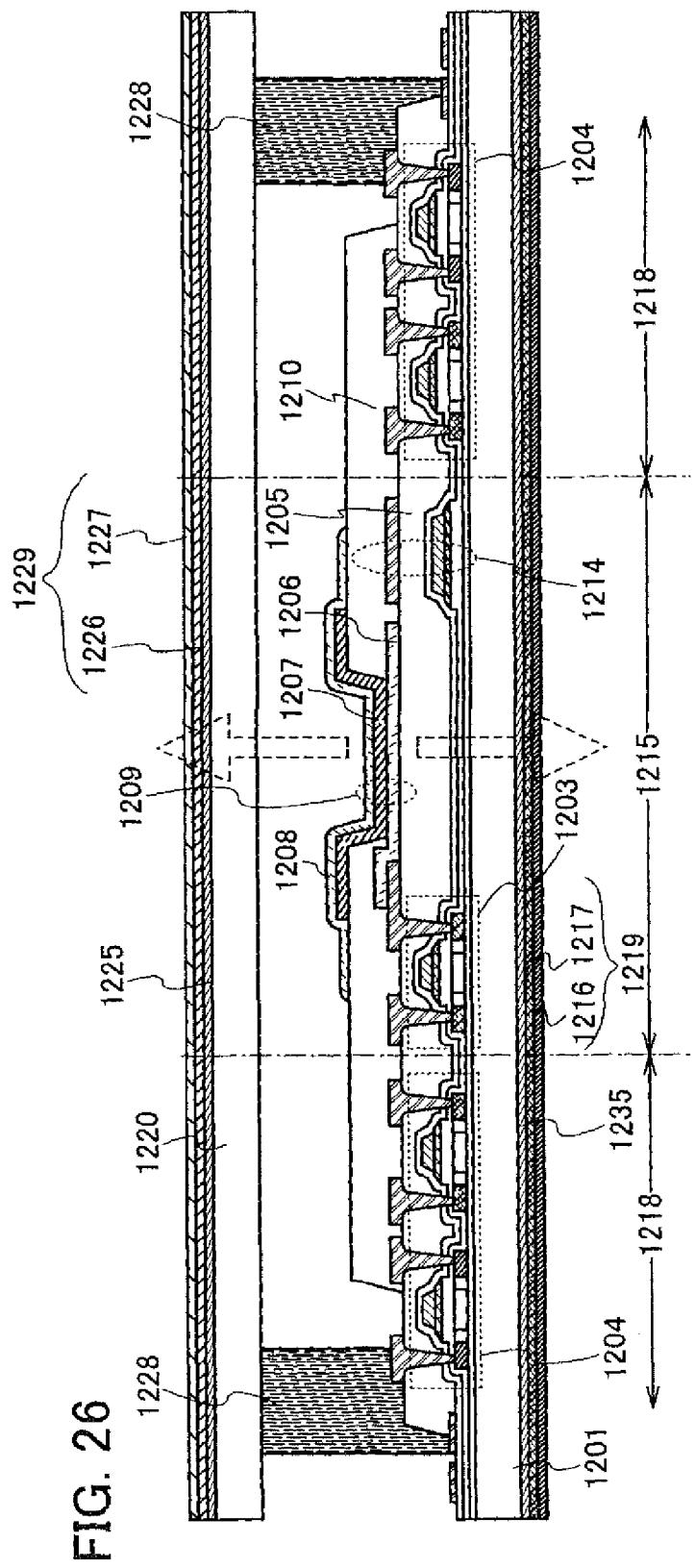
FIG. 26 is a cross sectional view of a display device according to the present invention.

Embodiment Mode 19 will exemplify a cross sectional view of a display device of the present invention with reference to FIG. 26.

Note that elements in a display device shown in FIG. 26 similar to those in FIG. 23 are denoted by the same reference numerals, and description of FIG. 23 can be applied to an element which is not particularly described.

A thin film transistor is formed over the substrate (hereinafter referred to as an insulating substrate) 1201 having an insulating surface through an insulating layer. The thin film transistor (also referred to as a TFT) includes a semiconductor layer processed in a predetermined shape, a gate insulating layer which covers the semiconductor layer, a gate electrode provided over the semiconductor layer with the gate insulating layer interposed therebetween, and a source electrode or drain electrode connected to an impurity layer in a semiconductor film. A material used for the semiconductor layer is a semiconductor material having silicon, and a crystalline state thereof may be any of amorphous, microcrystalline, and crystalline. An inorganic material is preferably used for the insulating layer typified by a gate insulating film, and silicon nitride or silicon oxide can be used. The gate electrode and the source electrode or drain electrode may be formed from a conductive material, and tungsten, tantalum, aluminum, titanium, silver, gold, molybdenum, copper, or the like is included.

The display device can be roughly divided into the pixel portion 1215 and the driver circuit portion 1218. The thin film transistor 1203 provided in the pixel portion 1215 is used as a switching element, and the thin film transistor 1204 provided in the driver circuit portion is used as a CMOS circuit. In order to use the thin film transistor 1204 as a CMOS circuit, a p-channel TFT and an N-channel TFT are included. The thin film transistor 1203 can be controlled by the CMOS circuit provided in the driver circuit portion 1218.

Note that although FIG. 26 shows a top gate type TFT as a thin film transistor, a bottom gate type TFT may be used.

The insulating layer 1205 having a stacked structure or a single layer structure is formed so as to cover the thin film transistor 1203 and the thin film transistor 1204. The insulating layer 1205 can be formed from an inorganic material or an organic material. As the inorganic material, silicon nitride or silicon oxide can be used. As the organic material, polyimide, acrylic, polyamide, polyimide amide, resist, benzocyclobutene, siloxane, polysilazane, or the like can be used. Siloxane is composed of a skeleton structure formed by the bond of silicon (Si) and oxygen (O), in which an organic group containing at least hydrogen (such as an alkyl group or an aromatic hydrocarbon) is included as a substituent. Alternatively, a fluoro group may be used as the substituent. Further alternatively, a fluoro group and an organic group containing at least hydrogen may be used as the substituent. Polysilazane is formed using a liquid material containing a polymer material having the bond of silicon (Si) and nitrogen (N) as a starting material. If the insulating layer is formed using an inorganic material, a surface thereof follows a depression/projection below. Alternatively, if the insulating layer is formed using an organic material, a surface thereof is planarized. For example, in a case where the insulating layer 1205 is required to have planarity, it is preferable that the insulating layer 1205 be formed using an organic material. Note that, even if an inorganic material is used, planarity can be obtained by thickly forming the material.

The source electrode or drain electrode is manufactured by forming a conductive layer in an opening provided in the insulating layer 1205 or the like. At this time, a conductive layer serving as a wiring over the insulating layer 1205 can be formed. The capacitor 1214 can be formed using a conductive layer of the gate electrode, the insulating layer 1205, and a conductive layer of the source electrode or drain electrode.

The first electrode 1206 to be connected to either the source electrode or drain electrode is formed. The first electrode 1206 is formed using a material having a light-transmitting property. As the material having a light-transmitting property, indium tin oxide (ITO), zinc oxide (ZnO), indium zinc oxide (IZO), zinc oxide to which gallium is added (GZO), and the like can be given. Even if a non-light transmitting material such as rare-earth metal such as Yb or Er as well as alkali metal such as Li or Cs, alkaline earth metal such as Mg, Ca, or Sr, an alloy thereof (Mg:Ag, Al:Li, Mg:In, or the like), and a compound of these ($CaF_2$ or calcium nitride), is used, the first electrode 1206 can have a light-transmitting property by being formed to be extremely thin. Therefore, a non-light transmitting material may be used for the first electrode 1206.

The insulating layer 1210 is formed so as to cover an end portion of the first electrode 1206. The insulating layer 1210 can be formed in a similar manner to the insulating layer 1205. An opening is provided in the insulating layer 1210 to cover the end portion of the first electrode 1206. An end surface of the opening may have a tapered shape, whereby disconnection of a layer to be formed later can be prevented. For example, in a case where a non-photosensitive resin or a photosensitive resin is used for the insulating layer 1210, a tapered shape can be provided in a side surface of the opening in accordance with an exposure condition.

After that, the electroluminescent layer 1207 is formed in the opening of the insulating layer 1210. The electroluminescent layer 1207 includes a layer including each function, specifically, a hole injecting layer, a hole transporting layer, a light emitting layer, an electron transporting layer, and an electron injecting layer. A boundary of each layer is not necessarily clear, and there may be a case where a part of the boundary is mixed.

A specific material for forming the light emitting layer is exemplified hereinafter. When reddish emission is desired to be obtained, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidin-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonate) (abbreviation: Ir[Fdpq]$_2$(acac)), or the like can be used for the light emitting layer. However, it is not limited to these materials, and a substance which exhibits emission with a peak from 600 nm to 700 nm in an emission spectrum can be used.

When greenish emission is desired to be obtained, N,N'-dimethylquinacridone (abbreviation: DMQd), coumarin 6, coumarin 545T, tris(8-quinolinolato)aluminum (abbreviation: Alq$_3$), or the like can be used for the light emitting layer. However, it is not limited to these materials, and a substance which exhibits emission with a peak from 500 nm to 600 nm in an emission spectrum can be used.

When bluish emission is desired to be obtained, 9,10-bis (2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), or the like can be used for the light emitting layer. However, it is not limited to these materials, and a substance which exhibits emission with a peak from 400 nm to 500 nm in an emission spectrum can be used.

When whitish emission is desired to be obtained, a structure can be used, in which TPD (aromatic diamine), 3-(4-tert-butylphenyl)-4-phenyl-5-(4-biphenylyl)-1,2,4-triazole (abbreviation: TAZ), tris(8-quinolinolato)aluminum (abbreviation: Alq$_3$), Alq$_3$ doped with Nile Red which is a red light emitting pigment, and Alq$_3$ are stacked by an evaporation method or the like.

Then, the second electrode 1208 is formed. The second electrode 1208 can be formed in a similar manner to the first electrode 1206. The light emitting element 1209 having the first electrode 1206, the electroluminescent layer 1207, and the second electrode 1208 can be formed.

At this time, since the first electrode 1206 and the second electrode 1208 each have a light-transmitting property, light can be emitted in both directions from the electroluminescent layer 1207. Such a display device which can emit light in both directions can be referred to as a dual emission display device.

Then, the insulating substrate 1201 and the counter substrate 1220 are attached to each other by the sealing material 1228. In this embodiment mode, the sealing material 1228 is provided over a part of the driver circuit portion 1218; therefore, a narrow frame can be attempted. As a matter of course, arrangement of the sealing material 1228 is not limited thereto. The sealing material 1228 may be provided on the outer side than the driver circuit portion 1218.

A space formed by the attachment is filled with an inert gas such as nitrogen and sealed, or filled with a resin material having a light-transmitting property and high hygroscopicity. Accordingly, intrusion of moisture or oxygen, which becomes one factor of deterioration of the light emitting element 1209, can be prevented. Further, a spacer may be provided to keep a space between the insulating substrate 1201 and the counter substrate 1220, and the spacer may have hygroscopicity. The spacer has a spherical shape or a columnar shape.

The counter substrate 1220 can be provided with a color filter or a black matrix. Even in a case where a single color light emitting layer, for example, a white light emitting layer is used, full-color display is possible by the color filter. Further, even in a case where a light emitting layer of each R, G, and B is used, a wavelength of light to be emitted can be controlled by providing the color filter, whereby clear display can be provided. By the black matrix, reflection of external light caused by a wiring or the like can be reduced.

Then, a first retardation plate 1235, and the first polarizing plate 1216 and the second polarizing plate 1217, which are sequentially stacked as the polarizing plate 1219 having a stacked structure, are provided on the outer side of the insulating substrate 1201. A second retardation plate 1225, and the third polarizing plate 1226 and the fourth polarizing plate 1227, which are sequentially stacked as the polarizing plate having a stacked structure 1229, are provided on the outer side of the counter substrate 1220. In other words, a circularly polarizing plate having stacked polarizing plates is provided on the outer side of the insulating substrate 1201 and on the outer side of the counter substrate 1220.

At this time, the polarizing plate 1216 and the polarizing plate 1217 are attached to each other so as to be in a parallel Nicols state. The polarizing plate 1226 and the polarizing plate 1227 are also attached to each other so as to be in a parallel Nicols state.

Further, the polarizing plate having a stacked structure 1219 and the polarizing plate having a stacked structure 1229 are arranged to be in a crossed Nicols state.

Consequently, black luminance can be decreased, and the contrast ratio of the display device can be increased.

Since the retardation plate 1235 and the retardation plate 1225 are provided, reflected light of external light for a display device can be suppressed.

A structure in which polarizing plates are stacked as shown in FIG. 2A is used as a polarizer in this embodiment mode. Naturally, the stacked polarizers shown in FIG. 2B and FIG. 2C may also be used.

The wavelength distribution of extinction coefficients of the polarizing plate 1216 and the polarizing plate 1217 are different. The wavelength distribution of extinction coefficients of the polarizing plate 1226 and the polarizing plate 1227 are different.

FIG. 26 shows an example in which two polarizing plates are stacked for one substrate; however, three or more polarizing plates may be stacked.

In this embodiment mode, a mode is shown, in which the driver circuit portion is also formed over the insulating substrate 1201. However, an IC circuit formed from a silicon wafer may be used for the driver circuit portion. In this case, an image signal or the like from the IC circuit can be inputted to the switching TFT 1203 through a connecting terminal or the like.

This embodiment mode is described using an active display device. However, a circularly polarizing plate having stacked polarizing plates can be provided even in a passive display device. Accordingly, a contrast ratio can be increased.

In addition, this embodiment mode can be freely combined with other embodiment modes, if necessary.

Embodiment Mode 20

Embodiment Mode 20 will describe a concept of a display device of the present invention. In this embodiment mode, the display device uses an electroluminescent element as a light emitting element.

Figure 27A:
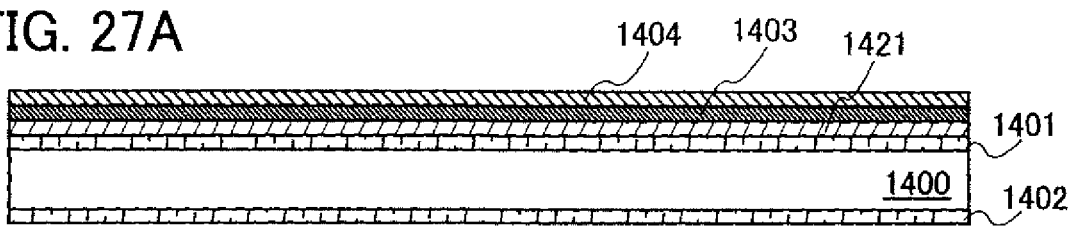
FIGS. 27A and 27B are diagrams showing a display device according to the present invention.
Figure 27B:
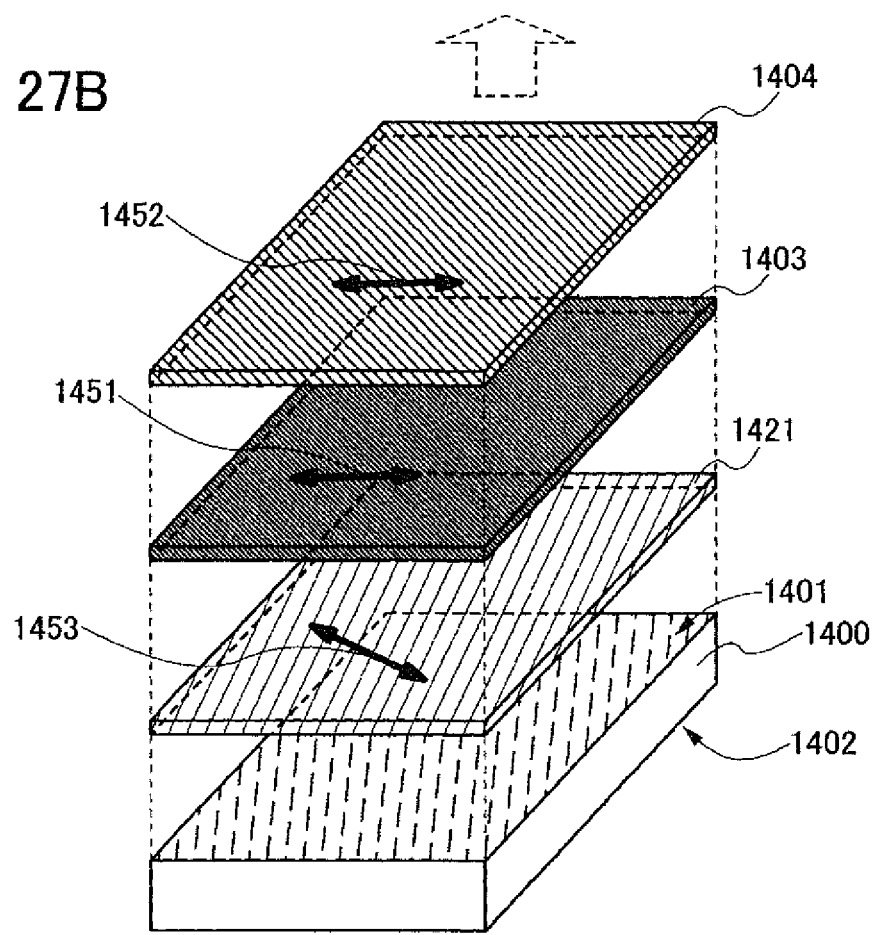

FIGS. 27A and 27B show a display device in which light from a light emitting element is emitted to the upper side of a substrate (light is emitted upwardly). As shown in FIGS. 27A and 27B, a layer 1400 including an electroluminescent element as a light emitting element is interposed between a first substrate 1401 and a second substrate 1402 arranged to be opposite to each other. Light from the electroluminescent element can be emitted to the first substrate 1401 side (in a direction indicated by a dashed arrow).

A light-transmitting substrate is used for the first substrate 1401. As such light-transmitting substrate, for example, a glass substrate such as barium borosilicate glass or alumino borosilicate glass, a quartz substrate, or the like can be used.

Further, a substrate formed from a synthetic resin having flexibility such as plastic typified by polyethylene-terephthalate (PET), polyethylene naphthalate (PEN), polyethersulfone (PES), or polycarbonate (PC), or acrylic can be used for the light-transmitting substrate.

Although a light-transmitting substrate may be used for the second substrate 1402, light from the layer 1400 including the electroluminescent element is not emitted through the second substrate 1402 because an electrode which is provided in the layer 1400 including the electroluminescent element is formed using a conductive film having a reflective property, or a material having a reflective property is formed on an entire surface of the second substrate 1402 so that light from the layer 1400 including the electroluminescent element should be reflected on the second substrate 1402 side and emitted toward the first substrate 1401 side, as is described later.

A retardation plate (also referred to as a wave plate) and stacked polarizers are provided on the outer side of a surface of the first substrate 1401 to which light is emitted. The stacked polarizers can be referred to as stacked linear polarizers. The stacked polarizers indicate a state where two or more polarizers are stacked. In this embodiment mode, as the structure of the stacked polarizers, polarizing plates each including one polarizing film shown in FIG. 2A are stacked. Needless to say, the structures shown in FIGS. 2B and 2C may also be used.

FIGS. 27A and 27B show an example in which two polarizing plates are provided; however, three or more polarizing plates may be stacked.

The retardation plate (in this embodiment mode, a quarter-wave plate) and the stacked polarizing plates are also collectively referred to as a circularly polarizing plate having stacked polarizing plates (linear polarizing plates).

A first polarizing plate 1403 and a second polarizing plate 1404 are arranged in such a way that an absorption axis 1451 of the first polarizing plate 1403 and an absorption axis 1452 of the second polarizing plate 1404 should be parallel. In other words, the first polarizing plate 1403 and the second polarizing plate 1404 are arranged to be in a parallel Nicols state. A slow axis 1453 of a retardation plate 1421 is arranged to be shifted from the absorption axis 1451 of the first polarizing plate 1403 and the absorption axis 1452 of the second polarizing plate 1404 by 45°.

Figure 28:
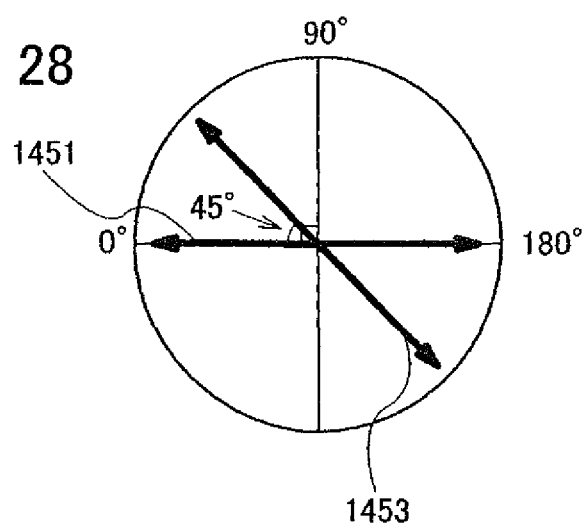
FIG. 28 is a diagram showing angular deviation between polarizers according to the present invention.

FIG. 28 shows angular deviation between the absorption axis 1451 and the slow axis 1453. The angle formed by the slow axis 1453 and the absorption axis 1451 is 45°. Since the absorption axis 1452 is in the same direction as the absorption axis 1451, the explanation with respect to the absorption axis 1452 is omitted here. In other words, the slow axis 1453 of the retardation plate 1421 is arranged to be shifted by 45° from the absorption axis 1451 of the first linear polarizing plate 1403.

The polarizing plate 1403 and the polarizing plate 1404 can be formed of a known material. For example, a structure can be used, in which an adhesive surface, TAC (triacetyl cellulose), a mixed layer of PVA (polyvinyl alcohol) and a dichroic pigment, and TAC are sequentially stacked from the substrate side. As a dichroic pigment iodine and dichromatic organic dye can be cited.

Transmission axes exist in a direction orthogonal to the absorption axes based on the characteristics of the polarizing plates. Therefore, a state in which the transmission axes are parallel to each other can also be referred to as parallel Nicols.

The wavelength distributions of extinction coefficients of the polarizing plate 1403 and the polarizing plate 1404 are different from each other.

FIGS. 27A and 27B show an example in which two polarizing plates are stacked for one substrate; however, three or more polarizing plates may be stacked.

A fast axis exists in a direction orthogonal to the slow axis based on the characteristics of the retardation plate. Therefore, arrangement of the retardation plate and the polarizing plate can be determined using not only the slow axis but also the fast axis. In this embodiment mode, the absorption axis and the slow axis are arranged to be shifted from each other by 45°, in other words, the absorption axis and the fast axis are arranged to be shifted from each other by 135°.

In this specification, it is assumed that the above angle condition is satisfied when angular deviation between absorption axes or angular deviation between an absorption axis and a slow axis is described; however, the angular deviation between the axes may differ from the above-described angles to some extent as long as a similar effect can be obtained.

Since the stacked polarizing plates are stacked to be in a parallel Nicols state, reflected light of external light can be reduced, compared to the case of using a singular polarizing plate. Accordingly, black luminance can be decreased, and the contrast ratio of the display device can be increased.

Embodiment Mode 21

Figure 29:
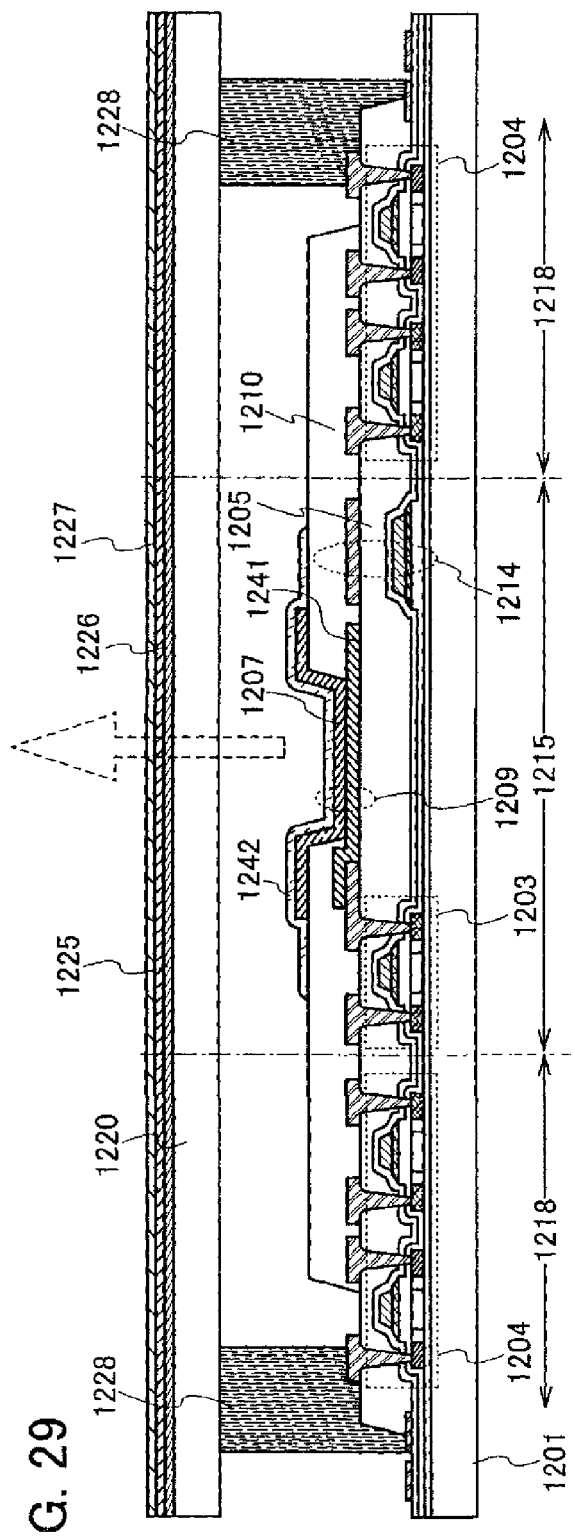
FIG. 29 is a cross sectional view of a display device according to the present invention.

Embodiment Mode 21 will describe a cross sectional view of a display device of the present invention with reference to FIG. 29.

Elements in a display device shown in FIG. 29 similar to those in FIG. 26 are denoted by the same reference numerals, and description of FIG. 26 can be applied to an element which is not particularly described.

A thin film transistor is formed over the substrate (hereinafter referred to as an insulating substrate) 1201 having an insulating surface with an insulating layer interposed therebetween. The thin film transistor (also referred to as a TFT) includes a semiconductor layer processed in a predetermined shape, a gate insulating layer which covers the semiconductor layer, a gate electrode provided over the semiconductor layer with the gate insulating layer interposed therebetween, and a source electrode or drain electrode connected to an impurity layer in a semiconductor film.

A material used for the semiconductor layer is a semiconductor material having silicon, and a crystalline state thereof may be any of amorphous, microcrystalline, and crystalline.

An inorganic material is preferably used for the insulating layer typified by a gate insulating film, and silicon nitride or silicon oxide can be used. The gate electrode and the source electrode or drain electrode may be formed from a conductive material, and tungsten, tantalum, aluminum, titanium, silver, gold, molybdenum, copper, or the like is included.

The display device can be roughly divided into the pixel portion 1215 and the driver circuit portion 1218. The thin film transistor 1203 provided in the pixel portion 1215 is used as a light-emitting switching element, and the thin film transistor 1204 provided in the driver circuit portion 1218 is used as a CMOS circuit. In order to use the thin film transistor 1204 as a CMOS circuit, a p-channel TFT and an N-channel TFT are included. The thin film transistor 1203 in the pixel portion 1215 can be controlled by the CMOS circuit provided in the driver circuit portion 1218.

Note that although FIG. 29 shows a top gate type TFT which is used as the thin film transistor 1203 and the thin film transistor 1204, a bottom gate type TFT may be used.

The insulating layer 1205 having a stacked structure or a single layer structure is formed to cover the thin film transistors in the pixel portion 1215 and the driver circuit portion 1218. The insulating layer 1205 can be formed from an inorganic material or an organic material. As the inorganic material, silicon nitride or silicon oxide can be used. As the organic material, polyimide, acrylic, polyamide, polyimide amide, resist, benzocyclobutene, siloxane, polysilazane, or the like can be used.

Siloxane is composed of a skeleton structure formed by the bond of silicon (Si) and oxygen (O), in which an organic group containing at least hydrogen (such as an alkyl group or an aromatic hydrocarbon) is included as a substituent. Alternatively, a fluoro group may be used as the substituent. Further alternatively, a fluoro group and an organic group containing at least hydrogen may be used as the substituent. Polysilazane is formed using a liquid material containing a polymer material having the bond of silicon (Si) and nitrogen (N) as a starting material.

If the insulating layer 1205 is formed using an inorganic material, a surface thereof follows a depression/projection below. Alternatively, if the insulating layer is formed using an organic material, a surface thereof is planarized. For example, in a case where the insulating layer 1205 is required to have planarity, it is preferable that the insulating layer 1205 be formed using an organic material. Note that, even if an inorganic material is used, planarity can be obtained by thickly forming the material.

The source electrode or drain electrode is manufactured by forming a conductive layer in an opening provided in the insulating layer 1205 or the like. At this time, a conductive layer serving as a wiring over the insulating layer 1205 can be formed. The capacitor 1214 can be formed using a conductive layer of the gate electrode, the insulating layer 1205, and a conductive layer of the source electrode or drain electrode.

A first electrode 1241 to be connected to either the source electrode or drain electrode is formed. The first electrode 1241 is formed using a conductive film having a reflective property. As the conductive film having a reflective property, a conductive film having a high work function such as platinum (Pt) or gold (Au) is used. Since these metals are expensive, a pixel electrode may be used in which the metals are stacked over an appropriate conductive film such as an aluminum film or a tungsten film, so that platinum or gold may be exposed at least in the outermost surface.

The insulating layer 1210 is formed so as to cover an end portion of the first electrode 1241. The insulating layer 1210 can be formed in a similar manner to the insulating layer 1205. An opening is provided in the insulating layer 1210 to cover the end portion of the first electrode 1206. An end surface of the opening may have a tapered shape, whereby disconnection of a layer to be formed later can be prevented. For example, in a case where a non-photosensitive resin or a photosensitive resin is used for the insulating layer 1210, a tapered shape can be provided in a side surface of the opening in accordance with an exposure condition.

After that, the electroluminescent layer 1207 is formed in the opening of the insulating layer 1210. The electroluminescent layer 1207 includes a layer including each function, specifically, a hole injecting layer, a hole transporting layer, a light emitting layer, an electron transporting layer, and an electron injecting layer. A boundary of each layer is not necessarily clear, and there may be a case where a part of the boundary is mixed.

A specific material for forming the light emitting layer is exemplified hereinafter. When reddish emission is desired to be obtained, 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidin-9-yl)ethenyl]-4H-pyran (abbreviation: DCJT), 4-dicyanomethylene-2-tert-butyl-6-[2-(1,1,7,7-tetramethyljulolidine-9-yl)ethenyl]-4H-pyran (abbreviation: DCJTB), periflanthene, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonate) (abbreviation: Ir[Fdpq]$_2$(acac)), or the like can be used for the light emitting layer. However, it is not limited to these materials, and a substance which exhibits emission with a peak from 600 nm to 700 nm in an emission spectrum can be used.

When greenish emission is desired to be obtained, N,N'-dimethylquinacridone (abbreviation: DMQd), coumarin 6, coumarin 545T, tris(8-quinolinolato)aluminum (abbreviation: Alq$_3$), or the like can be used for the light emitting layer. However, it is not limited to these materials, and a substance which exhibits emission with a peak from 500 nm to 600 nm in an emission spectrum can be used.

When bluish emission is desired to be obtained, 9,10-bis(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), or the like can be used for the light emitting layer. However, it is not limited to these materials, and a substance which exhibits emission with a peak from 400 nm to 500 nm in an emission spectrum can be used.

When whitish emission is desired to be obtained, a structure can be used, in which TPD (aromatic diamine), 3-(4-tert-butylphenyl)-4-phenyl-5-(4-biphenylyl)-1,2,4-triazole (abbreviation: TAZ), tris(8-quinolinolato)aluminum (abbreviation: Alq$_3$), Alq$_3$ doped with Nile Red which is a red light emitting pigment, and Alq$_3$ are stacked by an evaporation method or the like.

Then, a second electrode 1242 is formed. The second electrode 1242 is formed by staking a conductive film having a light-transmitting property over a conductive film which has a low work function and a thin film thickness (preferably 10 to 50 nm). The conductive film having a low work function is formed from a material containing an element which belongs to Group 1 or Group 2 of the periodic table (for example, Al, Mg, Ag, Li, Ca, or an alloy thereof such as MgAg, MgAgAl, MgIn, LiAl, LiFAl, CaF$_2$, or Ca$_3$N$_2$). The conductive film having a transmitting property is formed using indium tin oxide (ITO), zinc oxide (ZnO), indium zinc oxide, zinc oxide to which gallium is added (GZO), or the like.

In addition, an alkali metal such as Li or Cs, an alkaline earth metal such as Mg, Ca, or Sr, an alloy thereof (Mg:Ag, Al:Li, Mg:In, or the like), and a compound of these (CaF$_2$, calcium nitride) may also be used. Furthermore, a material with a non-light-transmitting property such as a rare-earth metal such as Yb or Er, may be used for the second electrode 1242 as long as a light-transmitting property can be obtained by making the film thickness very thin.

In this way, the light emitting element 1209 which has the first electrode 1241 and the second electrode 1242, which are a pair of electrodes, and the electroluminescent layer 1207 provided between the pair of electrodes can be formed.

At this time, since the second electrode 1242 has a light-transmitting property, light can be emitted upwardly from the electroluminescent layer 1207.

Then, the insulating substrate 1201 and the counter substrate 1220 are attached to each other by the sealing material 1228. In this embodiment mode, the sealing material 1228 is provided over a part of the driver circuit portion 1218; therefore, a narrow frame can be attempted. As a matter of course, arrangement of the sealing material 1228 is not limited thereto. The sealing material 1228 may be provided on the outer side than the driver circuit portion 1218.

A space formed by the attachment is filled with an inert gas such as nitrogen and sealed, or filled with a resin material having a light-transmitting property and high hygroscopicity. Accordingly, intrusion of moisture or oxygen, which becomes one factor of deterioration of the light emitting element 1209, can be prevented. Further, a spacer may be provided to keep a space between the insulating substrate 1201 and the counter substrate 1220, and the spacer may have hygroscopicity. The spacer has a spherical shape or a columnar shape.

The counter substrate 1220 can be provided with a color filter or a black matrix. Even in a case where a single color light emitting layer, for example, a white light emitting layer is used, full-color display is possible by the color filter. Further, even in a case where a light emitting layer of each R, G, and B is used, a wavelength of light to be emitted can be controlled by providing the color filter, whereby clear display can be provided. By the black matrix, reflection of external light caused by a wiring or the like can be reduced.

Then, the retardation plate 1225, the first polarizing plate 1226, and the second polarizing plate 1227 are provided on the outer side of the counter substrate 1220 to which light from the light emitting element is emitted. In other words, a circularly polarizing plate having the stacked polarizing plates is provided on the outer side of the counter substrate 1220.

At this time, the polarizing plate 1226 and the polarizing plate 1227 are attached to each other so as to be in a parallel Nicols state.

Consequently, light leakage of external light can be suppressed, so that black luminance can be decreased, and the contrast ratio of the display device can be increased.

Since the retardation plate 1225 is provided, reflected light of external light from a display device can be suppressed.

The retardation plate 1225 may be provided similarly to the retardation plate 1421 described in Embodiment Mode 20, and the first polarizing plate 1226 and the second polarizing plate 1227 may also be provided similarly to the polarizing plate 1403 and the polarizing plate 1404. In this embodiment mode, only two polarizing plates are provided; however, three or more polarizing plates may be stacked.

A structure in which polarizing plates are stacked as shown in FIG. 2A is used as a polarizer in this embodiment mode. Naturally, the stacked polarizers shown in FIG. 2B and FIG. 2C may also be used.

The wavelength distributions of extinction coefficients of the polarizing plate 1226 and the polarizing plate 1227 are different from each other.

In this embodiment mode, a mode is shown, in which the driver circuit portion is also formed over the (same) insulating substrate 1201. However, an IC circuit formed from a silicon wafer may be used for the driver circuit portion. In this case, an image signal or the like from the IC circuit can be inputted to the switching TFT 1203 through a connecting terminal or the like.

This embodiment mode is described using an active display device. However, a circularly polarizing plate having stacked polarizing plates can be provided even in a passive display device. Accordingly, a contrast ratio can be increased.

In addition, this embodiment mode can be freely combined with other embodiment modes, if necessary.

Embodiment Mode 22

Embodiment Mode 22 will describe a concept of a display device of the present invention. In this embodiment mode, the display device uses an electroluminescent element as a light emitting element.

Figure 30A:
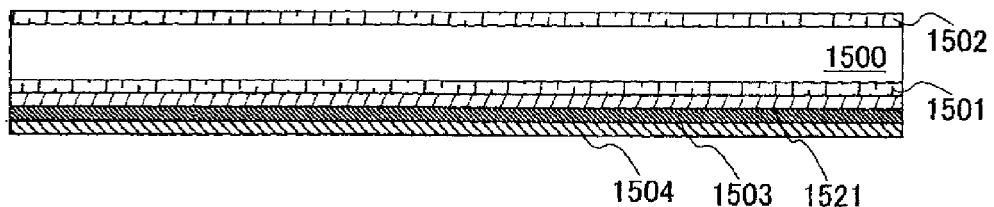
FIGS. 30A and 30B are diagrams showing a display device according to the present invention.
Figure 30B:
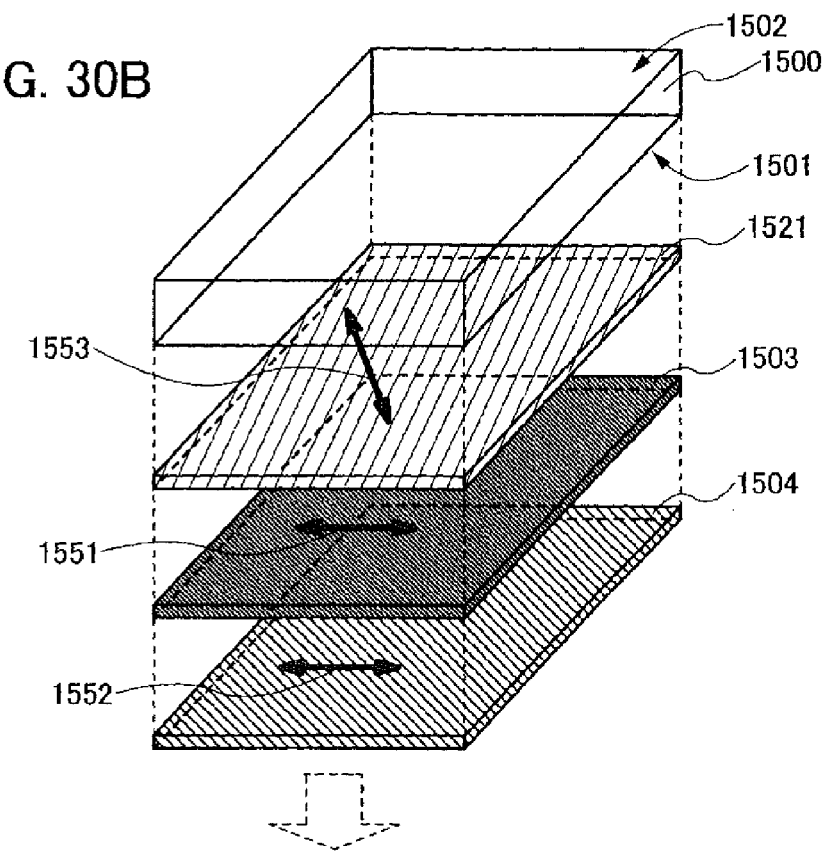

FIGS. 30A and 30B show a display device in which light from a light emitting element is emitted to the lower side of a substrate (light is emitted downwardly). As shown in FIGS. 30A and 30B, a layer 1500 including an electroluminescent element as a light emitting element is interposed between a first substrate 1501 and a second substrate 1502 arranged to be opposite to each other. Light from the electroluminescent element can be emitted to the first substrate 1501 side (in a direction indicated by a dashed arrow).

A light-transmitting substrate is used for the first substrate 1501. As such a light-transmitting substrate, a material similar to the substrate 1401 in Embodiment Mode 20 may be used.

Although a light-transmitting substrate may be used for the second substrate 1502, light from the layer 1500 including the electroluminescent element is not emitted through the second substrate 1502 because an electrode which is provided in the layer 1500 including the electroluminescent element may be formed using a conductive film having a reflective property, or a material having a reflective property is formed on an entire surface of the second substrate 1502 so that light from the layer 1500 including the electroluminescent element be reflected to the first substrate 1501 side, as is described later.

A retardation plate (also referred to as a wave plate) and stacked polarizers are provided on the outer side of a surface to which light of the first substrate 1501 is emitted.

The structure in which polarizing plates are stacked as shown in FIG. 2A is used as a polarizer in this embodiment mode. Naturally, the stacked polarizers shown in FIG. 2B and FIG. 2C may also be used.

The retardation plate (in this embodiment mode, a quarter-wave plate) and the stacked polarizing plates are also collectively referred to as a circularly polarizing plate having stacked polarizing plates (linear polarizing plates). In this embodiment mode, only two polarizing plates are provided; however, three or more polarizing plates may be stacked.

A first polarizing plate 1503 and a second polarizing plate 1504 are arranged in such a way that an absorption axis 1551 of the first polarizing plate 1503 and an absorption axis 1552 of the second polarizing plate 1504 should be parallel to each other. In other words, the first polarizing plate 1503 and the second polarizing plate 1504 are arranged to be in a parallel Nicols state. A slow axis 1553 of a retardation plate 1521 is arranged to be shifted from the absorption axis 1551 of the first polarizing plate 1503 and the absorption axis 1552 of the second polarizing plate 1504 by 45°.

In this specification, it is assumed that the above angle range is satisfied when angular deviation between absorption axes or angular deviation between an absorption axis and a slow axis is described; however, the angular deviation between the axes may differ from the above-described angles to some extent as long as a similar effect can be obtained.

For the polarizing plate 1503 and the polarizing plate 1504, a similar material to the polarizing plate 1403 and the polarizing plate 1404 in Embodiment Mode 20 may be used.

The wavelength distribution of extinction coefficients of the polarizing plate 1503 and the polarizing plate 1504 are different from each other.

In addition, a positional relationship between the absorption axis 1551 of the polarizing plate 1503, the absorption axis 1552 of the polarizing plate 1504, and the slow axis 1553 of the retardation plate 1521 is similar to that of Embodiment Mode 20 (see FIG. 28).

In the display device in which light is emitted to the lower side of a substrate (light is emitted downwardly) described in this embodiment mode, reflected light of external light can be reduced by stacking the polarizing plates to be in a parallel Nicols state, compared to the case of a singular polarizing plate. Accordingly, black luminance can be decreased, and the contrast ratio of the display device can be increased.

In addition, this embodiment mode can be freely combined with other embodiment modes, if necessary.

Embodiment Mode 23

Figure 31:
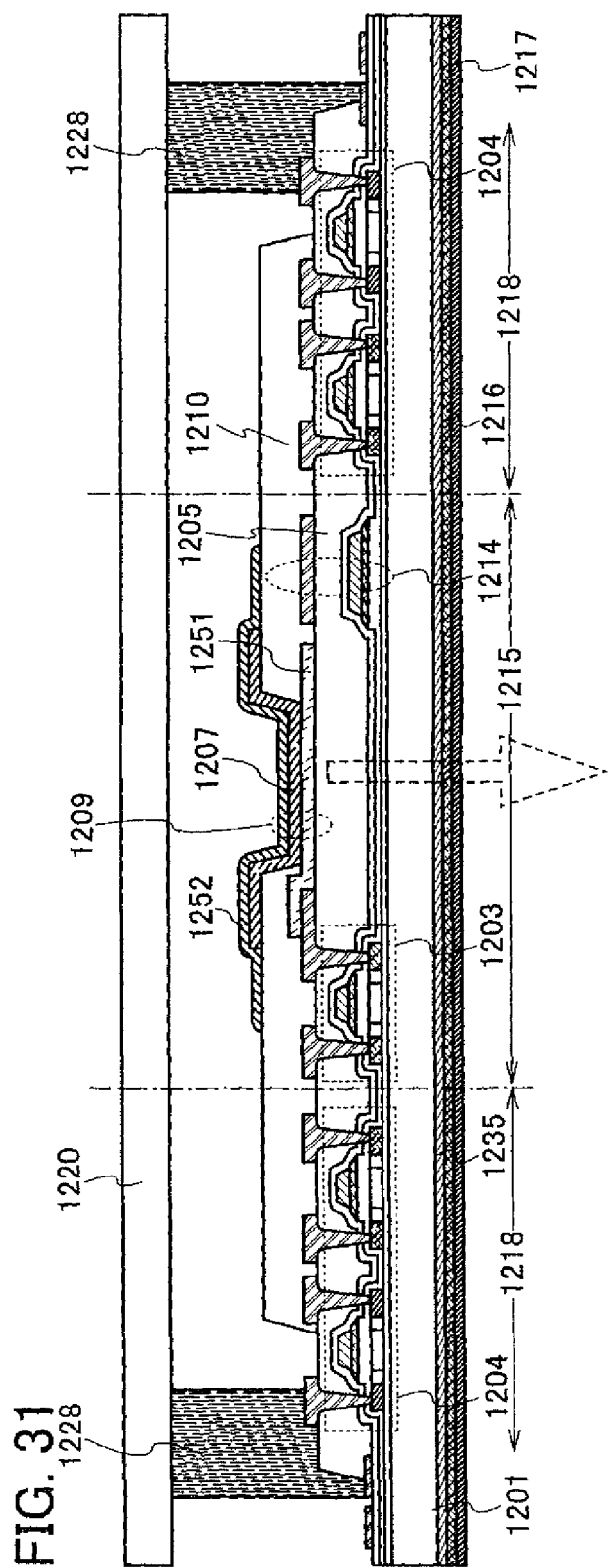
FIG. 31 is a cross sectional view of a display device according to the present invention.

FIG. 29 shows the display device in which light is emitted to the side opposite to the substrate provided with the thin film transistor (light is emitted upwardly), while FIG. 31 shows a display device in which light is emitted to the substrate side provided with a thin film transistor (light is emitted downwardly).

Elements in FIG. 31 similar to those in FIG. 29 are denoted by the same reference numerals. A display device in FIG. 31 includes a first electrode 1251, the electroluminescent layer 1207, and a second electrode 1252. The first electrode 1251 may be formed using the same material as that of the second electrode 1242 in FIG. 29. The second electrode 1252 may be formed using the same material as that of the first electrode 1241 in FIG. 29. The electroluminescent layer 1207 may be formed using a material similar to the electroluminescent layer 1207 in Embodiment Mode 3. Since the first electrode 1251 has a light-transmitting property, light can be emitted downwardly from the electroluminescent layer 1207.

The retardation plate 1235, the first polarizing plate 1216, and the second polarizing plate 1217 are provided on the outer side of the substrate 1201 to which light from the light emitting element is emitted. In other words, a circularly polarizing plate having stacked polarizing plates is provided on the outer side of the substrate 1201. Consequently, a display device having a high contrast ratio can be obtained. The retardation plate 1235 may be provided similarly to the retardation plate 1521 described in Embodiment Mode 22, and the first polarizing plate 1216 and the second polarizing plate 1217 may also be provided similarly to the polarizing plate 1503 and the polarizing plate 1504. In this embodiment mode, only two polarizing plates are provided; however, three or more polarizing plates may be stacked.

The wavelength distributions of extinction coefficients of the polarizing plate 1216 and the polarizing plate 1217 are different from each other.

In addition, this embodiment mode can be freely combined with other embodiment modes, if necessary.

Embodiment Mode 24

Embodiment Mode 24 will describe a structure of a display device having the pixel portion and the driver circuit in Embodiment Mode 16 to Embodiment Mode 23.

Figure 32:
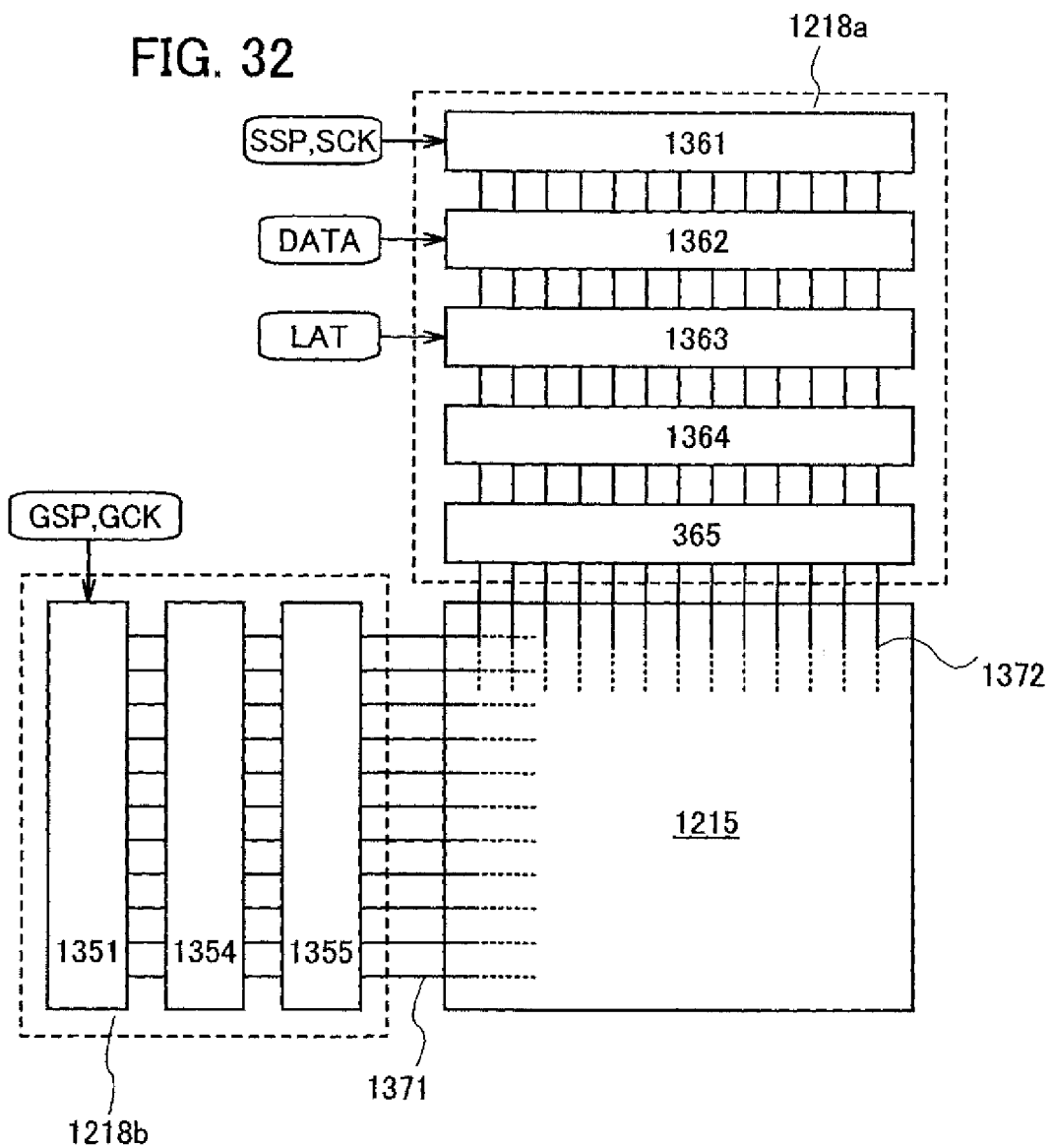
FIG. 32 is a block diagram showing a display device according to the present invention.

FIG. 32 shows a block diagram of a state where a scanning line driver circuit portion 1218b and a signal line driver circuit portion 1218a which are the driver circuit portion 1218 are provided in the periphery of the pixel portion 1215.

The pixel portion 1215 has a plurality of pixels, and the pixel is provided with a light emitting element and a switching element.

The scanning line driver circuit portion 1218b has a shift register 1351, a level shifter 1354, and a buffer 1355. A signal is produced based on a start pulse (GSP) and a clock pulse (GCK) inputted to the shift register 1351, and is inputted to the buffer 1355 through the level shifter 1354. A signal is amplified in the buffer 1355 and an amplified signal is inputted to the pixel portion 1215 through a scanning line 1371. The pixel portion 1215 is provided with a light emitting element and a switching element which selects a light emitting element, and the signal from the buffer 1355 is inputted to a gate line of the switching element. Accordingly, a switching element of a predetermined pixel is selected.

The signal line driver circuit portion 1218a includes a shift register 1361, a first latch circuit 1362, a second latch circuit 1363, a level shifter 1364, and a buffer 1365. A start pulse (SSP) and a clock pulse (SCK) are inputted to the shift register 1361. A data signal (DATA) is inputted to the first latch circuit 1362, and a latch pulse (LAT) is inputted to the second latch circuit 1363. The DATA is inputted to the second latch circuit 1363 based on the SSP and the SCK. The DATA for one row is held in the second latch circuit 1363 to be inputted all together to the pixel portion 1215 through a signal line 1372.

The signal line driver circuit portion 1218a, the scanning line driver circuit portion 1218b, and the pixel portion 1215 can be formed using a semiconductor element provided over the same substrate. For example, the signal line driver circuit portion 1218a, the scanning line driver circuit portion 1218b, and the pixel portion 1215 can be formed using a thin film transistor included in the insulating substrate described in the above embodiment modes.

An equivalent circuit diagram of a pixel included in a display device in this embodiment mode is described with reference to FIGS. 37A to 37C.

Figure 37A:
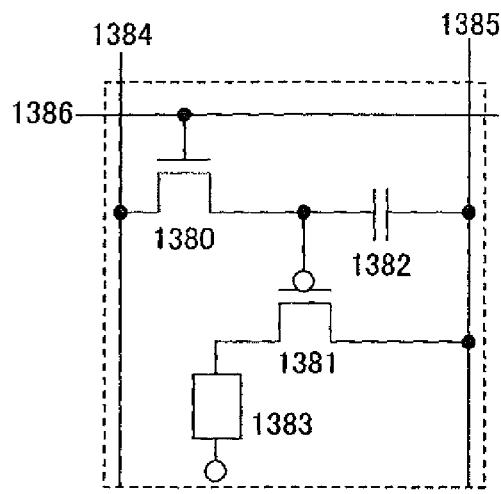
FIGS. 37A to 37C are diagrams each showing a pixel circuit included in a display device according to the present invention.

FIG. 37A shows an example of an equivalent circuit diagram of a pixel, which includes a signal line 1384, a power supply line 1385, and a scanning line 1386, and in an intersection region thereof, a light emitting element 1383, transistors 1380 and 1381, and a capacitor 1382. An image signal (also referred to as a video signal) is inputted to the signal line 1384 by a signal line driver circuit. The transistor 1380 can control supply of an electric potential of the image signal to a gate of the transistor 1381 in accordance with a selection signal inputted to the scanning line 1386. The transistor 1381 can control supply of a current to the light emitting element 1383 in accordance with an electric potential of the image signal. The capacitor 1382 can hold a voltage between the gate and a source (referred to as a gate-source voltage) of the transistor 1381. Although the capacitor 1382 is shown in FIG. 37A, the capacitor 1382 is not necessarily provided in a case where a gate capacitance of the transistor 1381 or other parasitic capacitances can serve.

Figure 37B:
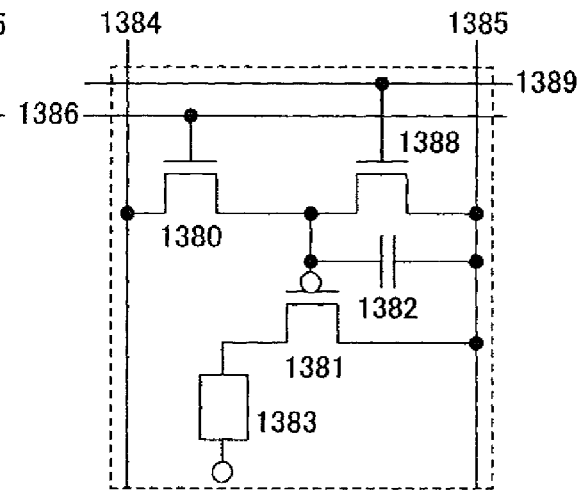

FIG. 37B is an equivalent circuit diagram of a pixel in which a transistor 1388 and a scanning line 1389 are newly provided in the pixel shown in FIG. 37A. The transistor 1388 makes it possible to make the electric potentials of the gate and source of the transistor 1381 equal to each other so that a state where no current flows in the light emitting element 1383 can be forcibly made. Therefore, a sub-frame period can be more shortened than a period during which an image signal is inputted to all pixels.

Figure 37C:
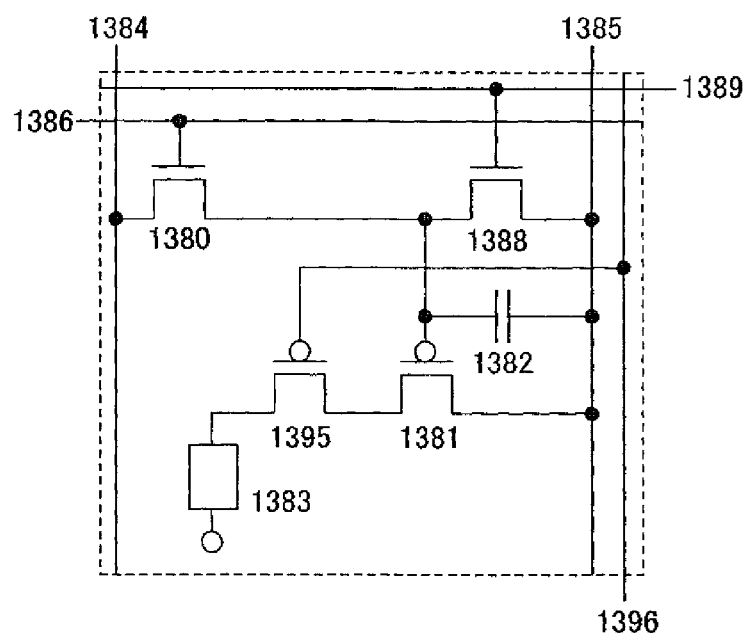

FIG. 37C is an equivalent circuit diagram of a pixel in which a transistor 1395 and a wiring 1396 are newly provided in the pixel shown in FIG. 37B. An electric potential of a gate of the transistor 1395 is fixed by the wiring 1396. The transistor 1381 and the transistor 1395 are connected in series between the power supply line 1385 and the light emitting element 1383. Accordingly, a value of a current supplied to the light emitting element 1383 can be controlled by the transistor 1395, and whether or not the current is supplied to the light emitting element 1383 can be controlled by the transistor 1381, in FIG. 37C.

A pixel circuit included in a display device of the present invention is not limited to the structure shown in this embodiment mode. For example, a pixel circuit having a current mirror may be employed, having a structure which conducts analog gradation display.

In addition, this embodiment mode can be freely combined with other embodiment modes, if necessary.

Embodiment Mode 25

Embodiment Mode 25 will describe a concept of a display device in which polarizers each having a stacked structure are arranged to be in a parallel Nicols state, namely, polarizers opposite to each other via a layer including a display element are arranged to be in a parallel Nicols state.

This embodiment mode can be applied to the dual-emission light emitting display devices (Embodiment Mode 18 and Embodiment Mode 19).

Figure 33:
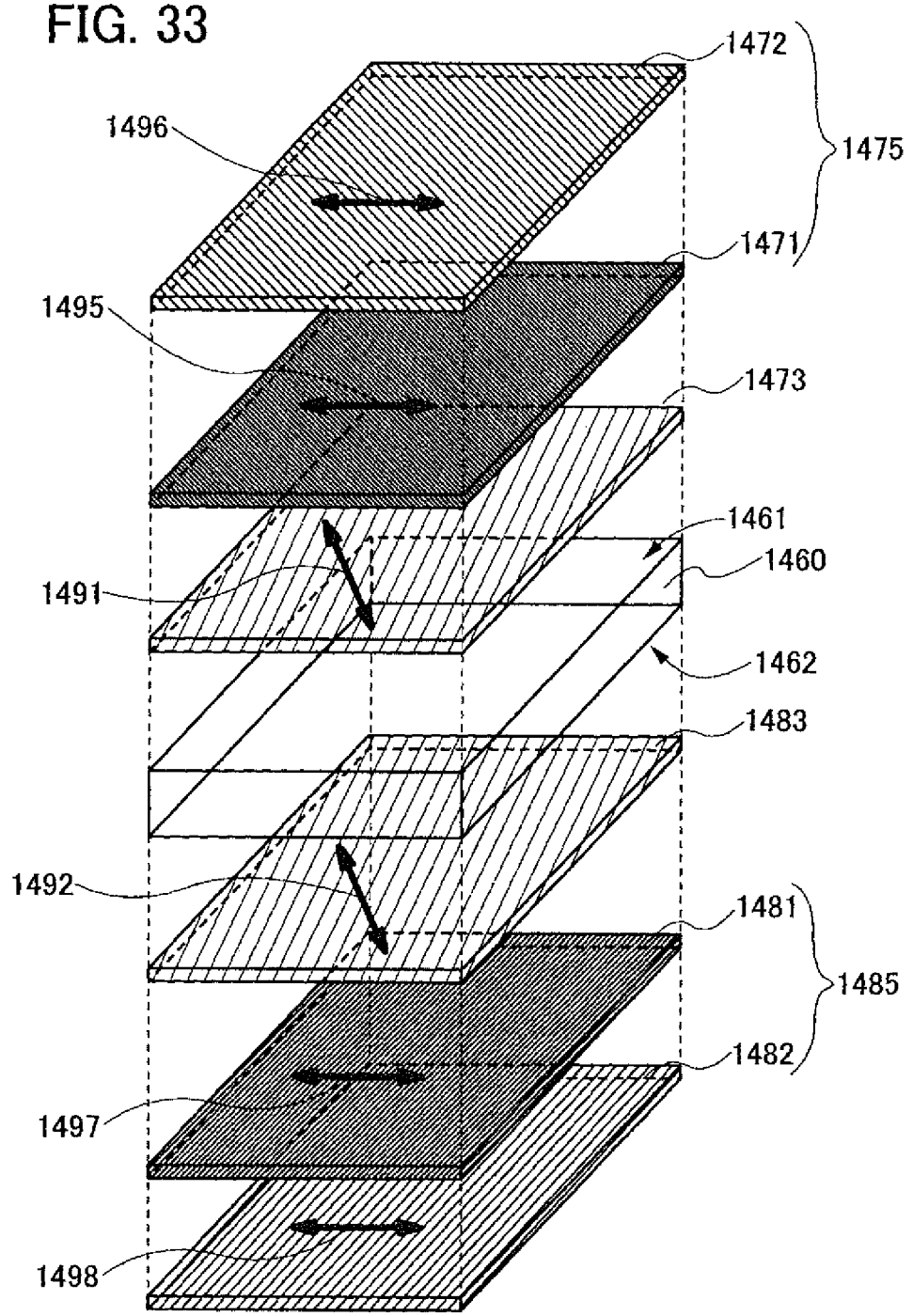
FIG. 33 is a diagram showing a display device according to the present invention.

As shown in FIG. 33, a layer 1460 including a display element is interposed between a first substrate 1461 and a second substrate 1462. It is acceptable as long as the display element is an electroluminescent element.

Light-transmitting substrates are used for the first substrate 1461 and the second substrate 1462. As the light-transmitting substrate, a material similar to the substrate 101 in Embodiment Mode 1 may be used.

On the outer sides of the substrate 1461 and the substrate 1462, namely on each of the sides which are not in contact with the layer 1460 including the display element from the substrate 1461 and the substrate 1462, stacked polarizers are provided. In this embodiment mode, as the structure of the stacked polarizers, polarizing plates each including one polarizing film shown in FIG. 2A are stacked. Needless to say, the structures shown in FIGS. 2B and 2C may also be used.

In the light emitting display device, light from the electroluminescent element is emitted to the first substrate 1461 side and the second substrate 1462 side.

On the outer side of the first substrate 1461, a first retardation plate 1473, a first polarizing plate 1471, and a second polarizing plate 1472 are sequentially provided. The first polarizing plate 1471 and the second polarizing plate 1472 are arranged in such a way that an absorption axis 1495 of the first polarizing plate 1471 and an absorption axis 1496 of the second polarizing plate 1472 should be parallel, namely stacked polarizing plates 1471 and 1472, are arranged to be in a parallel Nicols state. A slow axis 1491 of the first retardation plate 1473 is arranged so that the absorption axis 1495 of the first polarizing plate 1471 and the absorption axis 1496 of the second polarizing plate 1472 are shifted from the slow axis 1491 of the first retardation plate 1473 by 45°.

Figure 34A:
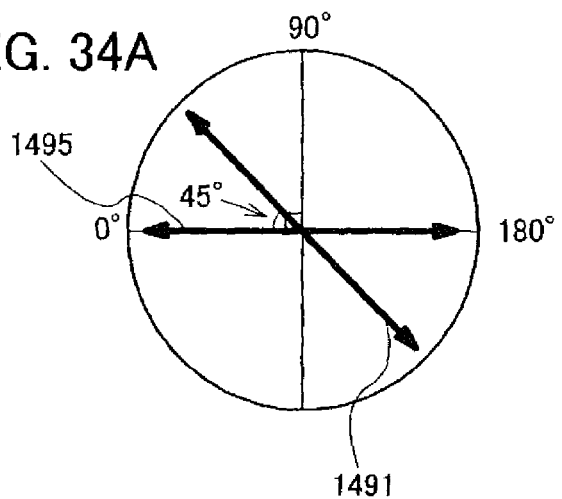
FIGS. 34A to 34C are diagrams each showing angular deviation between polarizers according to the present invention.

FIG. 34A shows the angular deviation between the absorption axis 1495 (and the absorption axis 1496) and the slow axis 1491. The angle formed by the slow axis 1491 and the absorption axis 1495 (and the absorption axis 1496) is 45°.

On the outer side of the second substrate 1462, a retardation plate 1483, a third polarizing plate 1481, and a fourth polarizing plate 1482 are sequentially provided. The third polarizing plate 1481 and the fourth polarizing plate 1482 are arranged in such a way that an absorption axis 1497 of the third polarizing plate 1481 and an absorption axis 1498 of the fourth polarizing plate 1482 should be parallel, namely stacked polarizing plates 1481 and 1482, are arranged to be in a parallel Nicols state. A slow axis 1492 of the retardation plate 1483 is arranged to be shifted from the absorption axis 1497 of the third polarizing plate 1481 and the absorption axis 1498 of the fourth polarizing plate 1482 by 45°.

Figure 34B:
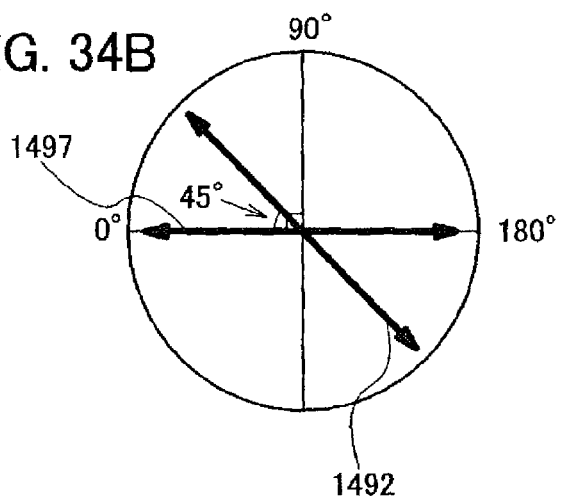

FIG. 34B shows the angular deviation between the absorption axis 1497 (and the absorption axis 1498) and the slow axis 1492. The angle formed by the slow axis 1492 and the absorption axis 1497 (and the absorption axis 1498) is 45°.

That is, the slow axis 1491 of the first retardation plate 1473 is arranged to be shifted from the absorption axis of the first linear polarizing plate 1471 and the absorption axis of the second linear polarizing plate 1472 by 45°. The slow axis 1492 of the second retardation plate 1483 is arranged to be shifted from the absorption axis 1497 of the third linear polarizing plate 1481 and the absorption axis 1498 of the fourth linear polarizing plate 1482 by 45°. The absorption axis 1497 of the third linear polarizing plate 1481 and the absorption axis 1498 of the fourth linear polarizing plate 1482 are arranged to be parallel to the absorption axis 1495 of the first linear polarizing plate 1471 and the absorption axis 1496 of the second linear polarizing plate 1472.

In this embodiment mode, the absorption axis 1495 (and the absorption axis 1496) of the polarizing plate having a stacked structure 1475 provided over the first substrate 1461 and the absorption axis 1497 (and the absorption axis 1498) of the polarizing plate having a stacked structure 1485 provided under the second substrate 1462 are parallel to each other. In other words, the polarizing plate having a stacked structure 1475 and the polarizing plate having a stacked structure 1485, namely polarizing plates each having a stacked structure and opposite to each other via a layer including a display device, are arranged to be in a parallel Nicols state.

Figure 34C:
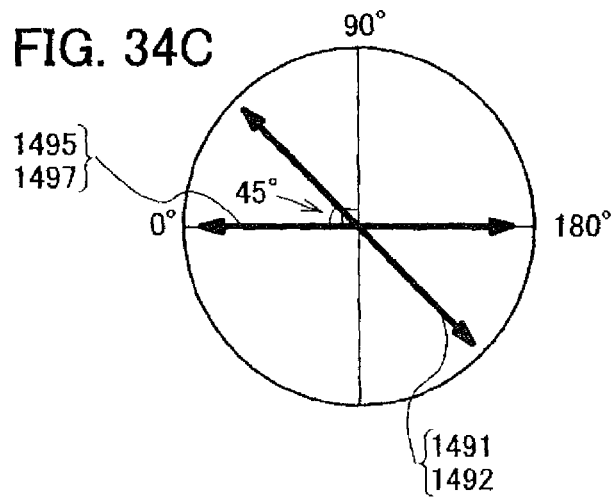

FIG. 34C shows a state where the absorption axis 1495 and the absorption axis 1497 overlap each other, and the slow axis 1491 and the slow axis 1492 overlap each other, which indicates that the polarizing plates 1471, 1472, 1481 and 1482 are in a parallel Nicols state.

In this specification, it is assumed that the above angle condition is satisfied when a parallel Nicols state or angular deviation between an absorption axis and a slow axis is described; however, the angular deviation between the axes may differ from the above-described angles to some extent as long as a similar effect can be obtained.

The wavelength distributions of extinction coefficients of the polarizing plate 1471 and the polarizing plate 1472 are different. The wavelength distributions of extinction coefficients of the polarizing plate 1481 and the polarizing plate 1482 are different.

As the circularly polarizing plate, a circularly polarizing plate with a widened band is given. The circularly polarizing plate with a widened band is an object in which a wavelength range in which phase difference is 90°, is widened by stacking several retardation plates. Also in this case, a slow axis of each retardation plate arranged on the outer side of the first substrate 1461 and a slow axis of each retardation plate arranged on the outer side of the second substrate 1462 may be arranged to be parallel to each other, and opposite polarizing plates may be arranged to be in a parallel Nicols state.

Since polarizing plates are stacked to be in a parallel Nicols state, light leakage in the absorption axis direction can be reduced. The polarizing plates each having a stacked structure and opposite to each other via a layer including a display device are arranged to be in a parallel Nicols state. By providing such circularly polarizing plates, light leakage can be further reduced compared to the case in which circularly polarizing plates each having a single polarizing plate are arranged to be in a parallel Nicols state. Accordingly, the contrast ratio of the display device can be increased.

In addition, this embodiment mode can be freely combined with other embodiment modes, if necessary.

Embodiment Mode 26

Embodiment Mode 26 will describe a display device having a structure in which the number of polarizers on the upper side is different from the number of polarizers on the lower side of a layer including a light emitting element.

This embodiment mode can be applied to a transmission type liquid crystal display devices (Embodiment Mode 4 to Embodiment Mode 6) and a dual-emission light emitting display devices (Embodiment Mode 16 and Embodiment Mode 17).

Figure 35A:
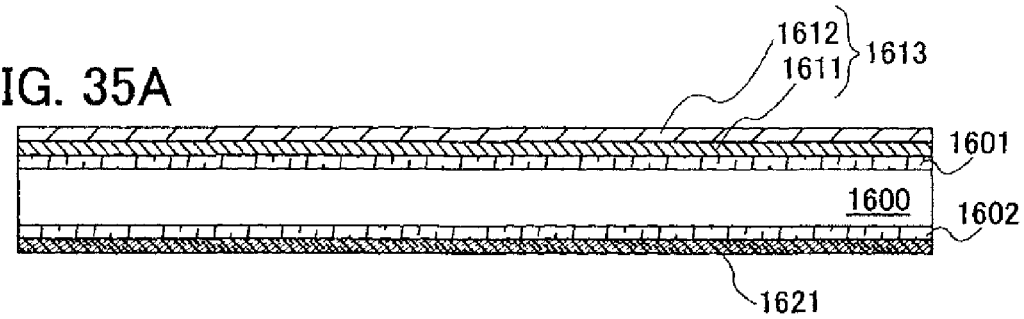
FIGS. 35A and 35B are diagrams showing a display device according to the present invention.
Figure 35B:
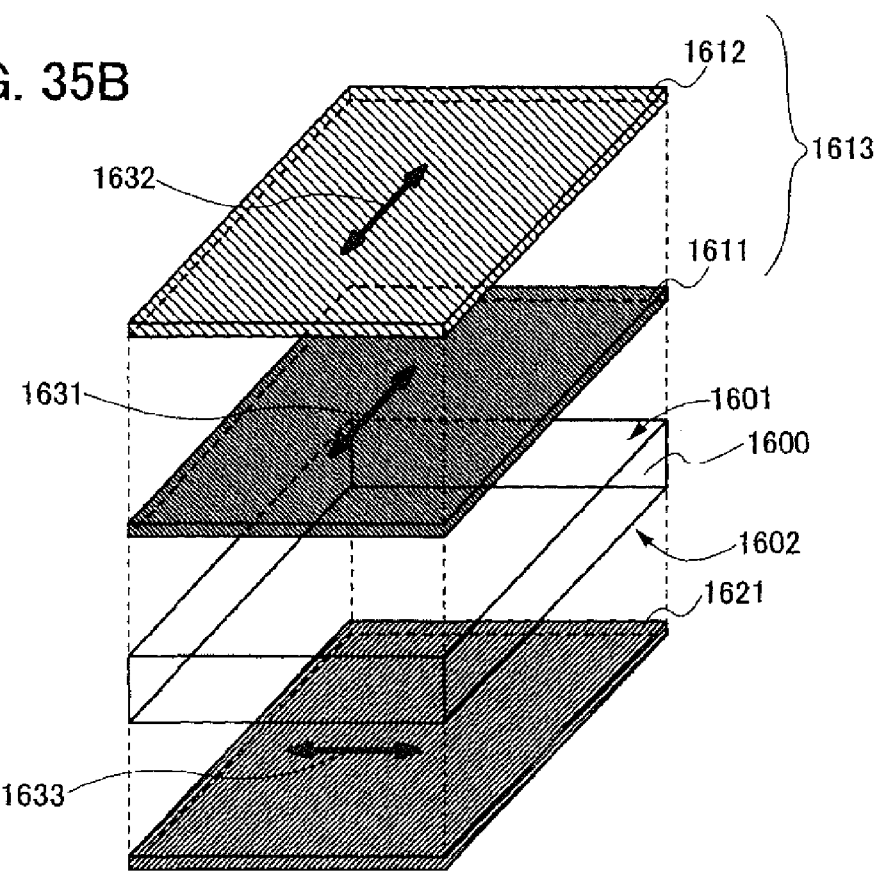

As shown in FIGS. 35A and 35B, a layer 1600 including a display element is interposed between a first substrate 1601 and a second substrate 1602 which are arranged to be opposite to each other. FIG. 35A shows a cross sectional view of a display device of this embodiment mode, and FIG. 35B shows a perspective view of the display device of this embodiment mode.

It is acceptable as long as the display element is a liquid crystal element in the case of a liquid crystal display device, and is an electroluminescent element in the case of a light emitting display device.

Light-transmitting substrates are used for the first substrate 1601 and the second substrate 1602. As such light-transmitting substrate, for example, a glass substrate such as barium borosilicate glass or alumino-borosilicate glass, a quartz substrate, or the like can be used. Alternatively, a substrate formed from a synthetic resin having flexibility, such as a plastic, typified by polyethylene-terephthalate (PET), polyethylene naphthalate (PEN), polyethersulfone (PES), or polycarbonate (PC), or acrylic, can be used for the light-transmitting substrate.

Stacked polarizers and a polarizer having a single layer structure are provided on the outer sides of the substrate 1601 and the substrate 1602, namely on the sides which are not in contact with the layer 1600 including the display element from the substrates 1601 and 1602, respectively. In this embodiment mode, as the structure of the stacked polarizers, polarizing plates each including one polarizing film shown in FIG. 2A are stacked. Needless to say, the structures shown in FIGS. 2B and 2C may also be used.

In a liquid crystal display device, light from a backlight (not shown) is extracted outside, passing through a layer including a liquid crystal element, a substrate, and a polarizer. In the light emitting display device, light from an electroluminescent element is emitted to the first substrate 1601 side and the second substrate 1602 side.

Light passing through the layer including the liquid crystal element or light emitted from the electroluminescent element is linearly polarized by the polarizing plate. That is, the stacked polarizing plates can be referred to as a linear polarizing plate having a stacked structure. The stacked polarizing plates indicate a state where two or more polarizing plates are stacked. The polarizing plate having a single layer structure refers to a state where one polarizing plate is provided.

In this embodiment mode, a display device in which two polarizing plates are stacked on one side of the layer 1600 including the display element and a polarizing plate having a single layer structure is provided on the other side thereof is exemplified, and the two polarizing plates to be stacked are stacked in contact with each other as shown in FIG. 35A.

A first polarizing plate 1611 and a second polarizing plate 1612 are sequentially provided on the outer side of the first substrate 1601. An absorption axis 1631 of the first polarizing plate 1611 and an absorption axis 1632 of the second polarizing plate 1612 are arranged to be parallel to each other. In other words, the first polarizing plate 1611 and the second polarizing plate 1612 are arranged to be in a parallel Nicols state.

A third polarizing plate 1621 is provided on the outer side of the second substrate 1602.

In this embodiment mode, the absorption axis 1631 and the absorption axis 1632 of the polarizing plate having a stacked structure 1613 provided over the first substrate 1601 and an absorption axis 1633 of the polarizing plate 1621 having a single layer structure provided under the second substrate 1602 are orthogonal to each other. In other words, the polarizing plate having a stacked structure 1613 and the polarizing plate 1621 having a single layer structure, namely polarizing plates opposite to each other via the layer including the display element, are arranged to be in a crossed Nicols state.

These polarizing plates 1611, 1612, and 1621 can be formed from a known material. For example, a structure can be used, in which an adhesive surface, TAC (triacetyl cellulose), a mixed layer of PVA (polyvinyl alcohol) and a dichroic pigment, and TAC are sequentially stacked from the substrate side. As a dichroic pigment, iodine and dichromatic organic dye can be cited.

Transmission axes exist in a direction orthogonal to the absorption axes based on the characteristics of the polarizing plates. Therefore, a state in which the transmission axes are parallel to each other can also be referred to as parallel Nicols.

The wavelength distributions of extinction coefficients of the polarizing plate 1611 and the polarizing plate 1612 are different from each other.

Figure 36A:
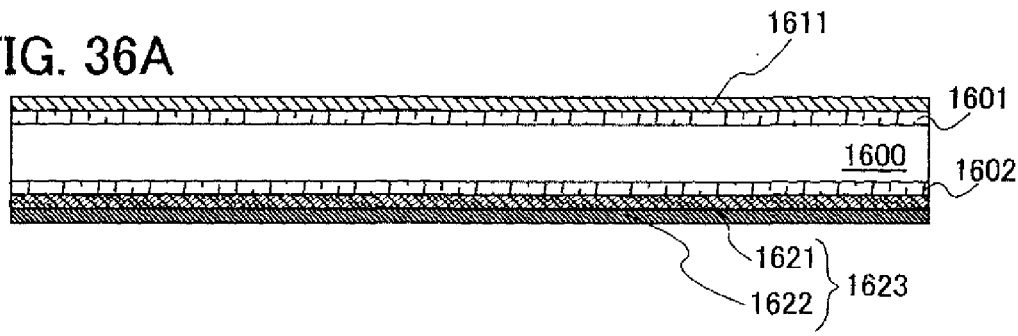
FIGS. 36A and 36B are diagrams showing a display device according to the present invention.
Figure 36B:
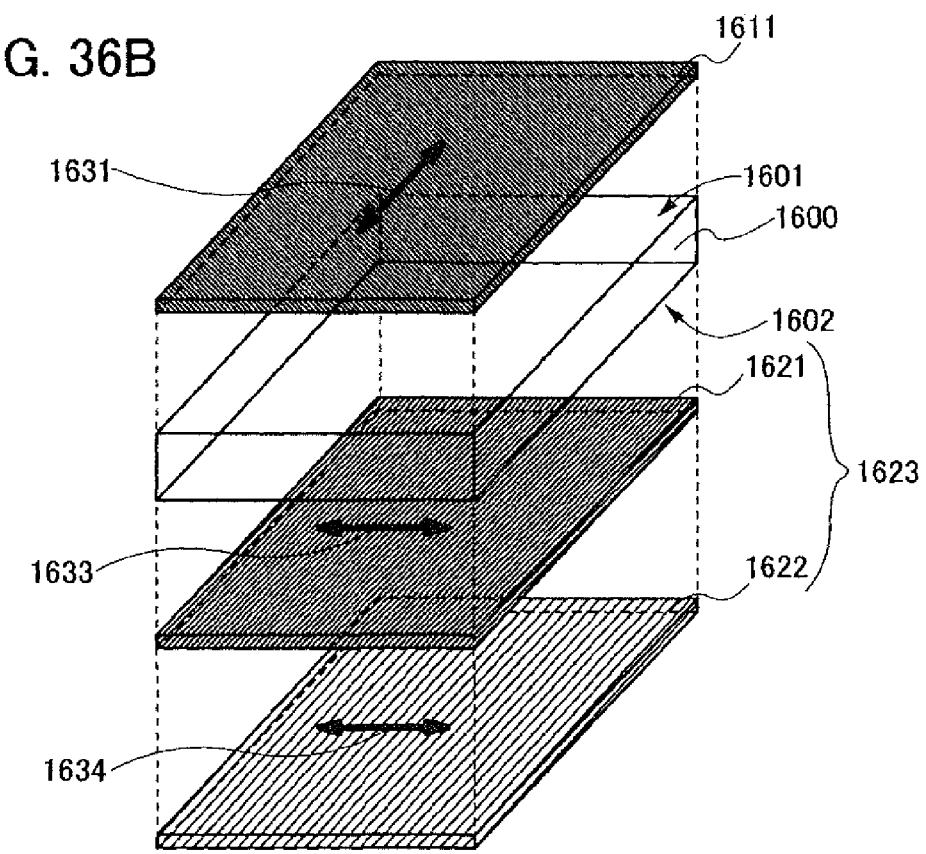

As shown in FIGS. 36A and 36B, on the first substrate 1601 side, the first polarizing plate 1611 is provided. That is, on the first substrate 1601 side, a polarizing plate having a single layer structure is formed using the first polarizing plate 1611. On the second substrate 1602 side, the second polarizing plate 1621 and a third polarizing plate 1622 are sequentially provided from the substrate side. That is, on the second substrate 1602 side, a polarizing plate having a stacked structure 1623 is formed using the second polarizing plate 1621 and the third polarizing plate 1622. Since the other structure is similar to that in FIGS. 35A and 35B, description thereof is omitted here.

The second polarizing plate 1621 and the third polarizing plate 1622 are arranged in such a way that the absorption axis 1633 of the second polarizing plate 1621 and an absorption axis 1634 of the third polarizing plate 1622 should be parallel. That is, the second polarizing plate 1621 and the third polarizing plate 1622 are arranged such that they are in a parallel Nicols state.

In this embodiment mode, the absorption axis 1631 of the polarizing plate 1611 having a single layer structure provided over the first substrate 1601, and the absorption axis 1633 and the absorption axis 1634 of the polarizing plate having a stacked structure 1623 provided under the second substrate 1602 are orthogonal to each other. That is, the polarizing plate 1611 having a single layer structure and the polarizing plate having a stacked structure 1623, namely polarizing plates which are opposite to each other via the layer including the display element, are arranged to be in a crossed Nicols state.

The wavelength distributions of extinction coefficients of the polarizing plate 1621 and the polarizing plate 1622 are different from each other.

As described above, of the polarizing plates arranged to be opposite to each other via the layer including the display device, polarizing plates on the side of one of the substrates are stacked on one another, and the polarizing plates opposite to each other via the layer including the display device are arranged to be in a crossed Nicols state. In this manner as well, light leakage in the absorption axis direction can be reduced. Consequently, the contrast ratio of the display device can be increased.

In this embodiment mode, an example in which stacked polarizing plates are used as an example of the stacked polarizers, and one polarizing plate is provided on one substrate side and two polarizing plates are provided on the other side is described. However, the number of stacked polarizers is not necessarily two, and three or more polarizers may be stacked.

In addition, this embodiment mode can be freely combined with other embodiment modes and other examples in this specification, if necessary.

Embodiment Mode 27

Embodiment Mode 27 will describe a display device in which a circularly polarizing plate having stacked polarizers on one side of a layer including a display element and a circularly polarizing plate having one polarizer on the other side are used.

This embodiment mode can be applied to a transmission type liquid crystal display devices (Embodiment Mode 7 to Embodiment Mode 9) and a dual-emission light emitting display devices (Embodiment Mode 18 and Embodiment Mode 19).

As shown in FIG. 38, a layer 1560 including a display element is interposed between a first substrate 1561 and a second substrate 1562, which are arranged to be opposite to each other.

As shown in FIG. 38, on the first substrate 1561 side, a retardation plate 1575, a first polarizing plate 1571, and a second polarizing plate 1572 are sequentially provided from the substrate side. That is, on the first substrate 1561 side, a polarizing plate having a stacked structure 1573 is formed using the first polarizing plate 1571 and the second polarizing plate 1572. On the second substrate 1562 side, a retardation plate 1576 and a third polarizing plate 1581 are sequentially provided from the substrate side. That is, on the second substrate 1562 side, a polarizing plate having a single layer structure is formed using the third polarizing plate 1581.

It is acceptable as long as the display element is a liquid crystal element in the case of a liquid crystal display device, and is an electroluminescent element in the case of a light emitting display device.

Light-transmitting substrates are used for the first substrate 1561 and the second substrate 1562. As such light-transmitting substrate, for example, a glass substrate such as barium borosilicate glass or alumino-borosilicate glass, a quartz substrate, or the like can be used. Alternatively, a substrate formed from a synthetic resin having flexibility, such as a plastic, typified by polyethylene-terephthalate (PET), polyethylene naphthalate (PEN), polyethersulfone (PES), or polycarbonate (PC), or acrylic, can be used for the light-transmitting substrate.

A retardation plate and stacked polarizers, and a retardation plate and a polarizer having a single layer structure are provided on the outer sides of the substrate 1561 and the substrate 1562, namely on the sides which are not in contact with the layer 1560 including the display element from the substrates 1561 and 1562, respectively. In this embodiment mode, as the structure of the stacked polarizers, polarizing plates each including one polarizing film shown in FIG. 2A are stacked. Needless to say, the structures shown in FIGS. 2B and 2C may also be used.

In the liquid crystal display device, light from a backlight (not shown) is extracted outside passing through the layer including the liquid crystal element, the substrate, the retardation plate, and the polarizer. In the light emitting display device, light from the electroluminescent element is emitted to the first substrate 1561 side and the second substrate 1562 side.

Light emitted from the electroluminescent element is circularly polarized by the retardation plate and linearly polarized by the polarizing plate. That is, the stacked polarizing plates can be referred to as a linear polarizing plate having a stacked structure. The stacked polarizing plates indicate a state where two or more polarizing plates are stacked. The polarizing plate having a single layer structure refers to a state where one polarizing plate is provided.

In the case of the liquid crystal display device, since the retardation plate is provided to obtain a wide viewing angle, which retardation plate is used may be decided as appropriate in accordance with a driving mode of a liquid crystal.

The first polarizing plate 1571 and the second polarizing plate 1572 are arranged in such a way that an absorption axis 1595 of the first polarizing plate 1571 and an absorption axis 1596 of the second polarizing plate 1572 should be parallel. This parallel state is referred to as a parallel Nicols state.

The polarizing plates 1571 and 1572 in this manner are arranged to be in a parallel Nicols state.

The absorption axis 1595 (and the absorption axis 1596) of the polarizing plate having a stacked structure 1573 and an absorption axis 1597 of the polarizing plate 1581 having a single layer structure are orthogonal to each other. In other words, the absorption axes of polarizing plates opposite to each other via the layer including the display device are arranged to be orthogonal to each other. This orthogonal state is referred to as a crossed Nicols state.

Note that transmission axes exist in a direction orthogonal to the absorption axes based on the characteristics of the polarizing plates. Therefore, a state in which the transmission axes are parallel to each other can also be referred to as parallel Nicols. In addition, a state in which the transmission axes are orthogonal to each other can be also referred to as a crossed Nicols state.

The wavelength distribution of extinction coefficients of the polarizing plate 1571 and the polarizing plate 1572 are different from each other.

With reference to FIGS. 38, and 40A to 40C, in the light emitting display device including an electroluminescent element, the angular deviation between a slow axis 1591 of the retardation plate and a slow axis 1592 of the retardation plate is described. In FIG. 38, the arrow 1591 shows a slow axis of the retardation plate 1575 and the arrow 1592 shows a slow axis of the retardation plate 1576.

The slow axis 1591 of the retardation plate 1575 is arranged to be shifted from the absorption axis 1595 of the first polarizing plate 1571 and the absorption axis 1596 of the second polarizing plate 1572 by 45°.

Figure 40A:
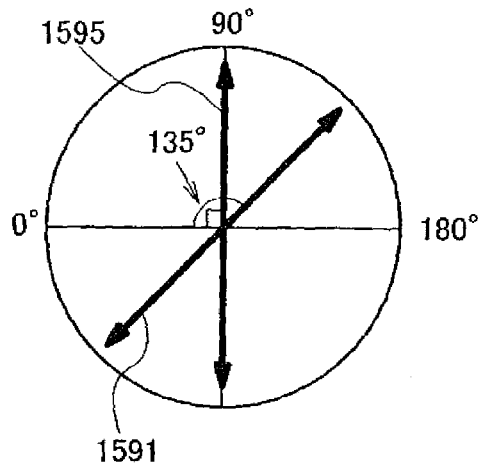
FIGS. 40A to 40C are diagrams each showing angular deviation between polarizers according to the present invention.

FIG. 40A shows angular deviation between the absorption axis 1595 of the first polarizing plate 1571 and the slow axis 1591 of the retardation plate 1575. The angle formed by the slow axis 1591 of the retardation plate 1575 and the transmission axis of the polarizing plate 1571 is 135° and the angle formed by the absorption axis 1595 of the first polarizing plate 1571 and the transmission axis of the polarizing plate 1571 is 90°, which means they are shifted from each other by 45°.

The slow axis 1592 of the retardation plate 1576 is arranged to be shifted from the absorption axis 1597 of the third polarizing plate 1581 by 45°.

Figure 40B:
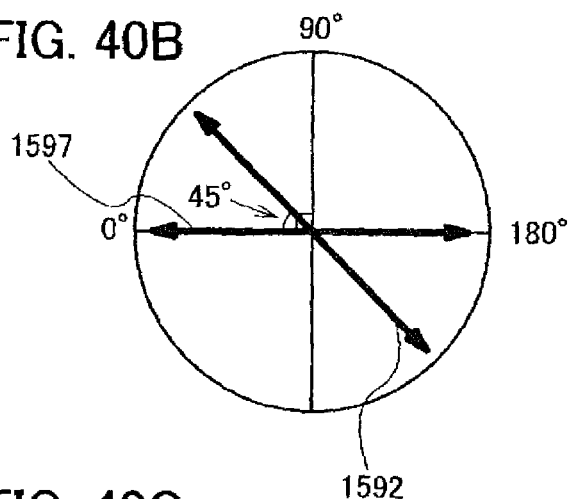

FIG. 40B shows angular deviation of the absorption axis 1597 of the third polarizing plate 1581. The formed by the slow axis 1592 of the retardation plate 1576 and the absorption axis 1597 of the third polarizing plate 1581 is 45°. In other words, the slow axis 1591 of the retardation plate 1575 is arranged to be shifted by 45° from the absorption axis 1595 of the first linear polarizing plate 1571 and the absorption axis 1596 of the second linear polarizing plate 1572. The slow axis 1592 of the retardation plate 1576 is arranged to be shifted by 45° from the absorption axis 1597 of the third linear polarizing plate 1581.

The absorption axis 1595 (and the absorption axis 1596) of the polarizing plate having a stacked structure 1573 provided over the first substrate 1561, and the absorption axis 1597 of the polarizing plate 1581, which has a single layer structure and provided under the second substrate 1562, are orthogonal to each other. In other words, the polarizing plates opposite to each other via the layer including the display device are arranged to be in a crossed Nicols state.

Figure 40C:
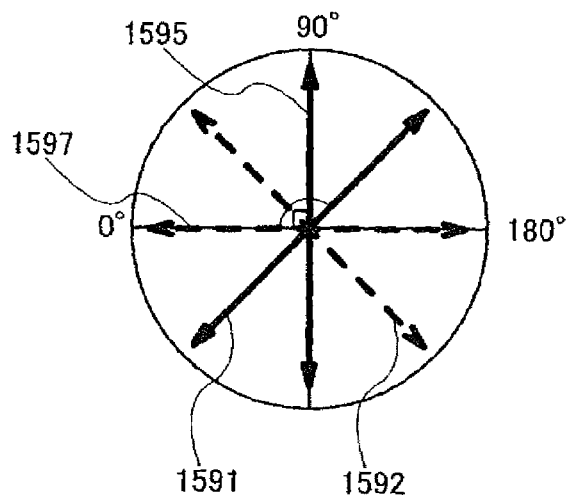

FIG. 40C shows a state where the absorption axis 1595 and the slow axis 1591 each indicated by a solid line and the absorption axis 1597 and the slow axis 1592 each indicated by a dashed line overlap each other. FIG. 40C shows that the absorption axis 1595 and the absorption axis 1597 are orthogonal, and the slow axis 1591 and the slow axis 1592 are also orthogonal.

A fast axis exists in a direction orthogonal to the slow axis based on the characteristics of the retardation plate. Therefore, arrangement of the retardation plate and the polarizing plate can be determined using not only the slow axis but also the fast axis. In this embodiment mode, the absorption axis and the slow axis are arranged to be shifted from each other by 45°, in other words, the absorption axis and the fast axis are arranged to be shifted from each other by 135°.

In this specification, it is assumed that the above angle condition is satisfied when angular deviation between absorption axes or angular deviation of an absorption axis and a slow axis is described; however, the angular deviation between the axes may differ from the above-described angles to some extent as long as a similar effect can be obtained.

FIG. 39 shows a different stacked structure from that in FIG. 38. In FIG. 39, on the first substrate 1561 side, the retardation plate 1575 and the first polarizing plate 1571 are sequentially provided from the substrate side. That is, on the first substrate 1561 side, a polarizing plate having a single layer structure is formed with the first polarizing plate 1571. On the second substrate 1562 side, the retardation plate 1576, and the second polarizing plate 1581 and a third polarizing plate 1582, which are stacked, are sequentially provided from the substrate side. That is, on the second substrate 1562 side, a polarizing plate having a stacked structure 1583 is formed with the second polarizing plate 1581 and the third polarizing plate 1582.

An absorption axis 1598 of the third polarizing plate 1582 and the absorption axis 1597 of the second polarizing plate 1581 are arranged to be parallel to each other. Therefore, angular deviation between the absorption axis and the slow axis are the same as that of the structure shown in FIG. 38, and description thereof is omitted here.

The wavelength distribution of extinction coefficients of the polarizing plate 1581 and the polarizing plate 1582 are different from each other.

As described above, by using polarizing plates stacked on a circularly polarizing plate on one side, and the polarizing plates opposite to each other via the layer including the display device are arranged to be in a crossed Nicols state. In this manner as well, light leakage in the absorption axis direction can be reduced. Consequently, the contrast ratio of the display device can be increased.

In this embodiment mode, an example in which stacked polarizing plates are used as an example of the stacked polarizers and one polarizing plate is provided on one substrate side and two polarizing plates are provided on the other side is described. However, the number of stacked polarizers is not necessarily two, and three or more polarizers may be stacked.

In addition, this embodiment mode can be freely combined with other embodiment modes and other examples in this specification, if necessary.

Embodiment Mode 28

Embodiment Mode 28 will describe a concept of a display device using a circularly polarizing plate having stacked polarizers and a circularly polarizing plate having one polarizer.

This embodiment mode can be applied to the dual-emission light emitting display device (Embodiment Mode 1).

As shown in FIG. 41, a layer 1660 including a display element is interposed between a first substrate 1661 and a second substrate 1662 which are arranged to be opposite to each other.

It is acceptable as long as the display element is an electroluminescent element.

Light-transmitting substrates are used for the first substrate 1661 and the second substrate 1662. As the light-transmitting substrate, a material similar to the substrate 1561 and the substrate 1562 described in Embodiment Mode 27 may be used.

On the outer sides of the substrate 1661 and the substrate 1662, namely on the sides which are not in contact with the layer 1660 including the display element from the substrates 1661 and 1662, stacked polarizers and a polarizer having a single layer structure are provided, respectively. In this embodiment mode, as the structure of the stacked polarizers, polarizing plates each including one polarizing film shown in FIG. 2A are stacked. Needless to say, the structures shown in FIGS. 2B and 2C may also be used.

In the light emitting display device, light from the electroluminescent element is emitted to the first substrate 1661 side and the second substrate 1662 side.

Light emitted from the electroluminescent element is linearly polarized by the polarizing plate. That is, the stacked polarizing plates can be referred to as a linear polarizing plate having a stacked structure. The stacked polarizing plates indicate a state where two or more polarizing plates are stacked. The polarizing plate having a single layer structure refers to a state where one polarizing plate is provided.

As shown in FIG. 41, on the first substrate 1661 side, a retardation plate 1675, a first polarizing plate 1671, and a second polarizing plate 1672 are sequentially provided from the substrate side. That is, on the first substrate 1661 side, a polarizing plate having a stacked structure 1673 is formed using the first polarizing plate 1671 and the second polarizing plate 1672. On the second substrate 1662 side, a retardation plate 1676 and a third polarizing plate 1681 are sequentially provided from the substrate side. That is, on the second substrate 1662 side, a polarizing plate having a single layer structure is formed using the third polarizing plate 1681.

The first polarizing plate 1671 and the second polarizing plate 1672 are arranged in such a way that an absorption axis 1695 of the first polarizing plate 1671 and an absorption axis 1696 of the second polarizing plate 1672 should be parallel, namely the stacked polarizing plates 1671 and 1672 are arranged to be in a parallel Nicols state. A slow axis 1691 of the first retardation plate 1675 is arranged to be shifted from the absorption axis 1695 of the first polarizing plate 1671 and the absorption axis 1696 of the second polarizing plate 1672 by 45°.

Figure 43A:
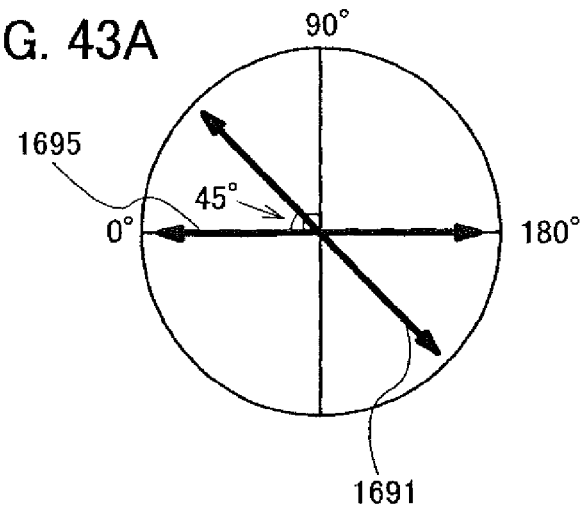
FIGS. 43A to 43C are diagrams each showing angular deviation between polarizers according to the present invention.

FIG. 43A shows the angular deviation between the absorption axis 1695 (and the absorption axis 1696) and the slow axis 1691. The angle formed by the slow axis 1691 and the absorption axis 1695 (and the absorption axis 1696) is 45°.

On the outer side of the second substrate 1662, the retardation plate 1676 and the third polarizing plate 1681 are sequentially provided. A slow axis 1692 of the retardation plate 1676 is arranged to be shifted from an absorption axis 1697 of the third polarizing plate 1681 by 45°.

Figure 43B:
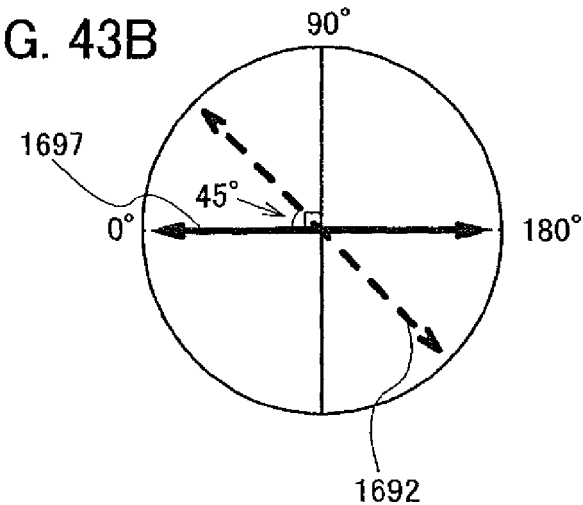

FIG. 43B shows the angular deviation between the absorption axis 1697 and the slow axis 1692. The angle formed by the slow axis 1692 and the absorption axis 1697 is 45°.

That is, the slow axis 1691 of the retardation plate 1675 is arranged to be shifted from the absorption axis 1695 of the first linear polarizing plate 1671 and the absorption axis 1696 of the second linear polarizing plate 1672 by 45°. The slow axis 1692 of the retardation plate 1676 is arranged to be shifted from the absorption axis 1697 of the third linear polarizing plate 1681 by 45°. The absorption axis 1697 of the third linear polarizing plate 1681 is arranged to be parallel to the absorption axis 1695 of the first linear polarizing plate 1671 and the absorption axis 1696 of the second linear polarizing plate 1672.

In this embodiment mode, the absorption axis 1695 (and the absorption axis 1696) of the polarizing plate having a stacked structure 1673 provided over the first substrate 1661 and the absorption axis 1697 of the polarizing plate 1681 provided under the second substrate 1662 are parallel to each other. In other words, the polarizing plate having a stacked structure 1673 and the polarizing plate 1681 having a single layer structure, namely polarizing plates opposite to each other via the layer including the display device, are arranged to be in a parallel Nicols state.

Figure 43C:
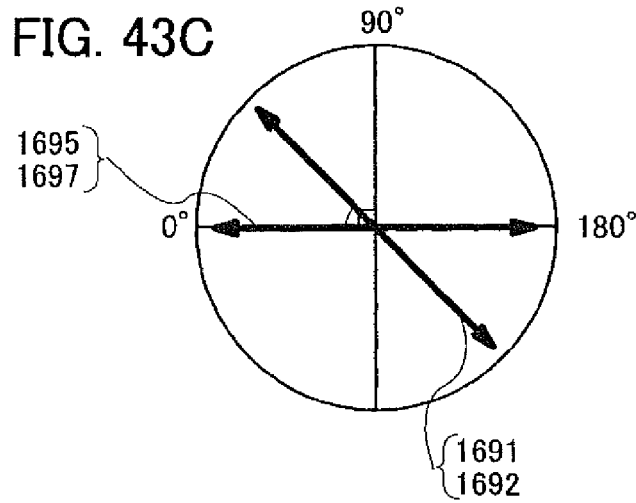

FIG. 43C shows a state where the absorption axis 1695 and the absorption axis 1697 overlap each other, and the slow axis 1691 and the slow axis 1692 overlap each other, which means the polarizing plates 1671, 1672 and 1681 are in a parallel Nicols state.

In this specification, it is assumed that the above angle condition is satisfied when a parallel Nicols state or angular deviation between an absorption axis and a slow axis is described; however, the angular deviation between the axes may differ from the above-described angles to some extent as long as a similar effect can be obtained.

The wavelength distributions of extinction coefficients of the polarizing plate 1671 and the polarizing plate 1672 are different from each other.

As the circularly polarizing plate, a circularly polarizing plate with a widened band is given. The circularly polarizing plate with a widened band is an object in which a wavelength range in which phase difference is 90°, is widened by stacking several retardation plates. Also in this case, a slow axis of each retardation plate arranged on the outer side of the first substrate 1661 and a slow axis of each retardation plate arranged on the outer side of the second substrate 1662 may be arranged to be parallel to each other, and opposite polarizing plates may be arranged to be in a parallel Nicols state.

Since the polarizing plates are stacked to be in a parallel Nicols state, light leakage in the absorption axis direction can be reduced. The polarizing plates opposite to each other via the layer including the display device are arranged to be in a parallel Nicols state. By providing such circularly polarizing plates, light leakage can be further reduced compared to the case in which circularly polarizing plates each having a single polarizing plates are arranged to be in a parallel Nicols state. Accordingly, the contrast ratio of the display device can be increased.

Figure 42:
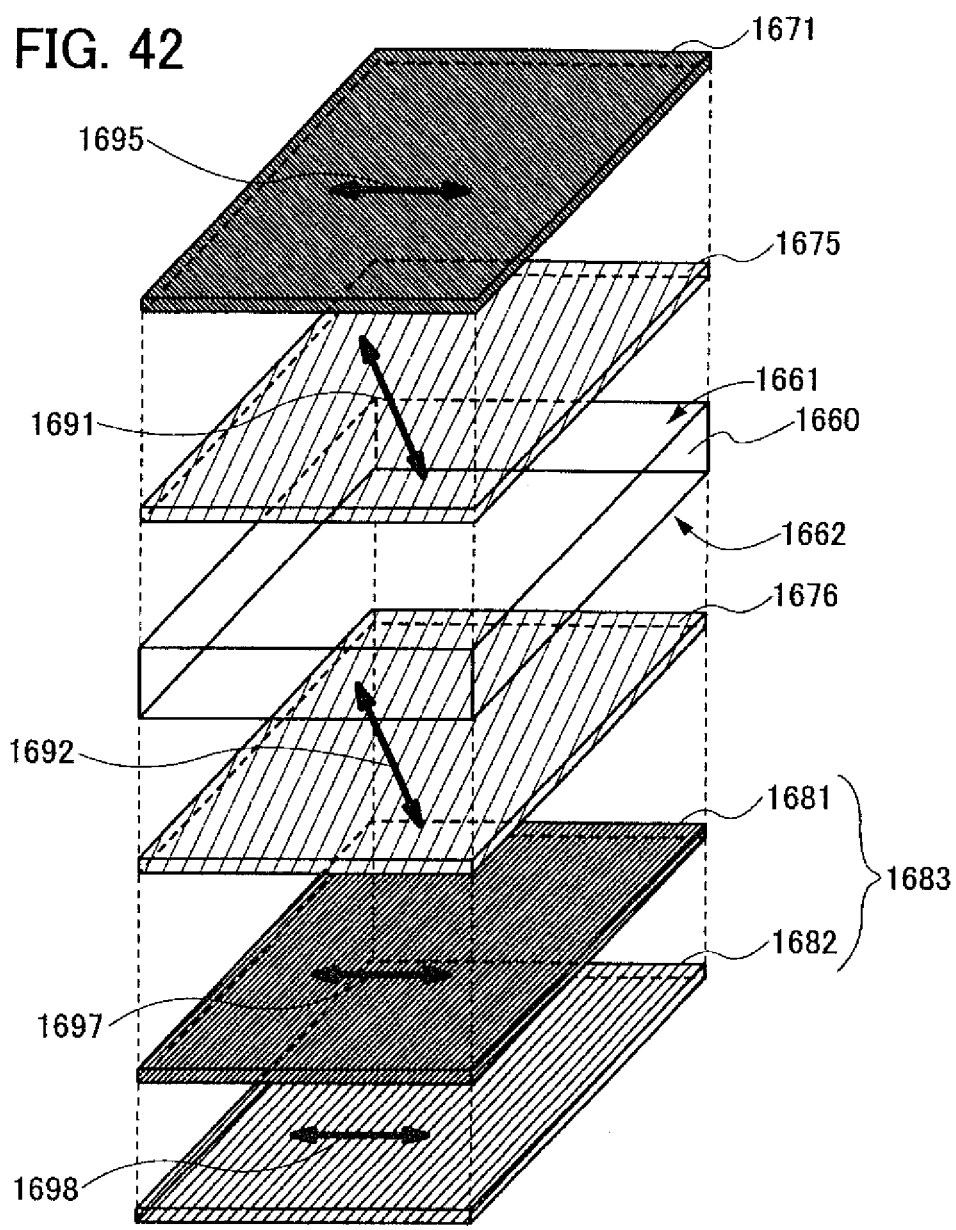
FIG. 42 is a diagram showing a display device according to the present invention.

As shown in FIG. 42, on the first substrate 1661 side, the retardation plate 1675 and the first polarizing plate 1671 are sequentially provided from the substrate side. That is, on the first substrate 1661 side, a polarizing plate having a single layer structure is formed using the first polarizing plate 1671. On the second substrate 1662 side, the retardation plate 1676, a second polarizing plate 1681, and a third polarizing plate 1682 are sequentially provided from the substrate side. That is, on the second substrate 1662 side, a polarizing plate having a stacked structure 1683 is formed using the second polarizing plate 1681 and the third polarizing plate 1682.

The third polarizing plate 1682 and the second polarizing plate 1681 are arranged in such a way that an absorption axis 1698 of the third polarizing plate 1682 and the absorption axis 1697 of the second polarizing plate 1681 are arranged to be parallel to each other. Therefore, angular deviation between the absorption axes and the slow axes are the same as that of the structure shown in FIG. 43, and description thereof is omitted here.

The wavelength distributions of extinction coefficients of the polarizing plate 1681 and the polarizing plate 1682 are different from each other.

By using the stacked polarizing plates in the circularly polarizing plate on one side so that the polarizing plates opposite to each other via the layer including the display device are arranged in a parallel Nicols state, light leakage in the transmission axis direction can be reduced. Accordingly, the contrast ratio of the display device can be increased.

In this embodiment mode, a case in which stacked polarizing plates are used as an example of the stacked polarizers, and one polarizing plate is provided on one substrate side and two polarizing plates are provided on the other side is described. However, the number of stacked polarizers is not necessarily two, and three or more polarizers may be stacked.

In addition, this embodiment mode can be freely combined with other embodiment modes and other examples in this specification, if necessary.

Embodiment Mode 29

As driving methods for liquid crystals in liquid crystal display devices, there is a vertical electric field method in which electric field is applied perpendicular to a substrate, and a horizontal electric field method in which electric field is applied parallel to a substrate. The structure of the present invention, in which plural polarizing plates are provided, can be applied to either the vertical electric field method or to the horizontal electric field method. Therefore, in this embodiment mode, examples of various types of liquid crystal modes to which a liquid crystal display device of the present invention can be applied will be explained.

This embodiment mode can be applied to liquid crystal display devices (Embodiment Modes 4 to 15, and Embodiment Modes 26 and 27).

The same elements are denoted by the same reference numerals in this embodiment mode.

First, schematic diagrams of a TN (Twisted Nematic) mode liquid crystal display device are shown in FIGS. 44A and 44B.

A layer 120 including a liquid crystal element is interposed between a first substrate 121 and a second substrate 122 which are arranged so as to be opposite to each other. On the first substrate 121 side, a layer 125 including a polarizer is formed. Further, on the second substrate 122 side, a layer 126 including a polarizer is formed. The layers 125 and 126 each including a polarizer may have the structures described in Embodiment Modes 4 to 15 and Embodiment Modes 26 and 27. In other words, a circularly polarizing plate including stacked polarizers may be provided, or only the stacked polarizers may be used without using a retardation plate. The number of polarizers above and below a layer including a display element may be equal or different. Moreover, the stacked polarizers may be in crossed Nicols above and below the substrate. When a reflection type liquid crystal display device is manufactured, one of the layers 125 and 126 including a polarizer is not necessarily formed. However, in the reflection type liquid crystal display device, both a retardation plate and a polarizer are provided for black display.

In this embodiment mode, the wavelength distributions of extinction coefficients in the polarizer having a stacked structure over one substrate are different.

A first electrode 127 and a second electrode 128 are provided for the first substrate 121 and the second substrate 122, respectively. In the case of a transmission type liquid crystal display device, at least one substrate has a light-transmitting property. In addition, in the case of a reflection type liquid crystal display device, one of the first electrode 127 and the second electrode 128 has a reflective property and the other one has a light-transmitting property.

In a liquid crystal display device with such a structure, in the case of normally white mode, when voltage is applied to the first electrode 127 and the second electrode 128 (this is called the vertical electric field method), black display is conducted, as shown in FIG. 44A. At this time, liquid crystal molecules 116 line up vertically. Then, in the case of the transmission type liquid crystal display device, light from the backlight cannot pass through the substrates, and black display results. Further, in the case of the reflection type liquid crystal display device, a retardation plate is provided, and as for light from the outside, only light composition which oscillates in the direction of the transmission axis of the polarizer can be transmitted and be linearly polarized. This light is circularly polarized by passing through the retardation plate (for example, right-handed circularly polarized light). When this right-handed circularly polarized light is reflected on a reflective plate (or a reflective electrode), it becomes left-handed circularly polarized light. When this left-handed circularly polarized light passes through the retardation plate, it becomes linearly polarized light which oscillates perpendicularly to the transmission axis of the polarizer (parallel to the absorption axis). Therefore, light is absorbed by the absorption axis of the polarizer, and thus, black display results.

Then, as shown in FIG. 44B, when voltage is not applied between the first electrode 127 and the second electrode 128, white display results. At this time, the liquid crystal molecules 116 line up horizontally, and rotate within the plane. As a result, in the case of the transmission type liquid crystal display device, light from the backlight can pass through the substrates provided with the layers 125 and 126 each including a polarizer, and display of a designated image can be conducted. In addition, in the case of the reflection type liquid crystal display device, reflected light passes through the substrate provided with the layers including polarizers, and display of a designated image can be conducted. At this time, full color display can be conducted by the provision of a color filter. The color filter can be provided on either the first substrate 121 side or on the second substrate 122 side.

A known liquid crystal material may be used as a liquid crystal material for the TN mode.

Next, FIGS. 45A and 45B show schematic diagrams of a Vertically Aligned (VA) mode liquid crystal display device. In VA mode, when there is no electric field, liquid crystal molecules are oriented such that they are perpendicular to substrates.

Similarly to FIGS. 44A and 44B, in the liquid crystal display device shown in FIGS. 45A and 45B, the first electrode 127 and the second electrode 128 are provided for the first substrate 121 and the second substrate 122, respectively. In the case of a transmission type liquid crystal display device, at least one electrode has a light-transmitting property. In addition, in the case of a reflection type liquid crystal display device, one of the first electrode 127 and the second electrode 128 has a reflective property and the other one has a light-transmitting property.

In a liquid crystal display device having such a structure, when voltage is applied to the first electrode 127 and the second electrode 128 (the vertical electric field method), an on-state in which white display is conducted results, as shown in FIG. 45A. At that time, the liquid crystal molecules 116 line up horizontally. As a result, in the case of the transmission type liquid crystal display device, light from the backlight can pass through the substrates provided with the layers 125 and 126 each including a polarizer, and display of a designated image can be conducted. In addition, in the case of the reflection type liquid crystal display device, reflected light passes through the substrate provided with the layers including polarizers, and display of a designated image can be conducted. At this time, full color display can be conducted by the provision of a color filter. The color filter can be provided on either the first substrate 121 side or on the second substrate 122 side.

Then, as shown in FIG. 45B, when voltage is not applied between the first electrode 127 and the second electrode 128, black display, that is, an off-state, results. At this time, the liquid crystal molecules 116 line up vertically. As a result, in the case of the transmission type liquid crystal display device, light from the backlight cannot pass through the substrates, and black display results. Further, in the case of the reflection type liquid crystal display device, a retardation plate is provided, and as for light from the outside, only light composition which oscillates in the direction of the transmission axis of the polarizer can be transmitted and be linearly polarized. This light is circularly polarized by passing through the retardation plate (for example, right-handed circularly polarized light). When this right-handed circularly polarized light is reflected on a reflective plate (or a reflective electrode), it becomes left-handed circularly polarized light. When this left-handed circularly polarized light passes through the retardation plate, it is linearly polarized and oscillates perpendicularly to the transmission axis of the polarizer (parallel to the absorption axis). Therefore, light is absorbed by the absorption axis of the polarizer, and thus, black display results.

In this manner, in the off-state, the liquid crystal molecules 116 stand up perpendicular to the substrates and black display results, and in the on-state, the liquid crystal molecules 116 fall parallel to the substrate, and white display results. In the off-state, since the liquid crystal molecules 116 are standing up, polarized light from the backlight can pass through the cell without being affected by the liquid crystal molecules 116 and can be completely blocked by the polarizers on the opposite substrate side, in the case of the transmission type liquid crystal display device. Therefore, by providing layers each including a polarizer, further improvement of the contrast ratio can be expected.

A known material can be used as a liquid crystal material for VA mode.

The present invention can be applied to an MVA mode in which orientation direction of liquid crystal is divided.

Figure 46A:
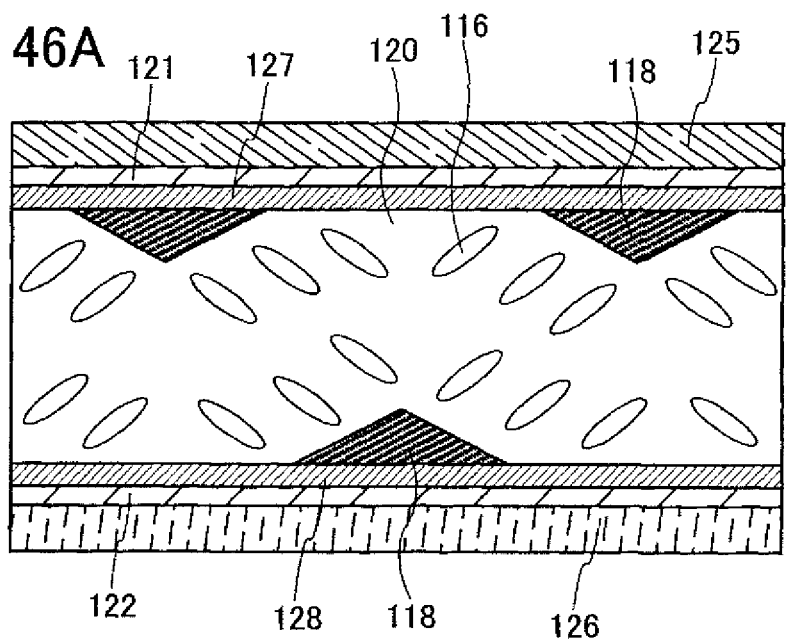
FIGS. 46A and 46B are diagrams each showing a mode of a liquid crystal element according to the present invention.
Figure 46B:
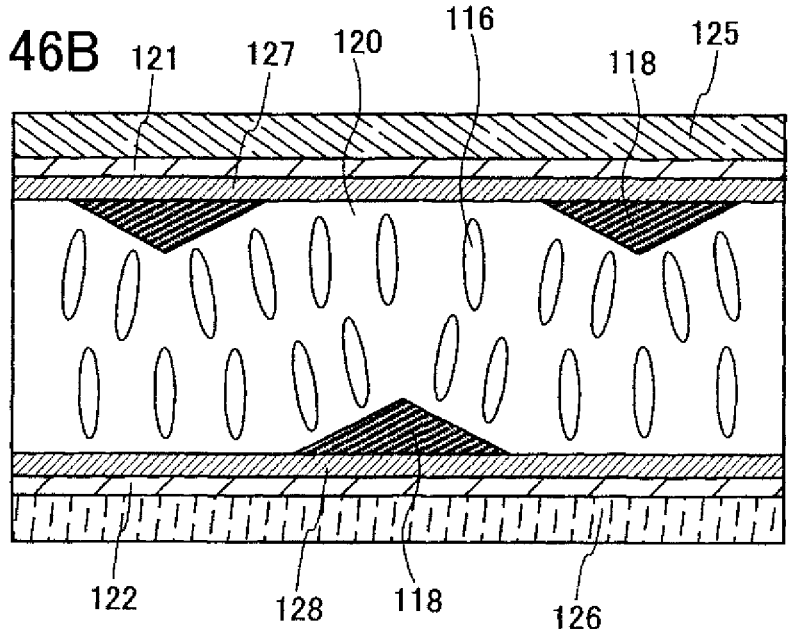

FIGS. 46A and 46B show a schematic view of a liquid crystal display device with an MVA (Multi-domain Vertically Aligned) mode.

The liquid crystal display device shown in FIGS. 46A and 46B is similar to that shown in FIGS. 44A and 44B. The first electrode 127 and the second electrode 128 are provided for the first substrate 121 and the second substrate 122, respectively. In the case of a transmission type liquid crystal display device, the electrode on the opposite side of a backlight, i.e., the electrode on the display surface side, for example, the second electrode 128 is formed so as to have at least a light-transmitting property. In addition, in the case of a reflection type liquid crystal display device, one of the first electrode 127 and the second electrode 128 has a light-reflecting property and the other one thereof has a light-emitting property.

A plurality of protrusions (also referred to as ribs) 118 are formed on the first substrate 127 and the second electrode 128. The protrusions 118 may be formed from resin such as acrylic. The protrusion 118 may be symmetrical, preferably a tetrahedron.

In the MVA mode, the liquid crystal display device is driven so that the liquid crystal molecules 116 incline symmetrically with respect to the protrusion 118. Accordingly, a difference in color seen from right and left sides can be suppressed. When inclination directions of the liquid crystal molecules 116 are varied in a pixel, uneven color is not generated from any directions when the display device is seen.

FIG. 46A shows a state in which voltage is applied, in other words, on-state. In the on-state, an inclined electric field is generated; accordingly, the liquid crystal molecules 116 incline in an inclination direction of the protrusion 118. Accordingly, the long axes of the liquid crystal molecules 116 and an absorption axis of the polarizer intersect with each other, and light passes through one of the layers 125 and 126 each including a polarizer which is an extraction side of light, and a light state (white display) results.

FIG. 46B shows a state in which voltage is not applied, that is, an off-state. In the off-state, the liquid crystal molecules 116 line up to be perpendicular to the substrates 121 and 122. Therefore, incident light entered from one of the layers 125 and 126 each including a polarizer which are provided for the substrates 121 and 122 respectively, directly passes through the liquid crystal molecules 116, and intersects with the other one of the layers 125 and 126 each including a polarizer which is an extraction side of light, at right angles. Accordingly, the light is not emitted, and a dark state (black display) results.

By providing the protrusion 118, the liquid crystal display device is driven so that the liquid crystal molecules 116 incline along with the inclined surfaces of the protrusion 118, and display with a symmetric property and an excellent viewing angle characteristic can be obtained.

Figure 47A:
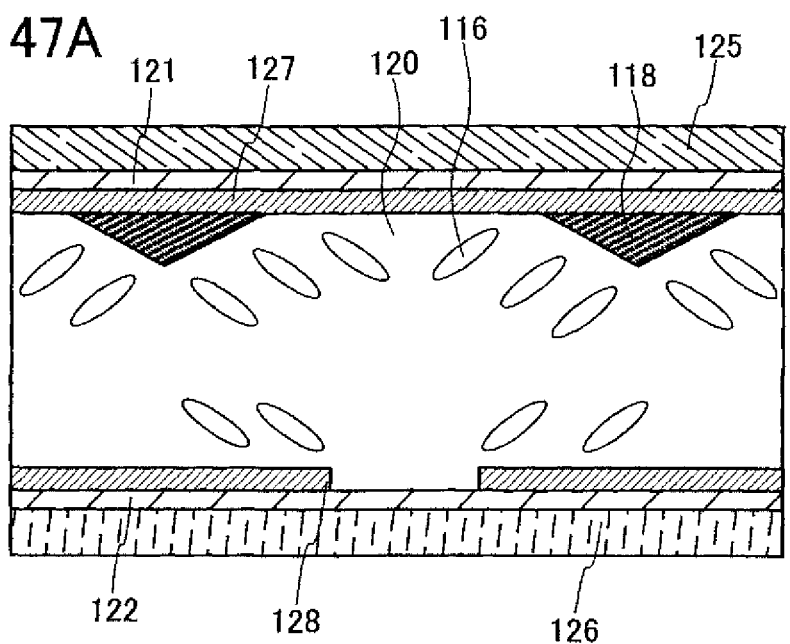
FIGS. 47A and 47B are diagrams each showing a mode of a liquid crystal element according to the present invention.
Figure 47B:
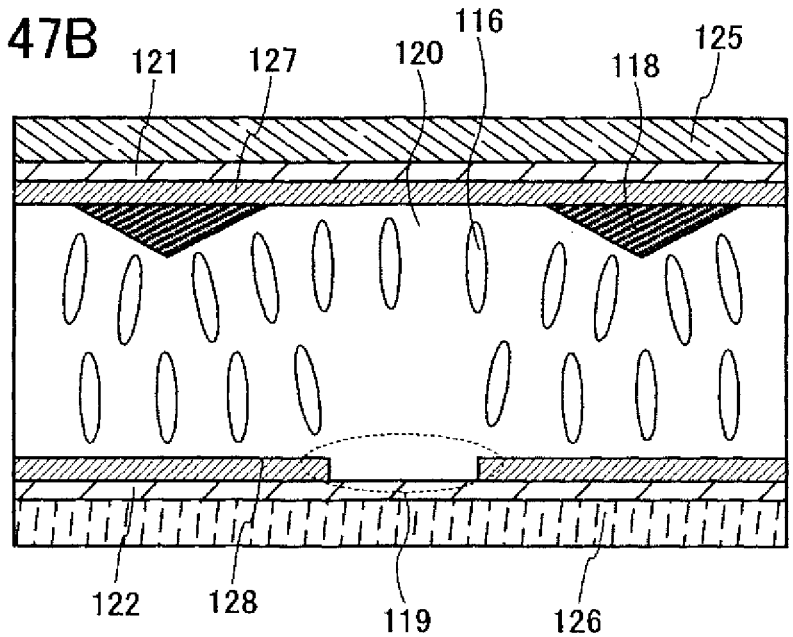

FIGS. 47A and 47B show another example of the MVA mode. Protrusions 118 are provided on one of the first electrode 127 and the second electrode 128, in this embodiment mode, on the first electrode 127, and a part of the other of the first electrode 127 and the second electrode 128, in this embodiment mode, a part of the second electrode 128 is removed to form a slit 119.

FIG. 47A shows a state where voltage is applied, in other words, on-state. At the time of on-state when voltage is applied, an inclined electric field is generated near the slit 119, even if the protrusions 118 are not provided. By the inclined electric field, the liquid crystal molecules 116 are inclined along with the incline direction of the protrusions 118. Thus, the long axes of the liquid crystal molecules 116 and an absorption axis of the polarizing plate intersect with each other, and light passes through one of the layers 125 and 126 each including a polarizer which is an extraction side of light, and a light state (white display) results.

FIG. 47B shows a state in which voltage is not applied, that is, an off-state. In the off-state, the liquid crystal molecules 116 line up to be perpendicular to the substrates 121 and 122. Therefore, incident light entered from one of the layers 125 and 126 each including a polarizer which are provided for the substrates 121 and 122 respectively, directly passes through the liquid crystal molecules 116, and intersects with the other one of the layers 125 and 126 each including a polarizer which is an extraction side of light, at right angles. Accordingly, the light is not emitted, and a dark state (black display) results.

A known liquid crystal material may be used as a liquid crystal material for the MVA mode.

Figure 48:
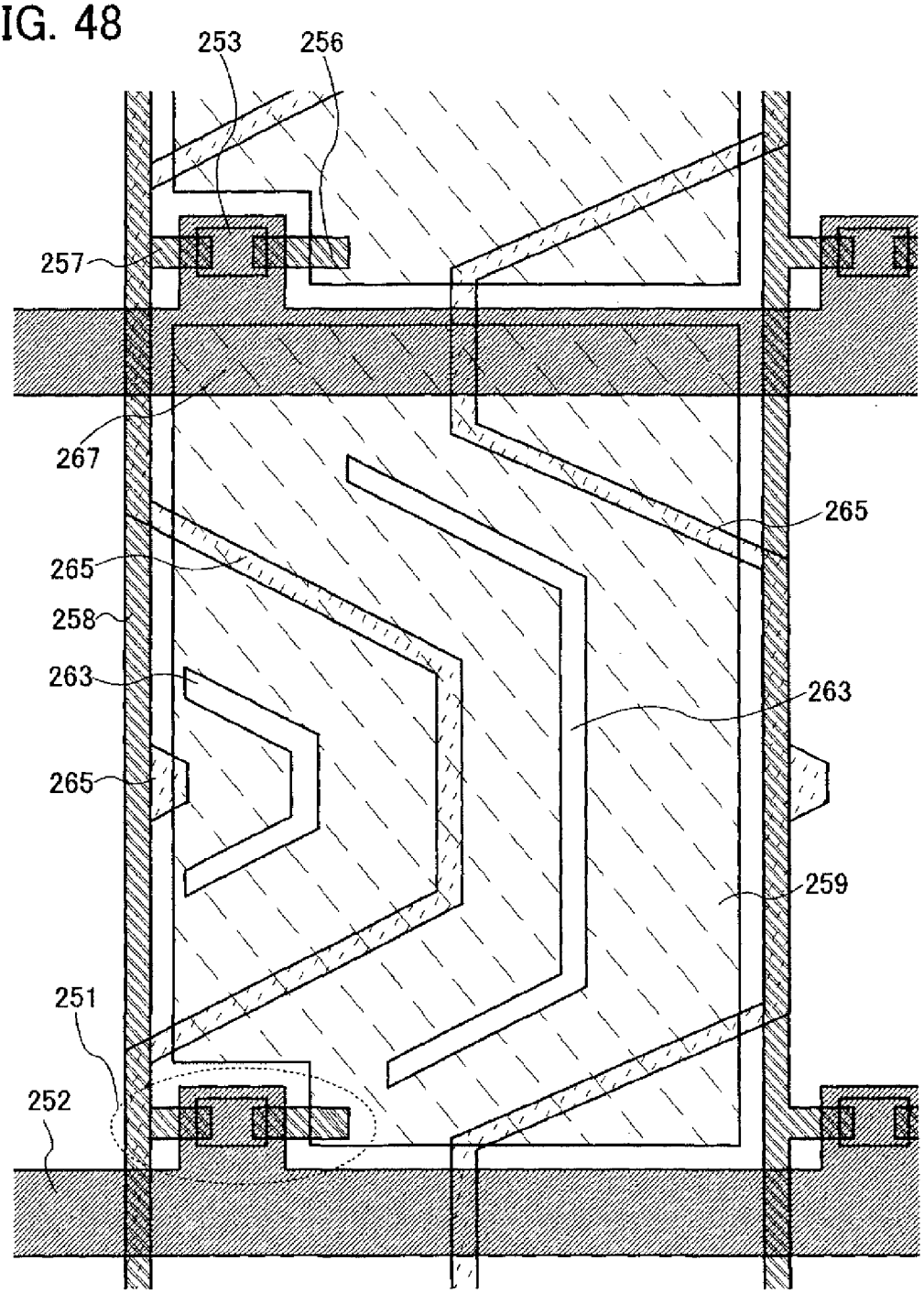
FIG. 48 is a top view showing one pixel of a display device according to the present invention.

FIG. 48 shows a top view of an arbitrary pixel in the liquid crystal display device with an MVA mode shown in FIGS. 47A and 47B.

A TFT 251 serving as a switching element of a pixel includes a gate wiring 252, a gate insulating film, an island-shaped semiconductor film 253, a source electrode 257 and a drain electrode 256.

A pixel electrode 259 is electrically connected to the drain electrode 256.

A plurality of grooves 263 is formed in the pixel electrode 259.

In a region where the gate wiring 252 and the pixel electrode 259 are overlapped, an auxiliary capacitor 267 using the gate insulating film as a dielectric is formed.

On the opposite electrode side (not shown) provided for the opposite substrate, a plurality of protrusions (also referred to as ribs) 265 are formed. The protrusions 265 may be formed from resin such as acrylic. The protrusions 265 may be symmetrical, preferably a tetrahedron.

Figure 53A:
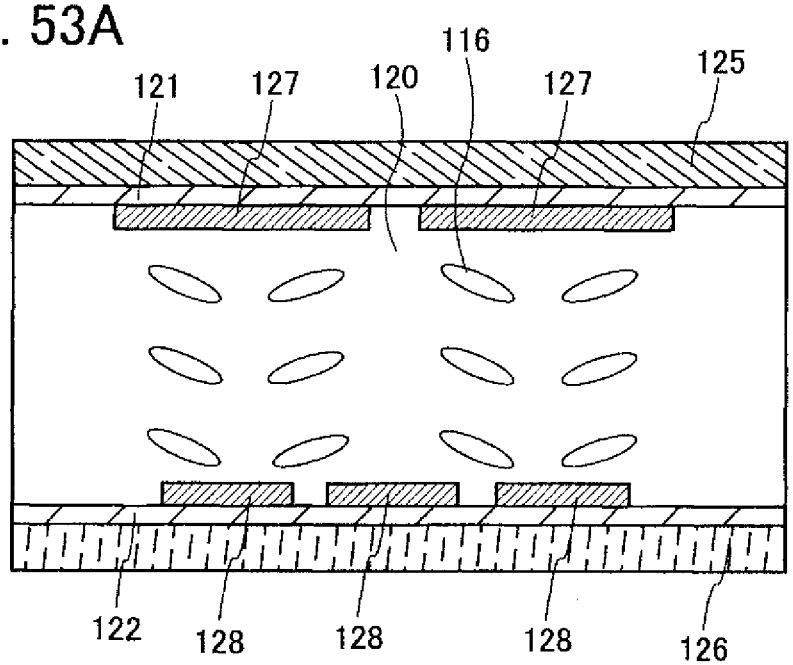
FIGS. 53A and 53B are diagrams each showing a mode of a liquid crystal element according to the present invention.
Figure 53B:
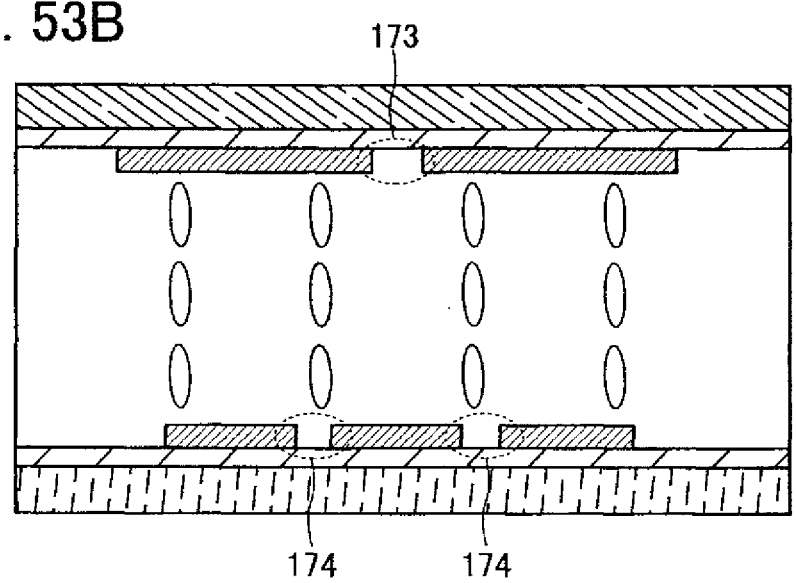

FIGS. 53A and 53B schematically show a liquid crystal display device with a Patterned Vertical Alignment (PVA) mode.

FIGS. 53A and 53B show movement of the liquid crystal molecules 116.

In the PVA mode, a groove 173 of electrodes 127 and grooves 174 of electrodes 128 are provided so as to be misaligned from each other, and the liquid crystal molecules 116 are aligned toward the groove 173 and the grooves 174 which are misaligned, and light passes therethrough.

FIG. 53A shows a state in which voltage is applied, in other words, on-state. At the time of on-state, when an inclined electric field is applied, the liquid crystal molecules 116 are inclined diagonally. Thus, the long axes of the liquid crystal molecule 116 and an absorption axis of the polarizer intersect with each other, and light passes through one of the layers 125 and 126 each including a polarizer, and a light state (white display) results.

FIG. 53B shows a state in which voltage is not applied, that is, an off-state. In the off-state, the liquid crystal molecules 116 line up to be perpendicular to the substrates 121 and 122. Therefore, incident light entered from one of the layers 125 and 126 each including a polarizer which are provided for the substrates 121 and 122 respectively, directly passes through the liquid crystal molecules 116, and intersects with the other one of the layers 125 and 126 each including a polarizer which is an extraction side of light, at right angles. Accordingly, the light is not emitted, and a dark state (black display) results.

By providing the groove 173 in the electrodes 127 and the grooves 174 in the pixel electrodes 128, by the inclined electric field toward the grooves 173 and 174, the liquid crystal molecules 116 are driven obliquely. Accordingly, display with a symmetric property in an oblique direction as well as up and down or right and left directions and with an excellent viewing angle characteristic can be obtained.

Figure 54:
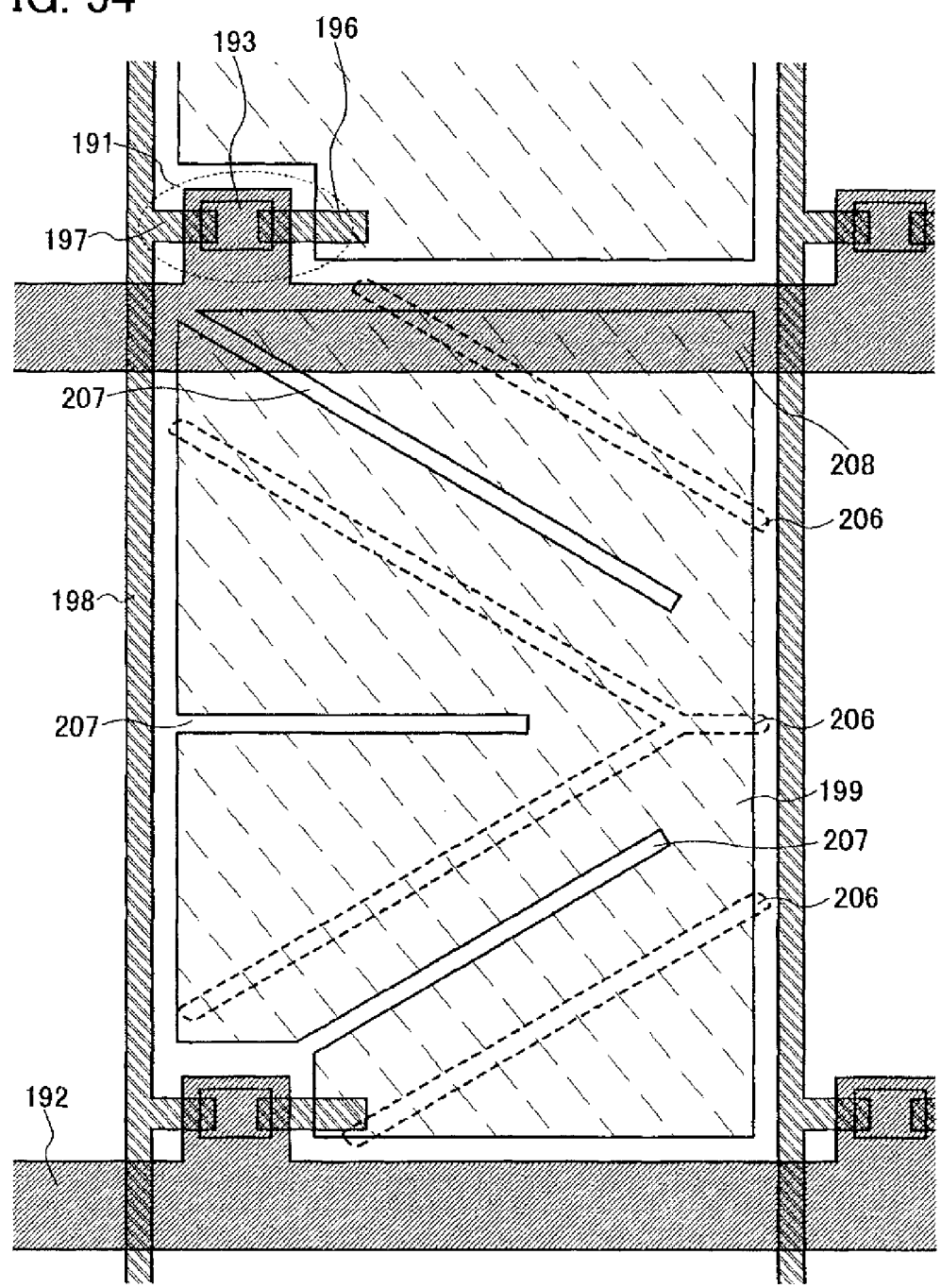
FIG. 54 is a top view showing one pixel of a display device according to the present invention.

FIG. 54 is a top view of an arbitrary pixel in the liquid crystal display device with the PVA mode shown in FIGS. 53A and 53B.

A TFT 191 serving as a switching element of a pixel includes a gate wiring 192, a gate insulating film, an island-shaped semiconductor film 193, a source electrode 197 and a drain electrode 196.

Note that in this embodiment mode, the source electrode 197 and a source wiring 198 are distinguished from each other as a matter of convenience; however the source electrode and the source wiring are formed from the same conductive film and connected to each other. The drain electrode 196 is also formed from the same material and in the same step as the source electrode 197 and the source wiring 198.

A plurality of grooves 207 are provided for a pixel electrode 199 which is electrically connected to the drain electrode 196.

In a region where the gate wiring 192 and the pixel electrode 199 are overlapped, an auxiliary capacitor 208 is formed with the gate insulating film interposed therebetween.

On the opposite electrode (not shown) provided for the opposite substrate, a plurality of grooves (also referred to as ribs) 206 are formed. The grooves 206 of the opposite electrode 206 are arranged so as to be alternated with the grooves 207 of the pixel electrode 199.

In the liquid crystal display device of the PVA mode, display with a symmetric property and an excellent viewing angle characteristic can be obtained.

Figure 49A:
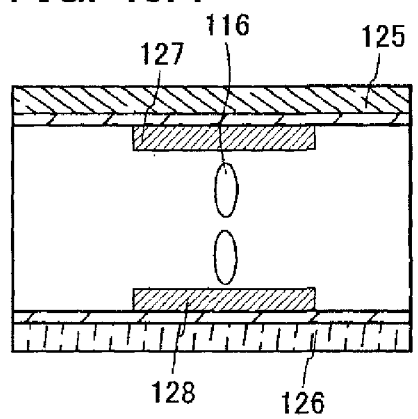
FIGS. 49A and 49B are diagrams each showing a mode of a liquid crystal element according to the present invention.
Figure 49B:
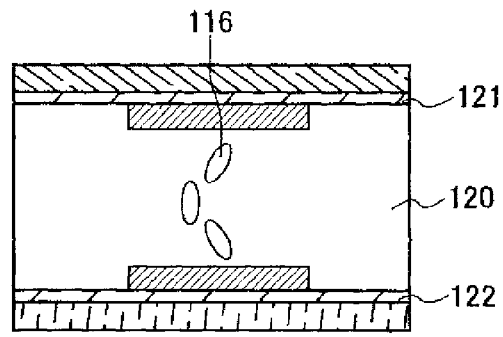

FIGS. 49A and 49B show a schematic view of a liquid crystal display device of an OCB mode. In the OCB mode, alignment of liquid crystal molecules forms a compensation-state optically in a liquid crystal layer, which is referred to as a bend orientation.

Similarly to FIGS. 44A and 44B, in the liquid crystal display device shown in FIGS. 49A and 49B, the first electrode 127 and the second electrode 128 are provided for the first substrate 121 and the second substrate 122 respectively. In the case of a transmission type liquid crystal display device, the electrode on the opposite side of a backlight, i.e., the electrode on the display surface side, for example, the second electrode 128 is formed so as to have at least a light-transmitting property. In addition, in the case of a reflection type liquid crystal display device, one of the first electrode 127 and the second electrode 128 has a light-reflecting property and the other thereof has a light-emitting property.

In a liquid crystal display device having such a structure, when voltage is applied to the first electrode 127 and the second electrode 128 (the vertical electric field method), black display is conducted as shown in FIG. 49A. At this time, the liquid crystal molecules 116 line up vertically. As a result, in the case of the transmission type liquid crystal display device, light from the backlight cannot pass through the substrates, and black display results. Further, in the case of the reflection type liquid crystal display device, a retardation plate is provided, and as for light from the outside, only light composition which oscillates in the direction of the transmission axis of the polarizer can be transmitted and be linearly polarized. This light is circularly polarized by passing through the retardation plate (for example, right-handed circularly polarized light). When this right-handed circularly polarized light is reflected on a reflective plate (or a reflective electrode), it becomes left-handed circularly polarized light. When this left-handed circularly polarized light passes through the retardation plate, it is linearly polarized and oscillates perpendicularly to the transmission axis of the polarizer (parallel to the absorption axis). Therefore, light is absorbed by the absorption axis of the polarizer, and thus, black display results.

As shown in FIG. 49B, when voltage is not applied between the first electrode 127 and the second electrode 128, white display results. At this time, the liquid crystal molecules 116 are aligned to be oriented obliquely. Then, in the case of the transmission type liquid crystal display device, light from the backlight can pass through the substrates provided with the layers 125 and 126 each including a polarizer, and display of a designated image can be conducted. In addition, in the case of the reflection type liquid crystal display device, reflected light passes through the substrate provided with the layers including polarizers, and display of a designated image can be conducted. At this time, full color display can be conducted by the provision of a color filter. The color filter can be provided on either the first substrate 121 side or on the second substrate 122 side.

In such an OCB mode, birefringence in a liquid crystal layer caused in another mode is compensated only in the liquid crystal layer, thereby achieving the wide viewing angle. Further, a contrast ratio can be enhanced by the layer including a polarizer of the present invention.

Figure 50A:
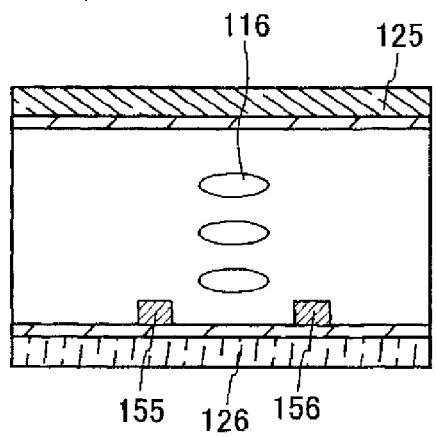
FIGS. 50A and 50B are diagrams each showing a mode of a liquid crystal element according to the present invention.
Figure 50B:
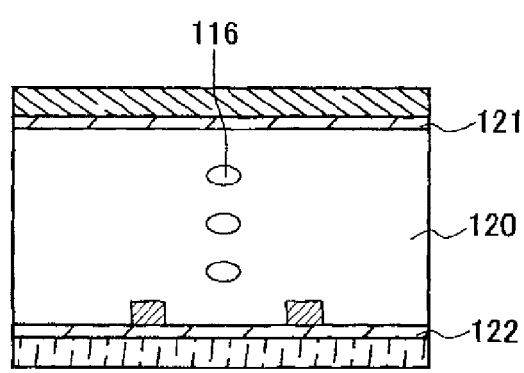

FIGS. 50A and 50B schematically show a liquid crystal display device of an IPS (In-Plane Switching) mode. In the IPS mode, liquid crystal molecules are rotated constantly within a plane with respect to a substrate, and a lateral electrical field method where electrodes are provided only on one substrate side is employed.

In the IPS mode, a liquid crystal is controlled by a pair of electrodes provided on one of the substrates. Therefore, a pair of electrodes 155 and 156 is provided on the second substrate 122. The pair of electrodes 155 and 156 preferably has light transmitting property.

When voltage is applied to the pair of electrodes 155 and 156 in a liquid crystal display device having such a structure, white display results, which means an on-state, as shown in FIG. 50A. Then, in the case of the transmission type liquid crystal display device, light from the backlight can pass through the substrates provided with the layers 125 and 126 each including a polarizer, and display of a designated image can be conducted. In addition, in the case of the reflection type liquid crystal display device, reflected light passes through the substrate provided with the layers including polarizers, and display of a designated image can be conducted. At this time, full color display can be conducted by the provision of a color filter. The color filter can be provided on either the first substrate 121 side or on the second substrate 122 side.

When a voltage is not applied between the pair of electrodes 155 and 156, black display is performed, which means an off state, as shown in FIG. 50B. At this time, the liquid crystal molecules 116 are aligned horizontally (parallel to the substrate) and rotated in a plane. Thus, in the case of a transmission type liquid crystal display device, light from the backlight cannot pass through the substrates, which leads to black display. In the case of a reflection type liquid crystal display device, a retardation plate is provided if necessary, and the phase together with the liquid crystal layer is shifted by 90° and black display is made.

A known liquid crystal material may be used for the IPS mode.

Figure 51A:
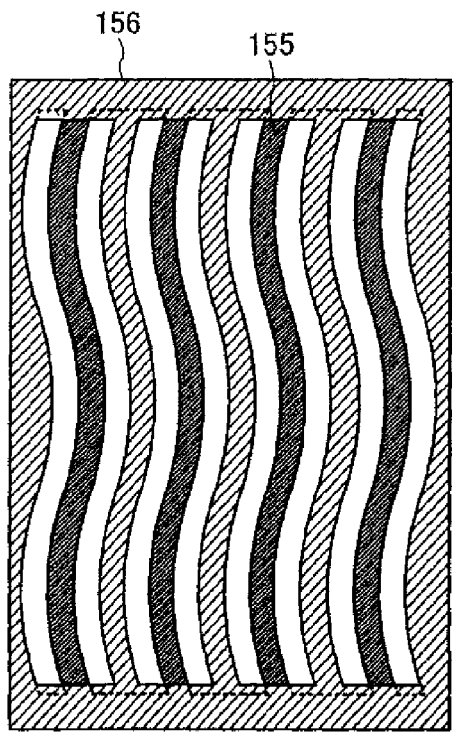
FIGS. 51A to 51D are diagrams showing an electrode which drives liquid crystal molecules of a display device according to the present invention.
Figure 51B:
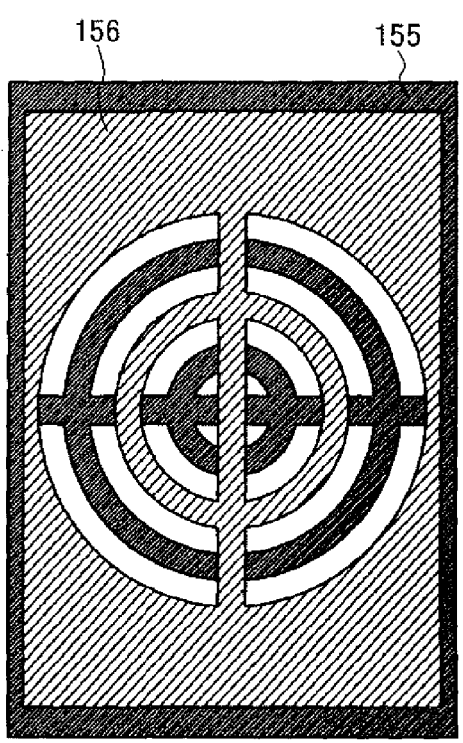
Figure 51C:
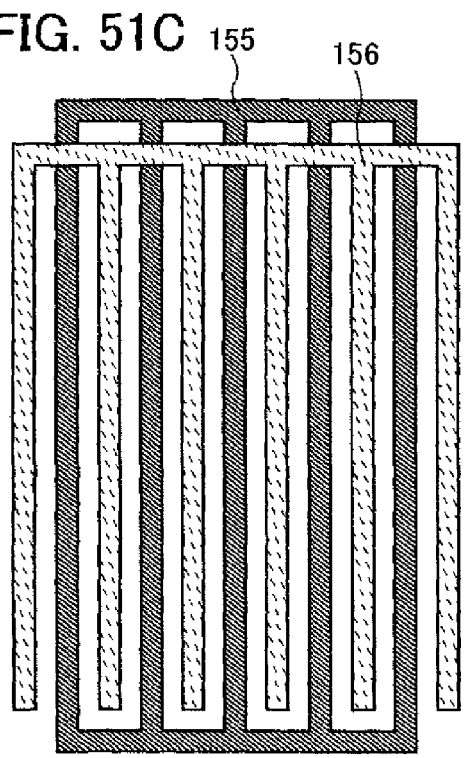
Figure 51D:
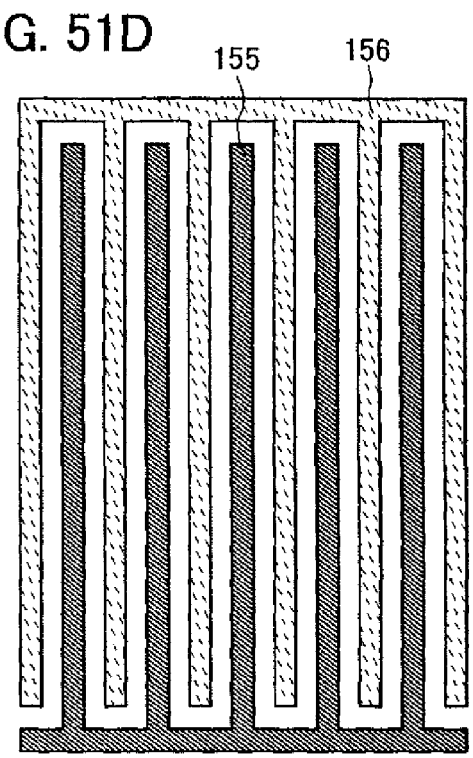

FIGS. 51A to 51D show examples of the pair of electrodes 155 and 156. In FIG. 51A, the pair of electrodes 155 and 156 has a wave-like shape. In FIG. 51B, a part of the pair of electrodes 155 and 156 has a circular shape. In FIG. 51C, the electrode 155 is a lattice-like shape and the electrode 156 has a comb-like shape. In FIG. 51D, each of the electrodes 155 and 156 as a pair has a comb-like electrode.

Figure 52:
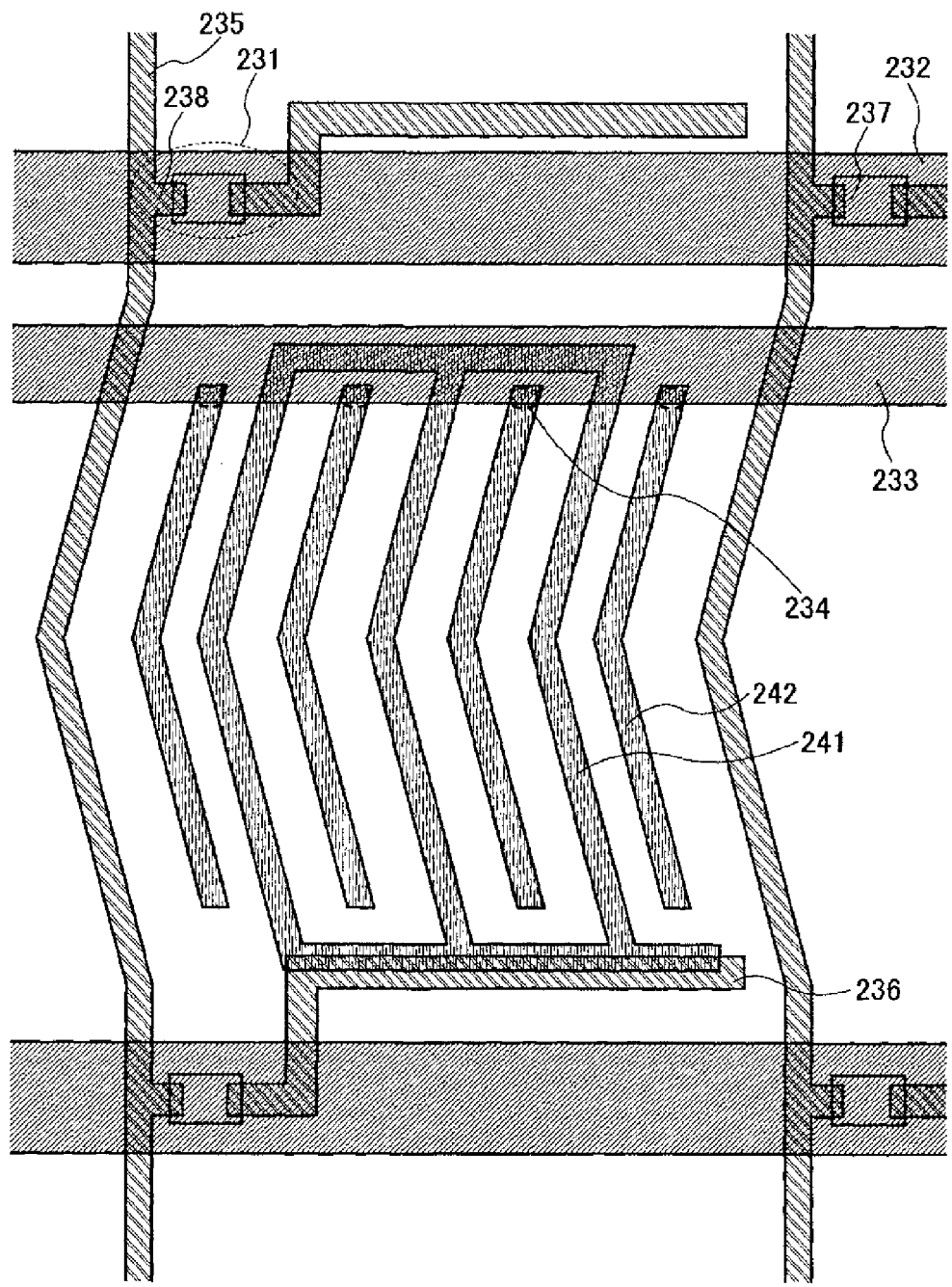
FIG. 52 is a top view showing one pixel of a display device according to the present invention.

FIG. 52 is a top view of an arbitrary pixel in the liquid crystal display device with the IPS mode shown in FIGS. 50A and 50B.

Over a substrate, a gate wiring 232 and a common wiring 233 are formed. The gate wiring 232 and the common wiring 233 are formed from the same material, in the same layer and in the same step.

A TFT 231 serving as a switching element of a pixel includes the gate wiring 232, a gate insulating film, an island-shaped semiconductor film 237, a source electrode 238 and a drain electrode 236.

The source electrode 238 and the source wiring 235 are distinguished from each other as a matter of convenience; however the source electrode and the source wiring are formed from the same conductive film and connected to each other. The drain electrode 236 is also formed from the same material and in the same step as the source electrode 238 and the source wiring 235.

The drain electrode 236 is electrically connected to a pixel electrode 241

The pixel electrode 241 and a plurality of common electrodes 242 are formed in the same step and from the same material. The common electrode 242 is electrically connected to the common wire 233 through a contact hole 234 in the gate insulating film.

Between the pixel electrode 241 and the common electrode 242, a lateral electric field parallel to the substrates is generated to control the liquid crystal.

In the liquid crystal display device with the IPS mode, the liquid crystal molecules do not stand up obliquely, and thus, optical characteristics hardly changes depending on the viewing angle, and thus, a wide viewing angle characteristic can be obtained.

By applying a layer including a polarizer of the present invention to a liquid crystal display device using a lateral electric field, a wide viewing angle can be obtained and display with high contrast ratio can be provided. Such lateral electric field type liquid crystal display device can be suitable for mobile display devices.

Figure 55A:
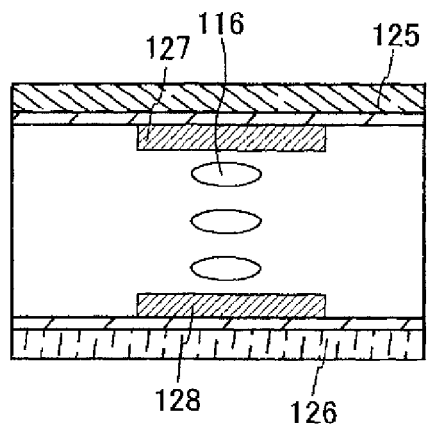
FIGS. 55A and 55B are diagrams each showing a mode of a liquid crystal element according to the present invention.
Figure 55B:
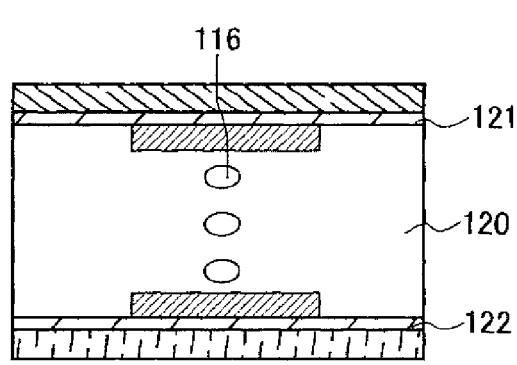

FIGS. 55A and 55B schematically show a Ferro-Electric Liquid Crystal (FLC) mode liquid crystal display mode and an Antiferro-Electric Liquid Crystal (AFLC) mode liquid crystal display device.

The liquid crystal display devices shown in FIGS. 55A and 55B are similar to those shown in FIGS. 44A and 44B, and include the first electrode 127 and the second electrode 128 which are provided on the first substrate 121 and the second substrate 122, respectively. In the case of a transmission type liquid crystal display device, the electrode on the opposite side of a backlight, i.e., the electrode on the display surface side, for example, the second electrode 128 is formed so as to have at least a light-transmitting property. In addition, in the case of a reflection type liquid crystal display device, one of the first electrode 127 and the second electrode 128 has a light-reflecting property and the other one thereof has a light-transmitting property.

In the liquid crystal display device having such a structure, when voltage is applied between the first electrode 127 and the second electrode 128 (vertical electric field), white display is obtained as shown in FIG. 55A. At this time, the liquid crystal molecules 116 are aligned horizontally and rotated within the plane. Then, in the case of the transmission type liquid crystal display device, light from the backlight can pass through the substrates provided with the layers 125 and 126 each including a polarizer, and display of a designated image can be conducted. In addition, in the case of the reflection type liquid crystal display device, reflected light passes through the substrate provided with the layers including polarizers, and display of a designated image can be conducted. At this time, full color display can be conducted by the provision of a color filter. The color filter can be provided on either the first substrate 121 side or on the second substrate 122 side.

When voltage is not applied between the first electrode 127 and the second electrode 128, black display is performed as shown in FIG. 55B. At this time, the liquid crystal molecules 116 are aligned horizontally. Thus, in the case of a transmission type liquid crystal display device, light from the backlight cannot pass through the substrates, which leads to black display. In the case of a reflection type liquid crystal display device, a retardation plate is provided if necessary, and the phase together with the liquid crystal layer is shifted by 90° and black display is made.

Known materials can be used as liquid crystal materials used for an FLC mode liquid crystal display device and an AFLC mode liquid crystal display device.

Next, examples in which the present invention is applied to a Fringe Field Switching (FFS) mode liquid crystal display device and an Advanced Fringe Field Switching (AFFS) mode liquid crystal display device, are described.

Figure 56A:
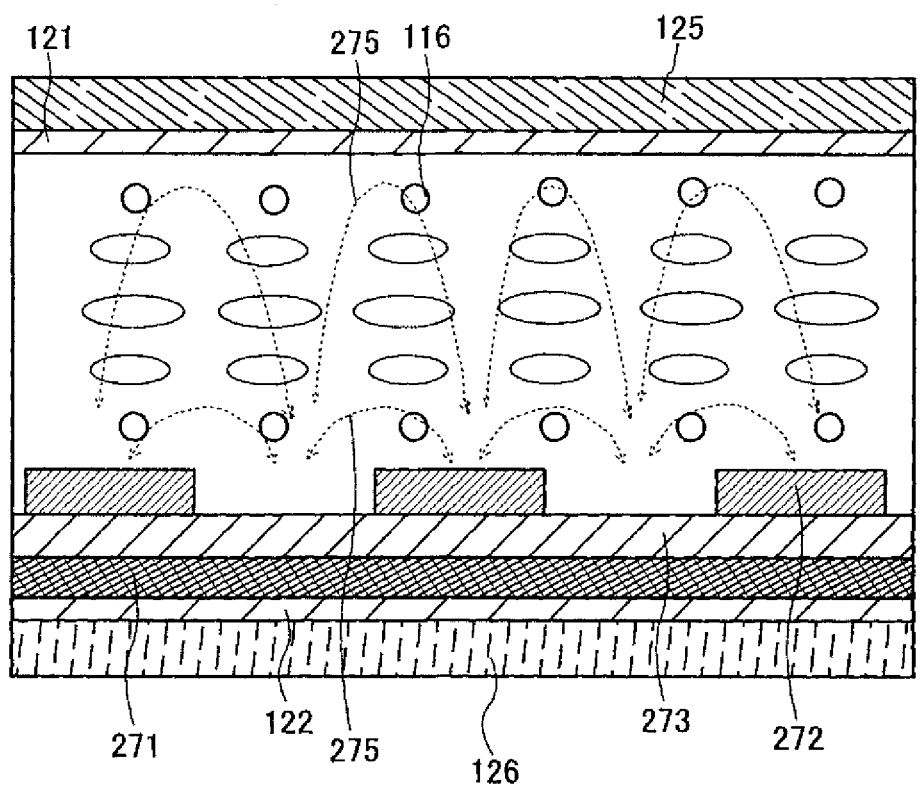
FIGS. 56A and 56B are diagrams each showing a mode of a liquid crystal element according to the present invention.
Figure 56B:
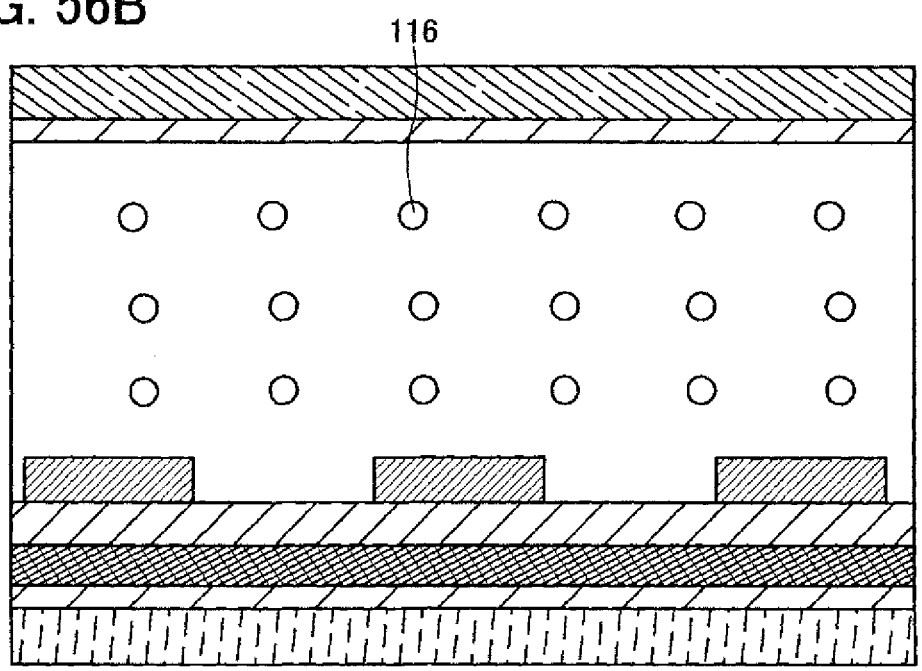

FIGS. 56A and 56B schematically show an AFFS mode liquid crystal display device.

The same elements in the liquid crystal display device shown in FIGS. 56A and 56B as those in FIGS. 44A and 44B are denoted by the same reference numerals. Over the second electrode 122, a first electrode 271, an insulating layer 273, and a second electrode 272 are provided. The first electrode 271 and the second electrode 272 have a light-transmitting property.

As shown in FIG. 56A, when voltage is applied to the first electrode 271 and the second electrode 272, a horizontal electric field 275 is generated. The liquid crystal molecules 116 rotate in a horizontal direction and twist, so that light can pass through the liquid crystal molecules. The rotation angles of the liquid crystal molecules are various, and obliquely incident light can pass through the liquid crystal molecules. Then, in the case of the transmission type liquid crystal display device, light from the backlight can pass through the substrates provided with the layers 125 and 126 each including a polarizer, and display of a designated image can be conducted. In addition, in the case of the reflection type liquid crystal display device, reflected light passes through the substrate provided with the layers including polarizers, and display of a designated image can be conducted. At this time, full color display can be conducted by the provision of a color filter. The color filter can be provided on either the first substrate 121 side or on the second substrate 122 side.

As shown in FIG. 50B, a state in which voltage is not applied between the first electrode 271 and the second electrode 272, black display, i.e., an off-state is obtained. At this time, the liquid crystal molecules 116 are aligned horizontally and rotated within a plane. Thus, in the case of a transmission type liquid crystal display device, light from the backlight cannot pass through the substrates, which leads to black display. Further, in the case of the reflection type liquid crystal display device, a retardation plate is provided, and as for light from the outside, only light composition which oscillates in the direction of the transmission axis of the polarizer can be transmitted and be linearly polarized. This light is circularly polarized by passing through the retardation plate (for example, right-handed circularly polarized light). When this right-handed circularly polarized light is reflected on a reflective plate (or a reflective electrode), it becomes left-handed circularly polarized light. When this left-handed circularly polarized light passes through the retardation plate, it is linearly polarized and oscillates perpendicularly to the transmission axis of the polarizer (parallel to the absorption axis). Therefore, light is absorbed by the absorption axis of the polarizer, and thus, black display results.

Known materials cam be used as liquid crystal materials used for an FFS mode liquid crystal display device and an AFFS mode liquid crystal display device.

Figure 57A:
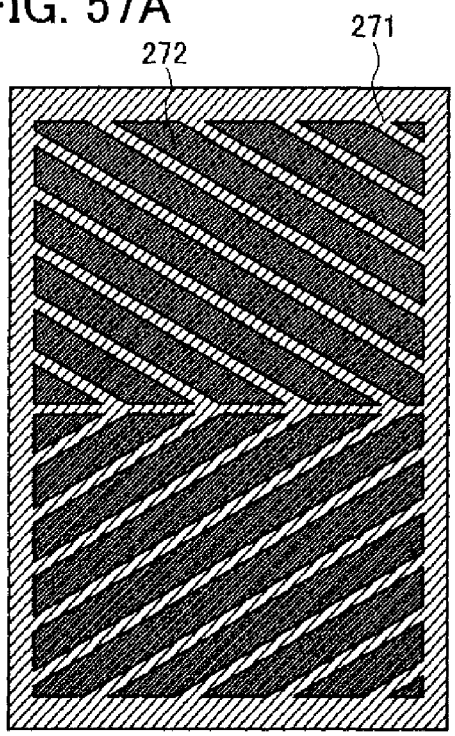
FIGS. 57A to 57D are diagrams each showing an electrode which drives liquid crystal molecules of a display device according to the present invention.
Figure 57B:
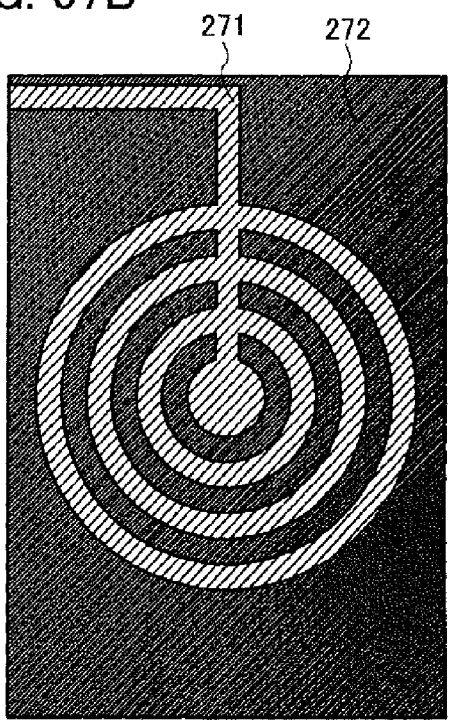
Figure 57C:
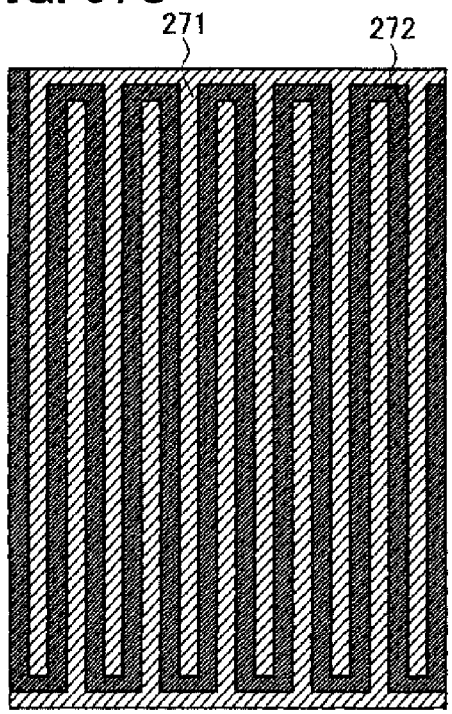
Figure 57D:
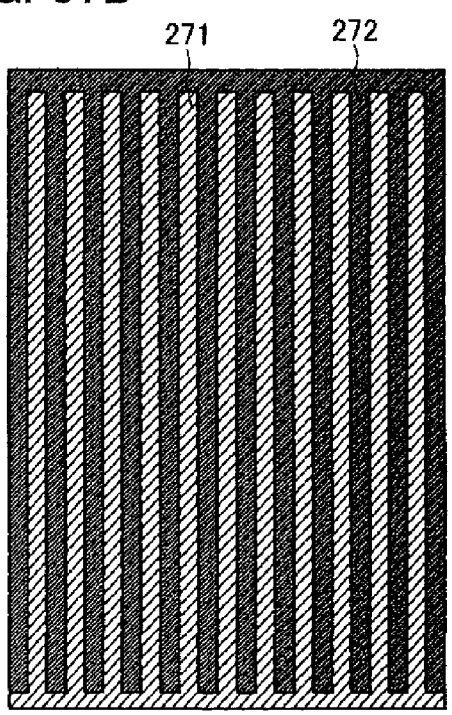

FIGS. 57A to 57D show examples of the first electrode 271 and the second electrode 272. In FIGS. 57A to 57D, the first electrode 271 is formed entirely, and the second electrodes 272 have various shapes. In FIG. 57A, the second electrode 272 has a reed-shaped and is arranged obliquely. In FIG. 57B, the second electrode 272 has partially circular shaped. In FIG. 57C, the second electrode 272 has a zigzag shape. In FIG. 57D, the second electrode 272 has a comb-like shape.

Additionally, the present invention can be applied to an optical rotation mode liquid crystal display device, a scattering mode liquid crystal display device, and a birefringent mode liquid crystal display device.

This embodiment mode can be freely combined with other embodiment modes and examples in this specification.

Embodiment Mode 30

Embodiment Mode 30 will describe application examples in which the liquid crystal display devices shown in Embodiment Modes 4 to 15 and Embodiment Modes 25 to 28 are applied to a 2D/3D switchable (two dimensional and three dimensional switchable) liquid crystal display device.

Figure 58:
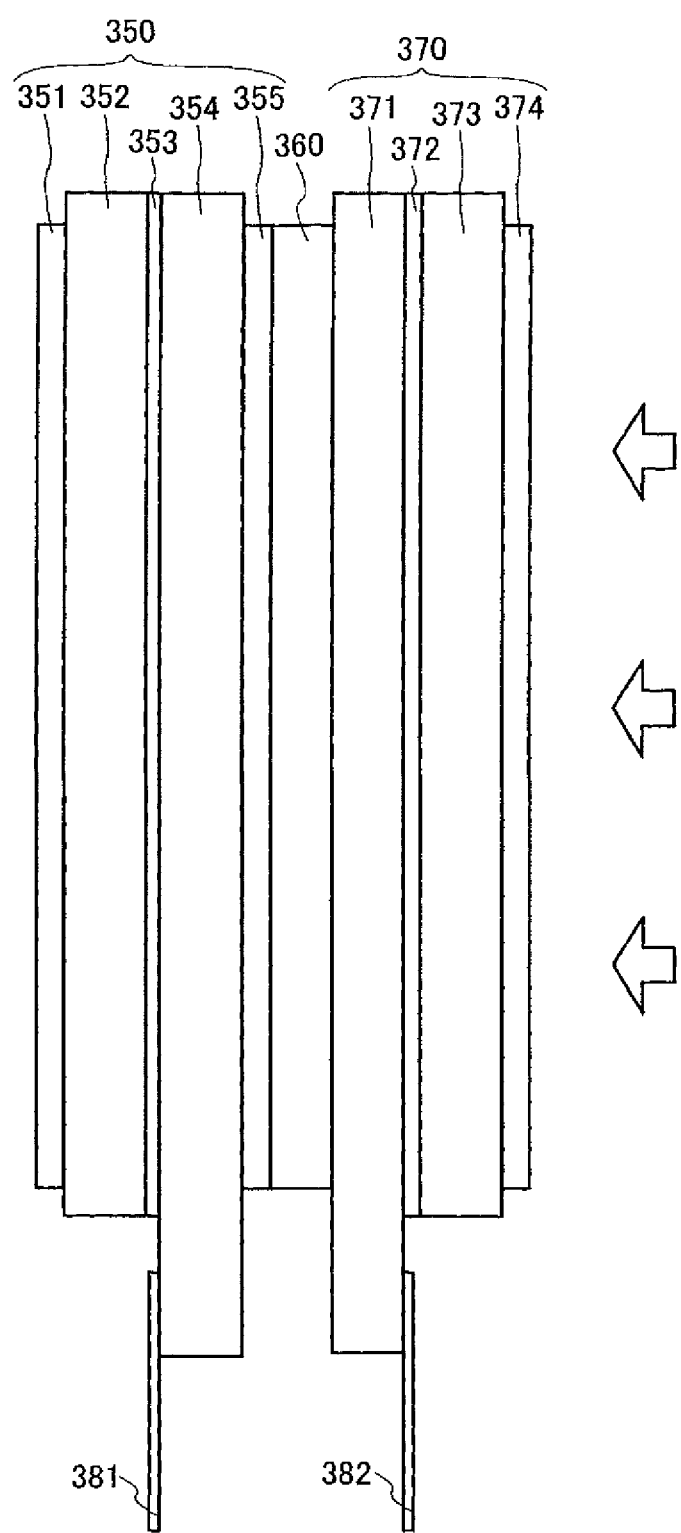
FIG. 58 is a diagram showing a 2D/3D switching type liquid crystal display panel having a display device according to the present invention.

FIG. 58 shows a structure of a 2D/3D switchable liquid crystal display panel in this embodiment mode.

As shown in FIG. 58, the 2D/3D switchable liquid crystal display panel has a structure in which a display panel of liquid crystal 350 (also referred to as a liquid crystal display panel 350), a retardation plate 360, and a switching liquid crystal panel 370 are attached.

The liquid crystal display panel 350 is provided as a TFT liquid crystal display panel, in which a first polarizing plate 351, an opposite substrate 352, a liquid crystal layer 353, an active matrix type substrate 354, and a second polarizing plate 355 are stacked. To the active matrix type substrate 354, video data corresponding to an image to be displayed is input, through a wiring 381 such as a flexible printed circuit (FPC).

In other words, the liquid crystal display panel 350 is provided so as to give the 2D/3D switchable liquid crystal display panel a function for producing an image on a display screen in accordance with the video data. In addition, there are no particular limitations on display modes (e.g., TN mode and STN mode) and driving methods (e.g., active matrix driving or passive matrix driving) for the liquid crystal display panel 350, as long as a function for producing images on the display screen can be obtained.

The retardation plate 360 serves as a part of a parallax barrier, and has a structure in which an orientation film is provided for a light-transmitting substrate, and a liquid crystal layer is stacked thereover.

In the switching liquid crystal panel 370, a driver side substrate 371, a liquid crystal layer 372, an opposite substrate 373 and a third polarizing plate 374 are stacked, and a wiring 382 for applying a driving voltage at the time of turning on the liquid crystal layer 372 is connected to the driver side substrate 371.

The switching liquid crystal panel 370 is provided in order to switch polarized state of light which passes through the switching liquid crystal panel 370, in accordance with ON/OFF of the liquid crystal layer 372. In addition, like the liquid crystal display panel 350, it is not necessary that the switching liquid crystal panel 370 is driven by a matrix driving method, and driving electrodes provided for the driver side substrate 371 and the opposite substrate 373 may be provided over the entire surface of an active area of the switching liquid crystal panel 370.

Next, display operation of the 2D/3D switchable liquid crystal display panel is described.

Incident light which is emitted from a light source is polarized by the third polarizing plate 374 of the switching liquid crystal panel 370 first. In addition, the switching liquid crystal panel 370 serves as a retardation plate (here, a half wave plate) at the off-state when 3D display is conducted.

In addition, then, the light which has passed through the switching liquid crystal panel 370 enters the retardation plate 360. The retardation plate 360 includes a first region and a second region, and rubbing directions of the first region and the second region are different. A state of the different rubbing directions means a state in which light which has passed through the first region and light which has passed through the second region have different polarized states since the slow axes are in different directions. For example, a polarizing axis of the light which has passed through the first region is different by 90° from that of the light which has passed through the second region. In addition, the retardation plate 360 is set to serve as a half wave plate, based on birefringence anisotropy and thickness of the liquid crystal layer included in the retardation plate 360.

The light which has passed through the retardation plate 360 enters the second polarizing plate 355 of the liquid crystal display panel 350. At the time of 3D display, the polarizing axis of the light which has passed through the first region of the retardation plate 360 is parallel with a transmission axis of the second polarizing plate 355, and the light which has passed through the first region passes through the second polarizing plate 355. On the other hand, the polarizing axis of the light which has passed through the second region of the retardation plate 360 is shifted by 90° from the transmission axis of the second polarizing plate 355, and the light which has passed through the second region does not passes through the second polarizing plate 355.

In other words, by the optical characteristics of the retardation plate 360 and the second polarizing plate 355, the function of a parallax barrier is achieved, and the first region of the retardation plate 360 becomes a transmission region and the second region becomes a shielding region.

The light which has passed through the second polarizing plate 355 is subjected to different optical modulation in pixels of black and pixels of white in the liquid crystal layer 353 of the liquid crystal display panel 350, and only light which has been subjected to optical modulation in the pixels of white passes through the first polarizing plate 351 and an image is displayed.

At this time, light passes through the transmission region of the parallax barrier, or light having a particular viewing angle passes through each pixel corresponding to an image for right eye and an image for left eye in the liquid crystal display panel 350. Thus, the image for right eye and the image for left eye are separated into different viewing angles, and thus 3D display is provided.

Further, at the time of 2D display, the switching liquid crystal panel 370 is turned on, and the light which has passed through the switching liquid crystal panel 370 is not subjected to optical modulation. The light which has passed through the switching liquid crystal panel 370 then passes through the retardation plate 360, and the light which has passed through the first region and the light which has passed through the second region are provided with different polarized states.

However, 2D display is different from 3D display in that optical modulation effect is not generated in the switching liquid crystal display panel 370. Thus, in the case of 2D display, the polarizing axis of the light which passes through the polarizing plate 360 is symmetrically misaligned in the angle from the transmission axis of the second polarizing plate 355. Therefore, the light which has passed through the first region of the retardation plate 360 and the light which has passed through the second region thereof both pass through the second polarizing plate 355 with the same transmittance, and the function of a parallax barrier by the optical effect between the retardation plate 360 and the second polarizing plate 355 is not achieved (a particular viewing angle is not obtained). In this manner, 2D display is provided.

This embodiment mode can be freely combined with other embodiment modes and examples in this specification if necessary.

Embodiment Mode 31

Electronic devices to which the display device of the present invention is applied includes: television devices (also simply referred to as TVs or television receivers), cameras such as digital cameras and digital video cameras, mobile phone sets (also simply referred to as cellular phone sets or cellular phones), portable information terminals such as PDA, portable game machines, monitors for computers, computers, audio reproducing devices such as car audio sets, image reproducing devices provided with a recording medium such as home-use game machines, and the like. Specific examples thereof are described with reference to FIGS. 65A to 65F.

Figure 65A:
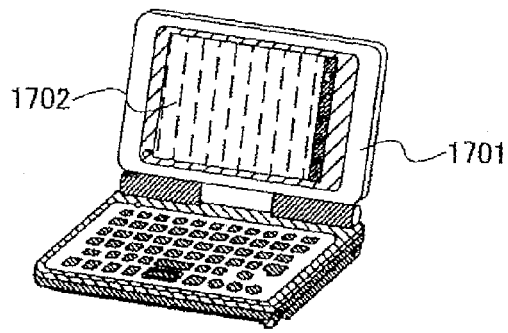
FIGS. 65A to 65F are views each showing an electronic apparatus having a display device according to the present invention.

A portable information terminal device shown in FIG. 65A includes a main body 1701, a display portion 1702, and the like. The display device of the present invention can be applied to the display portion 1702. Thus, a portable information terminal device with a high contrast ratio can be provided.

Figure 65B:
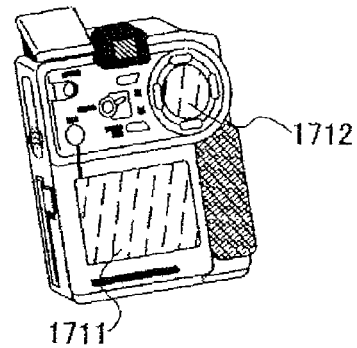

A digital video camera shown in FIG. 65B includes a display portion 1711, a display portion 1712, and the like. The display device of the present invention can be applied to the display portion 1711. Thus, a digital video camera with a high contrast ratio can be provided.

Figure 65C:
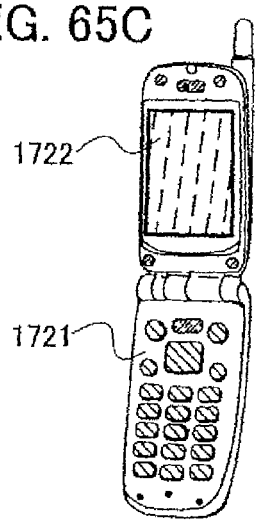

A cellular phone set shown in FIG. 65C includes a main body 1721, a display portion 1722, and the like. The display device of the present invention can be applied to the display portion 1722. Thus, a cellular phone set with a high contrast ratio can be provided.

Figure 65D:
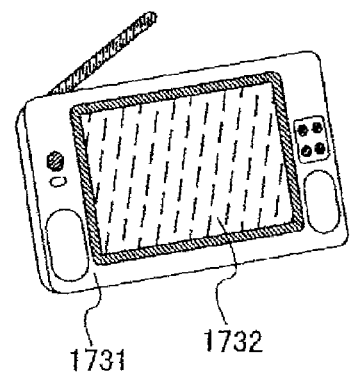

A portable television device shown in FIG. 65D includes a main body 1731, a display portion 1732, and the like. The display device of the present invention can be applied to the display portion 1732. Thus, a portable television device with a high contrast ratio can be provided. The display device of the present invention can be applied to various types of television devices including a small-sized television incorporated in a portable terminal such as a cellular phone set, a medium-sized television which is portable, and a large-sized television (for example, 40 inches in size or more).

Figure 65E:
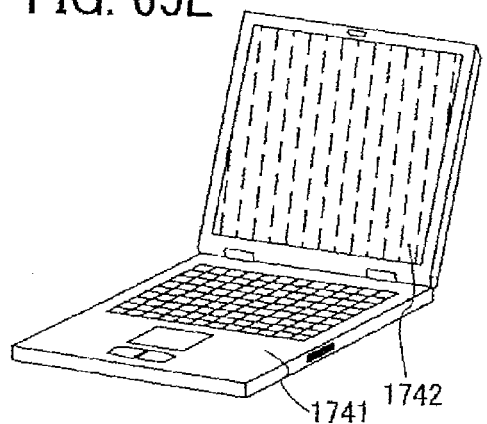

A portable computer shown in FIG. 65E includes a main body 1741, a display portion 1742, and the like. The display device of the present invention can be applied to the display portion 1742. Thus, a portable computer with a high contrast ratio can be provided.

Figure 65F:
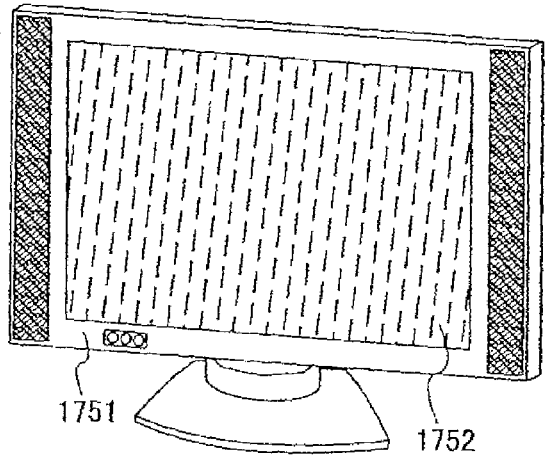

A television device shown in FIG. 65F includes a main body 1751, a display portion 1752, and the like. The display device of the present invention can be applied to the display portion 1752. Thus, a television device with a high contrast ratio can be provided.

Figure 66:
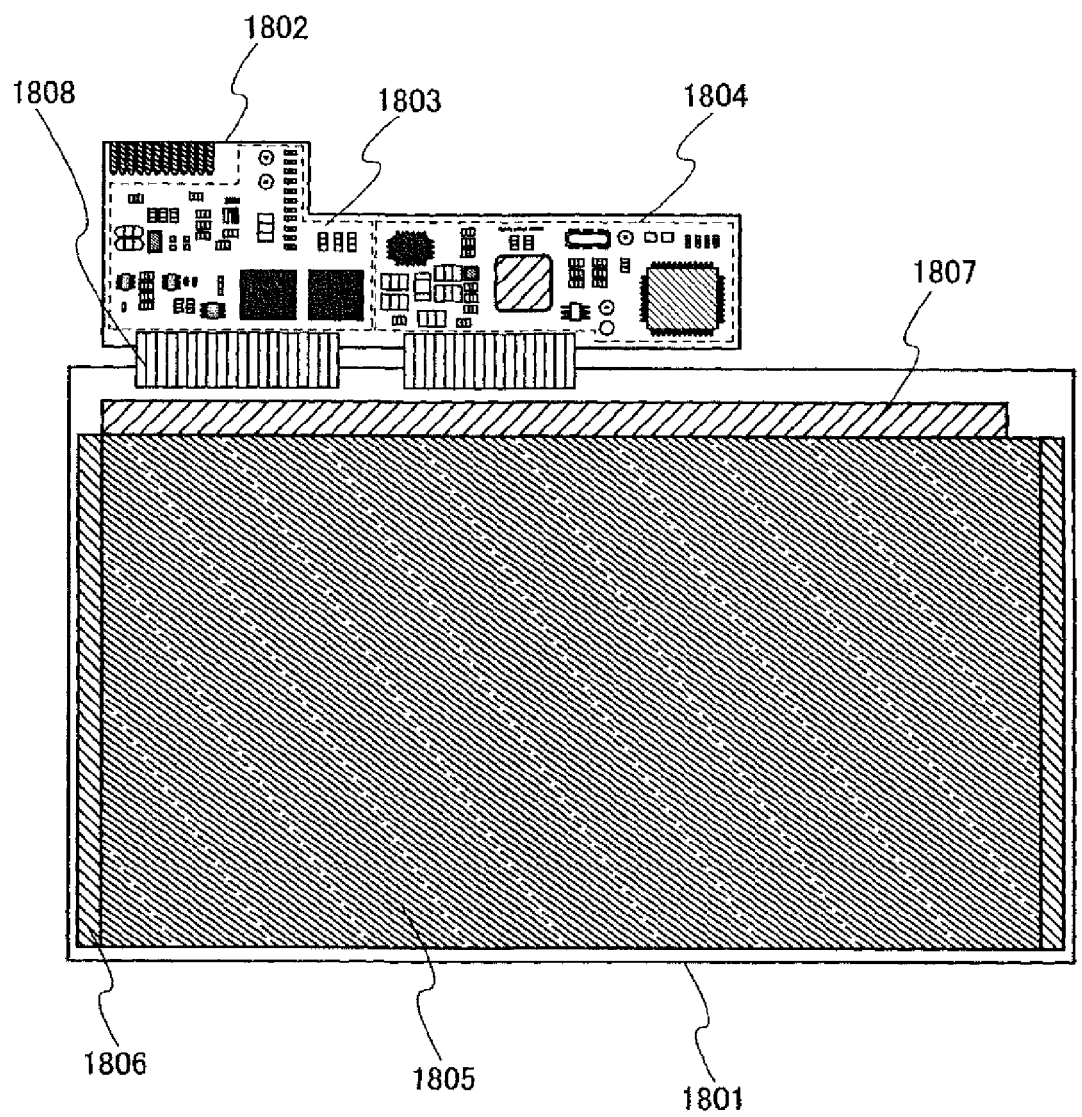
FIG. 66 is a view showing an electronic apparatus having a display device according to the present invention.
Figure 67:
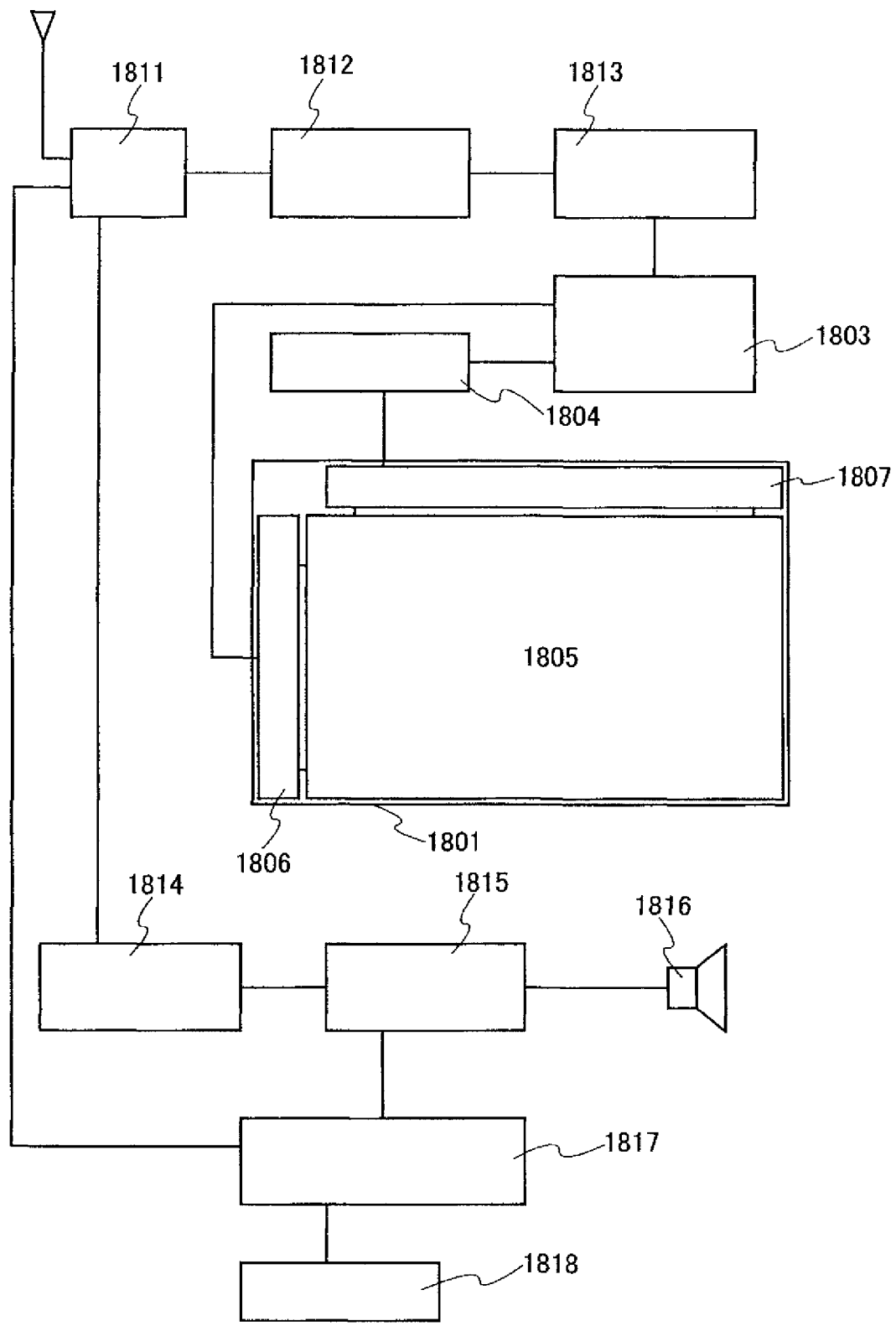
FIG. 67 is a view showing an electronic apparatus having a display device according to the present invention.
Figure 68:
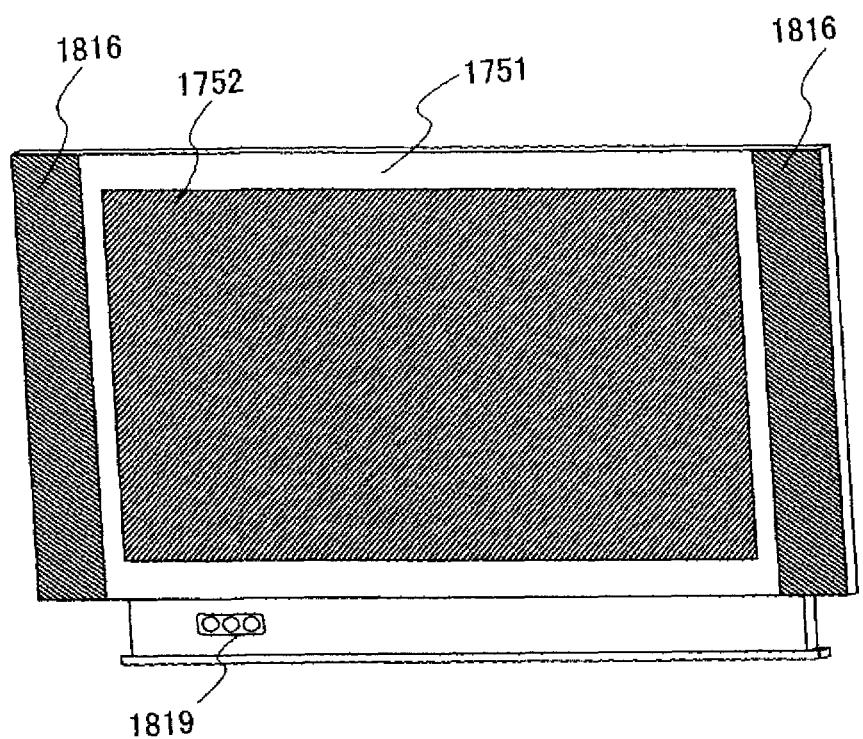
FIG. 68 is a view showing an electronic apparatus having a display device according to the present invention.

FIGS. 66 to 68 show detailed structures of the television device shown in FIG. 65F.

FIG. 66 shows a liquid crystal module or a light-emitting display module (e.g., an EL module) constructed by combining a display panel 1801 and a circuit board 1802. Over the circuit board 1802, a control circuit 1803, a signal dividing circuit 1804 and/or the like are formed, which are electrically connected to the display panel 1801 and the circuit board 1802 through a connecting wiring 1808.

The display panel 1801 has a pixel portion 1805, a scan line driver circuit 1806, and a signal line driver circuit 1807 for supplying an image signal to a selected pixel. This structure is similar to those shown in FIGS. 20, 21 and 32.

A liquid crystal television device or a light-emitting display television device can be completed by using the liquid crystal module or the light-emitting display module. FIG. 67 is a block diagram showing the main configuration of the liquid crystal television device or the light-emitting display television device. A tuner 1811 receives an image signal and an audio signal. The image signal is processed by an image signal amplifying circuit 1812, an image signal processing circuit 1813 for converting an output signal from the image signal amplifying circuit 1812 to a color signal corresponding to each color of red, green and blue, and the control circuit 1803 for converting the image signal to be input into a driver IC. The control circuit 1803 outputs a signal to each of a scan line side and a signal line side. In the case of digital drive, the signal dividing circuit 1804 may be provided on the signal line side so that the input digital signal is divided into m signals to be supplied.

Of the signals received by the tuner 1811, an audio signal is transmitted to the audio signal amplifying circuit 1814, and an output thereof is supplied to a speaker 1816 through an audio signal processing circuit 1815. A control circuit 1817 receives control data on the receiving station (receive frequency) and volume from an input portion 1818, and transmits the signal to the tuner 1811 and the audio signal processing circuit 1815.

As shown in FIG. 68, a television receiver can be completed by incorporating a liquid crystal module or a light-emitting display module into the main body 1751. A display portion 1752 is formed using the liquid crystal module or the light-emitting display module. In addition, speakers 1816, an operating switch 1819 and/or the like are provided as appropriate.

By incorporating the display panel 1801 formed according to the present invention, a television device with a high contrast ratio can be provided.

Needless to say, the present invention is not limited to such television receivers, and can be applied to various objects, in particular, as a large-area advertising display medium, for example, an information display board at the train station or airport, an advertising display board on the street and the like, in addition to a monitor of a personal computer.

As described above, electronic devices with high contrast ratio can be provided by using the display devices of the present invention.

This embodiment mode can be freely combined with other embodiment modes and examples in this specification if necessary.

Example 1

Example 1 will describe a result of an optical calculation in the case where polarizing plates having different wavelength distributions of extinction coefficients of absorption axes are stacked when an electroluminescent element in which light is emitted to both sides is assumed to be used. Further, as a comparison, an optical calculation in a case of using one kind of one polarizing plate for each side and an optical calculation in a case of using two sets of one kind of two polarizing plates were performed. Note that a contrast ratio was a ratio of white transmittance to black transmittance (white transmittance/black transmittance), and black transmittance and white transmittance were figured out, from which a contrast ratio was calculated.

For the calculation in this example, the optical calculation simulator for liquid crystal LCD MASTER (manufactured by SHINTECH, Inc.) was used. An optical calculation of transmittance with respect to a wavelength was performed by the LCD MASTER with an optical calculation algorithm of 2×2 matrix, which was not in view of multiple interference between elements, and an optical source wavelength of an 10 nm interval between 380 nm and 780 nm.

Figure 69:
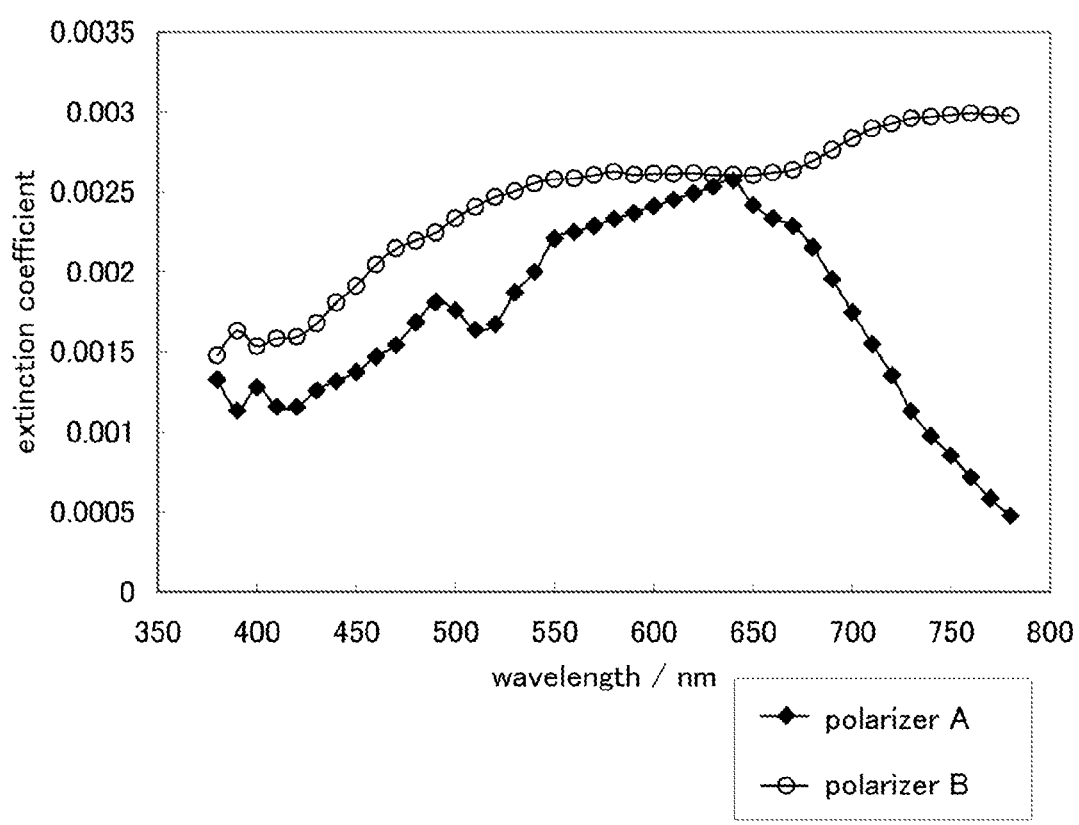
FIG. 69 is a graph showing extinction coefficients of polarizing plates of Example 1.

In this example, a polarizing plate A and a polarizing plate B having wavelength distributions of extinction coefficients different from each other were stacked were used. As the polarizing plate A, EG1425DU manufactured by Nitto Denko Corporation was used. As the polarizing plate B, SHC-PGW301 manufactured by Polatechno Co., Ltd. was used. FIG. 69 shows wavelength dependence (wavelength distribution) of the extinction coefficient of the absorption axis of each polarizing plate. According to FIG. 69, it can be seen that polarizing plates had different wavelength distributions of extinction coefficients. Further, a thickness of each of the polarizing plates was 180 μm. For a backlight, a D65 light source was used, and a polarizing state was mixed circularly polarization.

Table 1 shows wavelength dependence (wavelength distribution) of refractive indexes of a transmission axis and an absorption axis of the polarizing plate A, and extinction coefficients of the transmission axis and the absorption axis of the polarizing plate A.

TABLE 1

| wavelength/nm | refractive index of transmission axis | refractive index of absorption axis | extinction coefficient of transmission axis | extinction coefficient of absorption axis |
|---|---|---|---|---|
| 380 | 1.5 | 1.5 | 9.44E−04 | 1.33E−03 |
| 390 | 1.5 | 1.5 | 3.48E−04 | 1.13E−03 |
| 400 | 1.5 | 1.5 | 1.87E−04 | 1.28E−03 |
| 410 | 1.5 | 1.5 | 1.04E−04 | 1.16E−03 |
| 420 | 1.5 | 1.5 | 6.84E−05 | 1.15E−03 |
| 430 | 1.5 | 1.5 | 5.35E−05 | 1.26E−03 |
| 440 | 1.5 | 1.5 | 4.66E−05 | 1.32E−03 |
| 450 | 1.5 | 1.5 | 4.27E−05 | 1.38E−03 |
| 460 | 1.5 | 1.5 | 3.95E−05 | 1.47E−03 |
| 470 | 1.5 | 1.5 | 3.74E−05 | 1.54E−03 |
| 480 | 1.5 | 1.5 | 3.56E−05 | 1.69E−03 |
| 490 | 1.5 | 1.5 | 3.42E−05 | 1.81E−03 |
| 500 | 1.5 | 1.5 | 3.29E−05 | 1.76E−03 |
| 510 | 1.5 | 1.5 | 3.21E−05 | 1.64E−03 |
| 520 | 1.5 | 1.5 | 3.17E−05 | 1.67E−03 |
| 530 | 1.5 | 1.5 | 3.16E−05 | 1.87E−03 |
| 540 | 1.5 | 1.5 | 3.17E−05 | 2.00E−03 |
| 550 | 1.5 | 1.5 | 3.22E−05 | 2.21E−03 |
| 560 | 1.5 | 1.5 | 3.34E−05 | 2.25E−03 |
| 570 | 1.5 | 1.5 | 3.40E−05 | 2.29E−03 |
| 580 | 1.5 | 1.5 | 3.46E−05 | 2.33E−03 |
| 590 | 1.5 | 1.5 | 3.40E−05 | 2.37E−03 |
| 600 | 1.5 | 1.5 | 3.39E−05 | 2.41E−03 |
| 610 | 1.5 | 1.5 | 3.39E−05 | 2.45E−03 |
| 620 | 1.5 | 1.5 | 3.38E−05 | 2.49E−03 |
| 630 | 1.5 | 1.5 | 3.37E−05 | 2.53E−03 |
| 640 | 1.5 | 1.5 | 3.36E−05 | 2.57E−03 |
| 650 | 1.5 | 1.5 | 3.36E−05 | 2.42E−03 |
| 660 | 1.5 | 1.5 | 3.28E−05 | 2.34E−03 |
| 670 | 1.5 | 1.5 | 3.20E−05 | 2.29E−03 |
| 680 | 1.5 | 1.5 | 3.13E−05 | 2.15E−03 |
| 690 | 1.5 | 1.5 | 3.07E−05 | 1.95E−03 |
| 700 | 1.5 | 1.5 | 2.97E−05 | 1.75E−03 |
| 710 | 1.5 | 1.5 | 3.14E−05 | 1.55E−03 |
| 720 | 1.5 | 1.5 | 3.08E−05 | 1.36E−03 |
| 730 | 1.5 | 1.5 | 3.12E−05 | 1.13E−03 |
| 740 | 1.5 | 1.5 | 2.97E−05 | 9.76E−04 |
| 750 | 1.5 | 1.5 | 2.62E−05 | 8.54E−04 |
| 760 | 1.5 | 1.5 | 2.46E−05 | 7.16E−04 |
| 770 | 1.5 | 1.5 | 2.37E−05 | 5.85E−04 |
| 780 | 1.5 | 1.5 | 2.02E−05 | 4.80E−04 |

Table 2 shows wavelength dependence (wavelength distribution) of refractive indexes of a transmission axis and an absorption axis of the polarizing plate B, and extinction coefficients of the transmission axis and the absorption axis of the polarizing plate B.

TABLE 2

| wavelength/nm | refractive index of transmission axis | refractive index of absorption axis | extinction coefficient of transmission axis | extinction coefficient of absorption axis |
|---|---|---|---|---|
| 380 | 1.5 | 1.5 | 1.07E−03 | 1.48E−03 |
| 390 | 1.5 | 1.5 | 7.27E−04 | 1.63E−03 |
| 400 | 1.5 | 1.5 | 4.54E−04 | 1.53E−03 |
| 410 | 1.5 | 1.5 | 2.75E−04 | 1.59E−03 |
| 420 | 1.5 | 1.5 | 1.66E−04 | 1.59E−03 |
| 430 | 1.5 | 1.5 | 1.10E−04 | 1.68E−03 |
| 440 | 1.5 | 1.5 | 8.28E−05 | 1.81E−03 |
| 450 | 1.5 | 1.5 | 7.01E−05 | 1.91E−03 |
| 460 | 1.5 | 1.5 | 6.51E−05 | 2.05E−03 |
| 470 | 1.5 | 1.5 | 6.23E−05 | 2.15E−03 |
| 480 | 1.5 | 1.5 | 6.11E−05 | 2.20E−03 |
| 490 | 1.5 | 1.5 | 5.98E−05 | 2.24E−03 |
| 500 | 1.5 | 1.5 | 5.85E−05 | 2.33E−03 |
| 510 | 1.5 | 1.5 | 5.77E−05 | 2.41E−03 |
| 520 | 1.5 | 1.5 | 5.63E−05 | 2.47E−03 |
| 530 | 1.5 | 1.5 | 5.49E−05 | 2.50E−03 |
| 540 | 1.5 | 1.5 | 5.31E−05 | 2.55E−03 |
| 550 | 1.5 | 1.5 | 5.11E−05 | 2.58E−03 |
| 560 | 1.5 | 1.5 | 4.85E−05 | 2.58E−03 |
| 570 | 1.5 | 1.5 | 4.64E−05 | 2.60E−03 |
| 580 | 1.5 | 1.5 | 4.36E−05 | 2.63E−03 |
| 590 | 1.5 | 1.5 | 4.16E−05 | 2.61E−03 |
| 600 | 1.5 | 1.5 | 3.98E−05 | 2.61E−03 |
| 610 | 1.5 | 1.5 | 3.85E−05 | 2.61E−03 |
| 620 | 1.5 | 1.5 | 3.77E−05 | 2.62E−03 |
| 630 | 1.5 | 1.5 | 3.65E−05 | 2.60E−03 |
| 640 | 1.5 | 1.5 | 3.61E−05 | 2.61E−03 |
| 650 | 1.5 | 1.5 | 3.54E−05 | 2.60E−03 |
| 660 | 1.5 | 1.5 | 3.48E−05 | 2.62E−03 |
| 670 | 1.5 | 1.5 | 3.49E−05 | 2.64E−03 |
| 680 | 1.5 | 1.5 | 3.45E−05 | 2.70E−03 |
| 690 | 1.5 | 1.5 | 3.46E−05 | 2.76E−03 |
| 700 | 1.5 | 1.5 | 3.50E−05 | 2.83E−03 |
| 710 | 1.5 | 1.5 | 3.48E−05 | 2.90E−03 |
| 720 | 1.5 | 1.5 | 3.50E−05 | 2.93E−03 |
| 730 | 1.5 | 1.5 | 3.54E−05 | 2.96E−03 |
| 740 | 1.5 | 1.5 | 3.50E−05 | 2.97E−03 |
| 750 | 1.5 | 1.5 | 3.49E−05 | 2.98E−03 |
| 760 | 1.5 | 1.5 | 3.55E−05 | 2.99E−03 |
| 770 | 1.5 | 1.5 | 3.55E−05 | 2.98E−03 |
| 780 | 1.5 | 1.5 | 3.48E−05 | 2.98E−03 |

In this example, two kinds of polarizing plates each having different wavelength dependence (wavelength distribution) of extinction coefficients of a transmission axis and an absorption axis were particularly used as just described, and increase of a contrast ratio when the polarizing plates were stacked was verified.

Table 3 shows a wavelength and energy density of a backlight.

TABLE 3

| wavelength/nm | energy density/a.u. |
|---|---|
| 380 | 50 |
| 385 | 52.3 |
| 390 | 54.6 |
| 395 | 68.7 |
| 400 | 82.8 |
| 405 | 87.1 |
| 410 | 91.5 |
| 415 | 92.5 |
| 420 | 93.4 |
| 425 | 90.1 |
| 430 | 86.7 |
| 435 | 95.8 |
| 440 | 104.9 |
| 445 | 110.9 |
| 450 | 117 |
| 455 | 117.4 |
| 460 | 117.8 |
| 465 | 116.3 |
| 470 | 114.9 |
| 475 | 115.4 |
| 480 | 115.9 |
| 485 | 112.4 |
| 490 | 108.8 |
| 495 | 109.1 |
| 500 | 109.4 |
| 505 | 108.6 |
| 510 | 107.8 |
| 515 | 106.3 |
| 520 | 104.8 |
| 525 | 106.2 |
| 530 | 107.7 |
| 535 | 106 |
| 540 | 104.4 |
| 545 | 104.2 |
| 550 | 104 |
| 555 | 102 |
| 560 | 100 |
| 565 | 98.2 |
| 570 | 96.3 |
| 575 | 96.1 |
| 580 | 95.8 |
| 585 | 92.2 |
| 590 | 88.7 |
| 595 | 89.3 |
| 600 | 90 |

TABLE 3-continued

| wavelength/nm | energy density/a.u. |
|---|---|
| 605 | 89.8 |
| 610 | 89.6 |
| 615 | 88.6 |
| 620 | 88.7 |
| 625 | 85.5 |
| 630 | 83.3 |
| 635 | 83.5 |
| 640 | 83.7 |
| 645 | 81.9 |
| 650 | 80 |
| 655 | 80.1 |
| 660 | 80.2 |
| 665 | 81.2 |
| 670 | 82.3 |
| 675 | 80.3 |
| 680 | 78.3 |
| 685 | 74 |
| 690 | 69.7 |
| 695 | 70.7 |
| 700 | 71.6 |
| 705 | 73 |
| 710 | 74.3 |
| 715 | 68 |
| 720 | 61.6 |
| 725 | 65.7 |
| 730 | 69.9 |
| 735 | 72.5 |
| 740 | 75.1 |
| 745 | 69.3 |
| 750 | 63.6 |
| 755 | 55 |
| 760 | 46.4 |
| 765 | 56.6 |
| 770 | 66.8 |
| 775 | 65.1 |
| 780 | 63.4 |
| 770 | 66.8 |
| 775 | 65.1 |
| 780 | 63.4 |

Table 4 shows an optical system of black transmittance. A light emitting layer of the electroluminescent element should be provided between polarizing plates which are in a crossed Nicols state in which angular deviation between the absorption axes of the polarizing plates are 0° and 90°. However, at the time of black display, since the electroluminescent element does not emit light, a light emitting layer is not provided. In addition, display is assumed to be performed under external light; a backlight is arranged instead of external light. As for an arrangement of the absorption axes of the polarizing plates, the polarizing plates which were opposite to each other were arranged to be in a crossed Nicols state, and the polarizing plates to be stacked were arranged to be in a parallel Nicols state as shown in Table 4.

TABLE 4

| angle of absorption axis of polarizer | structure 1 | structure 2 viewing side | structure 3 |
|---|---|---|---|
| polarizer 90° |  | polarizer A | polarizer A |
| polarizer 90° | polarizer A | polarizer A | polarizer B |
| polarizer 0° | Polarizer A | polarizer A | polarizer B |
| polarizer 0° |  | polarizer A | polarizer A |
|  |  | backlight(external light) |  |

In the thus arranged optical system, a calculation of transmittance of light from a backlight, which passes through a viewing side opposite to the backlight, was performed. Calculation of a structure 1 where one polarizing plate A for each side was used; a structure 2 where two sets of the doubly-stacked polarizing plates A were used; and a structure 3 where two sets of stacked one polarizing plate A and one polarizing plate B were used was performed.

Table 5 shows an optical system of white transmittance. A backlight was used instead of the light emitting layer of the electroluminescent element. Accordingly, the polarizing plates were arranged over the backlight which serves as the light emitting layer, and the stacked polarizing plates were arranged to be in a parallel Nicols state. In the thus arranged optical system, a calculation of transmittance of light from the backlight, which passed through a viewing side opposite to the backlight, was performed. Note that in the optical system of white transmittance, a light source which served as external light was not arranged. This is because a result of black transmittance which is described later was lower than a result of white transmittance; therefore, the result of the white transmittance was considered not to affect external light.

TABLE 5

| angle of absorption axis of polarizer | structure 4 | structure 5 viewing side | structure 6 |
|---|---|---|---|
| polarizer 0° |  | polarizer A | polarizer A |
| polarizer 0° | polarizer A | polarizer A | polarizer B |
|  |  | backlight (light emitting layer) |  |

Calculations were performed for: a structure 4 where one polarizing plate A was used; a structure 5 where two polarizing plates A were stacked; and a structure 6 where one polarizing plate A and one polarizing plate B were stacked.

Figure 70:
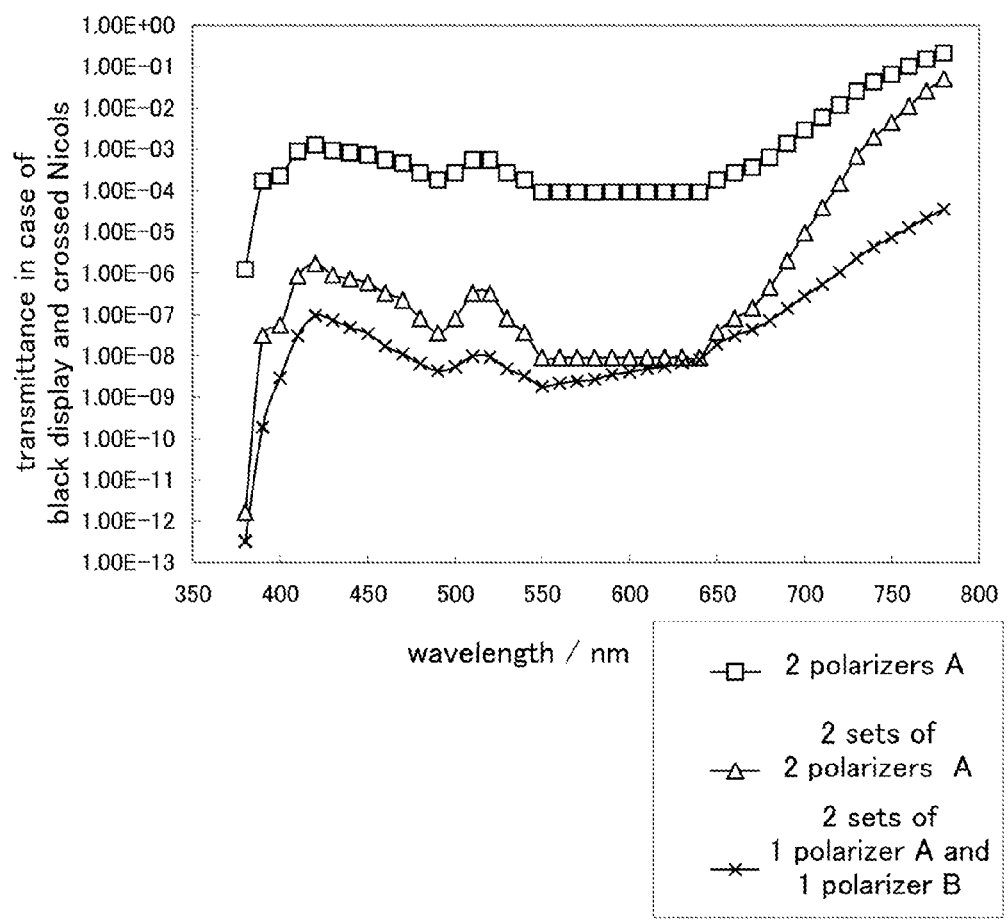
FIG. 70 is a graph showing a result of calculation of Example 1.

FIG. 70 shows a calculation result of black transmittance in the case of arrangement shown in Table 4. According to this, transmittance in the case of using two sets of the doubly-stacked polarizing plates A (2 sets of 2 polarizing plates A) is lower than that in the case of using one polarizing plate A for each side (2 polarizing plates) in the whole wavelength region between 380 nm and 780 nm. Further, it can be seen that transmittance in the case of using two sets of stacked one polarizing plate A and one polarizing plates B (2 sets of 1 polarizing plate A and 1 polarizing plate B) is lower than that in the case of using two sets of the doubly-stacked polarizing plates A (2 sets of 2 polarizing plates A) in the whole wavelength region. This is because the polarizing plate B has a larger extinction coefficient of an absorption axis than the polarizing plate A, which means that light leakage can be reduced by stacking polarizing plates having different wavelength distributions of extinction coefficients.

Further, the ratio (white transmittance/black transmittance) of the white transmittance in the case of arrangement shown in Table 5 to the black transmittance in the case of arrangement shown in Table 4 was calculated. A contrast ratio when one polarizing plate A for one side is used is a ratio of transmittance of the structure 4 to the transmittance of the structure 1. A contrast ratio when two sets of the doubly-stacked polarizing plates A are used is a ratio of transmittance of the structure 5 and transmittance of the structure 2. A contrast ratio when two sets of stacked one polarizing plate A and one polarizing plate B were used is a ratio of transmittance of the structure 6 and transmittance of the structure 3.

Figure 71:
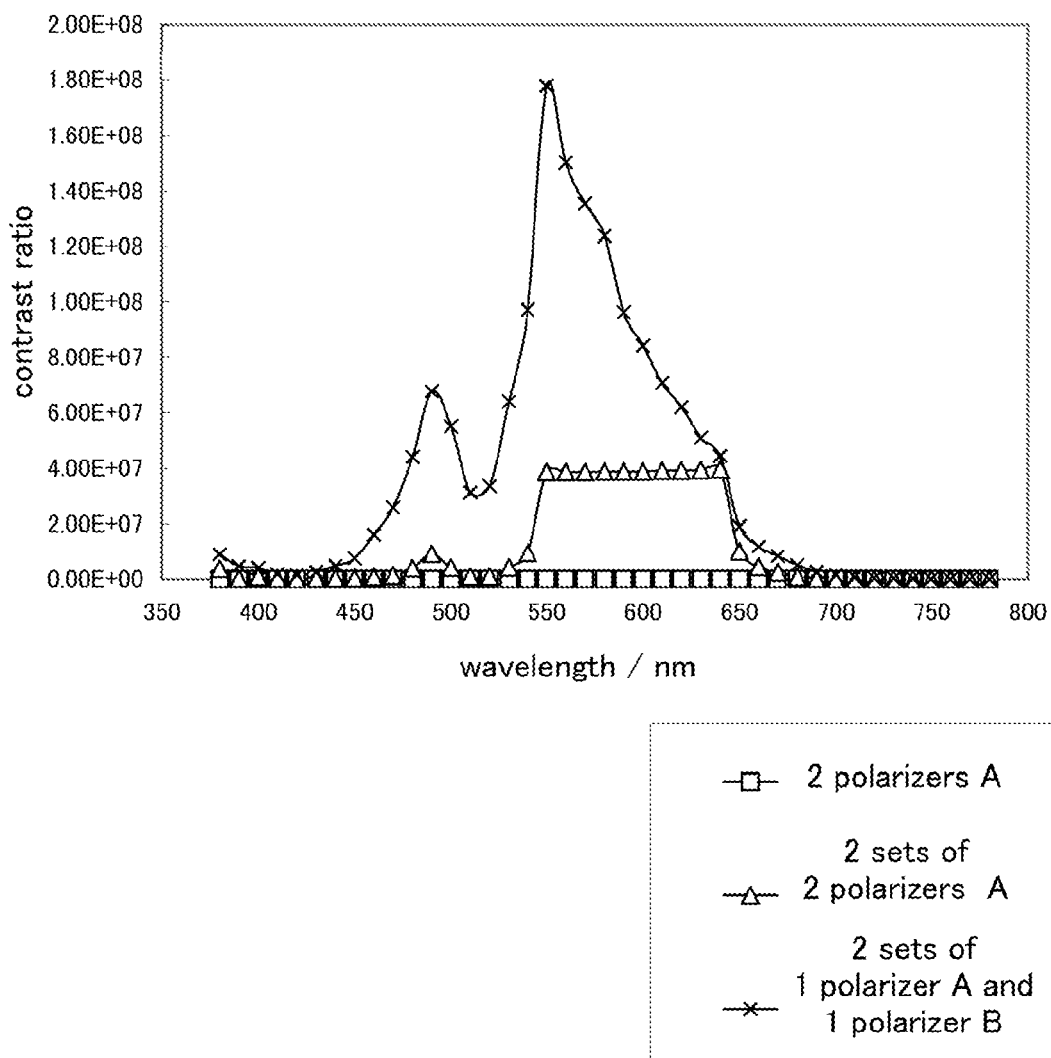
FIG. 71 is a graph showing a result of calculation of Example 1.

FIG. 71 shows calculation results of the contrast ratios. According to this, the contrast ratio in the case of 2 sets of 2 polarizing plates A is higher than that in the case of two polarizing plates A in the whole wavelength region between 380 nm and 780 nm. Further, the contrast ratio in the case of 2 sets of 1 polarizing plate A and 1 polarizing plate B is higher than that in the case of 2 sets of 2 polarizing plates A in the whole wavelength region. This is because black transmittance is lowered by stacking polarizing plates having different wavelength distributions of extinction coefficients of the absorption axes.

Note that as for two sets of one polarizing plate A and one polarizing plate B in the optical system of black transmittance, combinations shown in Table 6 (structures 7, 8, and 9) can be given other than the structure 3. In addition, in the optical system of white transmittance, a structure 10 shown in Table 7 can be given other than the structure 6. The black transmittance and the white transmittance in these structures are the same as the results of the structures 3 and 6, and any combination can improve contrast.

TABLE 6

| angle of absorption axis of polarizer | structure 7 | structure 8 viewing side | structure 9 |
|---|---|---|---|
| polarizer 90° | polarizer A | polarizer B | polarizer B |
| polarizer 90° | polarizer B | polarizer A | polarizer A |
| polarizer 0° | polarizer A | polarizer B | polarizer A |
| polarizer 0° | polarizer B | polarizer A | polarizer B |
| | | backlight (external light) | |

TABLE 7

| angle of absorption axis of polarizer | structure 10 viewing side |
|---|---|
| polarizer 0° | polarizer B |
| polarizer 0° | polarizer A |
| | backlight (light emitting layer) |

As a result, by stacking polarizing plates having different wavelength distributions of extinction coefficients of absorption axes, light leakage can be reduced. Therefore, the contrast ratio can be increased.

Example 2

Example 2 will describe a result of an optical calculation in the case where polarizing plates having different wavelength distributions of extinction coefficients of absorption axes are stacked and a structure including a retardation plate (a quarter-wave plate is used and hereinafter referred to as a "λ/4 plate" in this example) is used when an electroluminescent element in which light is emitted to both sides is assumed to be used. Further, as a comparison, an optical calculation in a case of using one kind of one polarizing plate for each side and an optical calculation in a case of using two sets of one kind of doubly-stacked polarizing plates were performed. Note that a contrast ratio was a ratio of white transmittance to black transmittance (white transmittance/black transmittance), and black transmittance and white transmittance were figured out, from which a contrast ratio was calculated.

For the calculation in this example, the optical calculation simulator for liquid crystal LCD MASTER (manufactured by SHINTECH, Inc.) was used. An optical calculation of transmittance with respect to a wavelength was performed by the LCD MASTER with an optical calculation algorithm of 2×2 matrix, which was not in view of multiple interference between elements, and an optical source wavelength of an 10 nm interval between 380 nm and 780 nm.

Figure 72:
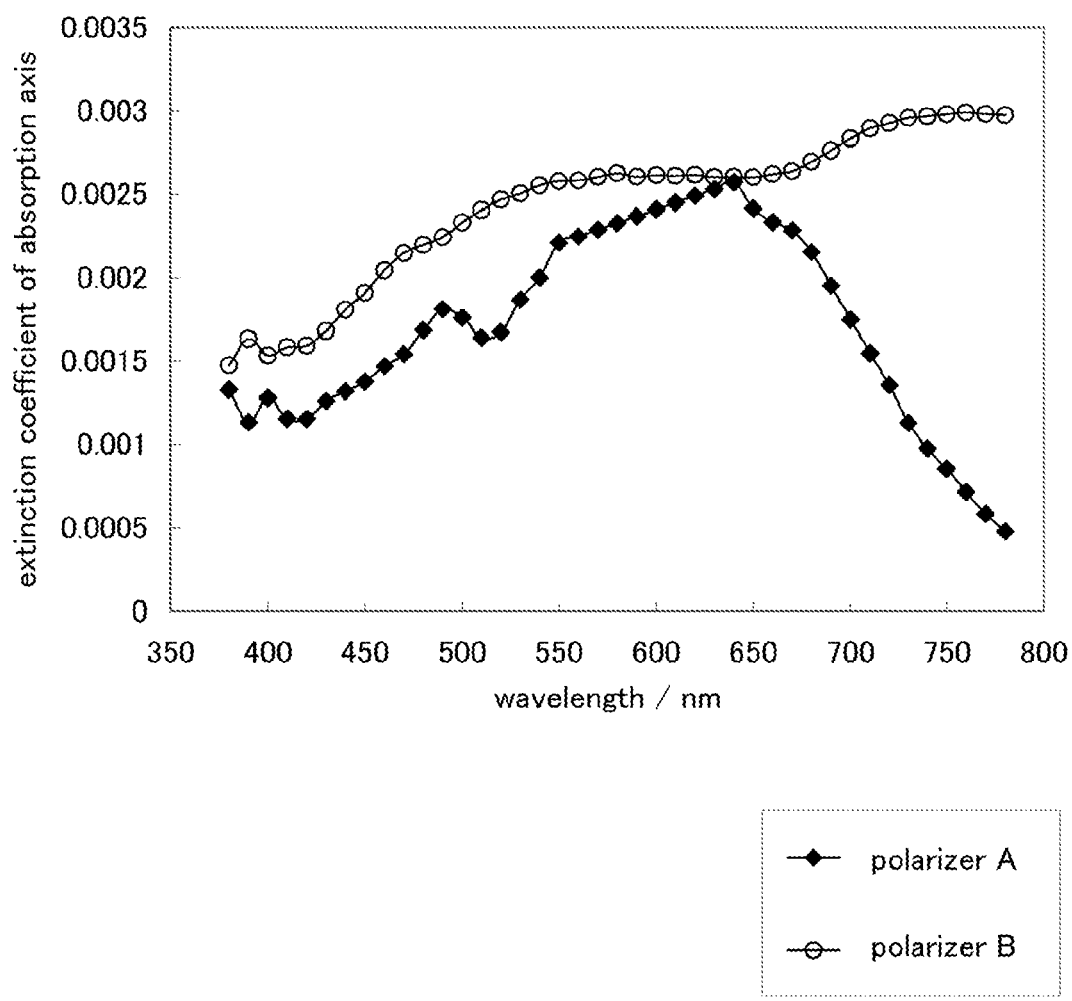
FIG. 72 is a graph showing extinction coefficients of polarizing plates of Example 2.

A polarizing plate A and a polarizing plate B similarly to those of Example 1 were used. FIG. 72 shows wavelength dependence (wavelength distributions) of an extinction coefficient of an absorption axis of each polarizing plate. According to FIG. 72, it can be seen that polarizing plates had different wavelength distributions of extinction coefficients of absorption axes. Further, a thickness of each of the polarizing plates was 180 μm. For a backlight, the D65 light source was used, and the polarizing state was mixed circularly polarization. As for the quarter-wave plate, in the whole wavelength region between 380 nm and 780 nm, a retardation plate of which retardation was 137.5 nm was used. The thickness of the quarter-wave plate was 100 μm.

Table 8 shows wavelength dependence in accordance with refractive indexes in x, y, and z directions of the quarter-wave plate. In this example, calculation was performed with a retardation plate having a property shown in Table 8 hereinafter.

TABLE 8

| wavelength/ nm | refractive index of x direction | refractive index of y direction | refractive index of z direction |
|---|---|---|---|
| 380 | 1.58835 | 1.586975 | 1.586975 |
| 390 | 1.58835 | 1.586975 | 1.586975 |
| 400 | 1.58835 | 1.586975 | 1.586975 |
| 410 | 1.58835 | 1.586975 | 1.586975 |
| 420 | 1.58835 | 1.586975 | 1.586975 |
| 430 | 1.58835 | 1.586975 | 1.586975 |
| 440 | 1.58835 | 1.586975 | 1.586975 |
| 450 | 1.58835 | 1.586975 | 1.586975 |
| 460 | 1.58835 | 1.586975 | 1.586975 |
| 470 | 1.58835 | 1.586975 | 1.586975 |
| 480 | 1.58835 | 1.586975 | 1.586975 |
| 490 | 1.58835 | 1.586975 | 1.586975 |
| 500 | 1.58835 | 1.586975 | 1.586975 |
| 510 | 1.58835 | 1.586975 | 1.586975 |
| 520 | 1.58835 | 1.586975 | 1.586975 |
| 530 | 1.58835 | 1.586975 | 1.586975 |
| 540 | 1.58835 | 1.586975 | 1.586975 |
| 550 | 1.58835 | 1.586975 | 1.586975 |
| 560 | 1.58835 | 1.586975 | 1.586975 |
| 570 | 1.58835 | 1.586975 | 1.586975 |
| 580 | 1.58835 | 1.586975 | 1.586975 |
| 590 | 1.58835 | 1.586975 | 1.586975 |
| 600 | 1.58835 | 1.586975 | 1.586975 |
| 610 | 1.58835 | 1.586975 | 1.586975 |
| 620 | 1.58835 | 1.586975 | 1.586975 |
| 630 | 1.58835 | 1.586975 | 1.586975 |
| 640 | 1.58835 | 1.586975 | 1.586975 |
| 650 | 1.58835 | 1.586975 | 1.586975 |
| 660 | 1.58835 | 1.586975 | 1.586975 |
| 670 | 1.58835 | 1.586975 | 1.586975 |
| 680 | 1.58835 | 1.586975 | 1.586975 |
| 690 | 1.58835 | 1.586975 | 1.586975 |
| 700 | 1.58835 | 1.586975 | 1.586975 |
| 710 | 1.58835 | 1.586975 | 1.586975 |
| 720 | 1.58835 | 1.586975 | 1.586975 |
| 730 | 1.58835 | 1.586975 | 1.586975 |
| 740 | 1.58835 | 1.586975 | 1.586975 |
| 750 | 1.58835 | 1.586975 | 1.586975 |
| 760 | 1.58835 | 1.586975 | 1.586975 |
| 770 | 1.58835 | 1.586975 | 1.586975 |
| 780 | 1.58835 | 1.586975 | 1.586975 |

Tables 9A and 9B show an optical system of black transmittance. Since display in black in the electroluminescent element does not emit light, a light emitting layer of the electroluminescent element is not provided between quarter-wave plates. In addition, display is assumed to be performed under external light; a backlight was arranged instead of external light. As for an arrangement of a slow axis of the quarter-wave plate and an absorption axis of a polarizing plate, there were a case where slow axes of the quarter-wave plates were arranged to be shifted from each other by 90°, the polarizing plates which were opposite to each other were arranged to be in a crossed Nicols state, and polarizing plates to be stacked were arranged to be in a parallel Nicols state as shown in Table 9A, and a case where the slow axes of the quarter-wave plates were arranged to be parallel each other, the polarizing plates which were opposite to each other were arranged to be in a parallel Nicols state, and the polarizing plates to be stacked were arranged to be in a parallel Nicols state as shown in Table 9B

TABLE 9

(A)

| angle of absorption axis of polarizer or slow axis of quarter wave plate | structure 1 | structure 2 viewing side | structure 3 |
|---|---|---|---|
| polarizer 90° | | polarizer A | polarizer A |
| polarizer 90° | polarizer A | polarizer A | polarizer B |
| quarter wave plate 135° | quarter wave plate | quarter wave plate | quarter wave plate |
| quarter wave plate 45° | quarter wave plate | quarter wave plate | quarter wave plate |
| polarizer 0° | polarizer A | polarizer A | polarizer B |
| polarizer 0° | | polarizer A | polarizer A |
| | | backlight (external light) | |

(B)

| angle of absorption axis of polarizer or slow axis of quarter wave plate | structure 4 | structure 5 viewing side | structure 6 |
|---|---|---|---|
| polarizer 0° | | polarizer A | polarizer A |
| polarizer 0° | polarizer A | polarizer A | polarizer B |
| quarter wave plate 45° | quarter wave plate | quarter wave plate | quarter wave plate |
| quarter wave plate 45° | quarter wave plate | quarter wave plate | quarter wave plate |
| polarizer 0° | polarizer A | polarizer A | polarizer B |
| polarizer 0° | | polarizer A | polarizer A |
| | | backlight (external light) | |

In the thus arranged optical system, a calculation of transmittance of light from a backlight, which passes through a viewing side opposite to the backlight, was performed. Calculation of the structure 1 and the structure 4 where one polarizing plate A for each side were used; the structure 2 and the structure 5 where two sets of the doubly-stacked polarizing plates A were used; and the structure 3 and the structure 6 where two sets of stacked one polarizing plate A and one polarizing plate B were used was performed.

Table 10 shows an optical system of white transmittance. A backlight was used instead of the light emission from the electroluminescent element. Accordingly, a quarter-wave plate was arranged over the backlight and a polarizing plate was arranged over the quarter-wave plate, and the pair of quarter-wave plates or the like was not arranged as shown in Tables 9A and 9B.

TABLE 10

| angle of absorption axis of polarizer or slow axis of quarter wave plate | structure 7 | structure 8 viewing side | structure 9 |
|---|---|---|---|
| polarizer 0° | | polarizer A | polarizer A |
| polarizer 0° | polarizer A | polarizer A | polarizer B |
| quarter wave plate 45° | quarter wave plate | quarter wave plate | quarter wave plate |
| | | backlight (light emitting layer) | |

At this time, absorption axes of the polarizing plates were arranged to be shifted by 45° from the slow axis of the quarter-wave plate. The stacked polarizing plates were in a parallel Nicols state. In the thus arranged optical system, a calculation of transmittance of light from the backlight, which passes through a viewing side opposite to the backlight, was performed. Note that in the optical system of white transmittance, a light source which served as external light was not arranged. This is because a result of black transmittance which is described later is lower than a result of white transmittance; therefore, the result of the white transmittance is considered not to affect external light.

Calculation of a structure 7 where a part of one polarizing plate A was used; a structure 8 where a part of two polarizing plates A were stacked; and a structure 9 where a part of one polarizing plate A and one polarizing plate B were stacked was performed. Note that as the arrangement in optical system of white transmittance shown in Table 10, the absorption axis of the polarizing plate was arranged to be shifted by 45° from the slow axis of the quarter-wave plate; therefore, white transmittance in both cases in Tables 9A and 9B were calculated.

Figure 73:
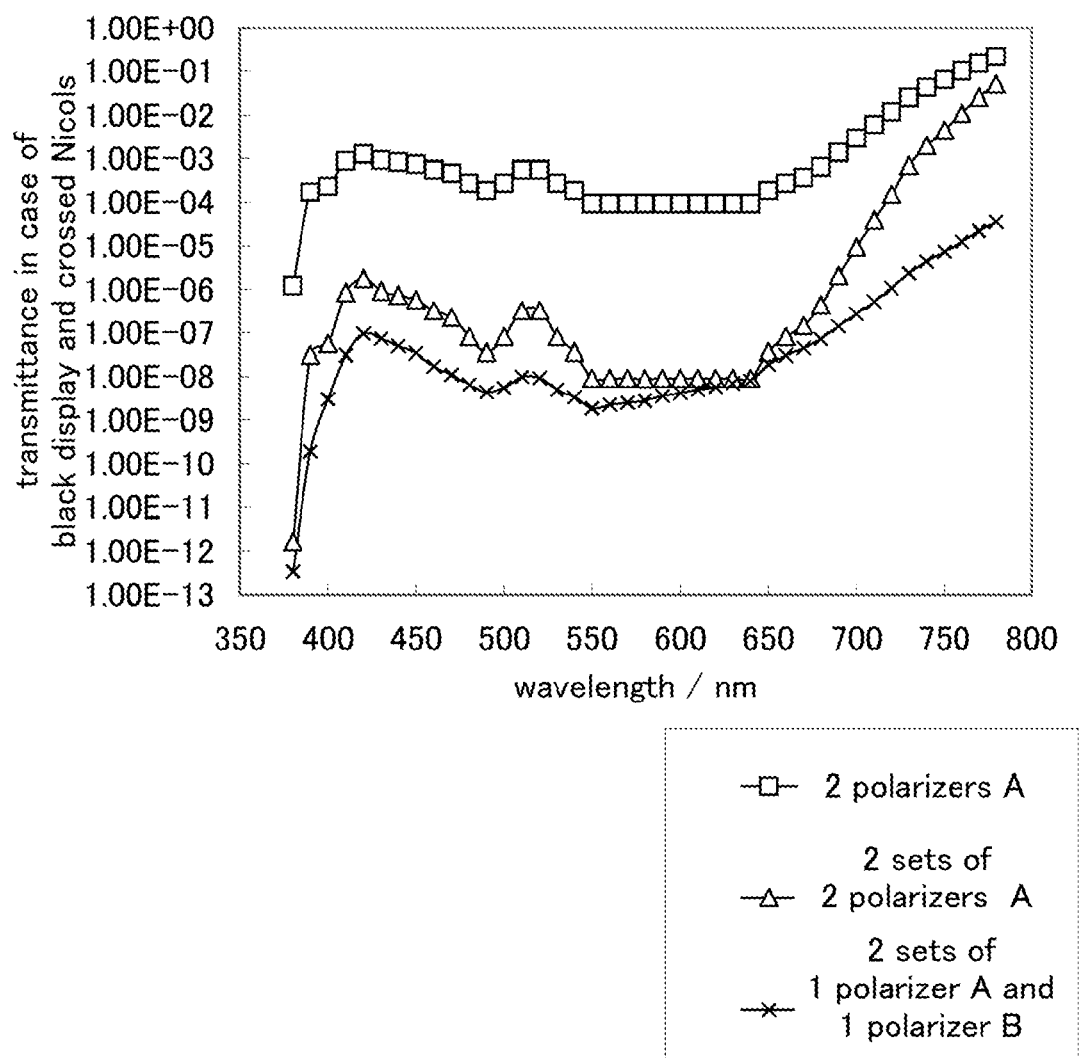
FIG. 73 is a graph showing a result of calculation of Example 2.

FIG. 73 shows a calculation result of black transmittance in the case of arrangement shown in Table 9A. According to this, transmittance in the case of using two sets of the doubly-stacked polarizing plates A (2 sets of 2 polarizing plates A) is lower than that in the case of using one polarizing plate A for each side (2 polarizing plates A) in the whole wavelength region between 380 nm and 780 nm. Further, it can be seen that transmittance in the case of using two sets of stacked one polarizing plate A and one polarizing plate B (two sets of 1 polarizing plate A and 1 polarizing plate B) is lower than that in the case of using two sets of the doubly-stacked polarizing plates A (2 sets of 2 polarizing plates A) in the whole wavelength region. This is because the polarizing plate B has a larger extinction coefficient of an absorption axis than the polarizing plate A, which means that light leakage can be reduced by stacking polarizing plates having wavelength distributions of different extinction coefficients.

Figure 74:
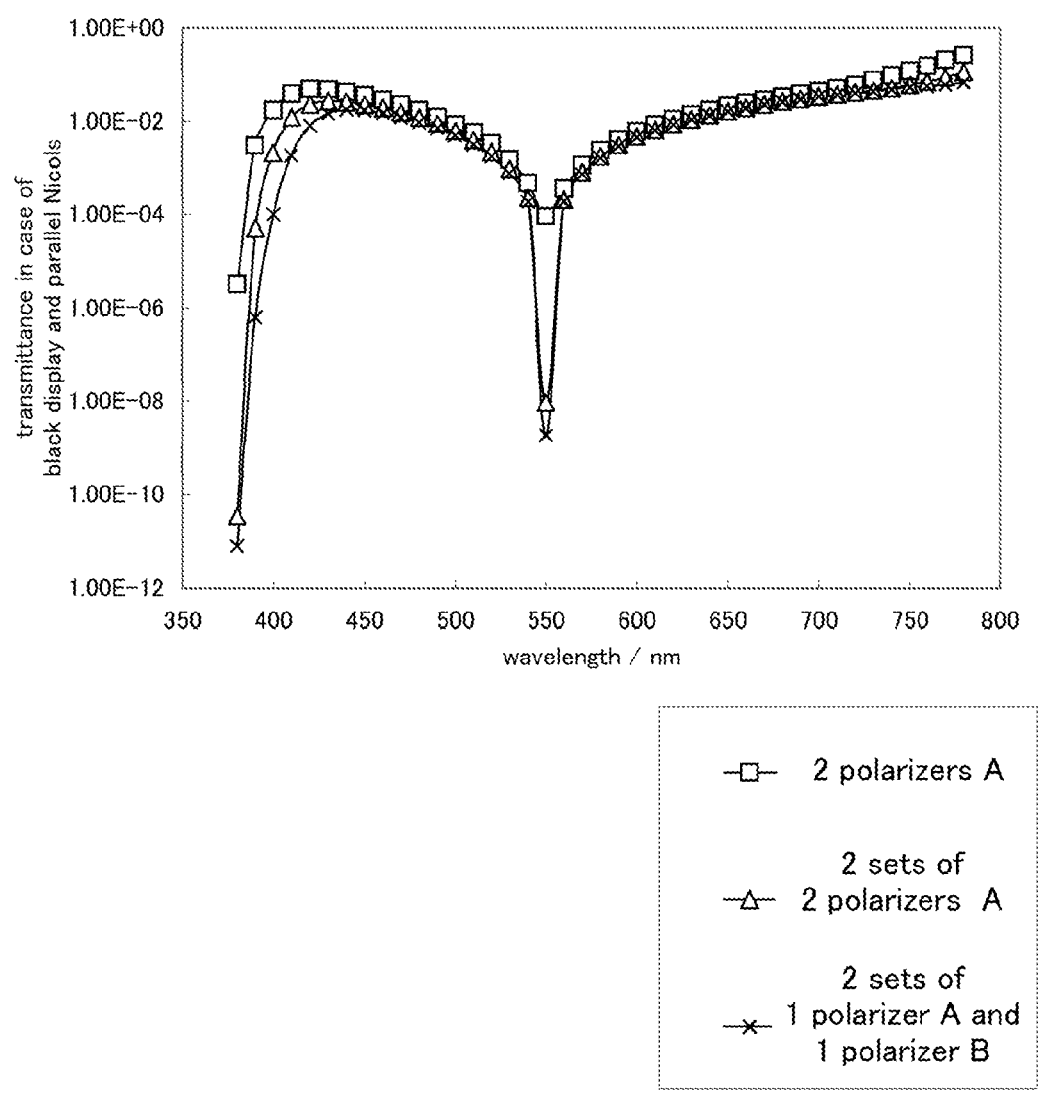
FIG. 74 is a graph showing a result of calculation of Example 2.

FIG. 74 shows a calculation result of black transmittance in the case of arrangement shown in Table 9B. According to this, transmittance in the case of using two sets of the doubly-stacked polarizing plates A (2 sets of 2 polarizing plates A) is lower than that in the case of using one polarizing plates A for each side (2 polarizing plates A) in the whole wavelength region between 380 nm and 780 nm. Further, it can be seen that transmittance in the case of using two sets of stacked one polarizing plate A and one polarizing plate B (two sets of 1 polarizing plate A and 1 polarizing plate B) is lower than that in the case of using two sets of the doubly-stacked polarizing plates A (2 sets of 2 polarizing plates A) in the short wavelength region. This is because the polarizing plate B has a larger extinction coefficient of an absorption axis than the polarizing plate A, which means that light leakage can be reduced by stacking polarizing plates having different wavelength distributions of extinction coefficients.

When FIG. 73 and FIG. 74 are compared, black transmittance is lower in a wide wavelength region in the case where opposite polarizing plates are arranged to be in a crossed Nicols state. On the contrary, black transmittance is lower only in the vicinity of a wavelength of 380 nm and in the vicinity of a wavelength of 550 nm in the case where opposite polarizing plates are arranged to be in a parallel Nicols state.

Further, the ratio of the white transmittance in the case of arrangement shown in Table 10 to the black transmittance in the case of arrangement shown in Tables 9A and 9B (white transmittance/black transmittance) was calculated. A contrast ratio when one polarizing plates A for each side is used is a ratio of transmittance of the structure 7 to the transmittance of the structure 1 or the structure 4. A contrast ratio when two sets of the doubly-stacked polarizing plates A are used is a ratio of transmittance of the structure 8 to transmittance of the structure 2 or the structure 5. A contrast ratio when two sets of stacked one polarizing plate A and one polarizing plate B were used is a ratio of transmittance of the structure 9 to transmittance of the structure 3 or the structure 6.

Figure 75:
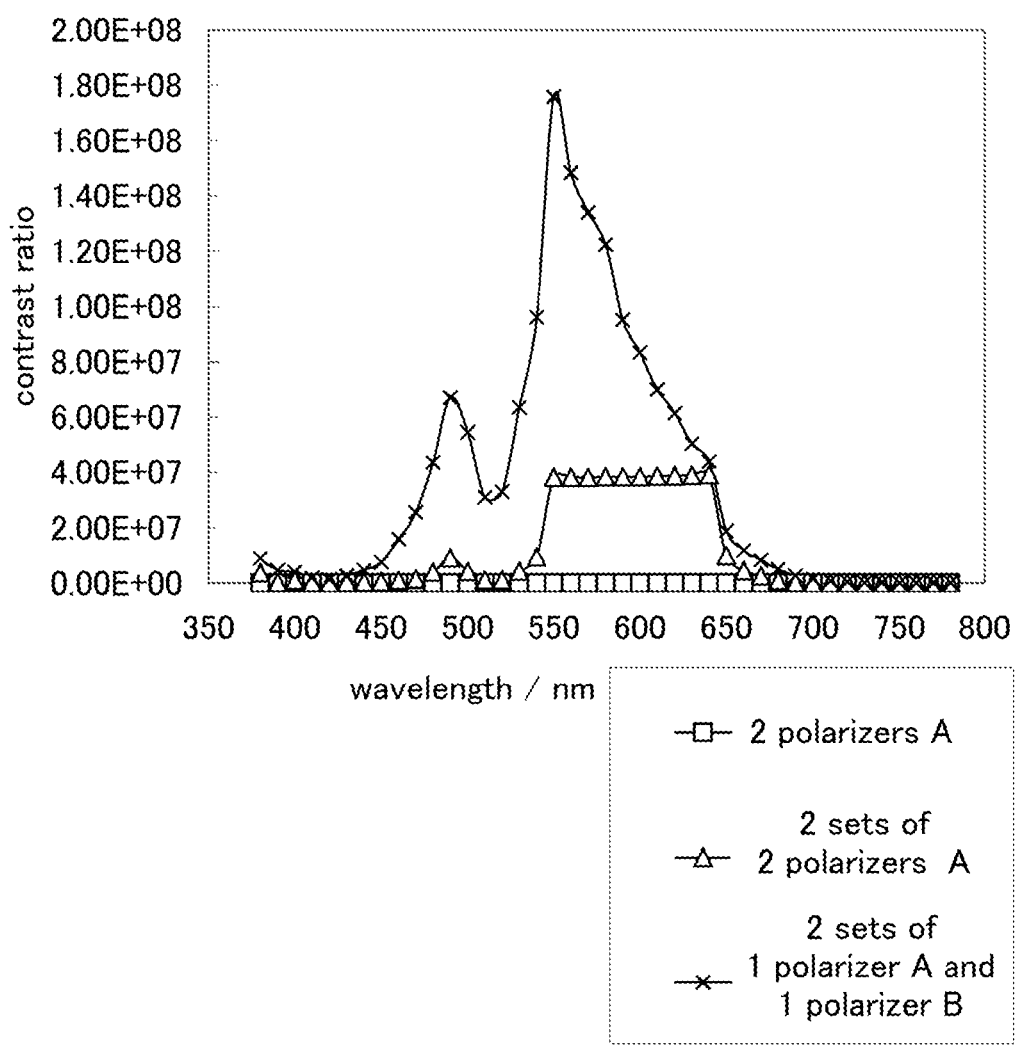
FIG. 75 is a graph showing a result of calculation of Example 2.

FIG. 75 shows a calculation result of a contrast ratio in the case of black transmittance in Table 9A. According to this, the contrast ratio in the case of 2 sets of 2 polarizing plates A is higher than that in the case of 2 polarizing plates A in the whole wavelength region between 380 nm and 780 nm. Further, the contrast ratio in the case of two sets of one polarizing plate A and one polarizing plate B is higher than that in the case of 2 sets of 2 polarizing plates A in the whole wavelength region. This is because black transmittance is lowered by stacking polarizing plates having different wavelength distributions of extinction coefficients of absorption axes.

Figure 76:
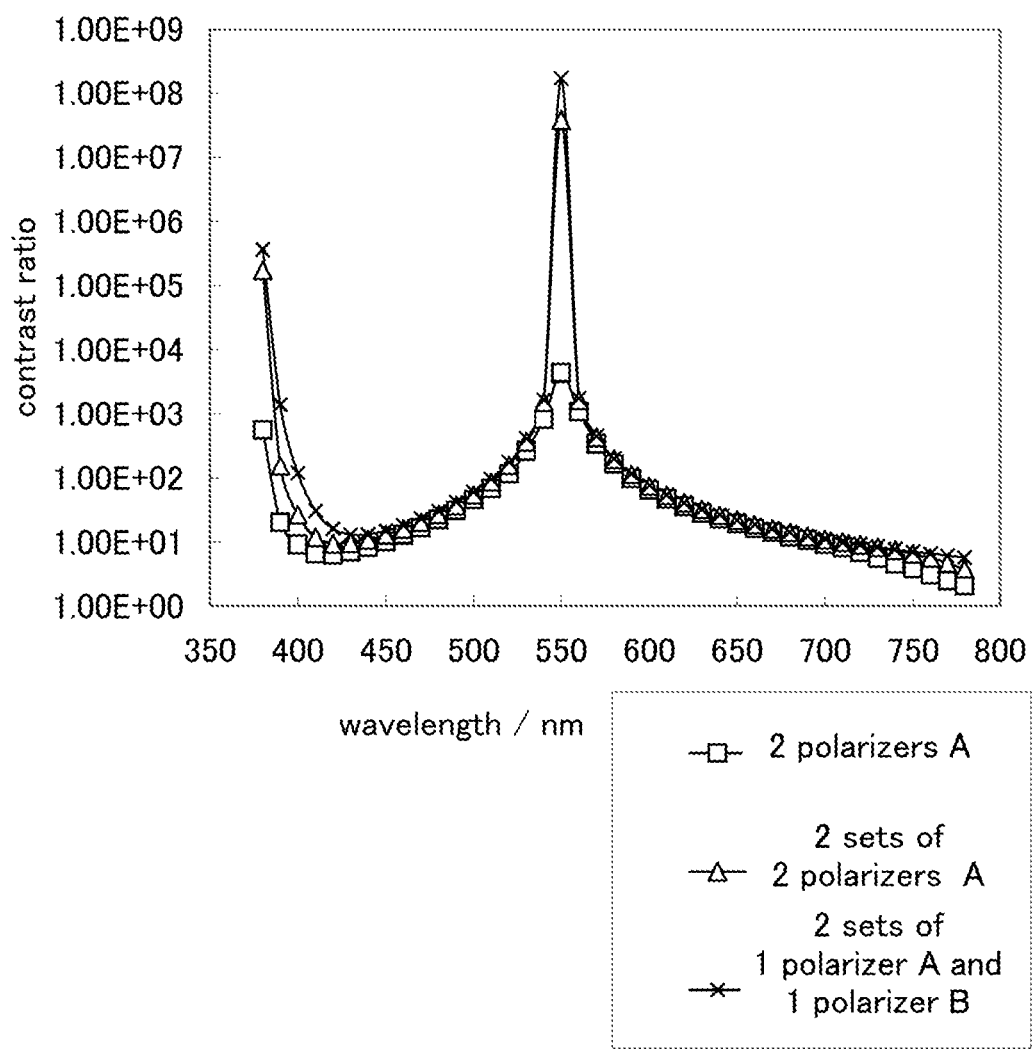
FIG. 76 is a graph showing a result of calculation of Example 2.

FIG. 76 shows a calculation result of a contrast ratio in the case of black transmittance in Table 9B. According to this, a contrast ratio in the case of the polarizing plates 2 sets of 2 polarizing plates A is higher than that in the case of 2 polarizing plates A in the whole wavelength region between 380 nm and 780 nm. Further, it can be seen that a contrast ratio in the case of two sets of one polarizing plate A and one polarizing plate B is higher than that in the case of the polarizing plates 2 sets of 2 polarizing plates A in the whole wavelength region. This is because black transmittance is lowered by stacking polarizing plates having different wavelength distributions of extinction coefficients of absorption axes.

When FIG. 75 and FIG. 76 are compared, a contrast ratio is higher in a wide wavelength region in the case where opposite polarizing plates are arranged to be in a crossed Nicols state. On the contrary, a contrast ratio is higher only in the vicinity of a wavelength of 380 nm and in the vicinity of a wavelength of 550 nm in the case where opposite polarizing plates are arranged to be in a parallel Nicols state.

This is because white transmittance in the case where the opposite polarizing plates are arranged to be in a crossed Nicols state is the same as that in the case where the opposite polarizing plates are arranged to be in a parallel Nicols state; therefore, a difference of black transmittance may be said to be expressed as the contrast ratio.

As for two sets of stacked one polarizing plate A and one polarizing plate B in the optical system of black transmittance, combinations shown in Table 11 (structures 10, 11, and 12) can be given other than the structure 3. In addition, in the optical system of white transmittance, a structure 13 shown in Table 12 can be given other than the structure 9. The black transmittance and the white transmittance in these structures are the same as the results of the structures 3 and 9, and any combination can improve contrast.

TABLE 11

| angle of absorption axis of polarizer or slow axis of quarter wave plate | structure 10 | structure 11 viewing side | structure 12 |
|---|---|---|---|
| polarizer 90° | polarizer A | polarizer B | polarizer B |
| polarizer 90° | polarizer B | polarizer A | polarizer A |
| quarter wave plate 135° | quarter wave plate | quarter wave plate | quarter wave plate |
| quarter wave plate 45° | quarter wave plate | quarter wave plate | quarter wave plate |
| polarizer 0° | polarizer A | polarizer B | polarizer A |
| polarizer 0° | polarizer B | polarizer A backlight | polarizer B |

TABLE 12

| angle of absorption axis of polarizer or slow axis of quarter wave plate | structure 13 viewing side |
|---|---|
| polarizer 0° | polarizer B |
| polarizer 0° | polarizer A |
| quarter wave plate 45° | quarter wave plate backlight (light emitting layer) |

As the above-described results, by stacking polarizing plates having different extinction coefficients of absorption axes are stacked, light leakage can be reduced. Therefore, a contrast ratio can be increased. The opposite polarizing plates are preferably arranged to be in a crossed Nicols state, and thus a high contrast ratio can be obtained in the wideband.

This application is based on Japanese Patent Application serial No. 2006-026416 filed in Japan Patent Office on Feb. 2, 2006, the entire contents of which are hereby incorporated by reference.

What is claimed is:
1. A display device comprising:
a first substrate;
a second substrate;
a first layer comprising a first liquid crystal element between the first substrate and the second substrate;
a stacked first polarizers;
a stacked second polarizers;
a transistor between the first layer and the second substrate;
a first electrode electrically connected to the transistor;
a second electrode;
a retardation plate;
a third substrate; and
a second layer including a second liquid crystal element between the retardation plate and the third substrate,
a stacked third polarizers;
wherein the first substrate is interposed between the first layer and the stacked first polarizers,
wherein the second substrate is interposed between the first layer and the stacked second polarizers,
wherein the stacked first polarizers are arranged to be in a parallel Nicols state with each other,
wherein the stacked second polarizers are arranged to be in a parallel Nicols state with each other,
wherein the first liquid crystal element comprises a birefringent mode liquid crystal,
wherein the first electrode and the second electrode are included into the layer,
wherein a molecular orientation of the first liquid crystal element is controlled by a voltage between the first electrode and the second electrode,
wherein the retardation plate is interposed between the stacked second polarizers and the second layer, and
wherein the third substrate is interposed between the first layer and the stacked third polarizers.
2. The display device according to claim 1, wherein the stacked first polarizers and the stacked second polarizers are arranged to be in a crossed Nicols state.
3. The display device according to claim 1, wherein the stacked first polarizers and the stacked second polarizers are arranged to be in a parallel Nicols state.
4. The display device according to claim 1, wherein a color filter is provided between the first substrate and the first layer.
5. The display device according to claim 1, wherein an alignment film is provided between the first layer and the first electrode.

6. The display device according to claim 1, wherein a shape of the first electrode is a wave-like shape, a circular shape, a lattice-like shape or a comb-like shape.

7. The display device according to claim 1, wherein the retardation plate comprising a first region and a second region, wherein a polarizing axis of light which has passed through the first region is substantially different by 90° from that of light which has passed through the second region.

8. The display device according to claim 1, wherein each of the first substrate, the second substrate and the third substrate comprises anyone of acrylic, polyethylene terephthalate, polyethylene naphthalate, polyethersulfone and polycarbonate.

9. An electric device comprising the display device according to claim 1 is selected from the group consisting of a television device, a digital camera, a digital video camera, a cellular phone, a portable information terminal, a portable game machine, a monitor for a computer, a computer, an audio reproducing devices and an image reproducing device.

* * * * *